(12) United States Patent
Zhang et al.

(10) Patent No.: US 12,557,299 B2
(45) Date of Patent: Feb. 17, 2026

(54) THREE-DIMENSIONAL MEMORY DEVICES AND FABRICATING METHODS THEREOF

(71) Applicant: YANGTZE MEMORY TECHNOLOGIES CO., LTD., Wuhan (CN)

(72) Inventors: Kun Zhang, Wuhan (CN); Yuancheng Yang, Wuhan (CN); Wenxi Zhou, Wuhan (CN); Zhiliang Xia, Wuhan (CN); Dongxue Zhao, Wuhan (CN); Tao Yang, Wuhan (CN); Lei Liu, Wuhan (CN); Di Wang, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 538 days.

(21) Appl. No.: 18/089,495

(22) Filed: Dec. 27, 2022

(65) Prior Publication Data
US 2024/0215272 A1 Jun. 27, 2024

(30) Foreign Application Priority Data

Dec. 22, 2022 (CN) .......................... 202211659079.X

(51) Int. Cl.
H01L 25/00 (2006.01)
H01L 23/00 (2006.01)
H01L 25/065 (2023.01)
H01L 25/18 (2023.01)
H10B 80/00 (2023.01)

(52) U.S. Cl.
CPC ............. *H10B 80/00* (2023.02); *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2225/06541* (2013.01); *H01L 2924/1431* (2013.01); *H01L 2924/1436* (2013.01); *H01L 2924/14511* (2013.01)

(58) Field of Classification Search
CPC ......... H10B 80/00; H01L 24/08; H01L 24/80; H01L 25/0657
See application file for complete search history.

(56) References Cited

U.S. PATENT DOCUMENTS

| 10,553,569 | B2 * | 2/2020 | Yu .......................... H01L 21/565 |
| 12,347,785 | B2 * | 7/2025 | Yu ............................ H01L 24/20 |
| 2021/0280528 | A1 * | 9/2021 | Yu ......................... H01L 23/5389 |
| 2023/0025662 | A1 * | 1/2023 | Chang ..................... H01L 25/50 |

(Continued)

Primary Examiner — Thao P Le
(74) Attorney, Agent, or Firm — BAYES PLLC

(57) ABSTRACT

Three-dimensional (3D) memory devices and fabricating methods are disclose. A disclosed 3D memory device can comprises, a first semiconductor structure comprising an array of first type memory cells, a second semiconductor structure comprising an array of second type memory cells different from the first type memory cells, a third semiconductor structure comprising a first peripheral circuit, and a fourth semiconductor structure comprising a second peripheral circuit. The first semiconductor structure and the second semiconductor structure are sandwiched between the third semiconductor structure and the fourth semiconductor structure in a vertical direction.

20 Claims, 82 Drawing Sheets

(56) References Cited

U.S. PATENT DOCUMENTS

| | | | |
|---|---|---|---|
| 2024/0071939 A1* | 2/2024 | Cheng | H01L 21/6836 |
| 2024/0120299 A1* | 4/2024 | Kim | H01L 24/06 |
| 2025/0192105 A1* | 6/2025 | Lin | H01L 23/49822 |

* cited by examiner

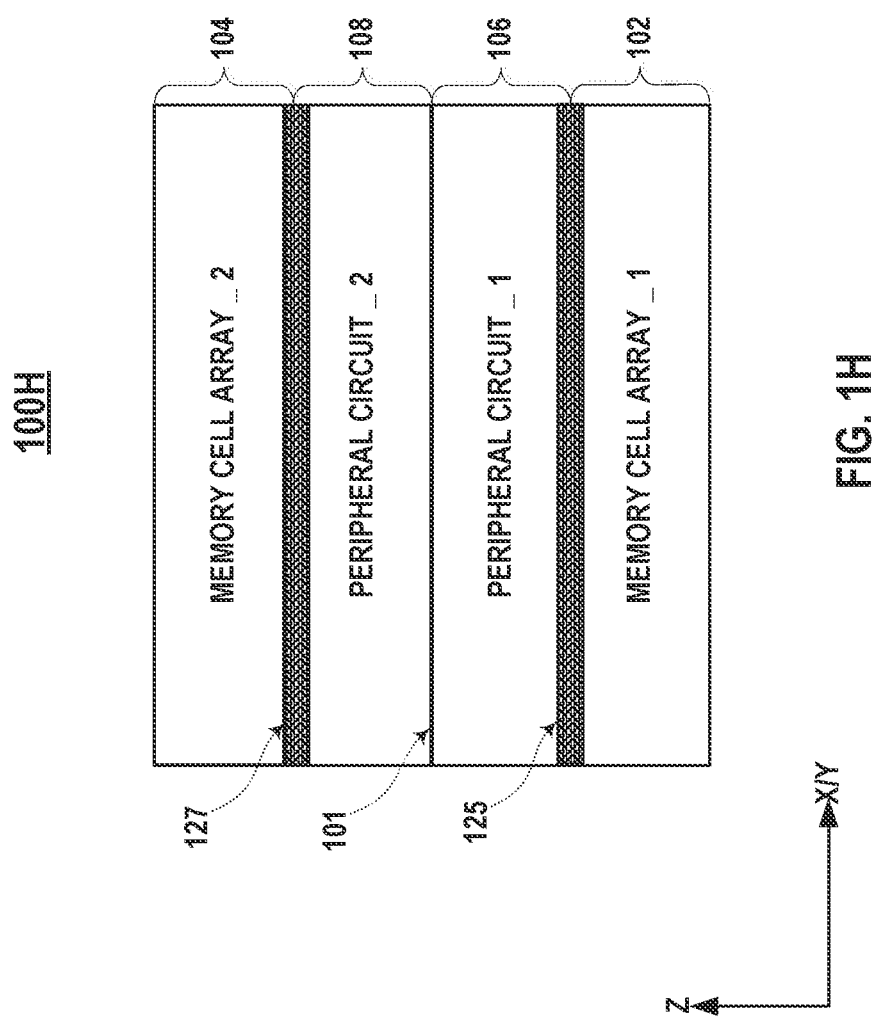

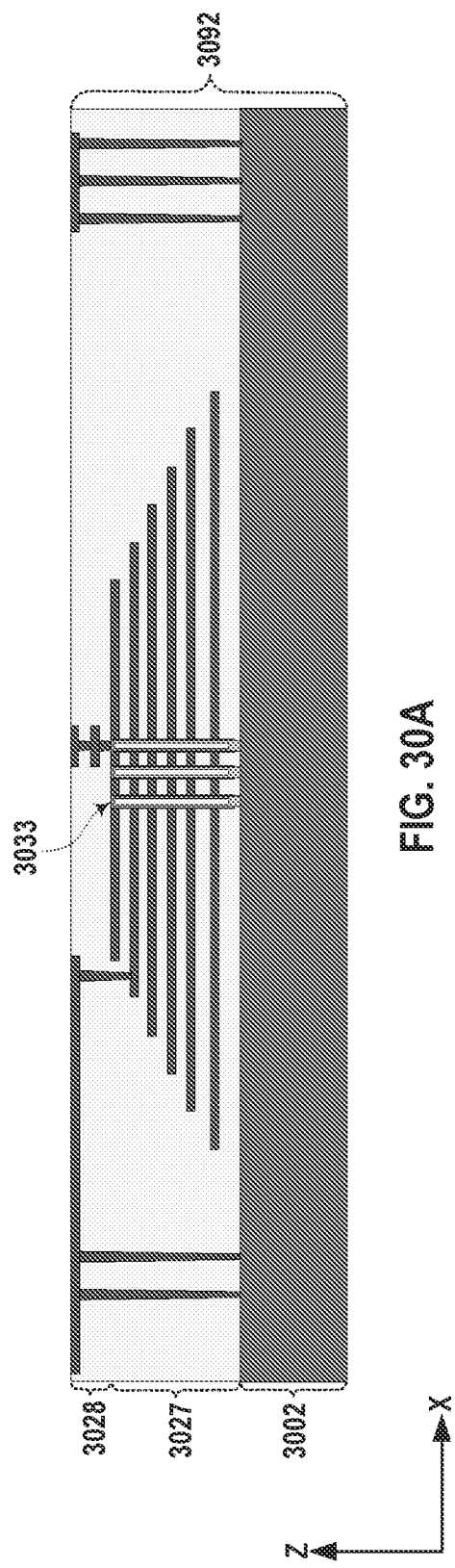
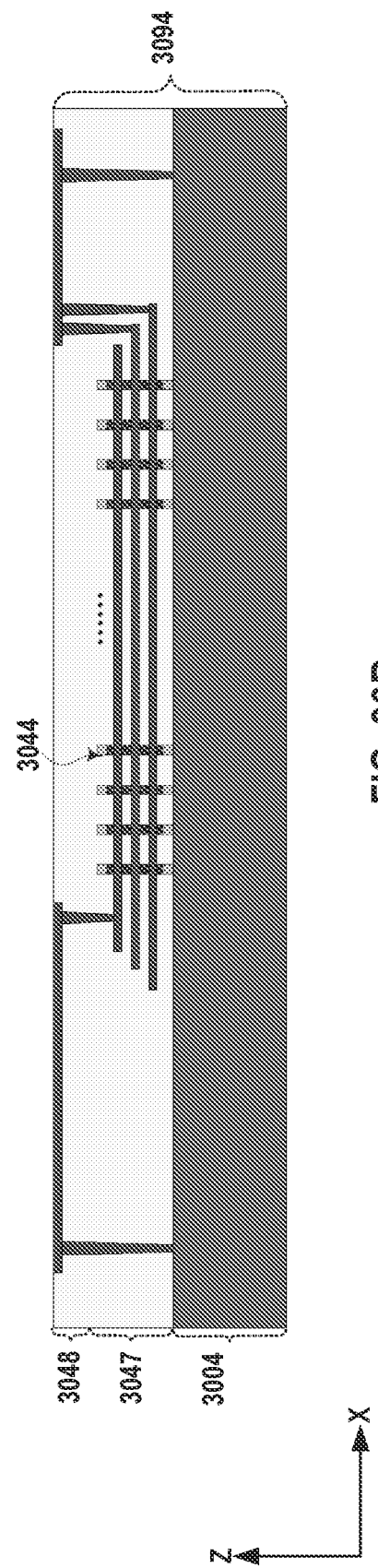
FIG. 30A
FIG. 30B

3400
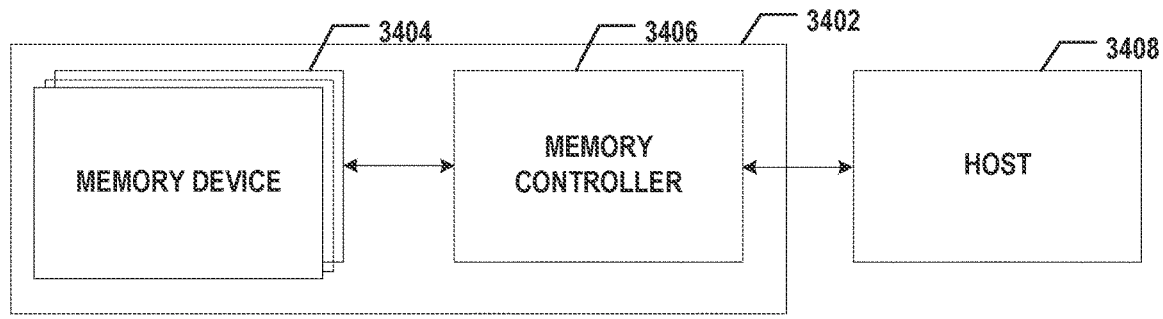
FIG. 34
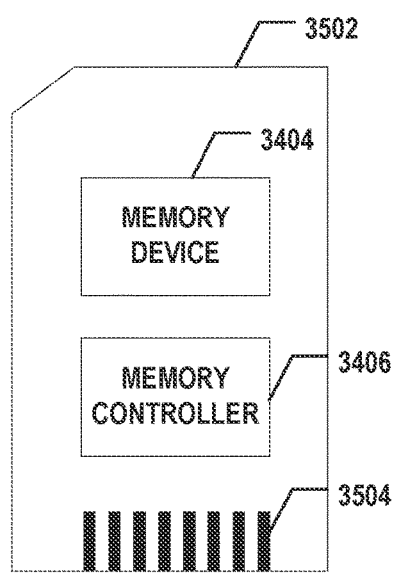
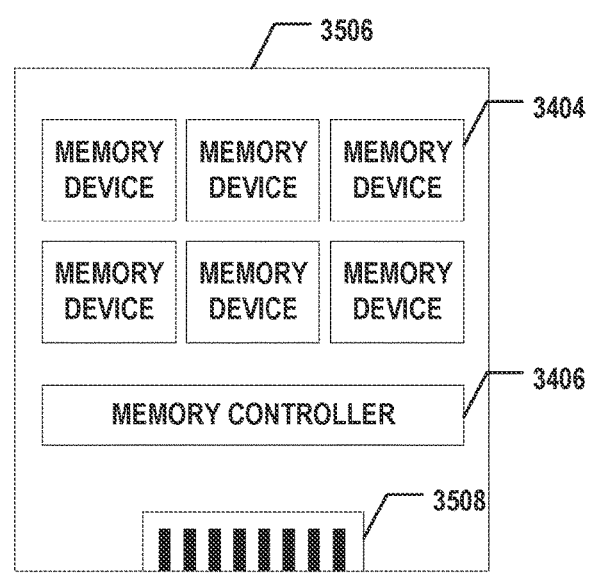
FIG. 35A          FIG.35B

THREE-DIMENSIONAL MEMORY DEVICES AND FABRICATING METHODS THEREOF

CROSS-REFERENCE TO RELATED APPLICATIONS

This application claims the benefit of priority to Chinese Application No. 202211659079.X, filed Dec. 22, 2022, which is incorporated herein by reference in its entirety.

TECHNICAL FIELD

The present disclosure generally relates to the field of semiconductor technology, and more particularly, to a three-dimensional (3D) memory device and a fabricating method thereof.

BACKGROUND

With continuous rising and development of artificial intelligence (AI), big data, Internet of Things, mobile devices and communications, and cloud storage, etc., the demand for memory capacity are growing in an exponential way.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, the present disclosure provides a three-dimensional (3D) memory device, comprising: a first semiconductor structure comprising an array of first type memory cells; a second semiconductor structure comprising an array of second type memory cells different from the first type memory cells; a third semiconductor structure comprising a first peripheral circuit; and a fourth semiconductor structure comprising a second peripheral circuit; wherein the first semiconductor structure and the second semiconductor structure are sandwiched between the third semiconductor structure and the fourth semiconductor structure in a vertical direction.

In some implementations, the first semiconductor structure further comprises a first semiconductor layer; and the array of first type memory cells comprises an array of NAND memory strings formed on the first semiconductor layer.

In some implementations, the second semiconductor structure further comprises a second semiconductor layer; and the array of second type memory cells comprises an array of multi-gate dynamic flash memory (DFM) cells formed on the second semiconductor layer.

In some implementations, the third semiconductor structure further comprises a third semiconductor layer; and the first peripheral circuit comprises a plurality of first type transistors having a first operating voltage on the third semiconductor layer.

In some implementations, the fourth semiconductor structure further comprises a fourth semiconductor layer; and the second peripheral circuit comprises a plurality of third type transistors having a third operating voltage on the fourth semiconductor layer, wherein the third operating voltage is lower than the first operating voltage.

In some implementations, the first peripheral circuit or the second peripheral circuit comprises a plurality of second type transistors having a second operating voltage lower than the first operating voltage and higher than the third operating voltage; and the third and fourth semiconductor layers have different thicknesses.

In some implementations, the 3D memory device further comprises: a first bonding interface between the first semiconductor structure and the third semiconductor structure; a second bonding interface between the second semiconductor structure and the fourth semiconductor structure; and a third bonding interface between the first semiconductor structure and the second semiconductor structure.

In some implementations, the first semiconductor structure further comprises a first interconnect layer comprising a first interconnect coupled to the array of NAND memory strings; the second semiconductor structure further comprises a second interconnect layer comprising a second interconnect coupled to the array of multi-gate DFM cells; the third semiconductor structure further comprises a third interconnect layer comprising a third interconnect coupled to the HV circuit; and the fourth semiconductor structure further comprises a fourth interconnect layer comprising a fourth interconnect coupled to the LLV circuit.

In some implementations, the first semiconductor structure further comprises a first through contact penetrating the first semiconductor layer to couple the first interconnect; the second semiconductor structure further comprises a second through contact penetrating the second semiconductor layer to couple the second interconnect; the third semiconductor structure further comprises a third through contact penetrating the third semiconductor layer to couple the third interconnect; and the fourth semiconductor structure further comprises a fourth through contact penetrating the fourth semiconductor layer to couple the fourth interconnect.

In some implementations, the third semiconductor structure or the fourth semiconductor structure further comprises a pad-out interconnect layer including a contact pad in electrical connection with the third through contact or the fourth through contact.

Another aspect of the present disclosure provides a system, comprising: a memory device configured to store data, and comprising: a first semiconductor structure comprising an array of first type memory cells, a second semiconductor structure comprising an array of second type memory cells different from the first type memory cells, a third semiconductor structure comprising a first peripheral circuit, and a fourth semiconductor structure comprising a second peripheral circuit, wherein the first semiconductor structure and the second semiconductor structure are sandwiched between the third semiconductor structure and the fourth semiconductor structure in a vertical direction; and a memory controller coupled to the memory device and configured to control the array of first type memory cells and the array of second type memory cells through the first peripheral circuit and the second peripheral circuit.

Another aspect of the present disclosure provides a method of forming a 3D memory device, comprising: forming a first semiconductor structure comprising an array of first type memory cells; forming a second semiconductor structure comprising an array of second type memory cells different from the first type memory cells; forming a third semiconductor structure comprising a first peripheral circuit;

forming a fourth semiconductor structure comprising a second peripheral circuit; bonding the first semiconductor structure to the third semiconductor structure; bonding the second semiconductor structure to the fourth semiconductor structure; and bonding the first semiconductor structure to the second semiconductor structure.

In some implementations, forming the first semiconductor structure comprises: forming an array of NAND memory strings on a first semiconductor layer; forming a first interconnect layer comprising a first interconnect coupled to the array of NAND memory strings; and forming a first through contact in the first semiconductor layer to couple the first interconnect.

In some implementations, forming the second semiconductor structure comprises: forming an array of multi-gate dynamic flash memory (DFM) cells on a second semiconductor layer; forming a second interconnect layer comprising a second interconnect coupled to the array of multi-gate DFM cells; and forming a second through contact in the second semiconductor layer to couple the second interconnect.

In some implementations, forming the third semiconductor structure comprises: forming a first circuit including a plurality of first type transistors having a first operating voltage on a third semiconductor layer; and forming a third interconnect layer comprising a third interconnect coupled to the first circuit.

In some implementations, forming the fourth semiconductor structure comprises: forming a third circuit including a plurality of third transistors having a third operating voltage on a fourth semiconductor layer, wherein the third operating voltage is lower than the first operating voltage; and forming a fourth interconnect layer comprising a fourth interconnect coupled to the third circuit.

In some implementations, forming the third semiconductor structure further comprises: forming a second circuit including a plurality of second type transistors having a second operating voltage on the third semiconductor layer; wherein the second operating voltage is lower than the first operating voltage, and the third interconnect layer comprising another third interconnect coupled to the second circuit.

In some implementations, forming the fourth semiconductor structure further comprises: forming a second circuit including a plurality of second type transistors having a second operating voltage on the third semiconductor layer; wherein the second operating voltage is lower than the first operating voltage and higher than the third operating voltage, and the fourth interconnect layer comprising another fourth interconnect coupled to the second circuit.

In some implementations, bonding the first semiconductor structure to the third semiconductor structure comprises bonding the first semiconductor structure and the third semiconductor structure in a face-to-face manner, such that the first interconnect is in contact with the third interconnect at a first bonding interface.

In some implementations, bonding the second semiconductor structure to the fourth semiconductor structure comprises bonding the second semiconductor structure and the fourth semiconductor structure in a face-to-face manner, such that the second interconnect is in contact with the fourth interconnect at a second bonding interface.

In some implementations, bonding the first semiconductor structure to the second semiconductor structure comprises: forming a first bonding layer on a backside of the first semiconductor layer; forming a second bonding layer on a backside of the second semiconductor layer; and bonding the first semiconductor structure and the second semiconductor structure in a back-to-back manner, such that the first through contact is coupled with the second through contact through a third bonding interface between the first bonding layer and the second bonding layer.

In some implementations, the method further comprises: forming a third through contact penetrating the third semiconductor layer and coupled to the third interconnect; and forming a first pad-out interconnect layer on a back side of the third semiconductor layer, the first pad-out interconnect layer including a first contact pad coupled with the third through contact.

In some implementations, the method further comprises: forming a fourth through contact penetrating the fourth semiconductor layer and coupled to the fourth interconnect; and forming a second pad-out interconnect layer on a back side of the fourth semiconductor layer, the second pad-out interconnect layer including a second contact pad coupled with the fourth through contact.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 1A-1H illustrate schematic diagrams of a cross-sectional view of exemplary 3D memory devices, according to various aspects of the present disclosure.

FIGS. 30A-30H illustrate a fabrication process for forming the 3D memory device in FIG. 25, according to some aspects of the present disclosure.

FIG. 34 illustrates a block diagram of an exemplary system having a memory device, according to some aspects of the present disclosure.

FIG. 35A illustrates a diagram of an exemplary memory card having a memory device, according to some aspects of the present disclosure.

FIG. 35B illustrates a diagram of an exemplary solid-state drive (SSD) having a memory device, according to some aspects of the present disclosure.

Figure 1A:
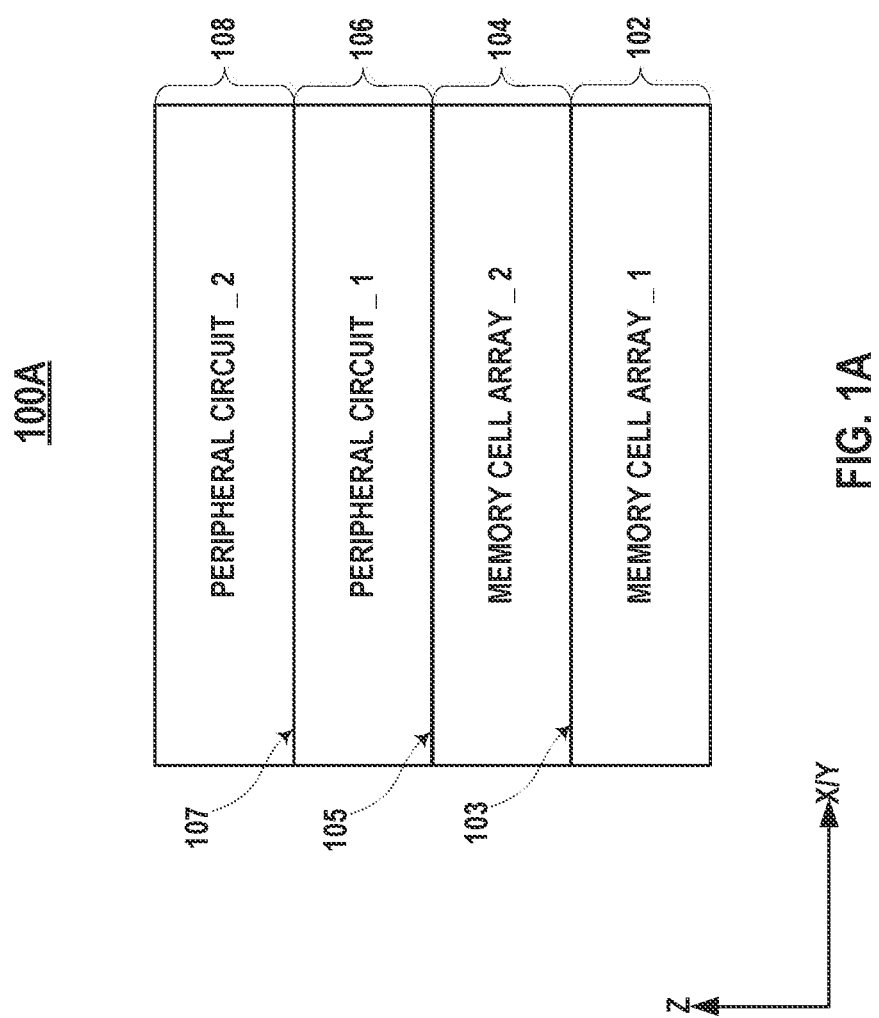

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

The term "dynamic random-access memory" or "DRAM" as used herein indicates a volatile memory that uses charge stored on a capacitor to represent information. DRAM stores each bit in a memory cell that includes a transistor and a capacitor (e.g., 1T1C). The 1T1C design can be based on metal-oxide-semiconductor (MOS) technology. Charge levels greater than a certain threshold can represent a first logic level (e.g., 1 state) and charge levels less than another threshold amount can represent a second logic level (e.g., 0 state). Leakage currents and various parasitic effects limit the length of time a capacitor can hold charge.

The term "NAND" as used herein indicates memory designs or architectures that resemble NAND logic gates (e.g., an inverted AND gate) and connect to memory cells in series (e.g., memory strings). In NAND flash, the relationship between a bit line and a word line resembles a NAND logic gate and can be used for fast writes and high-density arrays. NAND flash can access data sequentially since the transistors in the array are connected in series (e.g., memory strings). NAND flash can be read, programmed (written), and erased in blocks or pages. NAND flash can have a smaller cell size than DRAM but can require additional circuitry to implement.

The term "surrounding gate transistor" or "SGT" as used herein indicates a memory device that has a gate surrounding a channel region of a transistor on all sides.

The term "dynamic flash memory" or "DFM" as used herein indicates a volatile memory that uses a dual-gate SGT or a multi-gate SGT. The dual gates of the dual-gate SGT can include a word line (WL) gate and a plate line (PL) gate. The plurality of gates of the multi-gate SGT can include a word line (WL) gate and multiple plate line (PL) gates. DFM can be capacitor-free and can store charge on a channel region of a transistor. DFM can still require a refresh cycle but can offer longer retention times, faster operation speeds, and higher density than compared to DRAM or other types of volatile memory. Further, similar to flash, DFM can offer block refresh and block erase operations.

The term "bit line" or "BL" as used herein indicates an array connection to address a particular memory cell in a memory array. A bit line can be connected to a drain of a transistor (e.g., DFM device). A bit line can be connected to two or more serially connected memory cells (e.g., memory strings). Different voltage combinations applied to the bit line can define read, program (write), and erase operations in the memory cell.

The term "source line" or "SL" as used herein indicates an array connection to address a particular memory cell in a memory array. A source line can be connected to a source of a transistor (e.g., DFM device). A source line can be connected to two or more serially connected memory cells (e.g., memory strings). Different voltage combinations applied to the source line can define read, program (write), and erase operations in the memory cell.

The term "word line" or "WL" as used herein indicates an array connection to provide a voltage to a particular memory cell in a memory array to select which row of bits is to be read, programmed, or erased. A word line can act as a top select gate (TSG). A word line can be connected to a portion of a channel or a portion of a body of a transistor (e.g., DFM device). Different voltage combinations applied to the word line can define read, program (write), and erase operations in the memory cell. When the word line is activated, current flows only if charge is already on the memory cell. If there is charge on the channel or body of the memory cell, the read operation recharges the memory cell and is non-destructive. If there is no charge on the channel or body of the memory cell, no current flows, and the read is also non-destructive.

The term "plate line" or "PL" as used herein indicates an array connection to provide a voltage to a particular memory cell in a memory array to read, program, or erase charge on the memory cell. A plate line can be connected to a portion of a channel or a portion of a body of a transistor (e.g., DFM device). Different voltage combinations applied to the plate line can define read, program (write), and erase operations in the memory cell. When the plate line is activated, charge flows from the source line (source) to the bit line (drain). When the plate line is deactivated, any remaining charge is stored in the channel or body of the memory cell.

The term "dummy line" or "DMY" as used herein indicates an array connection, separate from a word line, to provide an additional voltage to a particular memory cell in a memory array to increase operating efficiency. A dummy line can be used for impact ionization programming to rapidly increase charge (e.g., holes) conduction generated at a word line contact to flow and increase charge (e.g., holes) in a channel of a memory cell. A dummy line can increase a program (write) rate of a memory cell.

The term "top select gate line" or "TSG" as used herein indicates an array connection to provide a voltage to a particular memory cell in a memory array to select which row of bits is to be read, programmed, or erased. The top select gate line can be used for gate-induced drain leakage (GIDL) programming to create a charge (e.g., hole) barrier to provide selective programming (writing) in a channel of a memory cell. A top select gate line can provide selective programming (writing) and increase a program (write) rate. A top select gate line can provide charge separation between a plate line and a bit line and thereby increasing charge retention times and decreasing refresh rates in a memory cell. A top select gate line can provide charge separation between a plate line and a bit line and thereby decrease junction leakage. A top select gate line can increase a depletion area of a memory cell.

The term "bottom select gate line" or "BSG" as used herein indicates an array connection to provide a voltage to a particular memory cell in a memory array to select which row of bits is to be read, programmed, or erased. The bottom select gate line can be used for gate-induced source leakage (GISL) programming to create a charge (e.g., hole) barrier to provide selective programming (writing) in a channel of a memory cell. A bottom select gate line can provide selective programming (writing) and increase a program (write) rate. A bottom select gate line can provide charge separation between a plate line and a source line and thereby increasing charge retention times and decreasing refresh rates in a memory cell. A bottom select gate line can provide charge separation between a plate line and a source line and thereby decrease junction leakage. A bottom select gate line can increase a depletion area of a memory cell.

The term "gate-induced drain leakage" or "GIDL" as used herein indicates a programming method to generate electrical charge on a channel through drain leakage. GIDL is caused by high electric fields in a drain junction of a memory cell. When a gate is at zero or negative voltage and a bit line has a positive voltage (e.g., above a threshold voltage), various charge generation effects (e.g., avalanche multiplication, band-to-band tunneling) will increase. For example, band-to-band tunneling can occur at the drain-channel junction of the memory cell. Minority carriers (e.g., holes) underneath the gate can flow to the source line to complete the GIDL path.

The term "gate-induced source leakage" or "GISL" as used herein indicates a programming method to generate electrical charge on a channel through source leakage. GISL is caused by high electric fields in a source junction of a memory cell. When a gate is at zero or negative voltage and a source line has a positive voltage (e.g., above a threshold voltage), various charge generation effects (e.g., avalanche multiplication, band-to-band tunneling) will increase. For example, band-to-band tunneling can occur at the source-channel junction of the memory cell. Minority carriers (e.g., holes) underneath the gate can flow to the drain (bit) line to complete the GISL path.

The term "substrate" as used herein indicates a planar wafer on which subsequent layers can be deposited, formed, or grown. A substrate can be formed of a single element (e.g., Si) or a compound material (e.g., GaAs), and may be doped or undoped. For example, a substrate can include silicon (Si), germanium (Ge), silicon-germanium (SiGe), gallium arsenide (GaAs), gallium nitride (GaN), gallium phosphide (GaP+), gallium antimonide (GaSb), indium phosphide (InP+), indium antimonide (InSb), a Group IV semiconductor, a Group III-V semiconductor, a Group II-VI semiconductor, graphene, sapphire, and/or any other semiconductor material. A substrate can be a monocrystalline material (e.g., monocrystalline Si).

The term "Group III-V semiconductor" as used herein indicates comprising one or more materials from Group III of the periodic table (e.g., group 13 elements: boron (B), aluminum (Al), gallium (Ga), indium (In), thallium (Tl)) with one or more materials from Group V of the periodic table (e.g., group 15 elements: nitrogen (N), phosphorus (P+), arsenic (As), antimony (Sb), bismuth (Bi)). The compounds have a 1:1 combination of Group III and Group V regardless of the number of elements from each group. Subscripts in chemical symbols of compounds refer to the proportion of that element within that group. For example, $Al_{0.25}GaAs$ means the Group III part comprises 25% Al, and thus 75% Ga, while the Group V part comprises 100% As.

The term "Group IV semiconductor" as used herein indicates comprising two or more materials from Group IV of the periodic table (e.g., group 14 elements: carbon (C), silicon (Si), germanium (Ge), tin (Sn), lead (Pb)). Subscripts in chemical symbols of compounds refer to the proportion of that element. For example, $Si_{0.25}Ge_{0.75}$ means the Group IV part comprises 25% Si, and thus 75% Ge.

The term "Group II-VI semiconductor" as used herein indicates comprising one or more materials from Group II of the periodic table (e.g., group 12 elements: zinc (Zn), cadmium (Cd), mercury (Hg)) with one or more materials from Group VII of the periodic table (e.g., group 16 elements: oxygen (O), sulfur (S), selenium (Se), tellurium (Te)). The compounds have a 1:1 combination of Group II and Group VI regardless of the number of elements from each group. Subscripts in chemical symbols of compounds refer to the proportion of that element within that group.

The term "doping" or "doped" as used herein indicates that a layer or material contains a small impurity concentration of another element (dopant) which donates (donor) or extracts (acceptor) charge carriers from the parent material and therefore alters the conductivity. Charge carriers may be electrons or holes. A doped material with extra electrons is called n-type while a doped material with extra holes (fewer electrons) is called p-type.

The term "crystalline" as used herein indicates a material or layer with a single crystal orientation. In epitaxial growth or deposition, subsequent layers with the same or similar lattice constant follow the registry of the previous crystalline layer and therefore grow with the same crystal orientation or crystallinity.

The term "monocrystalline" as used herein indicates a material or layer having a continuous crystal lattice throughout the material or layer. Monocrystalline can indicate a single crystal or monocrystal (e.g., Si, Ge, GaAs, etc.).

The term "monolithic" as used herein indicates a layer, element, or substrate comprising bulk (e.g., single) material throughout. A monolithic element (e.g., a semiconductor body) can be formed from a single bulk material (e.g., Si).

The term "deposit" or "deposition" as used herein indicates the depositing or growth of a layer on another layer or substrate. Deposition can encompass vacuum deposition, thermal evaporation, arc vaporization, ion beam deposition, e-beam deposition, sputtering, laser ablation, pulsed laser deposition (PLD), physical vapor deposition (PVD), atomic layer deposition (ALD), chemical vapor deposition (CVD), plasma-enhanced CVD (PECVD), low pressure CVD (LPCVD), metal-organic chemical vapor deposition (MOCVD), liquid source misted chemical deposition, spin-coating, epitaxy, vapor-phase epitaxy (VPE), liquid-phase epitaxy (LPE), solid-phase epitaxy (SPE), MBE, atomic layer epitaxy (ALE), molecular-beam epitaxy (MBE), powder bed deposition, and/or other known techniques to deposit material in a layer.

The term "dielectric" as used herein indicates an electrically insulating layer. Dielectric can encompass oxide, nitride, oxynitride, ceramic, glass, spin-on-glass (SOG), polymer, plastic, thermoplastic, resin, laminate, high-k dielectric, and/or any other electrically insulating material.

The term "high-k dielectric" as used herein indicates a material with a high dielectric constant k or K (kappa), for example, relative to the dielectric constant of silicon dioxide ($SiO_2$). High-k dielectrics can be used as a gate dielectric or as another dielectric layer in an electronic device.

The term "high-k metal gate" or "high-k dielectric and conductive gate" or "HKMG" as used herein indicates a process of forming a high-k dielectric layer and a conductive (metal) layer stack in a memory device. HKMG technology can reduce gate leakage, increase transistor capacitance, and provide low power consumption for devices. Two process flows to pattern the HKMG stack are gate-first and gate-last.

The term "epitaxy" or "epitaxial" or "epitaxially" as used herein indicates crystalline growth of material, for example, via high temperature deposition.

The term "selective epitaxial growth" or "SEG" as used herein indicates local growth of an epitaxial layer through a pattern mask on a substrate or a layer. SEG provides epitaxial growth only on the exposed substrate or layer and other regions are masked by a dielectric film or other material that is not reactive to epitaxy.

The term "dielectric stack" as used herein indicates a stack of different alternating dielectric layers in succession. For example, the first dielectric layer can be an oxide (e.g., silicon oxide) and the second dielectric layer can be a nitride (e.g., silicon nitride). The dielectric stack can be arranged in a staircase pattern.

The term "gate line trench" as used herein indicates a trench or hole extending through an dielectric stack of a memory device. The gate line trench can be used to form a gate line slit in the memory device.

The term "gate line slit" or "GLS" as used herein indicates a conductive pathway through an dielectric stack, for example, between adjacent memory blocks or adjacent memory cells. The GLS can provide connection to an HKMG stack in a memory device. The GLS can extend vertically through the dielectric stack and extend horizontally between two adjacent arrays of memory blocks or memory cells.

Aspects of the disclosure may be implemented in hardware, firmware, software, or any combination thereof. Aspects of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; dynamic flash memory (DFM) devices, electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

A dynamic random access memory (DRAM) is a type of random access semiconductor memory that can store each bit of data in a memory cell. Certain types of memory cells include a capacitor and an array transistor, also referred to as a 1T1C memory structure. The capacitor can be set to either a charged or discharged state, representing the bit value of zero and one, respectively. As DRAM technology progresses towards higher device densities and higher storage capacities, current 1T1C DRAM is approaching a process limit. The manufacturing of 1T1C DRAM devices with small-node capacitors to retain charge is becoming more difficult due to increased current leakage, increased power consumption, degraded operating voltage margins, and decreased retention times. There is a need for a capacitor-less or capacitor-free DRAM to replace the traditional 1T1C structure to continuous scaling down of DRAM. Capacitor-free one transistor memory structures, also referred to as 1T memory structures, such as Z-RAM, DFM, etc., have been developed to improve device density and storage capacities. However, capacitor-less one transistor memory structures face challenges and need further improvement and optimization for manufacturable integration and operation solutions.

In another aspect, with the development of 3D NAND Flash memory devices, the more stacked layers (e.g., more word lines and the resulting more NAND memory cells) require more peripheral circuits (and the components, e.g., transistors, forming the peripheral circuits) for operating the 3D memory devices. For example, the number and/or size of page buffers needs to increase to match the increased number of NAND memory cells. In another example, the number of string drivers in the word line driver is proportional to the number of word lines in the 3D NAND Flash memory. Thus, the continuous increase of the word lines also increases the area occupied by the word line driver, as well as the complexity of metal routings, sometimes even the number of metal layers. Moreover, in some 3D NAND Flash memory devices in which the NAND memory cell array and peripheral circuits are fabricated on different substrates and bonded together, the continuous increase of peripheral circuits' areas makes it the bottleneck for reducing the total chip size since the NAND memory cell array can be scaled up vertically by increasing the number of levels instead of increasing the planar size.

Thus, it is desirable to reduce the planar areas occupied by the peripheral circuits of the 3D memory devices with the increased numbers of peripheral circuits and the transistors thereof. However, scaling down the transistor size of the peripheral circuits following the advanced complementary metal-oxide-semiconductor (CMOS) technology node trend used for the logic devices would cause a significant cost increase and higher leakage current, which are undesirable for memory devices. Moreover, because the 3D memory devices require a relatively high voltage (e.g., above 5 V) in certain memory operations, such as program and erase, unlike logic devices, which can reduce its working voltage as the CMOS technology node advances, the voltage provided to the memory peripheral circuits cannot be reduced. As a result, scaling down the memory peripheral circuit sizes by following the trend for advancing the CMOS technology nodes, like the normal logic devices, becomes infeasible.

To address one or more of the aforementioned issues, various implementations in accordance with the present disclosure provide structures and fabricating methods for an integrated 3D memory device including both 3D DFM memory cell array and 3D NAND memory cell array. The 3D DFM memory cell array can have capacitor-free multi-gate vertical 1T memory structures that improve data retention, reduces leakage current, and improves operation speeds. The capacitor-free multi-gate vertical 1T memory structures can include a vertical semiconductor body surrounded by multiple gates. In some implementations, the semiconductor body can be surrounded by a word line gate, a plate line gate, and a bottom selection gate. In some implementations, the semiconductor body can be surrounded by a word line gate, and multiple plate line gates. Bit lines can be formed above the semiconductor body. A DFM memory cell is formed at the intersection between a word line and a bit line. The capacitor-free multi-gate vertical 1T memory structures of the present disclosure can provide various benefits, including but not limited to, improved transistor carrier density, and improved program/erase speeds, among other things.

Further, the present disclosure also introduces various solutions in which the peripheral circuits, the 3D DFM memory cell array, and the 3D NAND memory cell array of the integrated 3D memory device are disposed in different planes (levels, tiers) in the vertical direction, i.e., stacked over one another, to reduce the planar chip size of the peripheral circuits, as well as the total chip size of the memory device. In some implementations, the DFM memory cell array, the NAND memory cell array, and the memory peripheral circuits provided with a relatively high voltage (e.g., above 5 V), and the memory peripheral circuits provided with a relatively low voltage (e.g., below 1.3 V) are disposed in different planes in the vertical direction, i.e., stacked over one another, to further reduce the chip size. The integrated 3D memory device architectures and fabrication processes disclosed in the present disclosure can be easily scaled up vertically to stack more peripheral circuits in different planes to further reduce the chip size.

The peripheral circuits can be separated into different planes in the vertical direction based on different performance requirements, for example, the voltages applied to the transistors thereof, which affect the dimensions of the transistors (e.g., gate dielectric thickness), dimensions of the substrates in which the transistors are formed (e.g., substrate thickness), and thermal budgets (e.g., the interconnect material). Thus, peripheral circuits with different dimension requirements (e.g., gate dielectric thickness and substrate thickness) and thermal budgets can be fabricated in different processes to reduce the design and process constraints from each other, thereby improving the device performance and fabrication complexity.

According to some aspects of the present disclosure, the DFM memory cell array, the NAND memory cell array, and various peripheral circuits with different performance and dimension requirements can be fabricated in parallel on different substrates and then stacked over one another using various joining technologies, such as hybrid bonding, transfer bonding, etc. As a result, the fabrication cycle of the integrated 3D memory device can be further reduced. Moreover, since the thermal budgets of the different devices become independent of each other, interconnect materials with desirable electric performance but low thermal budget, such as copper, can be used in interconnecting the memory cells and transistors of the peripheral circuits, thereby further improving the device performance. Bonding technologies can introduce additional benefits as well. In some implementations, hybrid bonding in a face-to-face manner achieves millions of parallel short interconnects between the bonded semiconductor structures to increase the throughput and input/output (I/O) speed of the integrated 3D memory devices. In some implementations, transfer bonding re-uses a single wafer to transfer thin semiconductor layers thereof onto different memory devices for forming transistors thereon, which can reduce the cost of the integrated 3D memory devices.

The integrated 3D memory device architectures and fabrication processes disclosed in the present disclosure have the flexibility to allow various substrate materials suitable for different memory cell array designs, such as DFM memory strings and/or NAND memory strings suitable for gate-induced drain leakage (GIDL) erase operations or P-type bulk erase operations. In some implementations, single crystalline silicon (a.k.a. single-crystal silicon or monocrystalline silicon) with superior carrier electronic properties—the lack of grain boundaries allows better charge carrier flow and prevents electron recombination—is used as the substrate material of the DFM memory string array and/or NAND memory string array to achieve faster memory operations. In some implementations, polysilicon (a.k.a. polycrystalline silicon) is used as the substrate material of the DFM memory string array and/or NAND memory string array for GIDL erase operations.

The integrated 3D memory device architectures and fabrication processes disclosed in the present disclosure also have the flexibility to allow various device pad-out schemes to meet different needs and different designs of the memory cell array. In some implementations, the pad-out interconnect layer is formed from the side of the semiconductor structure that has the peripheral circuits to shorten the interconnect distance between the pad-out interconnect layer and the transistors of the peripheral circuits to reduce the parasitic capacitance from the interconnects and improve the electric performance. In some implementations, the pad-out interconnect layer is formed on a thinned substrate in which the DFM memory cell array and/or the NAND memory cell array are/is formed to enable inter-layer vias (LLVs, e.g., submicron-level) for pad-out interconnects with high I/O throughput and low fabrication complicity.

FIG. 1A illustrates a schematic view of a cross-section of a 3D memory device 100A, according to some aspects of the present disclosure. 3D memory device 100A represents an example of a bonded chip. In some implementations, at least some of the components of 3D memory device 100A (e.g., memory cell arrays and peripheral circuits) are formed separately on different substrates in parallel and then jointed to form a bonded chip (a process referred to herein as a "parallel process"). In some implementations, at least one semiconductor layer is attached onto another semiconductor structure using transferring bonding, then some of the components of 3D memory device 100A (e.g., memory cell arrays and peripheral circuits) are formed on the attached semiconductor layer (a process referred to herein as a "series process"). It is understood that in some examples, the components of 3D memory device 100A (e.g., memory cell arrays and peripheral circuits) may be formed by a hybrid process that combines the parallel process and the series process.

It is noted that z- and x/y-axes are added in FIG. 1A to further illustrate the spatial relationships of the components of a semiconductor device. A substrate of a semiconductor device, e.g., 3D memory device 100A, includes two lateral surfaces (e.g., a top surface and a bottom surface) extending laterally in the x/y-direction (the lateral direction). As used herein, x-direction represents a word line direction (WL direction), and y-direction represents a bit line direction (BL direction). As used herein, whether one component (e.g., a layer or a device) is "on," "above," or "below" another component (e.g., a layer or a device) of a semiconductor device is determined relative to the substrate of the semiconductor device in the z-direction (the vertical direction or thickness direction) when the substrate is positioned in the lowest plane of the semiconductor device in the z-direction. The same notion for describing the spatial relationships is applied throughout the present disclosure.

3D memory device 100A can include a first semiconductor structure 102 including a first array of memory cells (also referred to herein as a "first memory cell array"), and a second semiconductor structure 104 including a first array of memory cells (also referred to herein as a "first memory cell array"). In some implementations, the first memory cell array can include an array of NAND Flash memory cells, and the second memory cell array can include an array of DFM memory cells. In some other implementations, the first memory cell array can include an array of DFM memory cells, and the second memory cell array can include an array of NAND Flash memory cells.

In some implementations, the array of NAND memory cells is an array of 3D NAND memory strings, each of which extends vertically above a substrate in a 3D manner through a stack structure, e.g., a NAND memory stack. Depending on the 3D NAND technology (e.g., the number of layers/tiers in the memory stack), a 3D NAND memory string typically includes a certain number of NAND memory cells, each of which includes a floating-gate transistor or a charge-trap transistor.

In some implementations, the array of DFM memory cells is an array of 3D DFM memory strings, each of which extends vertically above the substrate in a 3D manner through a stack structure, e.g., a DFM memory stack. Depending on the 3D DFM technology (e.g., the number of layers/tiers in the memory stack), a 3D DFM memory string typically includes a certain number of DFM memory cells, each of which includes a surrounding gate transistor.

As shown in FIG. 1A, 3D memory device 100A can further include a third semiconductor structure 106 and a fourth semiconductor structure 108 each including some of the peripheral circuits of the first memory cell array in first semiconductor structure 102 and the second memory cell array in second semiconductor structure 104. That is, the peripheral circuits of the NAND memory cell array and the DFM memory cell array can be separated into at least two other semiconductor structures (e.g., 106 and 108 in FIG. 1A). The peripheral circuits (a.k.a. control and sensing circuits) can include any suitable digital, analog, and/or mixed-signal circuits used for facilitating the operations of the memory cell array. For example, the peripheral circuits can include one or more of a page buffer, a decoder (e.g., a row decoder and a column decoder), a sense amplifier, a driver (e.g., a word line driver), an I/O circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in second and third semiconductor structures 106 and 108 can use CMOS technology, e.g., which can be implemented with logic processes in any suitable technology nodes.

As shown in FIG. 1A, first, second, third, and fourth semiconductor structures 102, 104, 106, and 108 are stacked over one another in different planes, according to some implementations. As a result, the first memory cell array in first semiconductor structure 102, the second memory cell array in second semiconductor structure 104, the first peripheral circuit in third semiconductor structure 106, and the second peripheral circuit in fourth semiconductor structure 108 can be stacked over one another in different planes to reduce the planar size of 3D memory device 100A, compared with memory devices in which all the peripheral circuits are disposed in the same plane.

As shown in FIG. 1A, 3D memory device 100A further includes a first bonding interface 103 vertically between first semiconductor structure 102 and second semiconductor structure 104, a second bonding interface 105 vertically between second semiconductor structure 104 and third semiconductor structure 106, and a third bonding interface 107 vertically between third semiconductor structure 106 and fourth semiconductor structure 108. Each of the first, second, and third bonding interfaces 103, 105, and 107 can be an interface between two semiconductor structures formed by any suitable bonding technologies as described below in detail, such as hybrid bonding, anodic bonding, fusion bonding, transfer bonding, adhesive bonding, eutectic bonding, to name a few. In some implementations as shown in FIG. 1A, second semiconductor structure 104 is bonded to other two semiconductor structures 102 and 106 on opposite sides thereof, and third semiconductor structure 106 is bonded to other two semiconductor structures 104 and 108 on opposite sides thereof. That is, second semiconductor structure 104 can be vertically between first and third semiconductor structures 102 and 106, and third semiconductor structure 106 can be vertically between second and fourth semiconductor structures 104 and 108.

In some implementations, each of third and fourth semiconductor structures 106 and 108 does not include any memory cell. In other words, each of third and fourth semiconductor structures 106 and 108 only includes peripheral circuits, but not the memory cell arrays, according to some implementations. As a result, the memory cell arrays can be only included in first and second semiconductor structures 102 and 104, but not in third or fourth semiconductor structure 106 or 108. Further, the number of semiconductor structures including peripheral circuits can be different from the number of semiconductor structures including memory cell arrays.

Figure 1B:
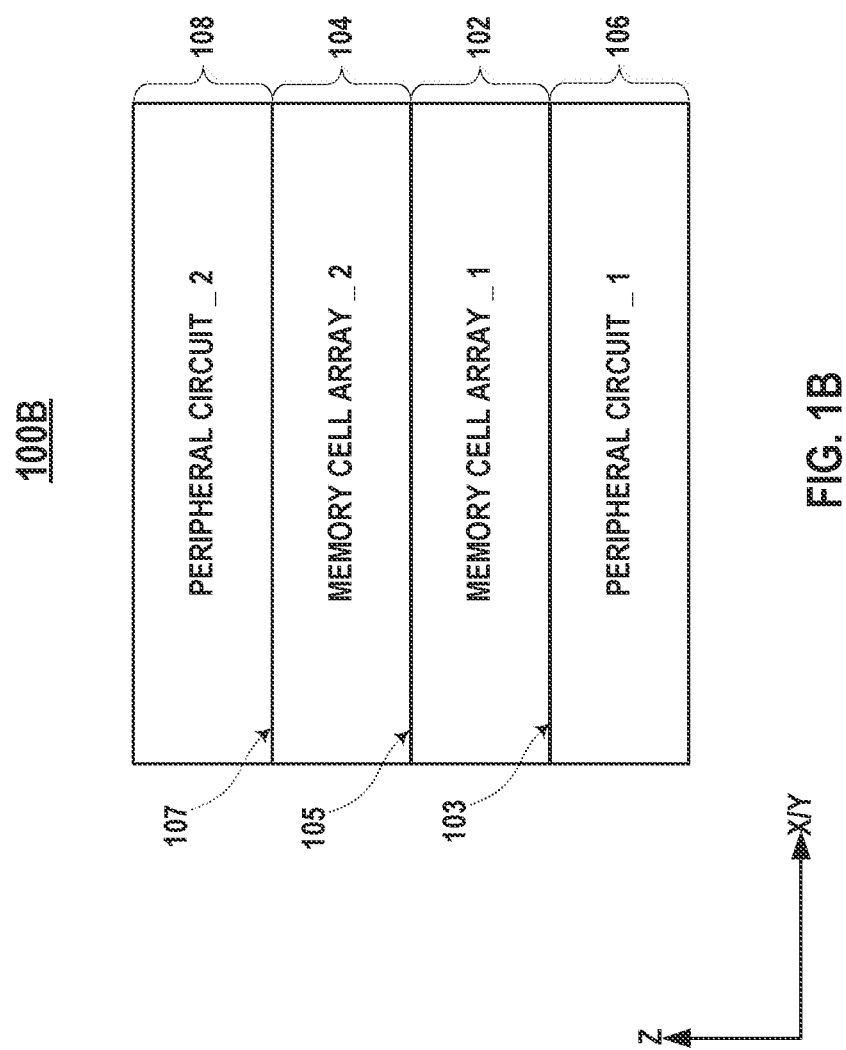

It is understood that the relative positions of stacked first, second, third, and four semiconductor structures 102, 104, 106, and 108 are not limited and may vary in different examples. As one example, FIG. 1B illustrates a schematic view of a cross-section of another exemplary 3D memory device 100B, according to some other implementations. In 3D memory device 100B in FIG. 1B, first and second semiconductor structures 102 and 104 each including a memory cell array can be sandwiched between third and fourth semiconductor structures 106 and 108 each including a peripheral circuit. In such implementations in 3D memory device 100B, first bonding interface 103 can be formed vertically between first and third semiconductor structures 102 and 106, second bonding interface 105 can be formed vertically between first and second semiconductor structures 102 and 104, third bonding interface 107 can be formed vertically between second and fourth semiconductor structures 104 and 108. Similarly, each of first, second, and third bonding interfaces 103, 105, and 107, can be an interface between two semiconductor structures formed by any suitable bonding technologies as described below in detail, such as hybrid bonding, anodic bonding, fusion bonding, transfer bonding, adhesive bonding, eutectic bonding, to name a few. In some implementations as shown in FIG. 1B, each of first and second semiconductor structures 102 and 104 is bonded to other two semiconductor structures on opposite sides thereof.

Figure 1C:
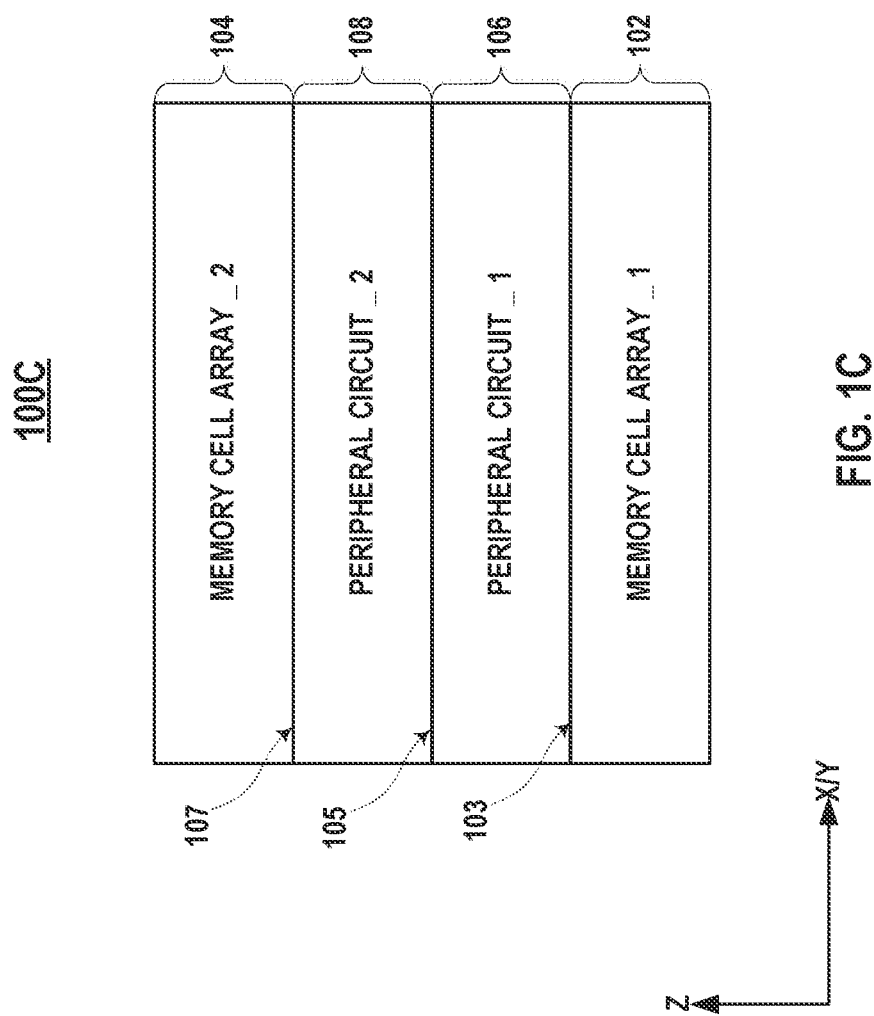

As another example, FIG. 1C illustrates a schematic view of a cross-section of yet another exemplary 3D memory device 100C, according to some other implementations. In 3D memory device 100C in FIG. 1C, third and fourth semiconductor structures 106 and 108 each including a peripheral circuit can be sandwiched between first and second semiconductor structures 102 and 104 each including a memory cell array. In such implementations in 3D memory device 100C, first bonding interface 103 can be formed vertically between first and third semiconductor structures 102 and 106, second bonding interface 105 can be formed vertically between third and fourth semiconductor structures 106 and 108, third bonding interface 107 can be formed vertically between fourth and second semiconductor structures 108 and 104. Similarly, each of first, second, and third bonding interfaces 103, 105, and 107, can be an interface between two semiconductor structures formed by any suitable bonding technologies as described below in detail, such as hybrid bonding, anodic bonding, fusion bonding, transfer bonding, adhesive bonding, eutectic bonding, to name a few. In some implementations as shown in FIG. 1C, each of third and fourth semiconductor structures 106 and 108 is bonded to other two semiconductor structures on opposite sides thereof.

As described below in detail, some or all of first, second, third, and fourth semiconductor structures 102, 104, 106, and 108 can be fabricated separately (and in parallel in some implementations) by the parallel process, such that the thermal budget of fabricating one of first, second, third, and fourth semiconductor structures 102, 104, 106, and 108 does not limit the processes of fabricating another one of first, second, third, and fourth semiconductor structures 102, 104, 106, and 108. Moreover, a large number of interconnects (e.g., bonding contacts and/or inter-layer vias (ILVs)/through substrate vias (TSVs)) can be formed across bonding interfaces 103, 105, and 107 to make direct, short-distance (e.g., micron- or submicron-level) electrical connections between adjacent semiconductor structures 102, 104, 106, and 108, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer among the different memory cell arrays and the different peripheral circuits in different semiconductor structures 102, 104, 106, and 108 can be performed through the interconnects (e.g., bonding contacts and/or ILVs/TSVs) across bonding interfaces 103, 105, and 107. By vertically integrating first, second, third, and fourth semiconductor structures 102, 104, 106, and 108, the chip size can be reduced, and the memory cell density can be increased.

Figure 1D:
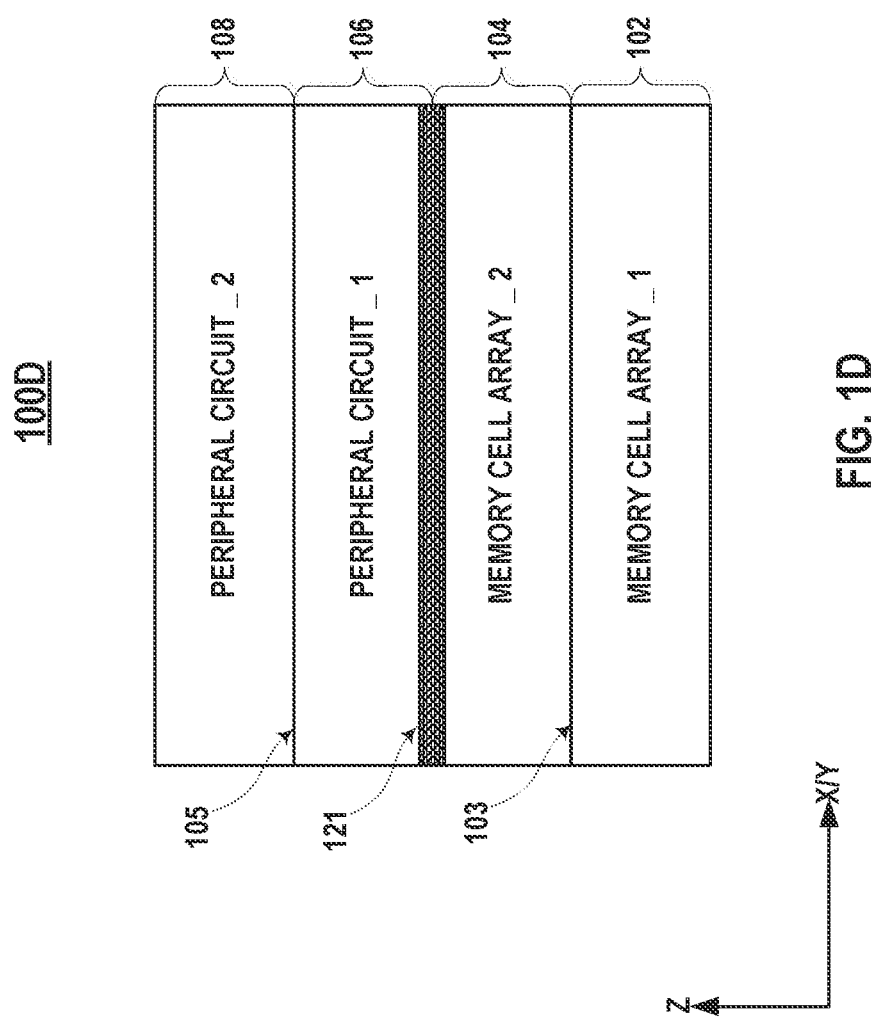

It is also understood that the number of bonding interfaces in a 3D memory device is not limited and may vary in different examples. FIG. 1D illustrates a schematic view of a cross-section of another exemplary 3D memory device 100D, according to some implementations. In 3D memory device 100D, the two memory cell arrays and the two portions of the peripheral circuits can be stacked over one another in different planes in 3D memory device 100D. Similar to 3D memory device 100A, in 3D memory device 100D, first and second semiconductor structures 102 and 104 including the two memory cell arrays can be located on one side of 3D memory device 100D in the vertical direction, and third and fourth semiconductor structures 106 and 108 including the two portions of the peripheral circuits can be located on another side of 3D memory device 100D in the vertical direction. However, second and third semiconductor structures 104 and 106 are not separated by a bonding interface formed by a bonding process, but are formed on opposite sides of a substrate 121. In some implementations, substrate 121 can include one or more semiconductor layer, such as one or more thinned silicon layer. First bonding interface 103 is vertically between first and second semiconductor structures 102 and 104, and second bonding interface 105 is vertically between third and fourth semiconductor structures 106 and 108. Depending on the thickness of substrate 121, interconnects (e.g., ILVs in the submicron-level or TSVs in the micron- or tens micron-level) can be formed through substrate 121 to make electrical connections between the different portions 3D memory device 100D on opposite sides of substrate 121.

Figure 1E:
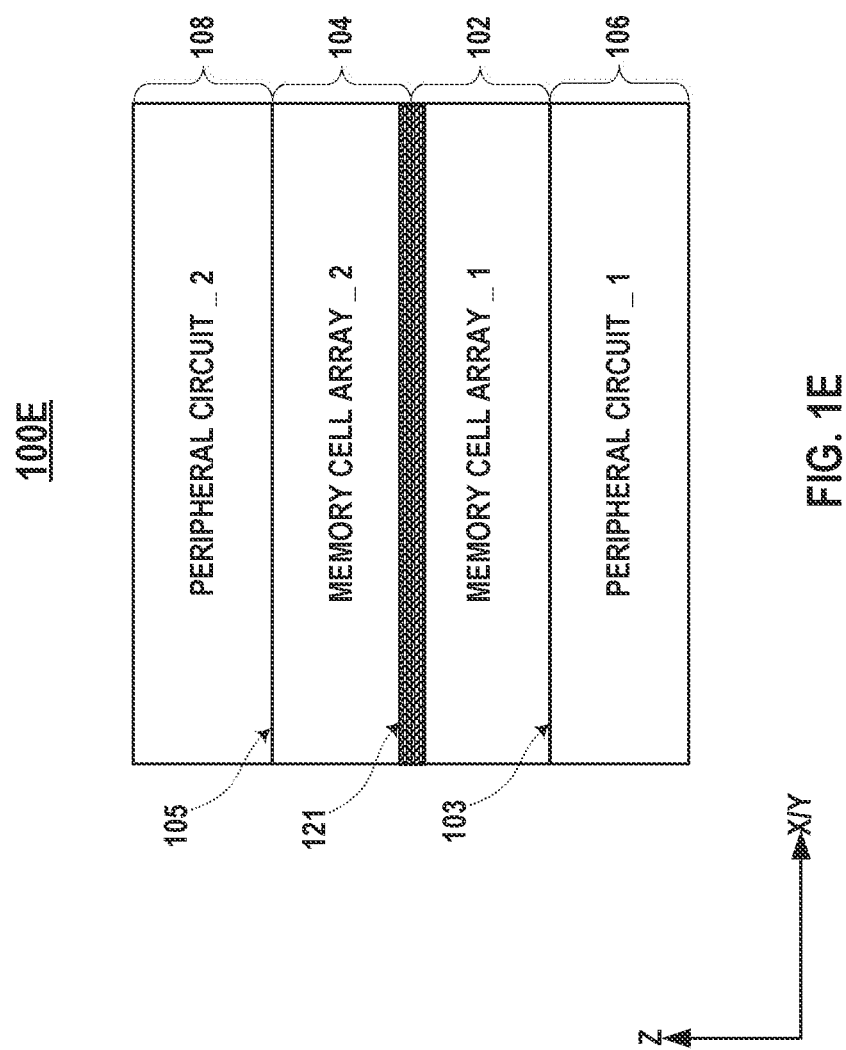

It is further understood that the types of devices disposed on opposite sides of substrate 121 are not limited and may vary in different examples. FIG. 1E illustrates a schematic view of a cross-section of still another exemplary 3D memory device 100E, according to some implementations. In 3D memory device 100E, the two memory cell arrays and the two portions of the peripheral circuits can be stacked over one another in different planes in 3D memory device 100E. Similar to 3D memory device 100B, in 3D memory device 100E, first and second semiconductor structures 102 and 104 can be sandwiched between third and fourth semiconductor structures 106 and 108. However, first and second semiconductor structures 102 and 104 (i.e., first and second memory cell arrays) are not separated by a bonding interface as a result of a bonding process, but formed on opposite sides of a substrate 121. In some implementations, substrate 121 can include one or more semiconductor layer, such as one or more thinned silicon layer. First bonding interface 103 is vertically between first and third semiconductor structures 102 and 106, and second bonding interface 105 is vertically between second and fourth semiconductor structures 102 and 106. Depending on the thickness of substrate 121, interconnects (e.g., ILVs in the submicron-level or TSVs in the micron- or tens micron-level) can be formed through substrate 121 to make electrical connections between the different portions 3D memory device 100E on opposite sides of substrate 121.

Figure 1F:
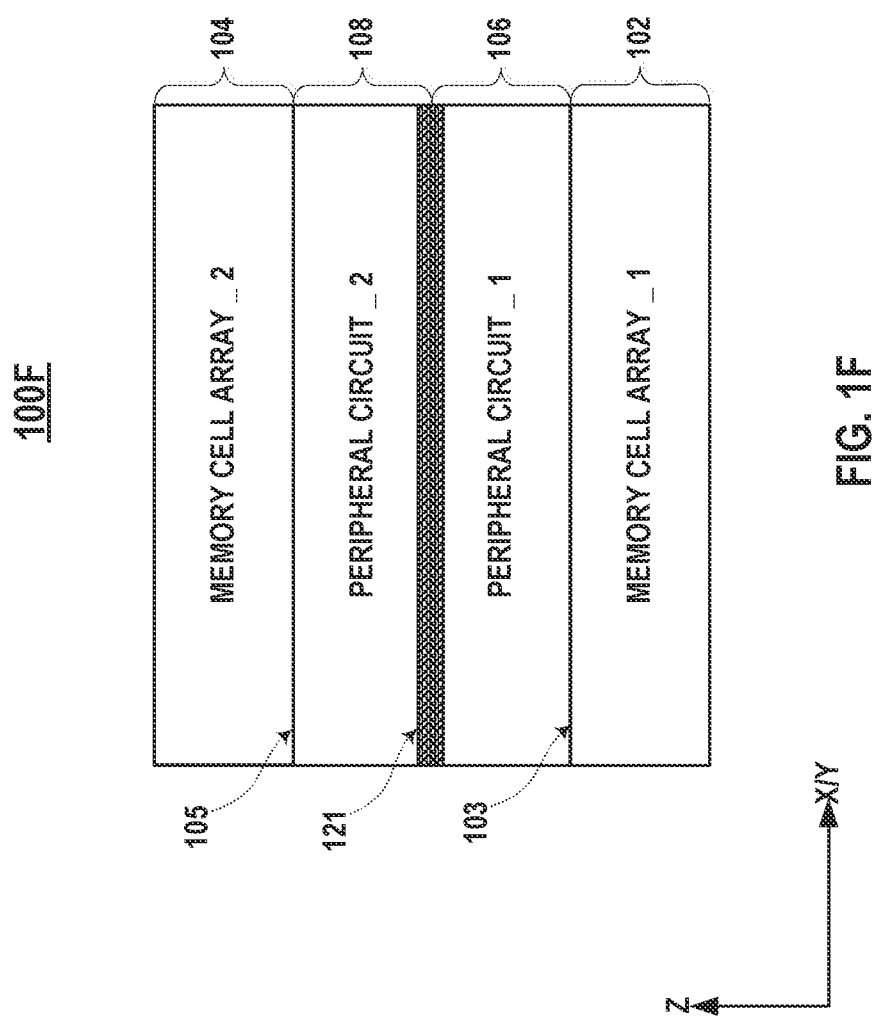

FIG. 1F illustrates a schematic view of a cross-section of still another exemplary 3D memory device 100F, according to some implementations. Similar to 3D memory device 100C, in 3D memory device 100F, third and fourth semiconductor structures 106 and 108 can be sandwiched between first and second semiconductor structures 102 and 104. However, the third and fourth semiconductor structures 106 and 108 (i.e., first and second peripheral circuits) are not separated by a bonding interface as a result of a bonding process, but formed on opposite sides of substrate 121. In some implementations, substrate 121 can include one or more semiconductor layer, such as one or more thinned silicon layer. First bonding interface 103 is vertically between first and third semiconductor structures 102 and 106, and second bonding interface 105 is vertically between second and fourth semiconductor structures 102 and 106. Depending on the thickness of substrate 121, interconnects (e.g., ILVs in the submicron-level or TSVs in the micron- or tens micron-level) can be formed through substrate 121 to make direct, short-distance (e.g., submicron-to tens micron-levels) electrical connections between the different portions of the peripheral circuits on opposite sides of substrate 121.

Figure 1G:
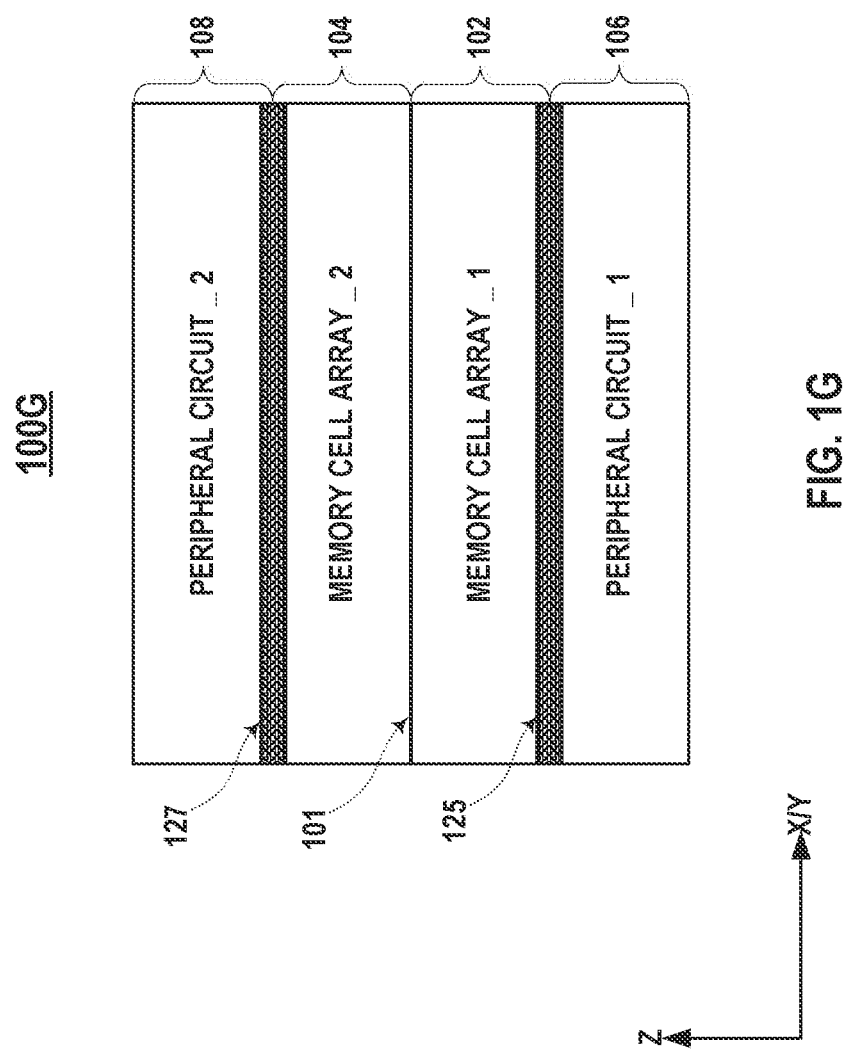

In some other implementations, memory components can be formed on opposite sides of one than one substrate. FIGS. 1G and 1H illustrate schematic diagrams of a cross-section view of two other exemplary 3D memory devices 100G and 100H, according to some implementations. In 3D memory device 100G, first and second semiconductor structures 102 and 104 are sandwiched between third and fourth semiconductor structures 106 and 108. First and third semiconductor structures 102 and 106 (i.e., first memory cell array and first peripheral circuit) are formed on opposite sides of first substrate 125, while second and fourth semiconductor structures 104 and 108 (i.e., second memory cell array and second peripheral circuit) are formed on opposite sides of second substrate 127. A single bonding interface 101 is vertically between first and second semiconductor structures 102 and 104 (i.e., first and second memory cell arrays). In 3D memory device 100H, third and fourth semiconductor structures 106 and 108 are sandwiched between first and second semiconductor structures 102 and 104. First and third semiconductor structures 102 and 106 (i.e., first memory cell array and first peripheral circuit) are formed on opposite sides of first substrate 125, while second and fourth semiconductor structures 104 and 108 (i.e., second memory cell array and second peripheral circuit) are formed on opposite sides of second substrate 127. A single bonding interface 101 is vertically between third and fourth semiconductor structures 106 and 108 (i.e., first and second peripheral circuits). Similarly, depending on the thickness of first and/or second substrate 125 and 127, interconnects (e.g., ILVs in the submicron-level or TSVs in the micron- or tens micron-level) can be formed through first and/or second substrate 125 and 127 to electrical connections between some of the peripheral circuits and corresponding memory cell array on opposite sides of first and/or second substrate 125 and 127.

It is understood that the numbers of stacked semiconductor structures in 3D memory devices 100A-100H are not limited by the examples shown in FIGS. 1A-1H, and additional semiconductor structure(s) may be further stacked above, below, or between semiconductor structures shown in FIGS. 1A-1H in the vertical direction. It is also understood that the number of bonding interfaces in a 3D memory device is not limited and may vary in different examples.

Figure 2:
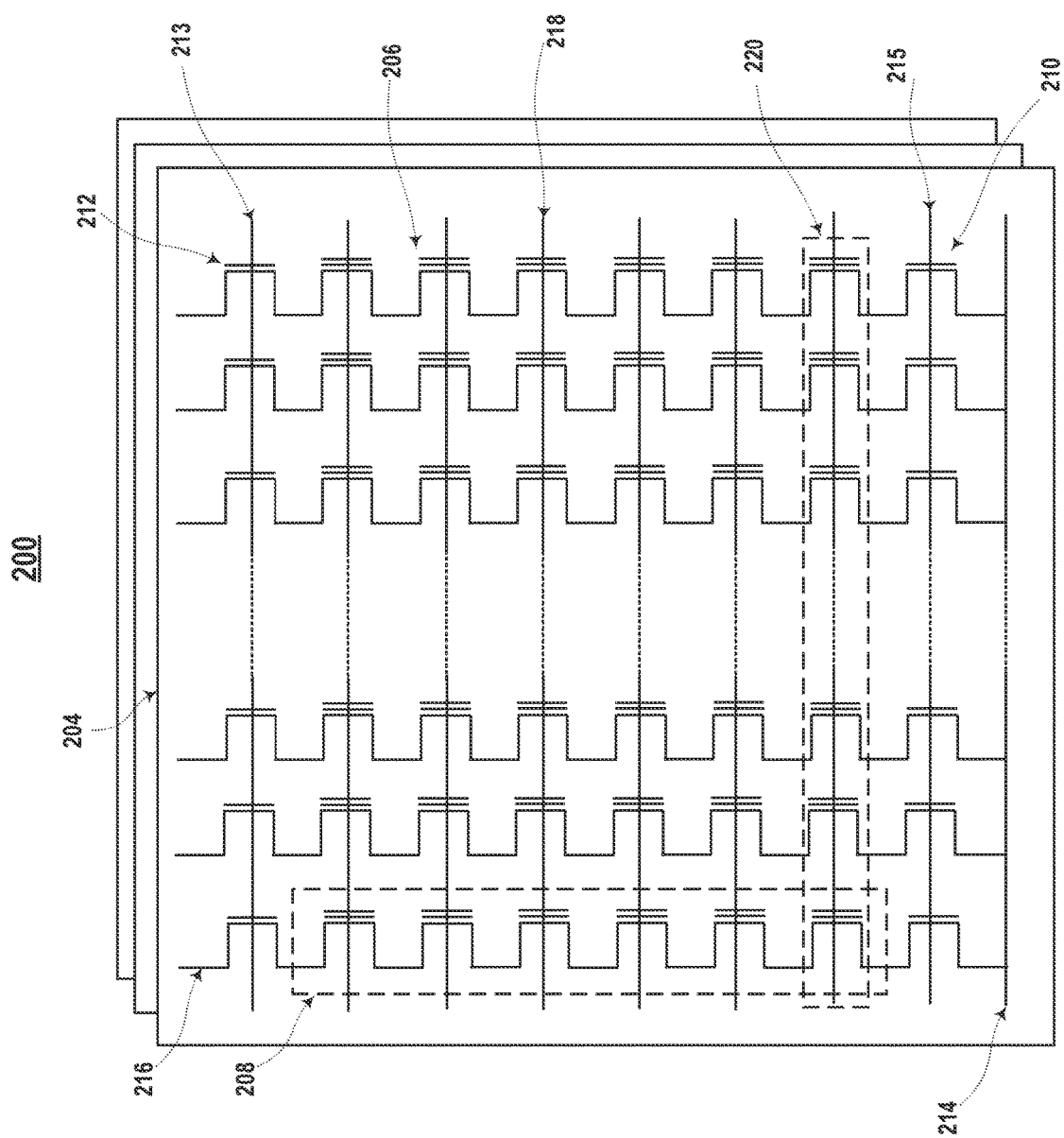
FIG. 2 illustrates a schematic circuit diagram of a NAND memory device, according to some aspects of the present disclosure.

FIG. 2 illustrates a schematic circuit diagram of a 3D NAND Flash memory cell array 200, according to some aspects of the present disclosure. In some implementations, 3D NAND Flash memory cell array 200 can include a plurality of NAND memory cells 206 provided in a form of an array of NAND memory strings 208 each extending vertically above a substrate (not shown). In some implementations, each NAND memory string 208 includes a plurality of memory cells 206 coupled in series and stacked vertically. Each NAND memory cell 206 can hold a continuous, analog value, such as an electrical voltage or charge, that depends on the number of electrons trapped within a region of NAND memory cell 206. Each NAND memory cell 206 can be either a floating gate type of memory cell including a floating-gate transistor or a charge trap type of memory cell including a charge-trap transistor.

In some implementations, each NAND memory cell 206 is a single-level cell (SLC) that has two possible memory states and thus, can store one bit of data. For example, the first memory state "0" can correspond to a first range of voltages, and the second memory state "1" can correspond to a second range of voltages. In some implementations, each NAND memory cell 206 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 2, each NAND memory string 208 can include a source select gate (SSG) transistor 210 at its source end and a drain select gate (DSG) transistor 212 at its drain end. SSG transistor 210 and DSG transistor 212 can be configured to activate selected NAND memory strings 208 (columns of the array) during read and program operations. In some implementations, SSG transistors 210 of NAND memory strings 208 in the same block 204 are coupled through a same source line (SL) 214, e.g., a common SL, for example, to the ground. DSG transistor 212 of each NAND memory string 208 is coupled to a respective bit line 216 from which data can be read or programmed via an output bus (not shown), according to some implementations. In some implementations, each NAND memory string 208 is configured to be selected or deselected by applying a select voltage (e.g., above the threshold voltage of DSG transistor 212) or a deselect voltage (e.g., 0 V) to respective DSG transistor 212 through one or more DSG lines 213 and/or by applying a select voltage (e.g., above the threshold voltage of SSG transistor 210) or a deselect voltage (e.g., 0 V) to respective SSG transistor 210 through one or more SSG lines 215.

As shown in FIG. 2, NAND memory strings 208 can be organized into multiple blocks 204, each of which can have a common source line 214. In some implementations, each block 204 is the basic data unit for erase operations, i.e., all NAND memory cells 206 on the same block 204 are erased at the same time. NAND memory cells 206 of adjacent NAND memory strings 208 can be coupled through word lines 218 that select which row of NAND memory cells 206 is affected by read and program operations. In some implementations, each word line 218 is coupled to a page 220 of NAND memory cells 206, which is the basic data unit for program and read operations. The size of one page 220 in bits can correspond to the number of NAND memory strings 208 coupled by word line 218 in one block 204. Each word line 218 can include a plurality of control gates (gate electrodes) at each NAND memory cell 206 in respective page 220 and a gate line coupling the control gates.

Figure 3A:
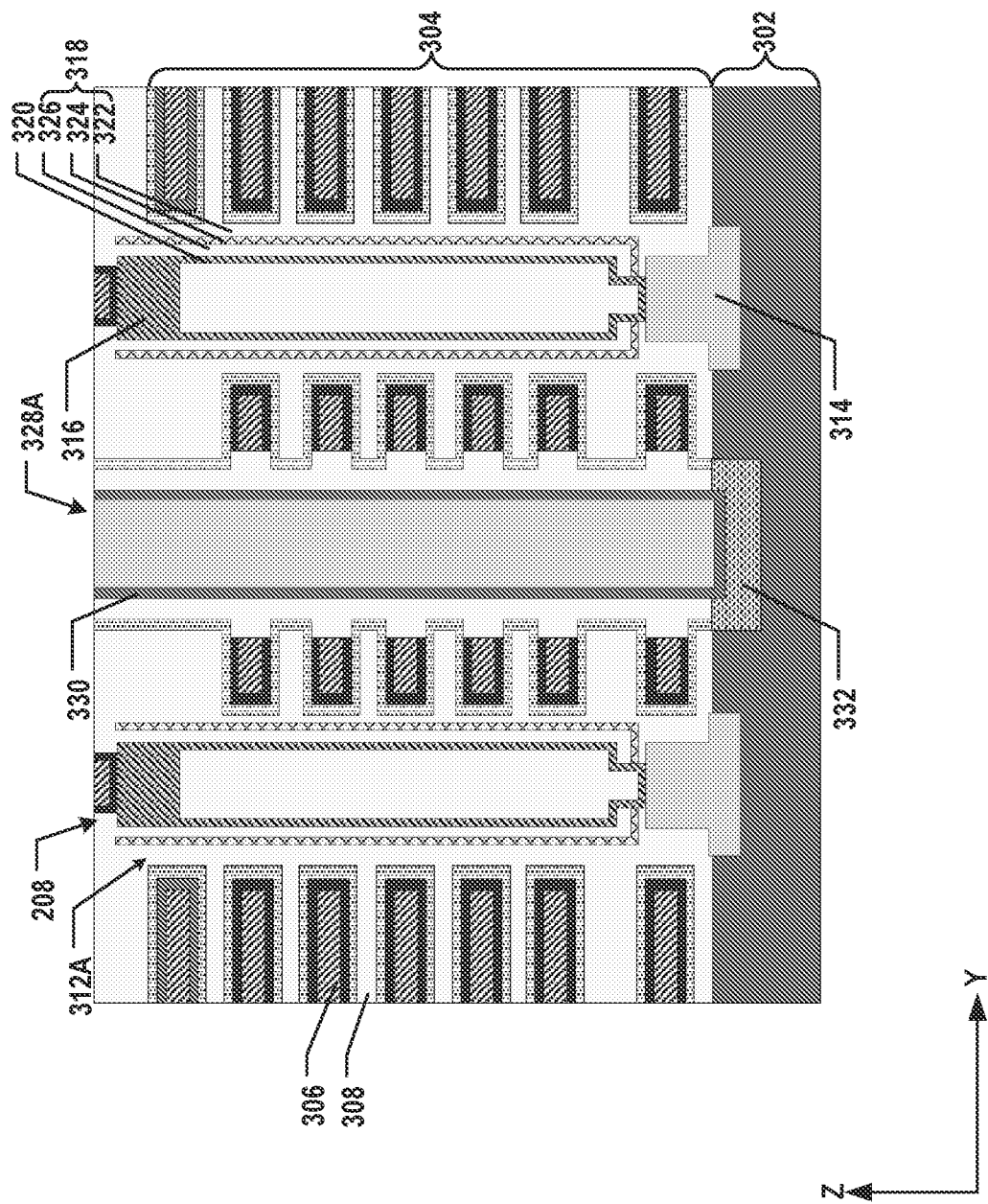
FIGS. 3A-3C illustrate side views of various NAND memory strings in 3D memory devices, according to various aspects of the present disclosure.
Figure 3B:
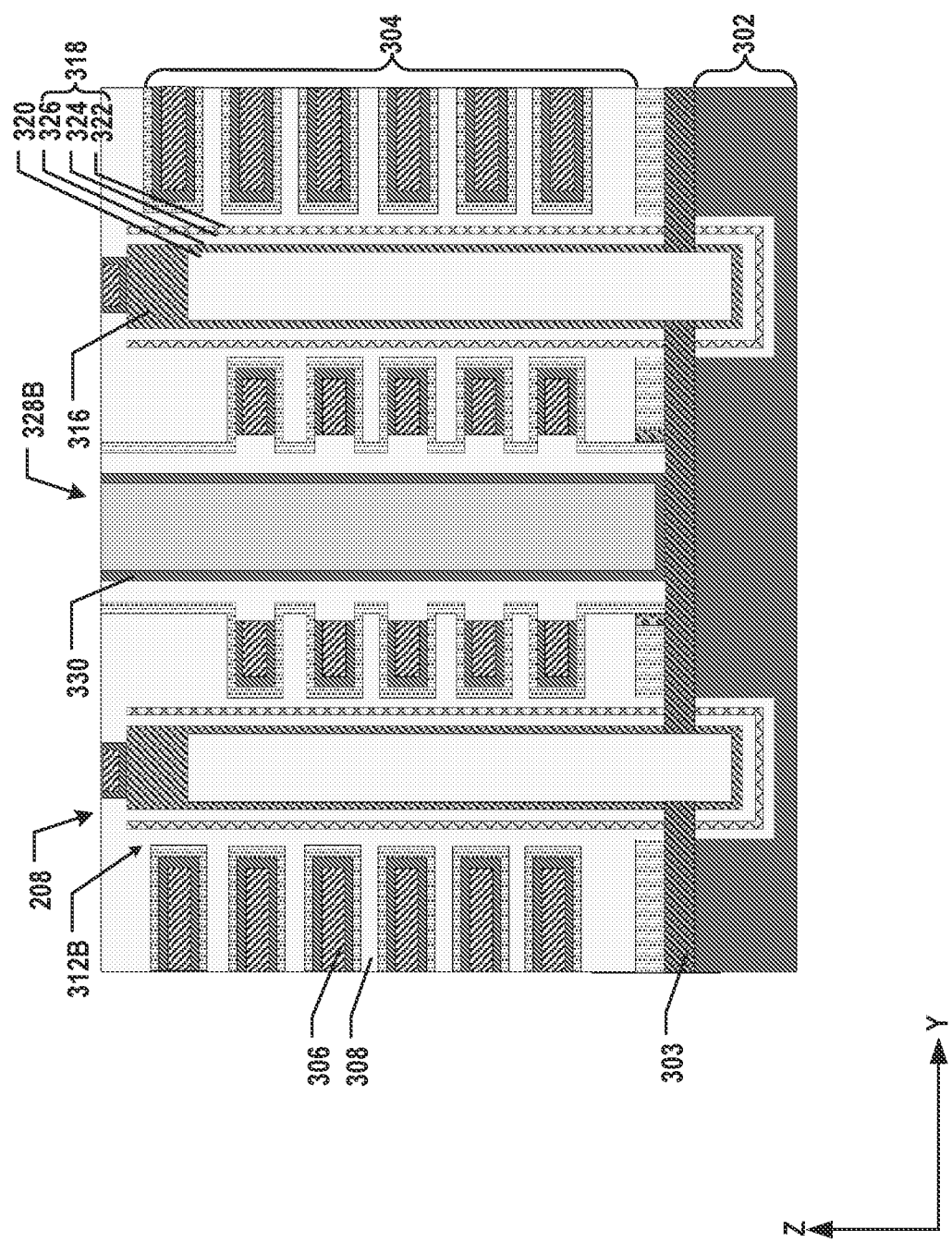
Figure 3C:
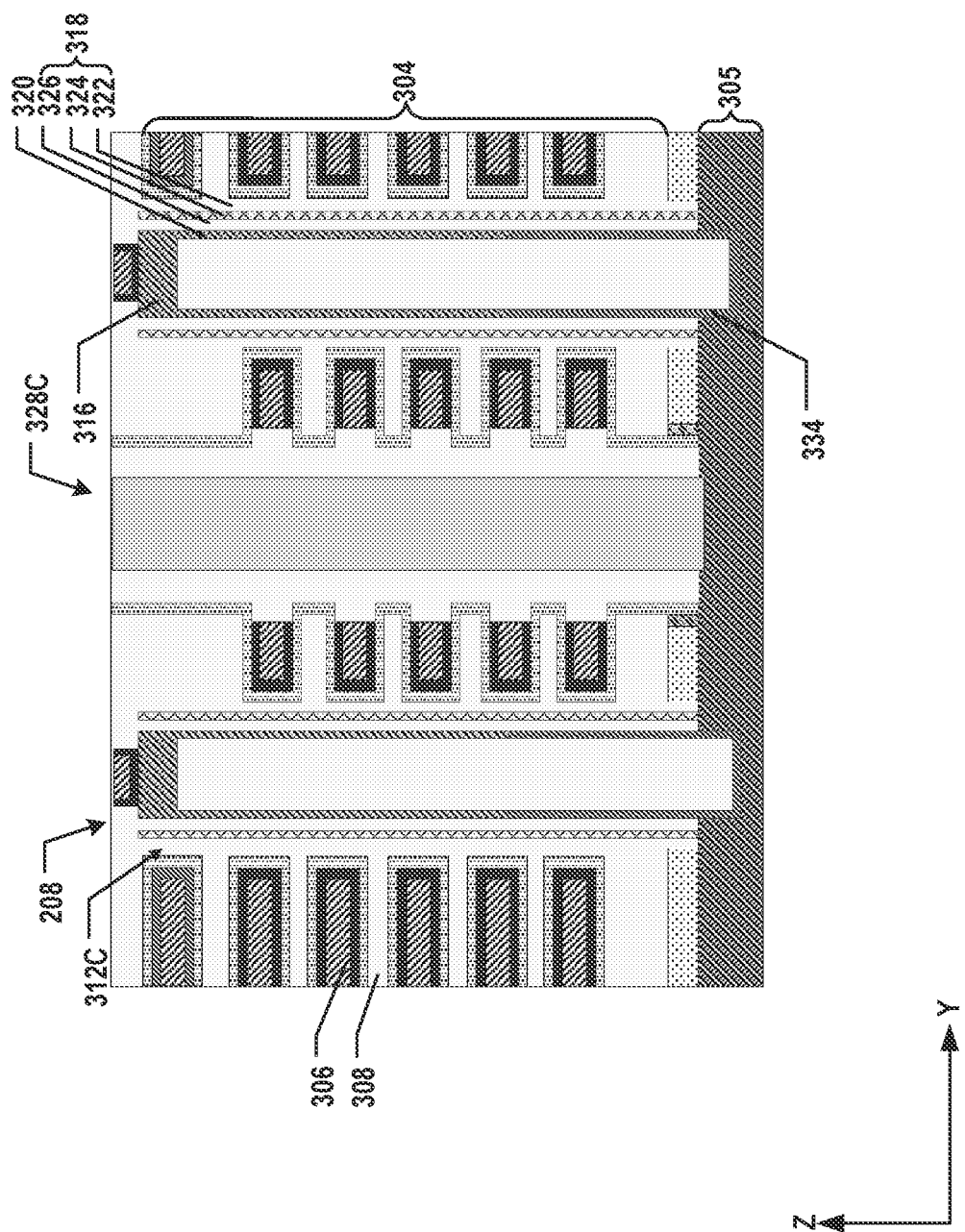

FIGS. 3A-3C illustrate side views of various NAND memory strings 208 in 3D memory devices, according to various aspects of the present disclosure. As shown in FIG. 3A, NAND memory string 208 can extend vertically through a memory stack 304 above a substrate 302. Substrate 302 can be a semiconductor layer including silicon (e.g., single crystalline silicon, c-silicon, or polycrystalline silicon), silicon germanium (SiGe), gallium arsenide (GaAs), germanium (Ge), silicon on insulator (SOI), germanium on insulator (GOI), or any other suitable semiconductor materials. In some implementations, substrate 302 includes single crystalline silicon or polycrystalline silicon.

Memory stack 304 can include interleaved gate conductive layers 306 and dielectric layers 308. The number of the pairs of gate conductive layers 306 and dielectric layers 308 in memory stack 304 can determine the number of NAND memory cells 206 in 3D NAND Flash memory cell array 200. Gate conductive layer 306 can include conductive materials including, but not limited to, tungsten (W), cobalt (Co), copper (Cu), aluminum (Al), polysilicon, doped silicon, silicides, or any combination thereof. In some implementations, each gate conductive layer 306 includes a metal layer, such as a tungsten layer. In some implementations, each gate conductive layer 306 includes a doped polysilicon layer. Each gate conductive layer 306 can include control gates surrounding the memory cells, the gates of DSG transistors 212, or the gates of SSG transistors 210, and can extend laterally as DSG line 213 at the top of memory stack 304, SSG line 215 at the bottom of memory stack 304, or word line 218 between DSG line 213 and SSG line 215.

As shown in FIG. 3A, NAND memory string 208 includes a channel structure 312A extending vertically through memory stack 304. In some implementations, channel structure 312A includes a channel hole filled with semiconductor material(s) (e.g., as a semiconductor channel 320) and dielectric material(s) (e.g., as a memory film 318). In some implementations, semiconductor channel 320 includes silicon, such as polysilicon. In some implementations, memory film 318 is a composite dielectric layer including a tunneling layer 326, a storage layer 324 (also known as a "charge trap/storage layer"), and a blocking layer 322. Channel structure 312A can have a cylinder shape (e.g., a pillar shape). Semiconductor channel 320, tunneling layer 326, storage layer 324, blocking layer 322 are arranged radially from the center toward the outer surface of the pillar in this order, according to some implementations. Tunneling layer 326 can include silicon oxide, silicon oxynitride, or any combination thereof. Storage layer 324 can include silicon nitride, silicon oxynitride, silicon, or any combination thereof. Blocking layer 322 can include silicon oxide, silicon oxynitride, high dielectric constant (high-k) dielectrics, or any combination thereof. In one example, memory film 318 may include a composite layer of silicon oxide/silicon oxynitride/silicon oxide (ONO). Channel structure 312A can further include a channel plug 316 on the drain end of NAND memory string 208. Channel plug 316 can include polysilicon and be in contact with semiconductor channel 320.

As shown in FIG. 3A, NAND memory string 208 can further include a semiconductor plug 314 on the source end thereof, which is in contact with semiconductor channel 320 of channel structure 312A. Semiconductor plug 314, also known as selective epitaxial growth (SEG), can be selectively grown from substrate 302 and thus, has the same material as substrate 302, such as single crystalline silicon or polycrystalline silicon. Channel structure 312A in contact with semiconductor plug 314 on the source end of NAND memory string 208 (e.g., at the bottom of NAND memory string 208 shown in FIG. 3A, a.k.a. a bottom plug) is referred to herein as a "bottom plug channel structure" 312A.

As shown in FIG. 3A, a slit structure 328A can extend vertically through memory stack 304 and be in contact with substrate 302. Slit structure 328A can include a source contact 330 having conductive materials, such as polysilicon, metals, metal compounds (e.g., titanium nitride (TiN), tantalum nitride (TaN), etc.), or silicides, as well as a well 332 (e.g., a P-well and/or an N-well) in substrate 302. In some implementations, source contact 330 and well 332 of slit structure 328A, part of substrate 302 between slit structure 328A and channel structure 312A, and semiconductor plug 314 function as parts of source line 214 coupled to the source of NAND memory string 208, for example, for applying an erase voltage to the source of NAND memory string 208 during erase operations.

Different from bottom plug channel structure 312A in FIG. 3A, as shown in FIG. 3B, NAND memory string 208 includes a sidewall plug channel structure 312B and is free of semiconductor plug 314 on the source end thereof, according to some implementations. Instead, a sidewall semiconductor layer 303 vertically between substrate 302 and memory stack 304 can be in contact with the sidewall of semiconductor channel 320 of channel structures 312B. Sidewall semiconductor layer 303 can include semiconductor materials, such as polysilicon. Also different from slit structure 328A in FIG. 3A, as shown in FIG. 3B, a slit structure 328B does not include well 332, and source contact 330 of slit structure 328B is in contact with sidewall semiconductor layer 303, according to some implementations. In some implementations, source contact 330 of slit structure 328B and sidewall semiconductor layer 303 collectively function as parts of source line 214 coupled to the source of NAND memory string 208, for example, for applying an erase voltage to the source of NAND memory string 208 during erase operations.

As shown in FIG. 3C, in some implementations, substrate 302 (e.g., having single crystalline silicon or polycrystalline silicon) is replaced with a semiconductor layer 305 in contact with semiconductor channel 320 of a bottom open channel structure 312C on the source end of NAND memory string 208. Parts of memory film 318 of channel structure 312C on the source end can be removed to expose semiconductor channel 320 to contact semiconductor layer 305. In some implementations, part of semiconductor channel 320 on the source end of NAND memory string 208 is doped to form a doped region 334 that is in contact with semiconductor layer 305. Semiconductor layer 305 can include semiconductor materials, such as polysilicon. In some implementations, semiconductor layer 305 includes N-type doped polysilicon to enable GILD erase operations. Also different from slit structures 328A and 328B in FIGS. 3A and 3B, as shown in FIG. 3C, a slit structure 328C does not include source contact 330 and thus, does not function as part of source line 214, according to some implementations. Instead, source contacts (not shown) may be formed on an opposite side of semiconductor layer 305 with respect to channel structure 312C, such that the source contacts and parts of semiconductor layer 305 may function as parts of source line 214 coupled to the source of NAND memory string 208, for example, for applying an erase voltage to the source of NAND memory string 208 during erase operations.

Figure 4:
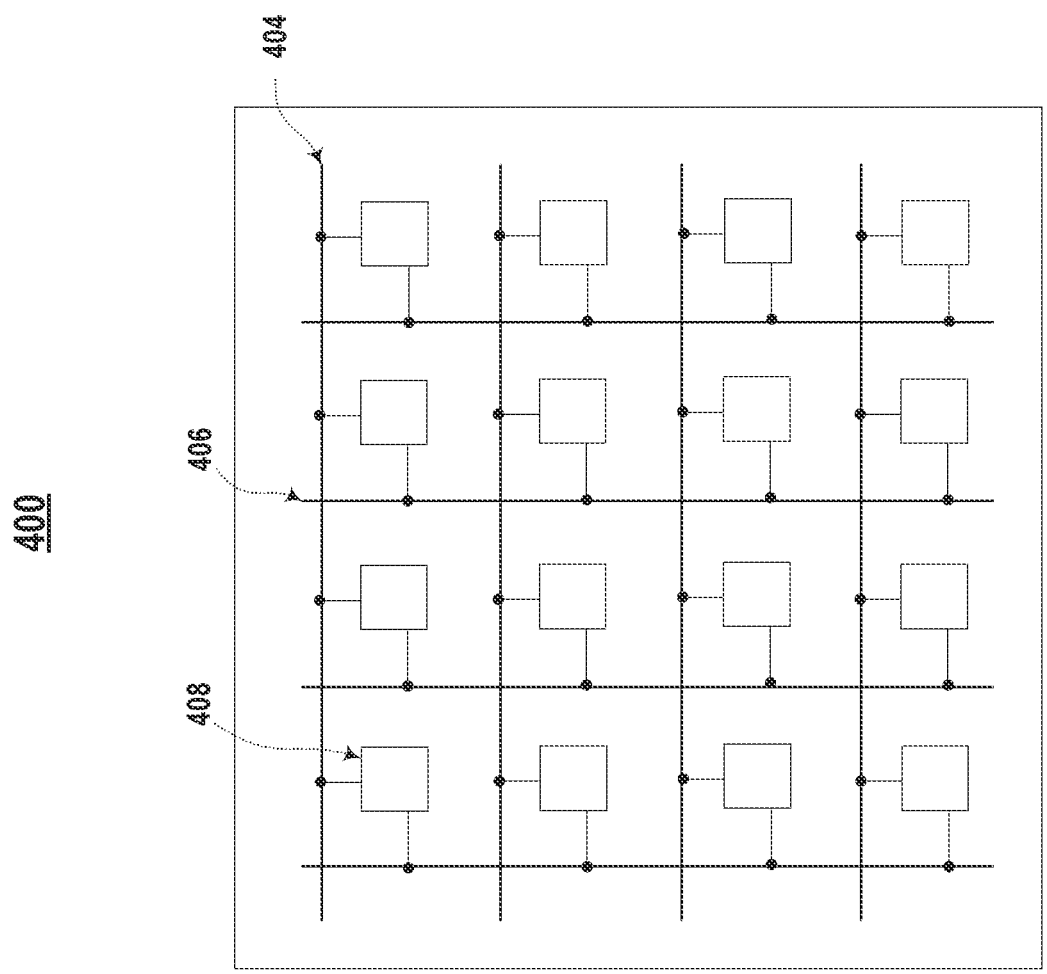
FIG. 4 illustrates a schematic circuit diagram of a dynamic flash memory (DFM) memory device, according to some aspects of the present disclosure.

FIG. 4 illustrates a schematic diagram of a 3D DFM memory cell array 400, according to some aspects of the present disclosure. 3D DFM memory cell array 400 can include a plurality of DFM memory cells 408. In some implementations, a plurality of DFM memory cell 408 arranged in an array in a lateral plane having rows and columns. The DFM memory cells 408 in a same row can be coupled to a same word line (WL) 404, and the DFM memory cells 408 in a same column can be coupled to a same bit line (BL) 406. 3D DFM memory cell array 400 can be configured to operate as a volatile capacitor-free 3D memory device. 3D DFM memory cell array 400 can be configured to provide faster operation speeds and higher density than DRAM or other types of volatile memory. 3D DFM memory cell array 400 can be further configured to provide block refresh and block erase operations similar to flash memory functionality.

Figure 5B:
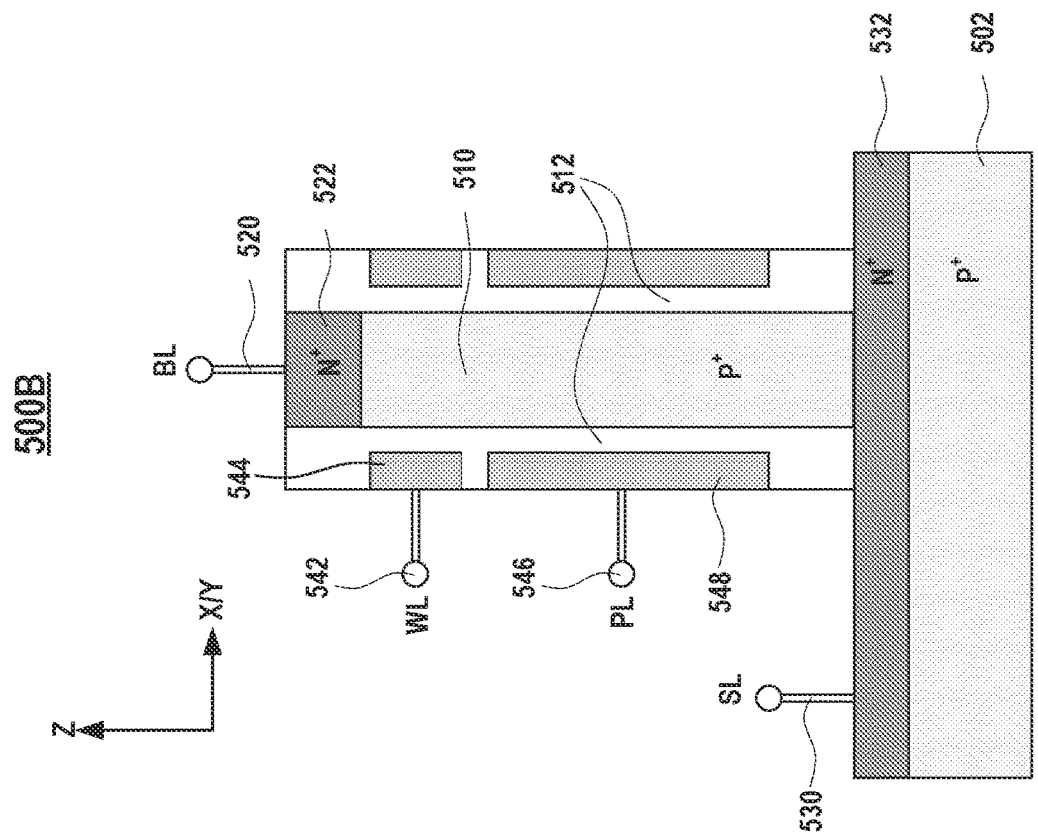
FIG. 5B is a schematic cross-sectional illustration of a dual-gate DFM device, according to some aspects of the present disclosure.
Figure 5A:
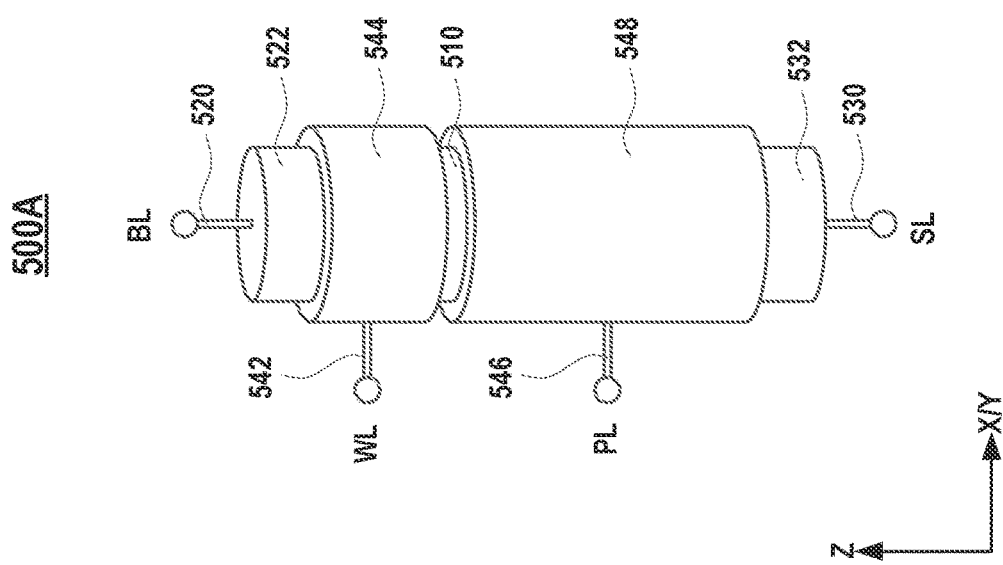
FIG. 5A is a schematic perspective illustration of a dual-gate DFM device, according to some aspects of the present disclosure.

FIG. 5A is a schematic perspective illustration of an exemplary DFM memory device 500A, according to some aspects of the present disclosure. FIG. 5B is a schematic cross-sectional illustration of an exemplary DFM memory device 500B, according to some aspects of the present disclosure. Consistent with the scope of the present disclosure, DFM memory device 500A/500B can include one or more vertical transistors, such as vertical metal-oxide-semiconductor field-effect transistors (MOSFETs), can replace the conventional planar transistors as the pass transistors of memory cells to reduce the area occupied by the pass transistors, the coupling capacitance, as well as the interconnect routing complexity, as described below in detail.

As shown in FIGS. 5A and 5B, DFM memory device 500A/500B can include a dual-gate surrounding gate transistor (SGT) configured to operate as a volatile capacitor-free 3D memory device. In some implementations, dual-gate SGT can include a semiconductor body 510 extending in a vertical direction, two gates (e.g., word line contact 544 and plate line contact 548) surrounding semiconductor body 510 laterally on all sides, a pair of a source and a drain (bit line contact 522 and source line contact 532, also referrer as S/D or source electrode and drain electrode) located at the two ends of semiconductor body 510 in the vertical direction, respectively.

In some implementations, different from planar transistors in which the active regions are formed in the substrates, semiconductor body 510 of dual-gate SGT can be a semiconductor structure extending in a vertical direction (e.g., z-direction) and configured to store charge (e.g., holes). It is understood that semiconductor body 510 may have any suitable 3D shape, such as a cylinder shape, as shown in FIG. 5A, or a polyhedron shape (e.g., cuboid shape, not shown). That is, the cross-section of semiconductor body 510 in the plan view (e.g., in the x-y plane) can have a circular (or an oval shape), a square shape, a rectangular shape (or a trapezoidal shape), or any other suitable shapes.

BL contact 522 can be located on one end of semiconductor body 510 in the vertical direction and act as a drain electrode of dual-gate SGT. BL 520 can be electrically connected to BL contact 522 and configured to address semiconductor body 510 in dual-gate SGT. SL contact 532 can be located on another end of semiconductor body 510 in the vertical direction and act as a source electrode of dual-gate SGT. SL 530 can be electrically connected to SL contact 532 and configured to address semiconductor body 510 in dual-gate SGT. The source and drain can be doped with any suitable P-type dopants, such as boron (B) or Gallium (Ga), or any suitable N-type dopants, such as phosphorus (P) or arsenic (As). The source and drain can be separated by gate structures (e.g., WL contact 544 and PL contact 548) in the vertical direction (the z-direction).

WL contact 544 can surround an upper portion of semiconductor body 510 and act as a first gate structure of dual-gate SGT. WL 542 can be electrically connected to WL contact 544, and configured to act as a top select gate connection. PL contact 548 can surround a lower portion of semiconductor body 510 and act as a second gate structure of dual-gate SGT. PL 546 can be electrically connected to PL contact 548, and configured to act as a traditional current-valve gate (e.g., similar to a metal-oxide-semiconductor field-effect transistor (MOSFET) gate) for semiconductor body 510 and cover a majority of a length of semiconductor body 510. The two gate structures (i.e., WL contact 544 and PL contact 548) are formed vertically between the source and drain (i.e., BL contact 522 and SL contact 532). As a result, one or more channels of dual-gate SGT can be formed in semiconductor body 510 vertically between the source and drain when a property gate voltage applied to WL contact 544 and/or PL contact 548 are above the threshold voltage of dual-gate SGT. That is, each channel of dual-gate SGT is also formed in the vertical direction along which semiconductor body 510 extends, according to some implementations.

As shown in FIG. 5B, DFM memory device 500B can be configured to arrange a dual-gate SGT in a vertical arrangement on substrate 502. In some implementations, the dual-gate SGT can include semiconductor body 510, dielectric spacer 512, bit line (BL) 520, BL contact 522, word line (WL) 542, WL contact 544, plate line (PL) 546, PL contact 548, source line (SL) 530, and SL contact 532 formed on substrate 502.

Substrate 502 can include silicon (e.g., single crystalline silicon or polycrystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials, and any combinations thereof. In some implementations, substrate 502 can be double-side polished prior to peripheral device fabrication. In this example, substrate 502 includes surfaces on the top and bottom sides both polished and treated to provide a smooth surface for high quality semiconductor devices. In some implementations, substrate 502 can include a dielectric layer formed of silicon, silicon oxide, silicon nitride, or any suitable dielectric material. Substrate 502 can be configured to support semiconductor body 510, dielectric spacer 512, BL contact 522, WL contact 544, PL contact 548, and SL contact 532. Substrate 502 can be coupled to SL contact 532. In some implementations, substrate 502 can be a p-type semiconductor (e.g., p+), for example, doped silicon.

Semiconductor body 510 can be a semiconductor structure configured to store charge (e.g., holes). Semiconductor body 510 can extend in a vertical direction (e.g., z-direction) with reference to a top surface of substrate 502. In some implementations, semiconductor body 510 can be formed of a pillar structure, such as a cylinder-shaped structure or a cuboid-shaped structure with a rectangular-shaped cross-sectional area in a side view. A diameter or a lateral dimension of the pillar structure of semiconductor body 510 can be in a range from about 2 nm to about 30 nm, and a height of the pillar structure of semiconductor body 510 can be in a range from about 40 nm to about 120 nm, such as about 100 nm. Semiconductor body 510 can be formed of a semiconductor material doped with suitable dopants. For example, semiconductor body 510 can be a silicon material doped with p-type dopants, such as boron, aluminum, nitrogen, gallium, indium, and/or combinations thereof. In some implementations, the dopant concentration of the p-type dopants can be between about $1\times10^{16}$ atom/cm$^3$ to about $1\times10^{22}$ atom/cm$^3$. In some implementations, semiconductor body 510 can be formed using an intrinsic semiconductor material, such as intrinsic polycrystalline silicon. As shown in FIG. 5B, semiconductor body 510 can be formed between BL contact 522 and SL contact 532. In some implementations, semiconductor body 510 can be formed from the substrate (e.g., by etching or epitaxy) and thus, has the same semiconductor material (e.g., silicon crystalline silicon) as the substrate (e.g., a silicon substrate).

BL 520 can be configured to address semiconductor body 510 of dual-gate SGT and be coupled to BL contact 522. In some implementations, BL 520 can be formed using a suitable conductive material, such as tungsten, cobalt, copper, aluminum, polysilicon, doped silicon, silicides, and/or combinations thereof. BL contact 522 can be configured to act as a drain connection to semiconductor body 510. In some implementations, BL contact 522 can be formed of a semiconductor material doped with suitable dopants, such as n-type dopants, such as phosphorus, arsenic, antimony, bismuth, lithium, and/or combinations thereof. In some implementations, the dopant concentration of the n-type dopants can be between about $1\times10^{16}$ atom/cm$^3$ to about $1\times10^{22}$ atom/cm$^3$. In some implementations, the dopant concentration of n-type dopants can be greater than about $1\times10^{20}$ atom/cm$^3$. In some implementations, BL contact 522 can be formed by doping a top portion of semiconductor body 510 with n-type dopants. It is understood that BL 520 and BL contact 522 may be a continuous conductive structure in some examples. In other words, BL contact 522 may be viewed as part of BL 520 that forms the drain connection to semiconductor body 510, or BL 520 may be viewed as the extension of BL contact 522 to be coupled to the peripheral circuits.

SL 530 can be configured to address semiconductor body 510 of dual-gate SGT and be coupled to SL contact 532. In some implementations, SL 530 can be formed using a suitable conductive material, such as tungsten, cobalt, copper, aluminum, polysilicon, doped silicon, silicides, and/or combinations thereof. SL contact 532 can be configured to act as a source connection to semiconductor body 510. In some implementations, SL contact 532 can be a conductive structure, such as a semiconductor layer doped with suitable dopants. In some implementations, SL contact 532 can be formed of a semiconductor material doped with n-type dopants, such as phosphorus, arsenic, antimony, bismuth, lithium, and/or combinations thereof. In some implementations, the dopant concentration of the n-type dopants can be between about $1\times10^{16}$ atom/cm$^3$ to about $1\times10^{22}$ atom/cm$^3$.

It is understood that SL 530 and SL contact 532 may be a continuous conductive structure in some examples. In other words, SL contact 532 may be viewed as part of SL 530 that forms the source connection to semiconductor body 510, or SL 530 may be viewed as the extension of SL contact 532 to be coupled to the peripheral circuits.

Dielectric spacer 512 can surround semiconductor body 510 and be configured to provide electrical insulation between semiconductor body 510 and WL contact 544, as well as between semiconductor body 510 and PL contact 548. Dielectric spacer 512 can include any suitable dielectric materials, such as silicon oxide, silicon nitride, silicon oxynitride, or high-k dielectrics. In some implementations, dielectric spacer 512 can be a high-k dielectric configured to increase a gate capacitance and decrease a leakage current in semiconductor body 510.

WL 542 can be configured to address semiconductor body 510 of dual-gate SGT and be coupled to WL contact 544. WL contact 544 can be configured to act as a first gate connection to semiconductor body 510. WL contact 544 can surround an upper portion of dielectric spacer 512, which surrounds an upper portion of the sidewall surfaces of semiconductor body 510 thereby forming a first concentric transistor. In some implementations, WL contact 544 can include a suitable conductive material, such as tungsten, cobalt, copper, aluminum, polysilicon, doped silicon, silicides, and/or combinations thereof. In some implementations, WL 542 can act as a top select gate connection. In some implementations, WL 542 can provide voltage to WL contact 544, thereby inducing an electric field within semiconductor body 510, to read, program, or erase charge on semiconductor body 510. It is understood that WL 542 and WL contact 544 may be a continuous conductive structure in some examples. In other words, WL contact 544 may be viewed as part of WL 542 that forms the first gate connection to semiconductor body 510, or WL 542 may be viewed as the extension of WL contact 544 to be coupled to the peripheral circuits.

PL 546 can be configured to address semiconductor body 510 of dual-gate SGT and be coupled to PL contact 548. PL contact 548 can be configured to act as a second gate connection to semiconductor body 510. PL contact 548 can surround a low portion of dielectric spacer 512, which surrounds a lower portion of the sidewall surfaces of semiconductor body 510 thereby forming a second concentric transistor. For example, the sidewall surface of PL 546 can be positioned around a circumference of semiconductor body 510. In some implementations, the sidewall surface of PL 546 can be concentric with the sidewall surface of semiconductor body 510. In some implementations, PL contact 548 can include a conductive material (e.g., metal, polysilicon, tungsten, etc.). In some implementations, PL 546 can act as a traditional current-valve gate (e.g., similar to a MOSFET gate) for semiconductor body 510 and cover a majority of a length of semiconductor body 510. In some implementations, PL 546 can provide voltage to PL contact 548, thereby inducing an electric field within semiconductor body 510, to read, program, or erase charge on semiconductor body 510. It is understood that PL 546 and PL contact 548 may be a continuous conductive structure in some examples. In other words, PL contact 548 may be viewed as part of PL 546 that forms the second gate connection to semiconductor body 510, or PL 546 may be viewed as the extension of PL contact 548 to be coupled to the peripheral circuits.

Figure 6B:
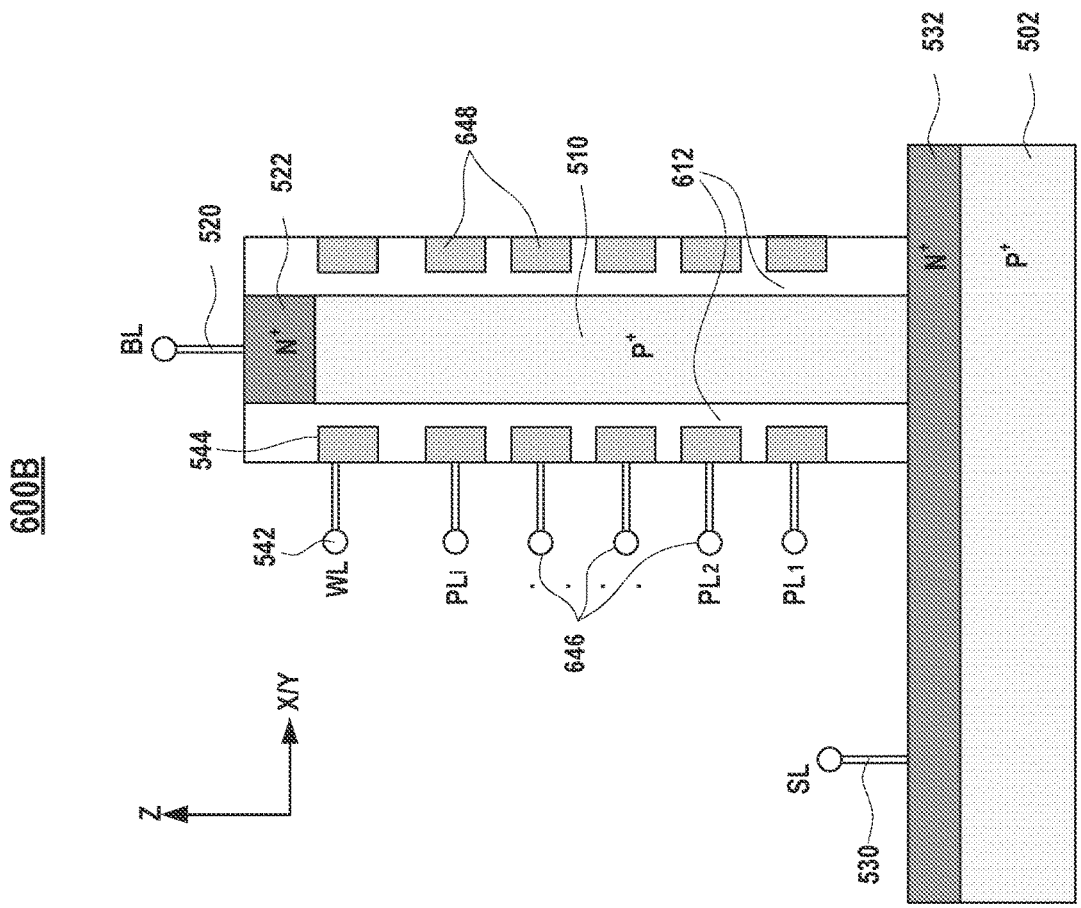
FIG. 6B is a schematic cross-sectional illustration of a multi-gate DFM device, according to some aspects of the present disclosure.
Figure 6A:
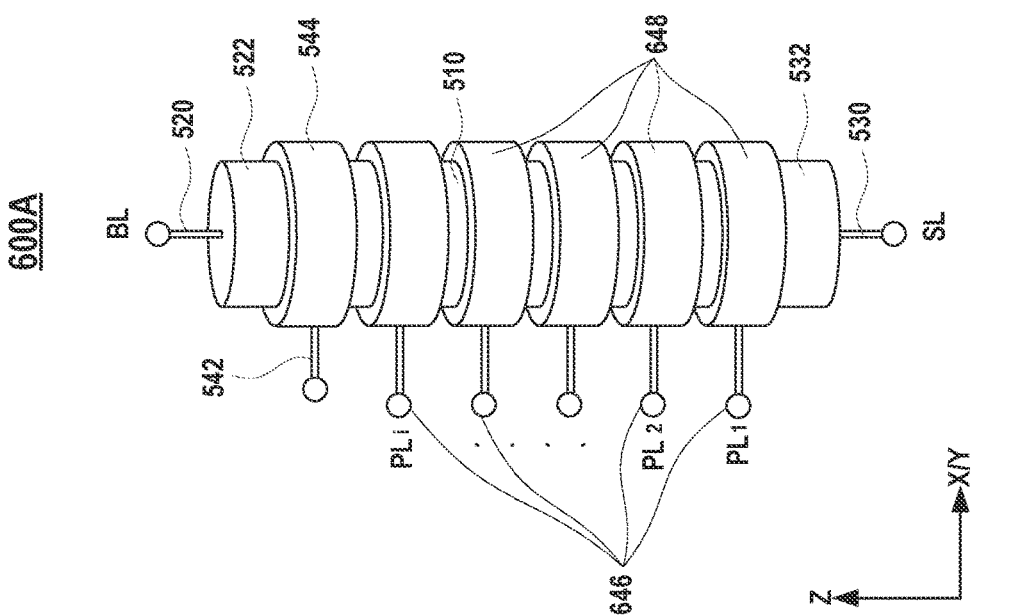
FIG. 6A is a schematic perspective illustration of a multi-gate DFM device, according to some aspects of the present disclosure.

In some implementations, multi-gate DFM cells can provide a capacitor-free dynamic random-access memory device to increase memory storage efficiency, increase read, program, and erase operation rates, decrease leakage current, decrease junction current, decrease power consumption, increase charge retention times, and/or decrease refresh rates. FIG. 6A is a schematic perspective illustration of an exemplary multi-gate DFM device 600A, according to some exemplary aspects. FIG. 6B is a schematic cross-sectional illustration of an exemplary multi-gate DFM memory device 500B, according to some aspects of the present disclosure. Multi-gate DFM device 600A/600B can include a multi-gate SGT configured to provide a plurality of gates (e.g., WL contact 544 and multiple PL contacts 648) surrounding a channel region (e.g., semiconductor body 510) on all sides.

As shown in FIGS. 6A and 6B, multi-gate DFM device 600A/600B can include semiconductor body 510 extending in a vertical direction, multiple gates (e.g., WL contact 544 and PL contact segments 648) surrounding semiconductor body 510 laterally on all sides, a pair of a source electrode and a drain electrode (e.g., BL contact 522 and SL contact 532) located at the two ends of semiconductor body 510 in the vertical direction, respectively. It is noted that, elements or components corresponding to those in FIGS. 5A and 5B are designated by similar numeral references and are not described herein.

Different from dual-gate SGT shown in FIGS. 5A and 5B, the PL contact of multi-gate SGT can include a plurality of PL contact segments 648. The plurality of PL contact segments 648 can be configured to act as multiple gate connections to semiconductor body 510. Each of the plurality of PL contact segments 648 can surround a corresponding portion of dielectric spacer 612 which surrounds a corresponding portion of semiconductor body 510 thereby forming a concentric transistor in multi-gate DFM device 600A/600B. In some implementations, the plurality of PL contact segments 648 can include any suitable conductive material (e.g., metal, polysilicon, tungsten, etc.).

In some implementations, each PL contact segments 648 can have a same height in the vertical direction, which can be equal to the height of the WL contact 544 in the vertical direction. The distance between adjacent PL contact segments 648 can be the same or different from the distance between WL contact 544 and its adjacent PL contact segment 648. In some implementations, the distance between adjacent PL contact segments 648 can be determined based on design requirement of actual impact ionization efficiency. The effective length of PL contact can be defined by the number of PL contact segments 648. It is noted that, although there are five PL contact segments 648 shown in FIGS. 6A and 6B, there can be any suitable number (e.g., 2, 3, 4, 6, 7, 8, 9, etc.) of PL contact segments 648.

In some implementations, the plurality of PL contact segments 648 of multi-gate SGT device 600A/600B as shown in FIGS. 6A and 6B can be respectively connected to a number i of plate lines 646 (e.g., PLs 646 including $PL_1$, $PL_2$, ..., $PL_i$). In some implementations, the plurality of PLs 646 can share a common voltage configuration to read, program, or erase charge on semiconductor body 510 through the plurality of PL contact segments 648. In some implementations, the plurality of PL contact segments 648 can control electrical charge conduction in semiconductor body 510. For example, the plurality of PL contact segments 648 can control electrical charge conduction between WL 542 and PLs 646. In some other implementations, the plurality of PLs 646 can be independently connected to a number i of independent power supplies, respectively, to regulate the channel surface potential distribution of semiconductor body 510 to maximize the drift speed of electrons reaching the bottom space charge region of WL contact 544 and enhance the impact ionization rate. In some implementations, each of the multiple PLs 646 can provide an independent voltage to address semiconductor body 510 through a corresponding PL contact segment 648.

In some implementations, the plurality of PL contact segments 648 can be configured to increase a program (write) rate of semiconductor body 510. For example, for impact ionization programming, the plurality of PL contact segments 648 can increase a charge flow from WL 542 to PLs 646, thereby increasing the program (write) rate. In some implementations, the plurality of PL contact segments 648 can increase a charge flow in semiconductor body 510. In some implementations, the plurality of PL contact segments 648 can decrease a program (write) time in multi-gate DFM device 600A/600B. In some implementations, the plurality of PL contact segments 648 can increase a program (write) rate in multi-gate DFM device 600A/600B. In some implementations, the plurality of PL contact segments 648 can decrease a read time in multi-gate DFM device 600A/600B. In some implementations, the plurality of PL contact segments 648 can increase a read rate in multi-gate DFM device 600A/600B. In some implementations, the plurality of PL contact segments 648 can decrease an erase time in multi-gate DFM device 600A/600B. In some implementations, the plurality of PL contact segments 648 can increase an erase rate in multi-gate DFM device 400.

It is noted that, in planar transistors and some lateral multiple-gate transistors (e.g., FinFET), the active regions, such as semiconductor bodies (e.g., Fins), extend laterally (in the x-y plane), and the source and the drain are disposed at different locations in the same lateral plane (the x-y plane). In contrast, in the disclosed 3D DFM cells (e.g., dual-gate DFM device 500A/500B, multi-gate DFM device 600A/600B), semiconductor body 510 extends vertically (in the z-direction), and the source and the drain (e.g., BL contact 522 and SL contact 532) are disposed in the different lateral planes, according to some implementations. In some implementations, the source and the drain are formed at two ends of semiconductor body 510 in the vertical direction (the z-direction), respectively, thereby being overlapped in the plan view. As a result, the area (in the x-y plane) occupied by 3D DFM cells can be reduced compared with planar transistor and lateral multiple-gate transistors. Also, the metal wiring coupled to vertical arranged SGTs can be simplified as well since the interconnects can be routed in different lateral planes. For example, BL 520 and SL 530 may be coupled to the source or the drain on opposite sides of semiconductor body 510, and WL 542 and multiple PLs 646 may be coupled to the corresponding WL contact 544 or PL contact segments 648, respectively, in different lateral planes in the vertical direction.

Figure 7:
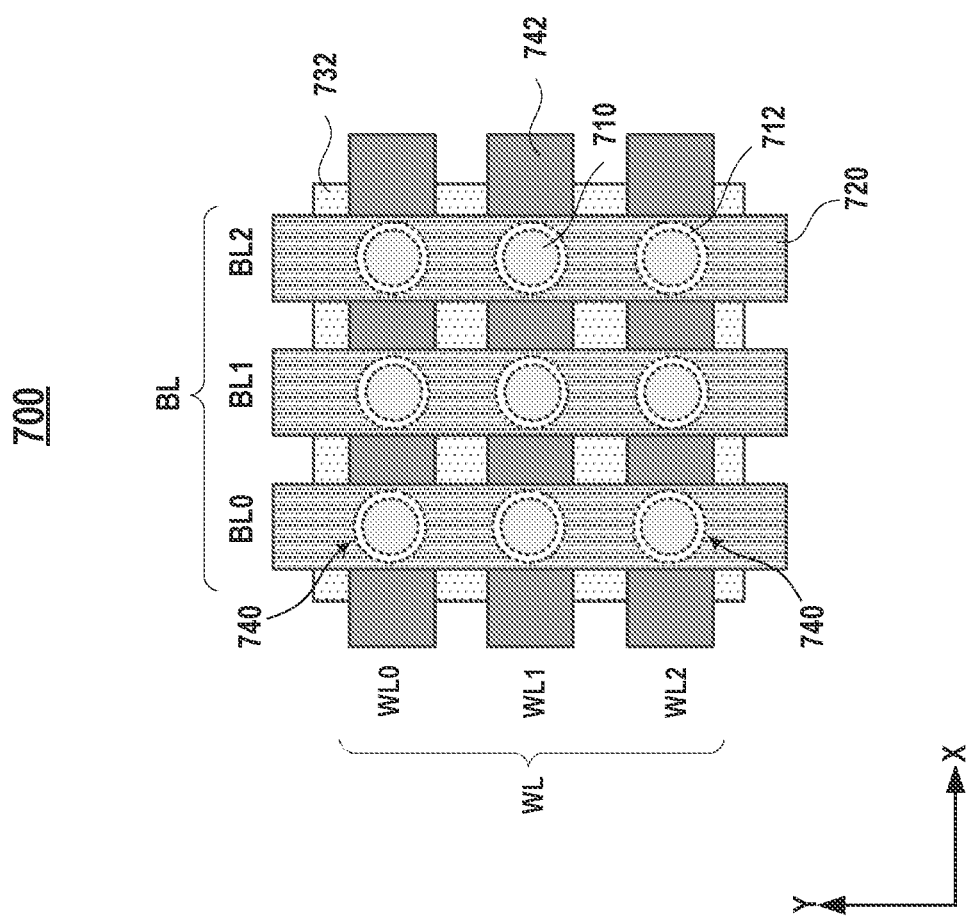
FIG. 7 is a schematic top-down illustration of a DFM cell array, according to some aspects of the present disclosure.

FIG. 7 illustrates a top-down view of a DFM memory array 700 formed of capacitor-less dual-gate or multi-gate DFM memory cells, according to some embodiments of the present disclosure. Examples of the dual-gate or multi-gate DFM memory cells can be referred to dual-gate DFM memory device 500A/500B or multi-gate DFM memory device 600A/600B described above in connection with FIGS. 5A-5B and 6A-6B. DFM memory array 700 can include additional DFM memory cells that are not illustrated for simplicity.

Multiple bit lines (BLs) 720 and word lines (WLs) 742 are intersected to form DFM memory array 700. As shown in FIG. 7, WLs 742 can extend in a first lateral direction (e.g., x-direction) and designated as WL0, WL1, and WL2, etc. Similarly, BLs 720 can extend in a second lateral direction (e.g., y-direction) and designated as BL0, BL1, and BL2, etc. Each DFM memory cell 740 is formed at an intersection of a WL 742 and a BL 720. For example, DFM memory cells 740 can be formed at the intersection of WL0 and BL0 and also at the intersection of WL2 and BL0. It is noted that, SL contact 732, semiconductor body 710, and dielectric spacer 712 can be referred to SL contact 532, semiconductor body 510, and dielectric spacer 512/612 described above in connection with FIGS. 5A-5B and 6A-6B.

Figure 8A:
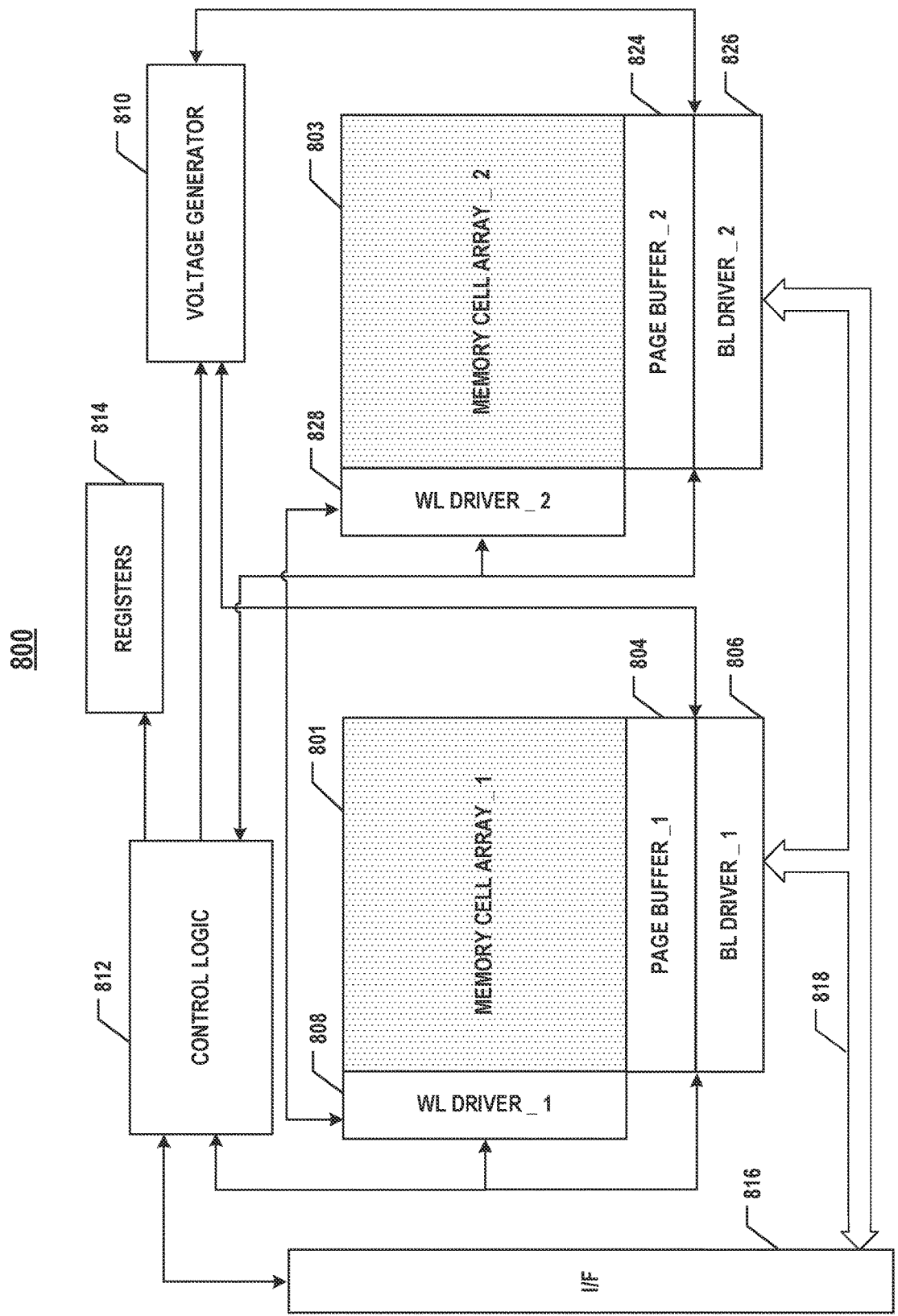
FIG. 8A illustrates a block diagram of a memory device including memory cell arrays and peripheral circuits, according to some aspects of the present disclosure.

Referring to FIG. 8A, a schematic circuit diagram of an exemplary memory device 800 including periphery circuits is illustrated according to some aspects of the present disclosure. As described above, the periphery circuits can be coupled to at least two memory cell arrays (e.g., 3D NAND memory cell array and 3D DFM memory cell array) and can include any suitable circuits for facilitating the operations of the at least two memory cell arrays by applying and sensing voltage signals and/or current signals to and from each target memory cell of the at least two memory cell arrays. The periphery circuits can include various types of periphery circuits formed using CMOS technologies. For example, FIG. 8A illustrates memory device 800 including a first memory cell array 801 and a second memory cell array 803, and various exemplary periphery circuits including a voltage generator 810, control logic 812, registers 814, an interface (I/F) 816, a data bus 818, a first page buffer 804 and a second page buffer 824, a first BL driver 806 and a second BL driver 826 (also referred as column decoders), a first WL driver 808 and a second WL driver 828 (also referred as row decoders). It is understood that in some examples, additional periphery circuits may be included as well.

First page buffer 804 and second page buffer 824 can be configured to buffer data read from or programmed to first memory cell array 801 and second memory cell array 803, respectively, according to the control signals of control logic 812. In one example, first page buffer 804 and/or second page buffer 824 may store one page of program data (write data) to be programmed into one page of first memory cell array 801 and/or second memory cell array 803. In another example, first page buffer 804 and/or second page buffer 824 also performs program verify operations to ensure that the data has been properly programmed into NAND and/or DFM memory cells of first memory cell array 801 and/or second memory cell array 803 coupled to selected word lines.

First WL driver 808 and second WL driver 828 can be configured to be controlled by control logic 812 and select block of first memory cell array 801 and/or second memory cell array 803 and a word line of the selected block. First WL driver 808 and second WL driver 828 can be further configured to drive first memory cell array 801 and/or second memory cell array 803, respectively. For example, first WL driver 808 and second WL driver 828 may drive NAND memory cells and/or DFM cells of first memory cell array 801 and/or second memory cell array 803 coupled to the selected word line using a word line voltage generated from voltage generator 810.

First BL driver 806 and second BL driver 826 can be configured to be controlled by control logic 812 and select one or more 3D NAND memory strings and/or one or more 3D DFM cells of first memory cell array 801 and/or second memory cell array 803 by applying bit line voltages generated from voltage generator 810. For example, first BL driver 806 and second BL driver 826 may apply column signals for selecting a set of N bits of data from page buffer 804 to be outputted in a read operation.

Control logic 812 can be coupled to each of the plurality of peripheral circuits and configured to control operations of the plurality of peripheral circuits. Registers 814 can be coupled to control logic 812 and include status registers, command registers, and address registers for storing status information, command operation codes (OP codes), and command addresses for controlling the operations of each of peripheral circuits.

Interface 816 can be coupled to control logic 812 and configured to interface first memory cell array 801 and second memory cell array 803 with one or more memory controllers (not shown). In some implementations, interface 816 acts as a control buffer to buffer and relay control commands received from the one or more memory controllers and/or a host (not shown) to control logic 812 and status information received from control logic 812 to the memory controller and/or the host. Interface 816 can also be coupled to first and second page buffers 804, 824, and first and second BL drivers 806, 826 via data bus 818 and act as an I/O interface and a data buffer to buffer and relay the program data received from the one or more memory controllers and/or the host to first and second page buffers 804, 824, and the read data from first and second page buffers 804, 824 to the one or more memory controllers and/or the host. In some implementations, interface 816 and data bus 818 are parts of an I/O circuit of the peripheral circuits.

Voltage generator 810 can be configured to be controlled by control logic 812 and generate the word line voltages (e.g., read voltage, program voltage, pass voltage, local voltage, and verification voltage) and the bit line voltages to be supplied to first memory cell array 801 and second memory cell array 803. In some implementations, voltage generator 810 is part of a voltage source that provides voltages at various levels of different peripheral circuits as described below in detail. Consistent with the scope of the present disclosure, in some implementations, the voltages provided by voltage generator 810, for example, to first WL driver 808 and second WL driver 828, first BL driver 806 and second BL driver 826, first page buffer 804 and second page buffer 824, are above certain levels that are sufficient to perform the memory operations. For example, the voltages provided to the page buffer circuits in first page buffer 804 and second page buffer 824, and/or the logic circuits in control logic 812 may be between 1.3 V and 5 V, such as 3.3 V, and the voltages provided to the driving circuits in first WL driver 808 and second WL driver 828, first BL driver 806 and second BL driver 826 may be between 5 V and 30 V.

Figure 8B:
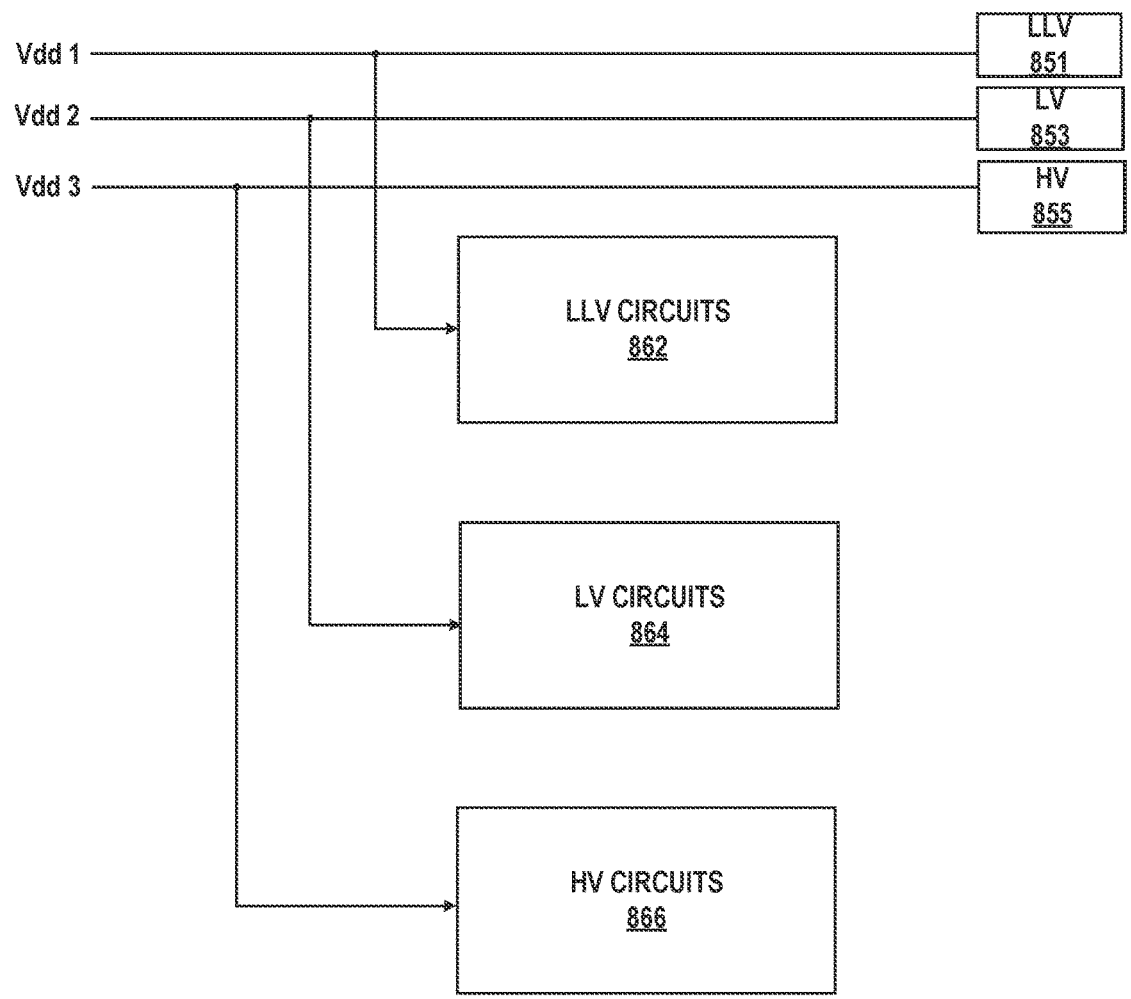
FIG. 8B illustrates a block diagram of peripheral circuits provided with various voltages, according to some aspects of the present disclosure.

Different from logic devices (e.g., microprocessors), memory devices, such as 3D NAND Flash memory and/or 3D DFM memory, require a wide range of voltages to be supplied to different memory peripheral circuits. For example, FIG. 8B illustrates a block diagram of peripheral circuits provided with various voltages, according to some aspects of the present disclosure. In some implementations, a memory device (e.g., memory devices 100A-100G) includes a low low voltage (LLV) source 851, a low voltage (LV) source 853, and a high voltage (HV) source 855, each of which is configured to provide a voltage at a respective level (Vdd1, Vdd2, or Vdd3). For example, Vdd3>Vdd2>Vdd1. Each voltage source 851, 853, or 855 can receive a voltage input at a suitable level from an external power source (e.g., a battery). Each voltage source 851, 853, or 855 can also include voltage converters and/or voltage regulators to convert the external voltage input to the respective level (Vdd1, Vdd2, or Vdd3) and maintain and output the voltage at the respective level (Vdd1, Vdd2, or Vdd3) through a corresponding power rail. In some implementations, voltage generator 810 of memory device 800 is part of voltage sources 851, 853, and 855.

In some implementations, LLV source 851 is configured to provide a voltage below 1.3 V, such as between 0.9 V and 1.2 V (e.g., 0.9 V, 0.95 V, 1 V, 1.05 V, 1.1 V, 1.15 V, 1.2 V, any range bounded by the lower end by any of these values, or in any range defined by any two of these values). In one example, the voltage is 1.2 V. In some implementations, LV source 853 is configured to provide a voltage between 1.3 V and 3.3 V (e.g., 1.3 V, 0. 1.4 V, 1.5 V, 1.6 V, 1.7 V, 1.8 V, 1.9 V, 2 V, 2.1 V, 2.2 V, 2.3 V, 2.4 V, 2.5 V, 2.6 V, 2.7V, 2.8 V, 2.9 V, 3 V, 3.1 V, 3.2 V, 3.3 V, any range bounded by the lower end by any of these values, or in any range defined by any two of these values). In one example, the voltage is 3.3 V. In some implementations, HV source 855 is configured to provide a voltage greater than 3.3 V, such as between 5 V and 30 V (e.g., 5 V, 6 V, 7 V, 8 V, 9 V, 10 V, 11 V, 12 V, 13 V, 14 V, 15 V, 16 V, 17 V, 18 V, 19 V, 20 V, 21 V, 22 V, 23 V, 24 V, 25 V, 26 V, 27 V, 28 V, 29 V, 30 V, any range bounded by the lower end by any of these values, or in any range defined by any two of these values). It is understood that the voltage ranges described above with respect to HV source 855, LV source 853, and LLV source 851 are for illustrative purposes and non-limiting, and any other suitable voltage ranges may be provided by HV source 855, LV source 853, and LLV source 851.

Based on their suitable voltage levels (Vdd1, Vdd 2, or Vdd3), the memory peripheral circuits can be categories into LLV circuits 862, LV circuits 864, and HV circuits 866, which can be coupled to LLV source 851, LV source 853, and HV source 855, respectively. In some implementations, HV circuits 866 includes one or more driving circuits that are coupled to the first and/or second memory cell arrays (e.g., 3D NAND memory cell array, 3D DFM memory cell array) through word lines, bit lines, SSG lines, DSG lines, source lines, etc., and configured to drive the first and/or second memory cell arrays by applying a voltage at a suitable level to the word lines, bit lines, SSG lines, DSG lines, source lines, etc., when performing memory operations (e.g., read, program, or erase). In one example, HV circuit 866 may include word line driving circuits (e.g., in first and second WL drivers 808, 828) that are coupled to word lines and apply a program voltage (Vprog) or a pass voltage (Vpass) in the range of, for example, 5 V and 30 V, to the word lines during program operations. In another example, HV circuit 866 may include bit line driving circuits (e.g., in first and second BL drivers 806, 826) that are coupled to bit lines and apply an erase voltage (Veras) in the range of, for example, 5 V and 30 V, to bit lines during erase operations. In some implementations, LV circuits 864 include page buffer circuits (e.g., in latches of first and second page buffers 804, 824) and are configured to buffer the data read from or programmed to the first and/or second memory cell arrays. For example, first and second page buffers 804, 824 may be provided with a voltage of, for example, 3.3 V, by LV source 853. LV circuits 864 can also include logic circuits (e.g., in control logic 812). In some implementations, LLV circuits 862 include an I/O circuit (e.g., in interface 816 and/or data bus 818) configured to interface first and second page buffers 804, 824 with one or more memory controllers. For example, the I/O circuit may be provided with a voltage of, for example, 1.2 V, by LLV source 851.

Figure 8C:
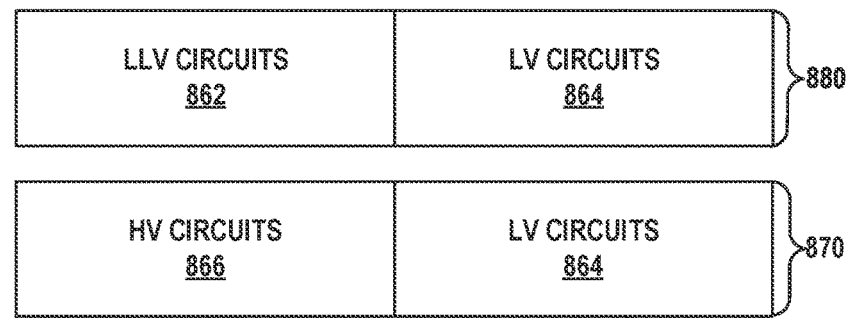
FIG. 8C illustrates a schematic diagram of peripheral circuits provided with various voltages arranged in separate semiconductor structures, according to some aspects of the present disclosure.

As described above, to reduce the total area occupied by the memory peripheral circuits, the peripheral circuits of the first and/or second memory cell arrays can be separately formed in different planes based on different performance requirements, such as the applied voltages. For example, FIG. 8C illustrates a schematic diagram of peripheral circuits provided with various voltages arranged in separate semiconductor structures, according to some aspects of the present disclosure. In some implementations, LLV circuits 862 and HV circuits 866 are separated, for example, in semiconductor structures 870 and 880, respectively, due to their significant difference in voltages and the resulting difference in device dimensions, such as different semiconductor layer (e.g., substrate or thinned substrate) thicknesses and different gate dielectric thicknesses. In one example, the thickness of the semiconductor layer (e.g., a substrate or a thinned substrate) in which HV circuits 866 are formed in semiconductor structure 870 may be larger than the thickness of the semiconductor layer (e.g., a substrate or a thinned substrate) in which LLV circuits 862 are formed in semiconductor structure 880. In another example, the thickness of the gate dielectric of transistors forming HV circuits 866 may be larger than the thickness of the gate dielectric of transistors forming LLV circuits 862. It is understood that stacked LLV circuits 862 and HV circuits 866 in different planes may be formed in two semiconductor structure 880 or 870 separated by a bonding interface (e.g., in FIGS. 1A, 1C, 1D, and 1H), or separated by other semiconductor structure(s) (e.g., in FIGS. 1B, 1E, and 1G), or on opposite sides of a semiconductor layer (e.g., in FIG. 1E).

LV circuits 864 can be formed in either semiconductor structure 870 or 880, or in another semiconductor, i.e., in the same plane as LLV circuits 862 or HV circuits 866, or a different plane from LLV circuits 862 and HV circuits 866. As shown in FIG. 8C, in some implementations, some of LV circuits 864 are formed in semiconductor structure 880, i.e., in the same plane as LLV circuits 862, while some of LV circuits 864 are formed in semiconductor structure 870, i.e., in the same plane as HV circuits 866. That is, LV circuits 864 can be separated into different planes as well. The thickness of the gate dielectric of transistors forming LV circuits 864 in semiconductor structure 880 can be the same as the thickness of the gate dielectric of transistors forming LV circuits 864 in semiconductor structure 870, for example, when the same voltage is applied to LV circuits 864 in different semiconductor structures 870 and 880. In some implementations, the same voltage is applied to both LV circuits 864 in semiconductor structure 880 and the LV circuits 864 in semiconductor structure 870, such that the voltage applied to HV circuits 866 in semiconductor structure 870 is higher than the voltage applied to LV circuits 864 in semiconductor structure 870 or 880, which is in turn higher than the voltage applied to LLV circuits 862 in semiconductor structure 880. Moreover, since the voltage applied to LV circuits 864 is between the voltages applied to HV circuits 866 and LLV circuits 862, the thickness of the gate dielectric of transistors forming LV circuits 864 is between the thickness of the gate dielectric of transistors forming HV circuits 866 and the thickness of the gate dielectric of transistors forming LLV circuits 862, according to some implementations. For example, the gate dielectric thickness of transistors forming LV circuits 864 may be larger than the gate dielectric thickness of transistors forming LLV circuits 862, but smaller than the gate dielectric thickness of transistors forming HV circuits 866.

Based on the different performance requirements (e.g., associated with different applied voltages), the peripheral circuits can be separated into at least two stacked semiconductor structures 870 and 880 in different planes. In some implementations, the I/O circuits in interface 816 and/or data bus 818 (as LLV circuits 862) and logic circuits in control logic 812 (as part of LV circuits) are disposed in semiconductor structure 880, while the page buffer circuits in first and second page buffers 804, 824, and driving circuits in first and second WL drivers 808, 828, and first and second BL drivers 806, 826, are disposed in semiconductor structure 870.

Figure 9A:
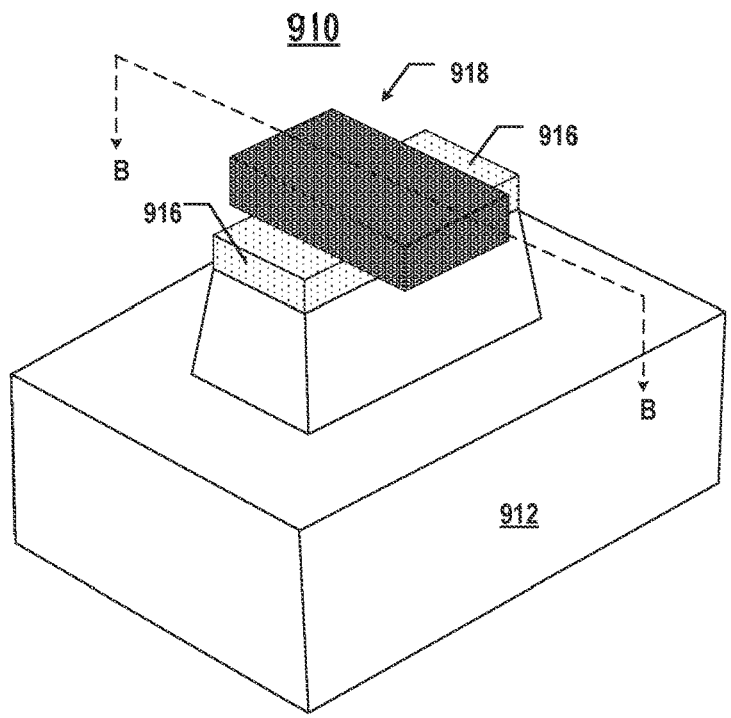
FIGS. 9A and 9B illustrate a perspective view and a side view, respectively, of a planar transistor, according to some aspects of the present disclosure.
Figure 9B:
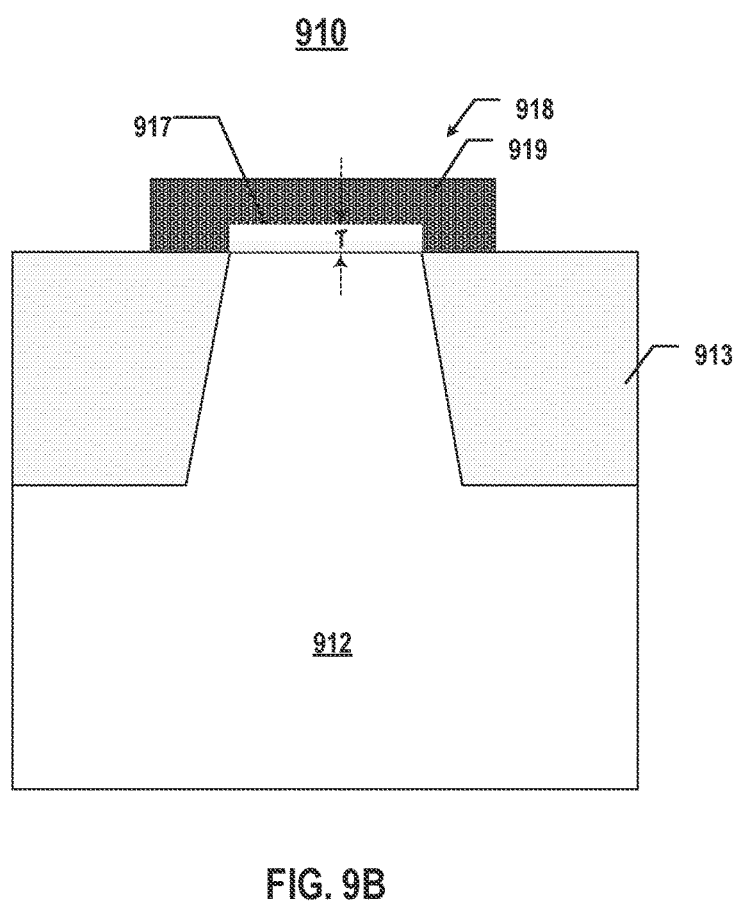
Figure 9C:
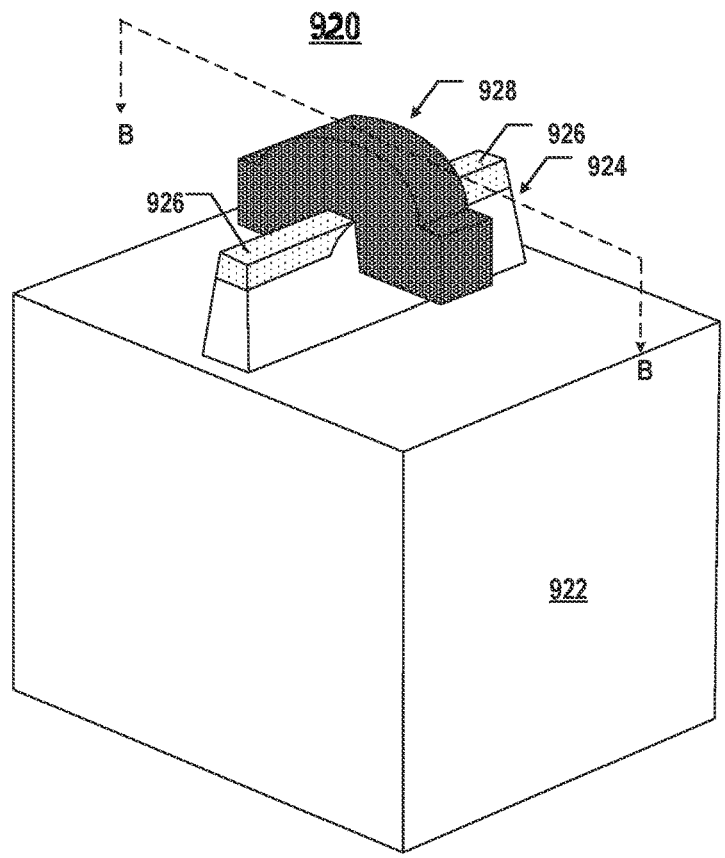
FIGS. 9C and 9D illustrate a perspective view and a side view, respectively, of a 3D transistor, according to some aspects of the present disclosure.
Figure 9D:
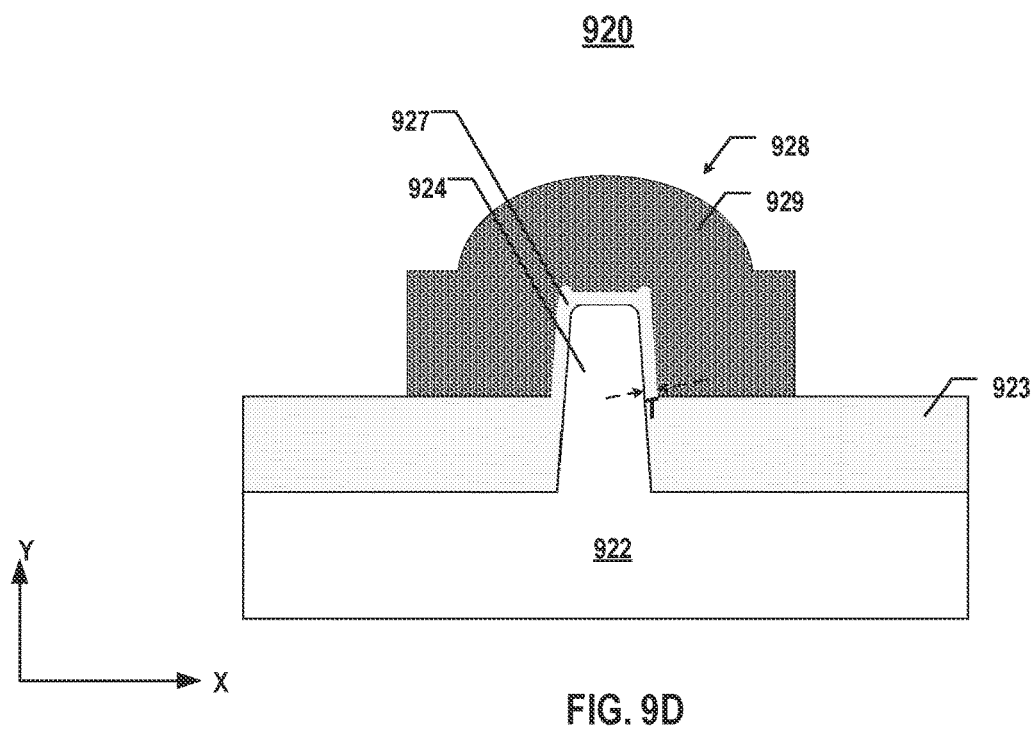

Consistent with the scope of the present disclosure, each peripheral circuit can include a plurality of transistors as the basic building units thereof. The transistors can be metal-oxide-semiconductor field-effect-transistors (MOSFETs) in 2D (2D transistors, a.k.a. planar transistors) or 3D (3D transistors). For example, FIGS. 9A and 9B illustrate a perspective view and a side view, respectively, of a planar transistor 910, according to some aspects of the present disclosure, and FIGS. 9C and 9D illustrate a perspective view and a side view, respectively, of a 3D transistor 920, according to some aspects of the present disclosure. FIG. 9B illustrates the side view of the cross-section of planar transistor 910 in FIG. 9A in the BB plane, and FIG. 9D illustrates the side view of the cross-section of 3D transistor 920 in FIG. 9C in the BB plane.

As shown in FIGS. 9A and 9B, planar transistor 910 can be a MOSFET on a substrate 912, which can include silicon (e.g., single crystalline silicon, c-Si, or polycrystalline silicon), SiGe, GaA), Ge, SOI, or any other suitable materials. Trench isolations 913, such as shallow trench isolations (STI), can be formed in substrate 912 and between adjacent planar transistors 910 to reduce current leakage. Trench isolations 913 can include any suitable dielectric materials, such as silicon oxide, silicon nitride, silicon oxynitride, or high dielectric constant (high-k) dielectrics (e.g., aluminum oxide, hafnium oxide, zirconium oxide, etc.). In some implementations, high-k dielectric materials include any dielectrics having a dielectric constant, or k-value, higher than that of silicon nitride (k>7). In some implementations, trench isolation 913 includes silicon oxide.

As shown in FIGS. 9A and 9B, planar transistor 910 can also include a gate structure 918 on substrate 912. In some implementations, gate structure 918 is on the top surface of substrate 912. As shown in FIG. 9B, gate structure 918 can include a gate dielectric 917 on substrate 912, i.e., above and in contact with the top surface of substrate 912. Gate structure 918 can also include a gate electrode 919 on gate dielectric 917, i.e., above and in contact with gate dielectric 917. Gate dielectric 917 can include any suitable dielectric materials, such as silicon oxide, silicon nitride, silicon oxynitride, or high-k dielectrics. In some implementations, gate dielectric 917 includes silicon oxide, i.e., a gate oxide. Gate electrode 919 can include any suitable conductive materials, such as polysilicon, metals (e.g., W, Cu, Al, etc.), metal compounds (e.g., TiN, TaN, etc.), or silicides. In some implementations, gate electrode 919 includes doped polysilicon, i.e., a gate poly.

As shown in FIG. 9A, planar transistor 910 can further include a pair of a source and a drain 916 in substrate 912. Source and drain 916 can be doped with any suitable P-type dopants, such as boron (B) or Gallium (Ga), or any suitable N-type dopants, such as phosphorus (P) or arsenic (As). Source and drain 916 can be separated by gate structure 918 in the plan view. In other words, gate structure 918 is formed between source and drain 916 in the plan view, according to some implementations. The channel of planar transistor 910 in substrate 912 can be formed laterally between source and drain 916 under gate structure 918 when a gate voltage applied to gate electrode 919 of gate structure 918 is above the threshold voltage of planar transistor 910. As shown in FIGS. 9A and 9B, gate structure 918 can be above and in contact with the top surface of the part of substrate 912 in which the channel can be formed (the active region). That is, gate structure 918 is in contact with only one side of the active region, i.e., in the plane of the top surface of substrate 912, according to some implementations. It is understood, although not shown in FIGS. 9A and 9B, planar transistor 910 may include additional components, such as wells and spacers.

As shown in FIGS. 9C and 9D, 3D transistor 920 can be a MOSFET on a substrate 922, which can include silicon (e.g., single crystalline silicon, c-Si, or polycrystalline silicon), SiGe, GaAs, Ge, silicon on insulator SOI, or any other suitable materials. In some implementations, substrate 922 includes single crystalline silicon or polycrystalline silicon. Trench isolations 923, such as STI, can be formed in substrate 922 and between adjacent 3D transistors 920 to reduce current leakage. Trench isolations 923 can include any suitable dielectric materials, such as silicon oxide, silicon nitride, silicon oxynitride, or high-k dielectrics (e.g., aluminum oxide, hafnium oxide, zirconium oxide, etc.). In some implementations, trench isolation 923 includes silicon oxide.

As shown in FIGS. 9C and 9D, different from planar transistor 910, 3D transistor 920 can further include a 3D semiconductor body 924 above substrate 922. That is, in some implementations, 3D semiconductor body 924 at least partially extends above the top surface of substrate 922 to expose not only the top surface, but also the two side surfaces, of 3D semiconductor body 924. As shown in FIGS. 9C and 9D, for example, 3D semiconductor body 924 may be in a 3D structure, which is also known as a "fin," to expose three sides thereof. 3D semiconductor body 924 is formed from substrate 922 and thus, has the same semiconductor material as substrate 922, according to some implementations. In some implementations, 3D semiconductor body 924 includes single crystalline silicon or polycrystalline silicon. Since the channels can be formed in 3D semiconductor body 924, as opposed to substrate 922, 3D semiconductor body 924 may be viewed as the active region for 3D transistor 920.

As shown in FIGS. 9C and 9D, 3D transistor 920 can also include a gate structure 928 on substrate 922. Different from planar transistors 910 in which gate structure 918 is in contact with only one side of the active region, i.e., in the plane of the top surface of substrate 912, gate structure 928 of 3D transistor 920 can be in contact with a plurality of sides of the active region, i.e., in multiple planes of the top surface and side surfaces of the 3D semiconductor body 924. In other words, the active region of 3D transistor 920, i.e., 3D semiconductor body 924, can be at least partially surrounded by gate structure 928.

Gate structure 928 can include a gate dielectric 927 over 3D semiconductor body 924, e.g., in contact with the top surface and two side surfaces of 3D semiconductor body 924. Gate structure 928 can also include a gate electrode 929 over and in contact with gate dielectric 927. Gate dielectric 927 can include any suitable dielectric materials, such as silicon oxide, silicon nitride, silicon oxynitride, or high-k dielectrics. In some implementations, gate dielectric 927 includes silicon oxide, i.e., a gate oxide. Gate electrode 929 can include any suitable conductive materials, such as polysilicon, metals (e.g., W, Cu, Al, etc.), metal compounds (e.g., TiN, TaN, etc.), or silicides. In some implementations, gate electrode 929 includes doped polysilicon, i.e., a gate poly.

As shown in FIG. 9C, 3D transistor 920 can further include a pair of a source and a drain 926 in 3D semiconductor body 924. Source and drain 926 can be doped with any suitable P-type dopants, such as B or Ga, or any suitable N-type dopants, such as P or Ar. Source and drain 926 can be separated by gate structure 928 in the plan view. In other words, gate structure 928 is formed between source and drain 926 in the plan view, according to some implementations. As a result, multiple channels of 3D transistor 920 in 3D semiconductor body 924 can be formed laterally between source and drain 926 surrounded by gate structure 928 when a gate voltage applied to gate electrode 929 of gate structure 928 is above the threshold voltage of 3D transistor 920. Different from planar transistor 910 in which only a single channel can be formed on the top surface of substrate 912, multiple channels can be formed on the top surface and side surfaces of 3D semiconductor body 924 in 3D transistor 920. In some implementations, 3D transistor 920 includes a multi-gate transistor. It is understood, although not shown in FIGS. 9C, and 9D, 3D transistor 920 may include additional components, such as wells, spacers, and stressors (a.k.a. strain elements) at source and drain 926.

It is further understood that FIGS. 9C and 9D illustrate one example of 3D transistors that can be used in memory peripheral circuits, and any other suitable 3D multi-gate transistors may be used in memory peripheral circuits as well, including, for example, a gate all around (GAA) silicon on nothing (SON) transistor, a multiple independent gate FET (MIGET), a trigate FET, a Π-gate FET, and a Ω-FET, a quadruple gate FET, a cylindrical FET, or a multi-bridge/stacked nanowire FET.

Regardless of planar transistor 910 or 3D transistor 920, each transistor a memory peripheral circuit can include a gate dielectric (e.g., gate dielectrics 917 and 927) having a thickness T (gate dielectric thickness, e.g., shown in FIGS. 9B and 9D). The gate dielectric thickness T of a transistor can be designed to accommodate the voltage applied to the transistor. For example, referring to FIGS. 8B and 8C, the gate dielectric thickness of transistors in HV circuits 866 (e.g., driving circuits 806, 808, 826, 828) may be larger than the gate dielectric thickness of transistors in LV circuits 864 (e.g., page buffer circuits 804, 824, or logic circuits in control logic 812), which may be in turn larger than the gate dielectric thickness of transistors in LLV circuits 862 (e.g., I/O circuits in interface 816 and data bus 818). In some implementations, the difference between the gate dielectric thickness of transistors in HV circuits 866 and the dielectric thickness of transistors in LLV circuits 862 is at least 5-fold, such as between 5-fold and 50-fold. For example, the gate dielectric thickness of transistors in HV circuits 866 may be at least 5 times larger than the gate dielectric thickness of transistors in LLV circuits 862.

In some implementations, the dielectric thickness of transistors in LLV circuits 862 is between 2 nm and 4 nm (e.g., 2 nm, 2.1 nm, 2.2 nm, 2.3 nm, 2.4 nm, 2.5 nm, 2.6 nm, 2.7 nm, 2.8 nm, 2.9 nm, 3 nm, 3.1 nm, 3.2 nm, 3.3 nm, 3.4 nm, 3.5 nm, 3.6 nm, 3.7 nm, 3.8 nm, 3.9 nm, 4 nm, any range bounded by the lower end by any of these values, or in any range defined by any two of these values). It is understood that the thickness may be commensurate with the LLV voltage range applied to LLV circuits 862, as described above in detail, such as below 1.3 V (e.g., 1.2 V). In some implementations, the dielectric thickness of transistors in LV circuits 864 is between 4 nm and 10 nm (e.g., 4 nm, 4.5 nm, 5 nm, 5.5 nm, 6 nm, 6.5 nm, 7 nm, 7.5 nm, 8 nm, 8.5 nm, 9 nm. 9.5 nm, 10 nm, any range bounded by the lower end by any of these values, or in any range defined by any two of these values). It is understood that the thickness may be commensurate with the LV voltage range applied to LV circuits 864, as described above in detail, such as between 1.3 V and 3.3 V (e.g., 3.3 V). In some implementations, the dielectric thickness of transistors in HV circuits 866 is between 20 nm and 100 nm (e.g., 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 45 nm, 50 nm, 55 nm, 60 nm, 65 nm, 70 nm, 75 nm, 80 nm, 85 nm, 90 nm, 95 nm, 100 nm, any range bounded by the lower end by any of these values, or in any range defined by any two of these values). It is understood that the thickness may be commensurate with the HV voltage range applied to HV circuits 866, as described above in detail, such as greater than 3.3 V (e.g., between 5 V and 30 V).

Figure 10:
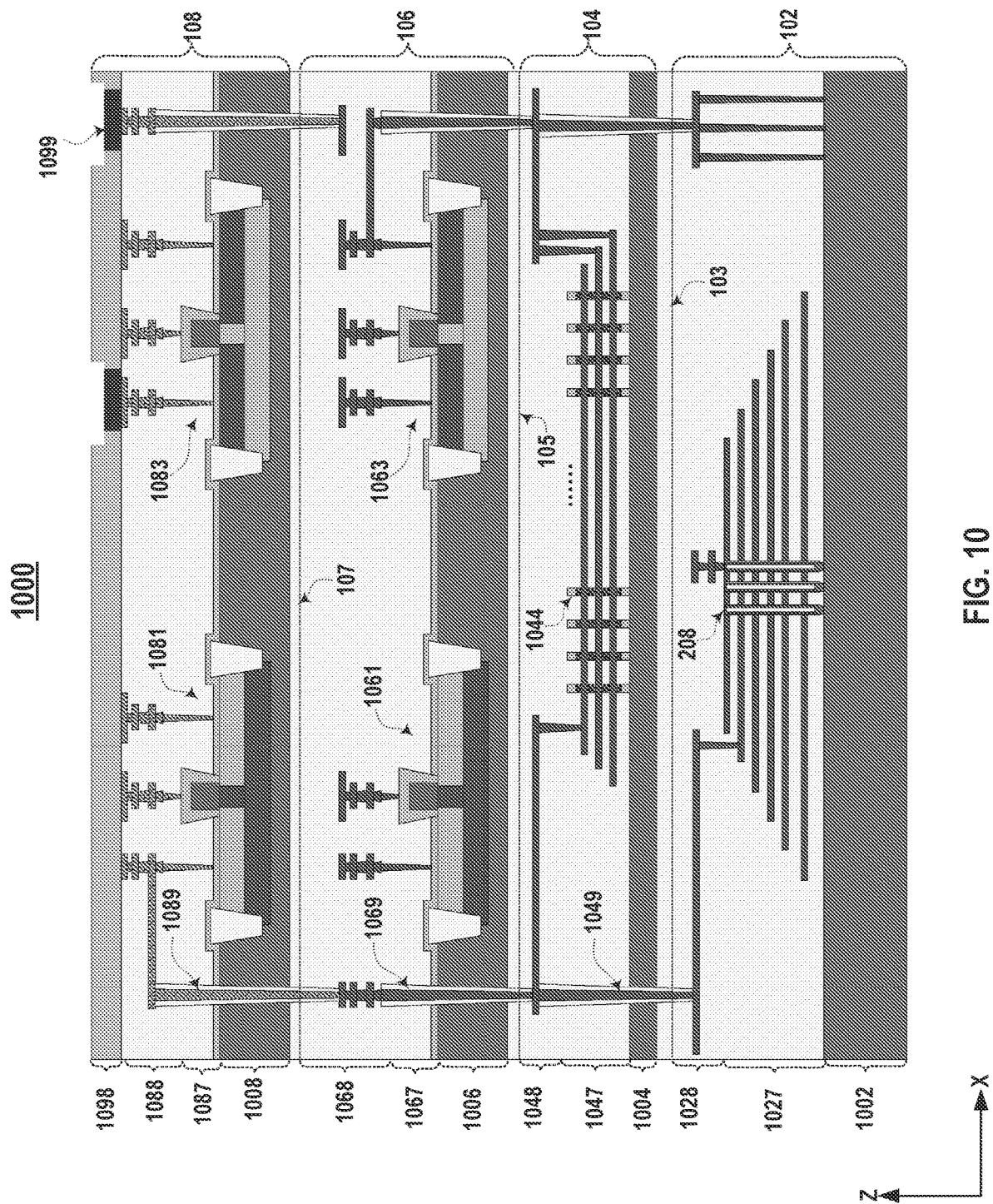
FIG. 10 illustrates a side view of a 3D memory device, according to some aspects of the present disclosure.

FIG. 10 illustrates a schematic diagram of a cross-sectional side view of an exemplary 3D memory device 1000 having four stacked semiconductor structures, according to some aspects of the present disclosure. 3D memory device 1000 may be an example of 3D memory device 100A in FIG. 1A. 3D memory device 1000 is a bonded chip including first semiconductor structure 102, second semiconductor structure 104, third semiconductor structure 106, and fourth semiconductor structure 108, which are stacked over one another in different planes in the vertical direction (e.g., the z-direction in FIG. 10), according to some implementations.

As shown in FIG. 10, second semiconductor structure 104 including the second memory array is bonded vertically between first semiconductor structure 102 including the first memory cell array and third semiconductor structure 106 including the first peripheral circuits, and third semiconductor structure 106 including the first peripheral circuit is bonded vertically between second semiconductor structure 104 including the second memory cell array and fourth semiconductor structure 108 including the second peripheral circuits. In other words, as shown in FIG. 10A, first and second semiconductor structures 102 and 104 including the first and second memory cell arrays are bonded together and disposed on one side of 3D memory device 1000, third and fourth semiconductor structures 106 and 108 including the first and second peripheral circuits are bonded together and disposed on another side of 3D memory device 1000, according to some implementations.

The above-mentioned arrangement of first, second, third, and fourth semiconductor structures 102, 104, 106, and 108, where first semiconductor structure 102 is on one side of 3D memory device 1000, can simplify the fabrication process by using the substrate of first semiconductor structure 102 on which the first memory cell array is formed as the base substrate to provide the support for processes, such as thinning, bonding, contact formation, etc. applied to second, third, and/or fourth semiconductor structures 104, 106, 108 without the need of introducing another handle substrate (carrier wafer). Moreover, the electrical connections between the memory cell arrays and the peripheral circuits in each of second, third, and fourth semiconductor structures 104, 106, 108 can be formed without penetrating the substrate of first semiconductor structure 102 on which the first memory cell array is formed, thereby reducing the wiring length and complexity.

Furthermore, in some implementations, the first memory cell array is a 3D NAND Flash memory cell array. By arranging the first semiconductor structure 102 having the 3D NAND Flash memory cell array on one side of 3D memory device 1000, the substrate (e.g., a silicon substrate having single crystalline silicon or polycrystalline silicon) of first semiconductor structure 102 on which the 3D NAND Flash memory cell array is formed is able to be relatively easily replaced with a semiconductor layer having a different material (e.g., a polysilicon layer), which is suitable for certain channel structures (e.g., bottom open channel structure 312C) of "charge trap" type of NAND memory strings or "floating gate" type of NAND memory strings.

Moreover, as shown in FIG. 10, 3D memory device 1000 can further include a pad-out interconnect layer 1098 for pad-out purposes, i.e., interconnecting with external devices using contact pads on which bonding wires can be soldered. In one example shown in FIG. 10, fourth semiconductor structure 108 including the second peripheral circuit on one side of 3D memory device 1000 may include the pad-out interconnect layer 1098, such that 3D memory device 1000 may be pad-out from the peripheral circuit side to reduce the interconnect distance between contact pads and the peripheral circuits, thereby decreasing the parasitic capacitance from the interconnects and improving the electrical performance of 3D memory device 1000. In another example not shown in the figures, first semiconductor structure 102 including the first memory cell array on another side of 3D memory device 1000 may include the pad-out interconnect layer 1098, such that 3D memory device may be pad-out from the memory cell array side. In yet another example not shown in the figures, fourth semiconductor structure 108 including the second peripheral circuit on one side of 3D memory device 1000 may include a first pad-out interconnect layer 1098, and first semiconductor structure 102 including the first memory cell array on another side of 3D memory device 1000 may include a second pad-out interconnect layer 1098, such that 3D memory device may be pad-out from both the peripheral circuit and the memory cell array side.

As shown in FIG. 10, first semiconductor structure 102 can include semiconductor layer 1002 having semiconductor materials. In some implementations, semiconductor layer 1002 is a silicon substrate having single crystalline silicon or polycrystalline silicon. First semiconductor structure 102 can include a first memory cell array, such as an array of NAND memory strings 208 on semiconductor layer 1002. The sources of NAND memory strings 208 can be in contact with semiconductor layer 1002. In some implementations, NAND memory strings 208 are disposed vertically between bonding interface 103 and semiconductor layer 1002. Each NAND memory string 208 extends vertically through a plurality of pairs each including a conductive layer and a dielectric layer, according to some implementations. The stacked and interleaved conductive layers and dielectric layers are also referred to herein as a stack structure, e.g., a memory stack 1027. Memory stack 1027 may be an example of memory stack 304 in FIGS. 3A-3C, and the conductive layer and dielectric layer in memory stack 1027 may be examples of gate conductive layers 306 and dielectric layer 308, respectively, in memory stack 304. The interleaved conductive layers and dielectric layers in memory stack 1027 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 1027. It is understood that in some examples, trench isolations and doped regions (not shown) may be formed in semiconductor layer 1002 as well.

In some implementations, each NAND memory string 208 is a "charge trap" type of NAND memory string including any suitable channel structures disclosed herein, such as bottom plug channel structure 312A, sidewall plug channel structure 312B, or bottom open channel structure 312C, described above in detail with respect to FIGS. 3A-3C. It is understood that NAND memory strings 208 are not limited to the "charge trap" type of NAND memory strings and may be "floating gate" type of NAND memory strings in other examples.

As shown in FIG. 10, first semiconductor structure 102 can further include an interconnect layer 1028 above and in contact with NAND memory strings 208 to transfer electrical signals to and from NAND memory strings 208. Interconnect layer 1028 can include a plurality of interconnects, (also referred to herein as "contacts"), including lateral lines and vias. As used herein, the term "interconnects" can broadly include any suitable types of interconnects, such as middle-end-of-line (MEOL) interconnects and back-end-of-line (BEOL) interconnects. In some implementations, the interconnects in interconnect layer 1028 also include local interconnects, such as bit line contacts and word line contacts. Interconnect layer 1028 can further include one or more interlayer dielectric (ILD) layers (also known as "intermetal dielectric (IMD) layers") in which the lateral lines and vias can form. The interconnects in interconnect layer 1028 can include conductive materials including, but not limited to W, Co, Cu, Al, silicides, or any combination thereof. The ILD layers in interconnect layer 1028 can include dielectric materials including, but not limited to, silicon oxide, silicon nitride, silicon oxynitride, low dielectric constant (low-k) dielectrics, or any combination thereof. In some implementations, the interconnects in interconnect layer 1028 include W, which has a relatively high thermal budget (compatible with high-temperature processes) and good quality (fewer detects, e.g., voids) among conductive metal materials.

Second semiconductor structure 104 can be bonded on top of first semiconductor structure 102 in a back-to-face manner at bonding interface 103. Second semiconductor structure 104 can include semiconductor layer 1004 having semiconductor materials. In some implementations, semiconductor layer 1004 is a layer of single crystalline silicon or polycrystalline silicon transferred from a silicon substrate or an SOI substrate and attached to the top surface of first semiconductor structure 102 by transfer bonding. In some implementations, bonding interface 103 is disposed vertically between interconnect layer 1028 and semiconductor layer 1004 as a result of transfer bonding, which transfers semiconductor layer 1004 from another substrate and bonds semiconductor layer 1004 onto first semiconductor structure 102 as described below in detail. In some implementations, bonding interface 103 is the place at which interconnect layer 1028 and semiconductor layer 1004 are met and bonded. In practice, bonding interface 103 can be a layer with a certain thickness that includes the top surface of interconnect layer 1028 of first semiconductor structure 102 and the bottom surface of semiconductor layer 1004 of second semiconductor structure 104. In some implementations, dielectric layer(s) (e.g., silicon oxide layer) are formed vertically between bonding interface 103 and semiconductor layer 1004 and/or between bonding interface 103 and interconnect layer 1028 to facilitate the transfer bonding of semiconductor layer 1004 onto interconnect layer 1028. Thus, it is understood that bonding interface 103 may include the surfaces of the dielectric layer(s) in some examples.

As shown in FIG. 10, second semiconductor structure 104 can include a second memory cell array, such as an array of multi-gate DFM cells 1044 on semiconductor layer 1004. In some implementations, each multi-gate DFM cell 1044 can be referred to DFM memory cell 600A/600B described above in connection with FIGS. 6A and 6B, and the array of multi-gate DFM cells can be referred to DFM memory array 700 described above in connection with FIG. 7. The sources of multi-gate DFM cells 1044 can be in contact with semiconductor layer 1004. In some implementations, multigate DFM cells 1044 are disposed vertically between bonding interface 105 and semiconductor layer 1004. Each multi-gate DFM cell 1044 extends vertically through a memory stack 1047 including a plurality of pairs each including a conductive layer and a dielectric layer, according to some implementations. The interleaved conductive layers and dielectric layers alternate in the vertical direction, according to some implementations. Each conductive layer can include a gate electrode surrounded by an adhesive layer and a gate dielectric layer. The gate electrode of the conductive layer can extend laterally as a word line or a plate line, ending at one or more staircase structures of the memory stack 1047. It is understood that in some examples, trench isolations and doped regions (not shown) may be formed in semiconductor layer 1004 as well.

As shown in FIG. 10, second semiconductor structure 104 can further include an interconnect layer 1048 above and in contact with multi-gate DFM cells 1044 to transfer electrical signals to and from multi-gate DFM cells 1044. Interconnect layer 1048 can include a plurality of interconnects, such as MEOL interconnects and BEOL interconnects. In some implementations, the interconnects in interconnect layer 1048 also include local interconnects, such as bit line connections, word line connections, plate line connections, and/or source line connections. Interconnect layer 1048 can further include one or more interlayer dielectric (ILD) layers in which the lateral lines and vias can form. The interconnects in interconnect layer 1048 can include conductive materials including, but not limited to W, Co, Cu, Al, silicides, or any combination thereof. The ILD layers in interconnect layer 1048 can include dielectric materials including, but not limited to, silicon oxide, silicon nitride, silicon oxynitride, low-k dielectrics, or any combination thereof.

As shown in FIG. 10, second semiconductor structure 104 can further include one or more through contacts 1049 extending vertically through semiconductor layer 1004. In some implementations, through contact 1049 couples the interconnects in interconnect layer 1048 to the interconnects in interconnect layer 1028 to make an electrical connection across bonding interface 103 between second and first semiconductor structures 104 and 102. Through contact 1049 can include conductive materials including, but not limited to, W, Co, Cu, Al, silicides, or any combination thereof. In some implementations, through contact 1049 includes W. In some implementations, through contact 1049 includes a via surrounded by a dielectric spacer (e.g., having silicon oxide) to electrically separate the via from semiconductor layer 1004. Depending on the thickness of semiconductor layer 1004, through contact 1049 can be an ILV having a depth in the submicron-level (e.g., between 10 nm and 1 μm), or a TSV having a depth in the micron- or tens micron-level (e.g., between 1 μm and 100 μm).

Third semiconductor structure 106 can be bonded on top of second semiconductor structure 104 in a back-to-face manner at bonding interface 105. Third semiconductor structure 106 can include semiconductor layer 1006 having semiconductor materials. In some implementations, semiconductor layer 1006 is a layer of single crystalline silicon or polycrystalline silicon transferred from a silicon substrate or an SOI substrate and attached to the top surface of second semiconductor structure 104 by transfer bonding. In some implementations, bonding interface 105 is disposed vertically between interconnect layer 1048 and semiconductor layer 1006 as a result of transfer bonding, which transfers semiconductor layer 1006 from another substrate and bonds semiconductor layer 1006 onto second semiconductor structure 104 as described below in detail. In some implementations, bonding interface 105 is the place at which interconnect layer 1048 and semiconductor layer 1006 are met and bonded. In practice, bonding interface 105 can be a layer with a certain thickness that includes the top surface of interconnect layer 1048 of second semiconductor structure 104 and the bottom surface of semiconductor layer 1006 of third semiconductor structure 106. In some implementations, dielectric layer(s) (e.g., silicon oxide layer) are formed vertically between bonding interface 105 and semiconductor layer 1006 and/or between bonding interface 105 and interconnect layer 1048 to facilitate the transfer bonding of semiconductor layer 1006 onto interconnect layer 1048. Thus, it is understood that bonding interface 105 may include the surfaces of the dielectric layer(s) in some examples.

As shown in FIG. 10, third semiconductor structure 106 can also include a device layer 1067 above and in contact with semiconductor layer 1006. In some implementations, device layer 1067 includes a first peripheral circuit 1061 and a second peripheral circuit 1063. First peripheral circuit 1061 can include HV circuits 866, such as driving circuits, and second peripheral circuit 1063 can include LV circuits 864, such as page buffer circuits and logic circuits. In some implementations, first peripheral circuit 1061 includes a plurality of HV transistors in contact with semiconductor layer 1006, and second peripheral circuit 1063 includes a plurality of LV transistors in contact with semiconductor layer 1006. In some implementations, each HV transistor or LV transistor includes a gate dielectric, and the thickness of the gate dielectric of HV transistor (e.g., in HV circuit 866) is larger than the thickness of the gate dielectric of LV transistor (e.g., in LV circuit 864) due to the higher voltage applied to the HV transistor than the LV transistor. Trench isolations (e.g., STIs) and doped regions (e.g., wells, sources, and drains of HV transistors and LV transistors) can be formed on or in semiconductor layer 1006 as well.

In some implementations, third semiconductor structure 106 further includes an interconnect layer 1068 above device layer 1067 to transfer electrical signals to and from peripheral circuits 1061 and 1063. As shown in FIG. 10, interconnect layer 1068 can be vertically between bonding interface 107 and device layer 1067 (including HV transistors and LV transistors of peripheral circuits 1061 and 1063). Interconnect layer 1068 can include a plurality of interconnects, such as MEOL interconnects and BEOL interconnects. The interconnects in interconnect layer 1068 can be coupled to HV transistors and LV transistors of peripheral circuits 1061 and 1063 in device layer 1067. Interconnect layer 1068 can further include one or more ILD layers in which the lateral lines and vias can form. That is, interconnect layer 1068 can include lateral lines and vias in multiple ILD layers. In some implementations, the devices in device layer 1067 are coupled to one another through the interconnects in interconnect layer 1068. For example, peripheral circuit 1061 may be coupled to peripheral circuit 1063 through interconnect layer 1068. The interconnects in interconnect layer 1068 can include conductive materials including, but not limited to, W, Co, Cu, Al, silicides, or any combination thereof. The ILD layers in interconnect layer 1068 can include dielectric materials including, but not limited to, silicon oxide, silicon nitride, silicon oxynitride, low-k dielectrics, or any combination thereof. In some implementations, the interconnects in interconnect layer 1068 include W, which has a relatively high thermal budget (compatible with high-temperature processes) and good quality (fewer detects, e.g., voids) among conductive metal materials.

As shown in FIG. 10, third semiconductor structure 106 can further include one or more through contacts 1069 extending vertically through semiconductor layer 1006. In some implementations, through contact 1069 couples the interconnects in interconnect layer 1068 to the interconnects in interconnect layer 1048 to make an electrical connection across bonding interface 105 between third and second semiconductor structures 106 and 104. Through contact 1069 can include conductive materials including, but not limited to, W, Co, Cu, Al, silicides, or any combination thereof. In some implementations, through contact 1069 includes W. In some implementations, through contact 1069 includes a via surrounded by a dielectric spacer (e.g., having silicon oxide) to electrically separate the via from semiconductor layer 1006. Depending on the thickness of semiconductor layer 1006, through contact 1069 can be an ILV having a depth in the submicron-level (e.g., between 10 nm and 1 μm), or a TSV having a depth in the micron- or tens micron-level (e.g., between 1 μm and 100 μm).

Fourth semiconductor structure 108 can be bonded on top of third semiconductor structure 106 in a back-to-face manner at bonding interface 107. Fourth semiconductor structure 108 can include semiconductor layer 1008 having semiconductor materials. In some implementations, semiconductor layer 1008 is a layer of single crystalline silicon or polycrystalline silicon transferred from a silicon substrate or an SOI substrate and attached to the top surface of third semiconductor structure 106 by transfer bonding. In some implementations, bonding interface 107 is disposed vertically between interconnect layer 1068 and semiconductor layer 1008 as a result of transfer bonding, which transfers semiconductor layer 1008 from another substrate and bonds semiconductor layer 1008 onto third semiconductor structure 106 as described below in detail. In some implementations, bonding interface 107 is the place at which interconnect layer 1068 and semiconductor layer 1008 are met and bonded. In practice, bonding interface 107 can be a layer with a certain thickness that includes the top surface of interconnect layer 1068 of third semiconductor structure 106 and the bottom surface of semiconductor layer 1008 of fourth semiconductor structure 108. In some implementations, dielectric layer(s) (e.g., silicon oxide layer) are formed vertically between bonding interface 107 and semiconductor layer 1008 and/or between bonding interface 107 and interconnect layer 1068 to facilitate the transfer bonding of semiconductor layer 1008 onto interconnect layer 1068. Thus, it is understood that bonding interface 107 may include the surfaces of the dielectric layer(s) in some examples.

Fourth semiconductor structure 108 can include a device layer 1087 above and in contact with semiconductor layer 1008. In some implementations, device layer 1087 includes a third peripheral circuit 1081 and a fourth peripheral circuit 1083. Third peripheral circuit 1081 can include LLV circuits 862, such as I/O circuits, and fourth peripheral circuit 1083 can include LV circuits 864, such as page buffer circuits and logic circuits. In some implementations, third peripheral circuit 1081 includes a plurality of LLV transistors, and fourth peripheral circuit 1083 includes a plurality of LV transistors as well. In some implementations, each LLV and LV transistor includes a gate dielectric, and the thickness of the gate dielectric of LLV transistor (e.g., in LLV circuit 862) is smaller than the thickness of the gate dielectric of LV transistor (e.g., in LV circuit 864) due to the lower voltage applied to the LLV transistor than the LV transistor. Trench isolations (e.g., STIs) and doped regions (e.g., wells, sources, and drains of the LL V transistor and the LV transistor can be formed on or in semiconductor layer 1008 as well.

Moreover, the different voltages applied to different HV transistors, LV transistors, and LLV transistors in third and fourth semiconductor structures 106 and 108 can lead to differences in device dimensions between second and third semiconductor structures 106 and 108. In some implementations, the thickness of the gate dielectric of HV transistor (e.g., in HV circuit 866) is larger than the thickness of the gate dielectric of LLV transistor (e.g., in LLV circuit 862) due to the higher voltage applied to the HV transistor than the LLV transistor. In some implementations, the thickness of the gate dielectric of the LV transistor (e.g., in LV circuit 864) in fourth semiconductor structure 108 is the same as the thickness of the gate dielectric of the LV transistor (e.g., in LV circuit 864) in third semiconductor structure 106 due to the same operation voltage. In some implementations, the thickness of semiconductor layer 1006 in which the HV transistor (e.g., in HV circuit 866) is formed is larger than the thickness of semiconductor layer 1008 in which the LLV transistor (e.g., in LLV circuit 862) is formed due to the higher voltage applied to the HV transistor than the LL V transistor.

As shown in FIG. 10, fourth semiconductor structure 108 can further include an interconnect layer 1088 above device layer 1087 to transfer electrical signals to and from peripheral circuits 1081 and 1083. As shown in FIG. 10, device layer 1087 (including HV transistors and LV transistors of peripheral circuits 1081 and 1083) can be vertically between bonding interface 107 and interconnect layer 1088. Interconnect layer 1088 can include a plurality of interconnects coupled to the HV transistors of peripheral circuit 1081 and the LV transistors of peripheral circuit 1083 in device layer 1087. Interconnect layer 1088 can further include one or more ILD layers in which the interconnects can form. That is, interconnect layer 1088 can include lateral lines and vias in multiple ILD layers. In some implementations, the devices in device layer 1087 are coupled to one another through the interconnects in interconnect layer 1088. For example, peripheral circuit 1081 may be coupled to peripheral circuit 1083 through interconnect layer 1088. The interconnects in interconnect layer 1088 can include conductive materials including, but not limited to, W, Co, Cu, Al, silicides, or any combination thereof. The ILD layers in interconnect layer 1088 can include dielectric materials including, but not limited to, silicon oxide, silicon nitride, silicon oxynitride, low-k dielectrics, or any combination thereof.

In some implementations, the interconnects in interconnect layer 1088 include Cu, which has a relatively low resistivity (better electrical performance) among conductive metal materials. As described below with respect to the fabrication process, although Cu has a relatively low thermal budget (incompatible with high-temperature processes), since the fabrication of interconnect layer 1088 can occur after the high-temperature processes in forming device layers 1067 and 1087 in third and fourth semiconductor structures 106 and 108, as well as after the high-temperature processes in forming first and second semiconductor structures 102 and 104, the interconnects of interconnect layer 1088 having Cu can become feasible. In some implementations, the interconnects in interconnect layer 1088 include Cu as the conductive metal material, but not other conductive metal materials, such as W.

As shown in FIG. 10, fourth semiconductor structure 108 can further include one or more through contacts 1089 extending vertically through semiconductor layer 1008. In some implementations, through contact 1089 couples the interconnects in interconnect layer 1088 to the interconnects in interconnect layer 1068 to make an electrical connection across bonding interface 107 between third and fourth semiconductor structures 106 and 108. Through contact 1089 can include conductive materials including, but not limited to, W, Co, Cu, Al, silicides, or any combination thereof. In some implementations, through contact 1089 includes Cu. For example, through contact 1089 may include Cu as the conductive metal material, but not other conductive metal materials, such as W. In some implementations, through contact 1089 includes a via surrounded by a dielectric spacer (e.g., having silicon oxide) to electrically separate the via from semiconductor layer 1008. Depending on the thickness of semiconductor layer 1008, through contact 1089 can be an ILV having a depth in the submicron-level (e.g., between 10 nm and 1 μm), or a TSV having a depth in the micron- or tens micron-level (e.g., between 1 μm and 100 μm).

As shown in FIG. 10, fourth semiconductor structure 108 can further include a pad-out interconnect layer 1098 above and in contact with interconnect layer 1088. In some implementations, interconnect layer 1088 is disposed vertically between pad-out interconnect layer 1098 and device layer 1087 including peripheral circuits 1081 and 1083. Pad-out interconnect layer 1098 can include interconnects, e.g., contact pads 1099, in one or more ILD layers. In some implementations, the interconnects in pad-out interconnect layer 1098 can transfer electrical signals between 3D memory device 1000 and external devices, e.g., for pad-out purposes.

As a result, peripheral circuits 1061, 1063, 1081, and 1083 in third and fourth semiconductor structures 106 and 108 can be coupled to NAND memory strings 208 in first semiconductor structure 102 and multi-gate DFM cells 1044 in second semiconductor structure 104 through various interconnection structures, including interconnect layers 1088, 1068, 1048, and 1028, as well as through contacts 1089, 1069, and 1049. Moreover, peripheral circuits 1081, 1083, 1061, and 1063, as well as NAND memory strings 208 and multi-gate DFM cells 1044 in 3D memory device 1000 can be further coupled to external devices through pad-out interconnect layer 1098.

It is understood that the pad-out of 3D memory devices is not limited to from fourth semiconductor structure 108 having peripheral circuits 1081 and 1083 as shown in FIG. 10 and may be from first semiconductor structure 102 having NAND memory strings 208. For example, although not shown in the figures, 3D memory device 1000 may include pad-out interconnect layer 1098 in first semiconductor structure 102. Pad-out interconnect layer 1098 can be in contact with semiconductor layer 1002 of first semiconductor structure 102 on which NAND memory strings 208 are formed. In some implementations, first semiconductor structure 102 further includes one or more through contacts (not shown) extending vertically through semiconductor layer 1002. In some implementations, the through contact penetrating semiconductor layer 1002 can be coupled with the interconnects in interconnect layer 1028 in first semiconductor structure 102 to contact pads 1099 in pad-out interconnect layer 1098 to make an electrical connection through semiconductor layer 1002. In some other implementations, the pad-out of 3D memory devices can be from both sides of 3D memory devices. That is, a first pad-out interconnect layer can be formed in fourth semiconductor structure 108 having peripheral circuits 1081 and 1083, and a second pad-out interconnect layer can be formed in first semiconductor structure 102 having NAND memory strings 208. It is also understood that, although not shown in FIG. 10, it is understood that in some examples, bonding interface(s) 103, 105, or 107 may result from hybrid bonding and thus, be disposed vertically between two bonding layers each including bonding contacts in corresponding semiconductor structure, respectively, as described above in detail.

Figure 11:
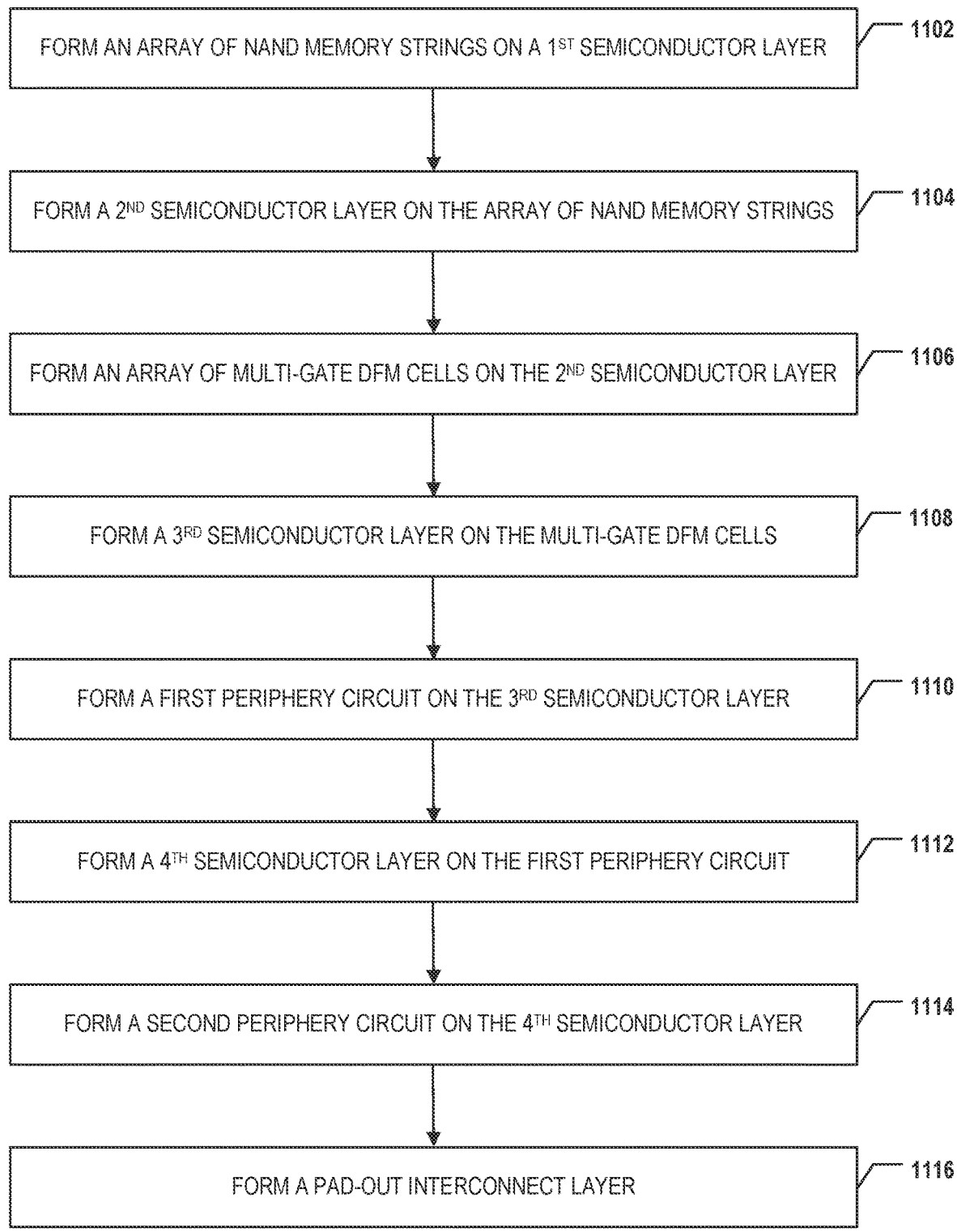
FIG. 11 illustrates a flowchart of a method for forming the 3D memory device in FIG. 10, according to some aspects of the present disclosure.

FIG. 11 illustrates a flowchart of a method 1100 for forming the 3D memory device 1000 shown in FIG. 10, according to some aspects of the present disclosure. FIGS. 12A-12G illustrate the 3D memory device 1000 at certain stages of the fabrication process of method 1100 as shown in FIG. 11, according to some aspects of the present disclosure. It is understood that the operations shown in method 1100 are not exhaustive and that other operations can be performed as well before, after, or between any of the illustrated operations. Further, some of the operations may be performed simultaneously, or in a different order than shown in FIG. 11.

Referring to FIG. 11, method 1100 starts at operation 1102, in which a first semiconductor structure including an array of NAND memory strings disposed on a first semiconductor layer can be formed. The first semiconductor layer can be a silicon substrate having single crystalline silicon or polycrystalline silicon. In some implementations, to form the array of NAND memory strings, a first memory stack is formed on the first semiconductor layer.

Figure 12A:
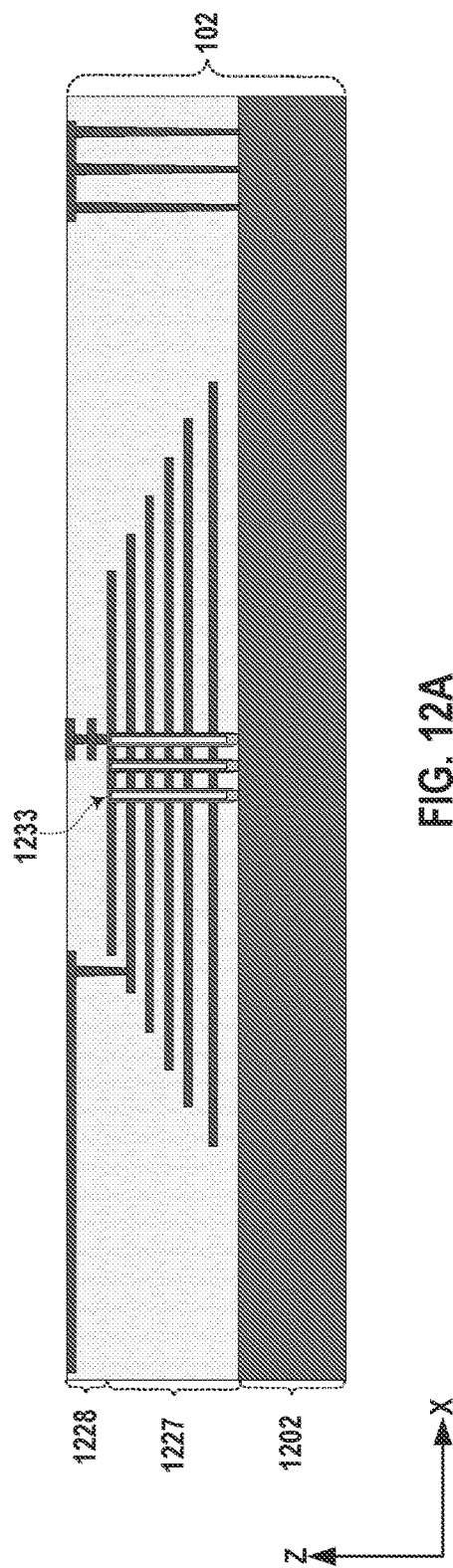
FIGS. 12A-12G illustrate a fabrication process for forming the 3D memory device in FIG. 10, according to some aspects of the present disclosure.

As illustrated in FIG. 12A, a first stack structure, such as a first memory stack 1227 including interleaved conductive layers and dielectric layers, is formed on a silicon substrate 1202. To form first memory stack 1227, in some implementations, a dielectric stack (not shown) including interleaved sacrificial layers (not shown) and the dielectric layers is formed on silicon substrate 1202. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. First memory stack 1227 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that first memory stack 1227 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between first memory stack 1227 and silicon substrate 1202.

As illustrated in FIG. 12A, NAND memory strings 1233 are formed above silicon substrate 1202, each of which extends vertically through first memory stack 1227 to be in contact with silicon substrate 1202. In some implementations, fabrication processes to form NAND memory string 1233 include forming a channel hole through first memory stack 1227 (or the dielectric stack) and into silicon substrate 1202 using dry etching/and or wet etching, such as deep reactive-ion etching (DRIE), followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 1233 may vary depending on the types of channel structures of NAND memory strings 1233 (e.g., bottom plug channel structure 312A, sidewall plug channel structure 312B, or bottom open channel structure 312C in FIGS. 3A-3C) and thus, are not elaborated for ease of description.

In some implementations, an interconnect layer is formed above the array of NAND memory strings on the first semiconductor layer. The interconnect layer can include a first plurality of interconnects in one or more ILD layers. As illustrated in FIG. 12A, an interconnect layer 1228 is formed above first memory stack 1227 and NAND memory strings 1233. Interconnect layer 1228 can include interconnects of MEOL and/or BEOL in a plurality of ILD layers to make electrical connections with NAND memory strings 1233 and/or silicon substrate 1202. In some implementations, interconnect layer 1228 includes multiple ILD layers and interconnects therein formed in multiple processes. For example, the interconnects in interconnect layer 1228 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 12A can be collectively referred to as interconnect layer 1228.

Method 1100 proceeds to operation 1104, as illustrated in FIG. 11, in which a second semiconductor layer is formed above the array of NAND memory strings. The second semiconductor layer can include single crystalline silicon or polycrystalline silicon. In some implementations, to form the second semiconductor layer, a second substrate and the first semiconductor structure 102 are bonded in a face-to-face manner, and the second substrate is thinned to leave the second semiconductor layer. The bonding can include transfer bonding. The second substrate can be a silicon substrate having single crystalline silicon or polycrystalline silicon.

Figure 12B:
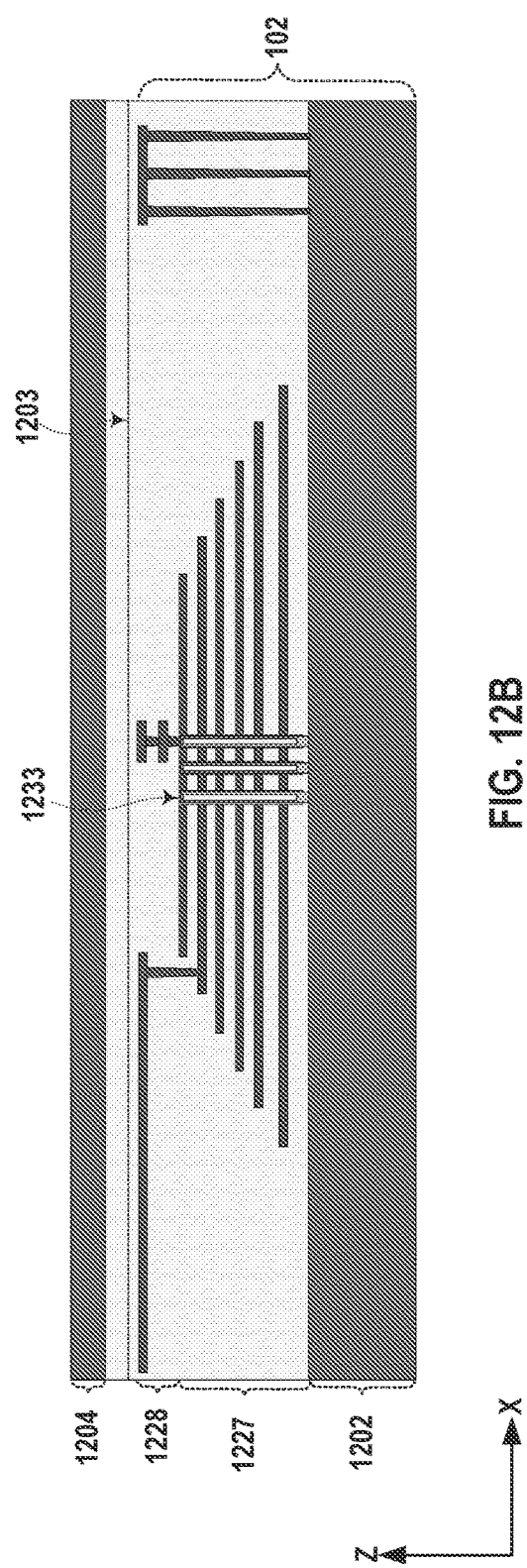

As illustrated in FIG. 12B, a semiconductor layer 1204, such as a single crystalline silicon layer or a polycrystalline silicon layer, is formed above interconnect layer 1228 and NAND memory strings 1233. Semiconductor layer 1204 can be attached above interconnect layer 1228 to form a bonding interface 1203 vertically between semiconductor layer 1204 and interconnect layer 1228. In some implementations, to form semiconductor layer 1204, a second silicon substrate (not shown in FIG. 12B) and first semiconductor structure 102 are bonded in a face-to-face manner (having the components formed on semiconductor layer 1002, such as NAND memory strings 1233, facing toward the second silicon substrate) using transfer bonding, thereby forming bonding interface 1203. The second silicon substrate can then be thinned using any suitable processes to leave semiconductor layer 1204 attached above interconnect layer 1228. The same "face-to-face" manner as described above is applied throughout the present disclosure in describing other figures.

Figure 31A:
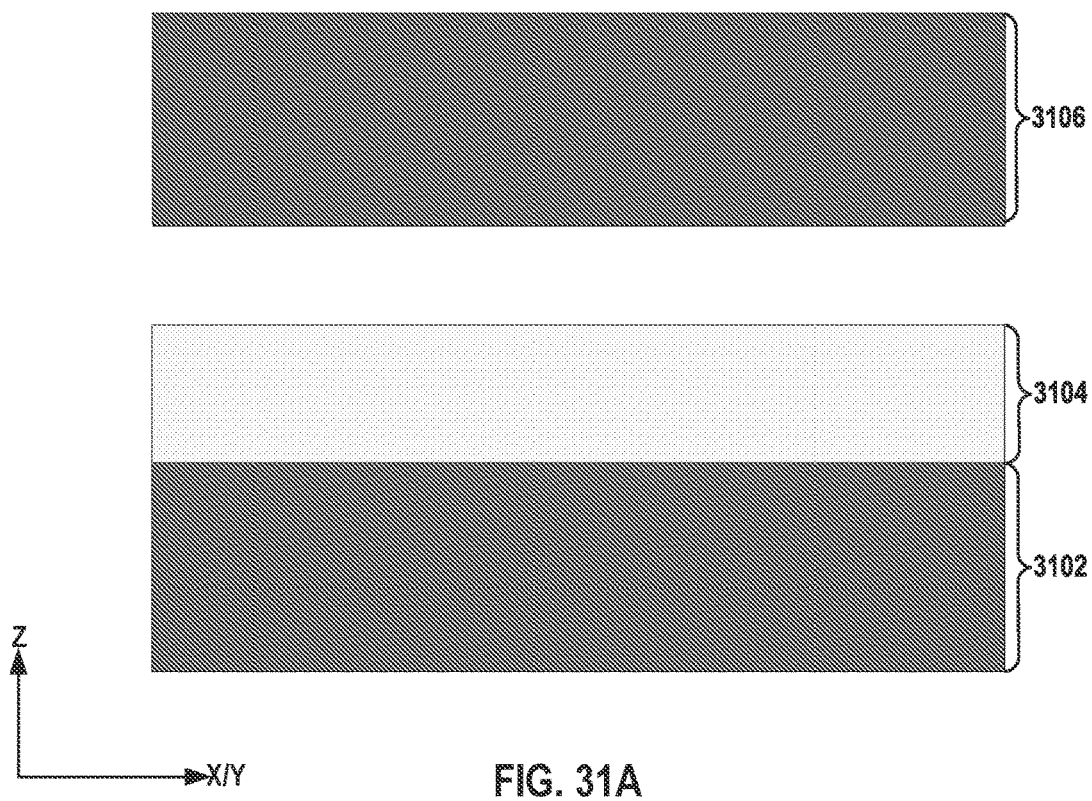
FIGS. 31A-31D illustrate a fabrication process of transfer bonding, according to some aspects of the present disclosure.
Figure 31B:
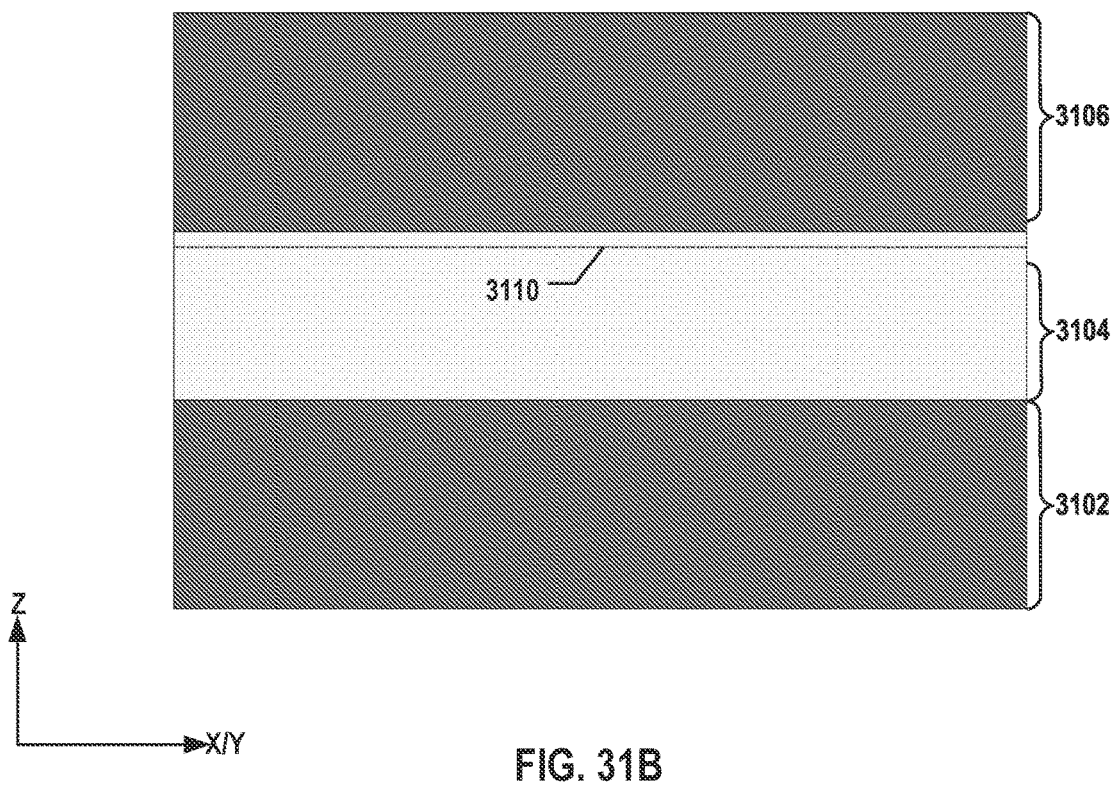

FIGS. 31A-31D illustrate a fabrication process of transfer bonding, according to some aspects of the present disclosure. As illustrated in FIG. 31A, a function layer 3104 can be formed on a base substrate 3102. Function layer 3104 can include device layers, interconnect layers, and/or any suitable layers disclosed herein. A transfer substrate 3106, such as a silicon substrate having single crystalline silicon or polycrystalline silicon, is provided. In some implementations, transfer substrate 3106 is a single crystalline silicon substrate or a polycrystalline silicon substrate. As illustrated in FIG. 31B, transfer substrate 3106 and base substrate 3102 (and function layer 3104 formed thereon) can be bonded in a face-to-face manner using any suitable substrate/wafer bonding processes including, for example, anodic bonding and fusion (direct) bonding, thereby forming a bonding interface 3110 between transfer substrate 3106 and base substrate 3102. In one example, fusion bonding may be performed between layers of silicon and silicon, silicon and silicon oxide, or silicon oxide and silicon oxide with pressure and heat. In another example, anodic bonding may be performed between layers of silicon oxide (in an ionic glass) and silicon with voltage, pressure, and heat. It is understood that depending on the bonding process, dielectric layers (e.g., silicon oxide layers) may be formed on one or both sides of bonding interface 3110. For example, silicon oxide layers may be formed on the top surfaces of both transfer substrate 3106 and function layer 3104 to allow $SiO_2$—$SiO_2$ bonding using fusion bonding. Or silicon oxide layer may be formed only on function layer 3104 to allow $SiO_2$—Si bonding using anodic bonding or fusion bonding. In some implementations in which a silicon oxide layer is formed on transfer substrate 3106 (e.g., shown in FIG. 31B), transfer substrate 3106 can be flipped upside, such that the silicon oxide layer on transfer substrate 3106 faces down toward base substrate 3102 before the bonding.

Figure 31C:
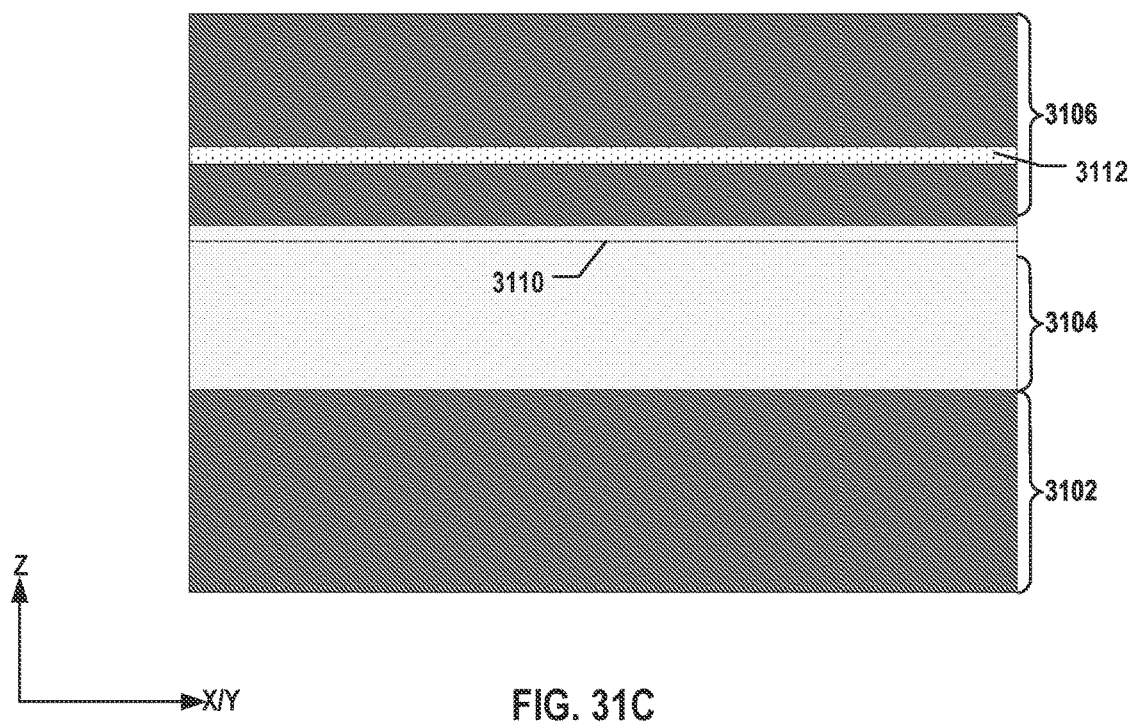
Figure 31D:
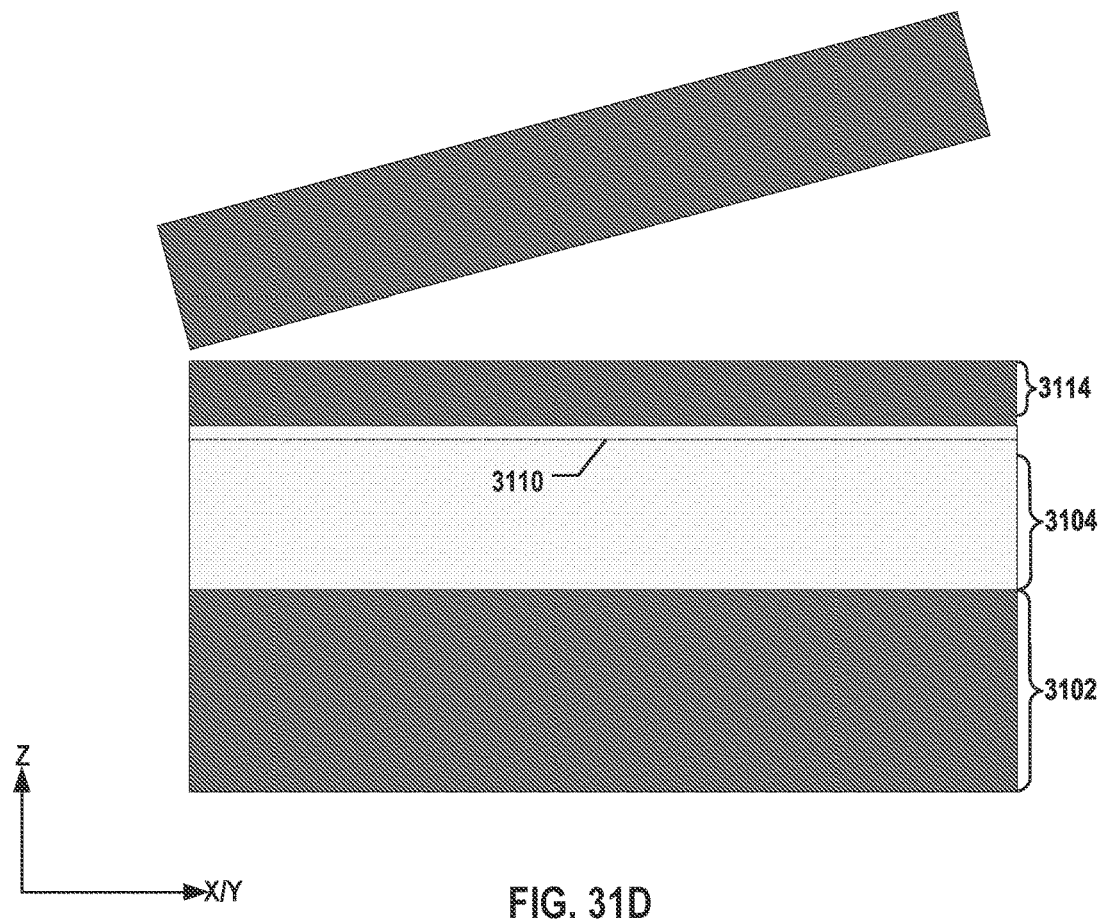

As illustrated in FIG. 31C, a cut layer 3112 can be formed in transfer substrate 3106, for example, using ion implantation. In some implementations, light elements, such as hydrogen ions, are implanted into transfer substrate 3106 to a desired depth, for example, by controlling the energy of the ion impanation process, to form cut layer 3112. As illustrated in FIG. 31D, transfer substrate 3106 can be thinned to leave only a semiconductor layer 3114 vertically between cut layer 3112 and bonding interface 3110. In some implementations, transfer substrate 3106 is split at cut layer 3112 by applying a mechanical force to transfer substrate 3106, i.e., peeling off the remainder of transfer substrate 3106 from semiconductor layer 3114. It is understood that transfer substrate 3106 may be split at cut layer 3112 by any suitable means, not limited to mechanical force alone, such as thermal means, acoustic means, optical means, etc., or any combination thereof. As a result, semiconductor layer 3114 can be transferred from transfer substrate 3106 and bonded onto base substrate 3102 (and function layer 3104) using a transfer bonding process. In some implementations, a planarization process, such as chemical mechanical polishing (CMP), is performed on semiconductor layer 3112 to polish and smooth the top surface of semiconductor layer 3112 and adjust the thickness of semiconductor layer 3112. Semiconductor layer 3114 thus can have the same material as transfer substrate 3106, such as single crystalline silicon or polycrystalline silicon. The thickness of semiconductor layer FIG. 25gfg can be determined by the depth of cut layer 3112, for example, by adjusting the implantation energy, and/or by the planarization process. Moreover, the remainder of transfer substrate 3106 can be re-used in the same manner to form semiconductor layers bonded onto other base substrates, thereby reducing the material cost of the transfer bonding process.

Figure 32A:
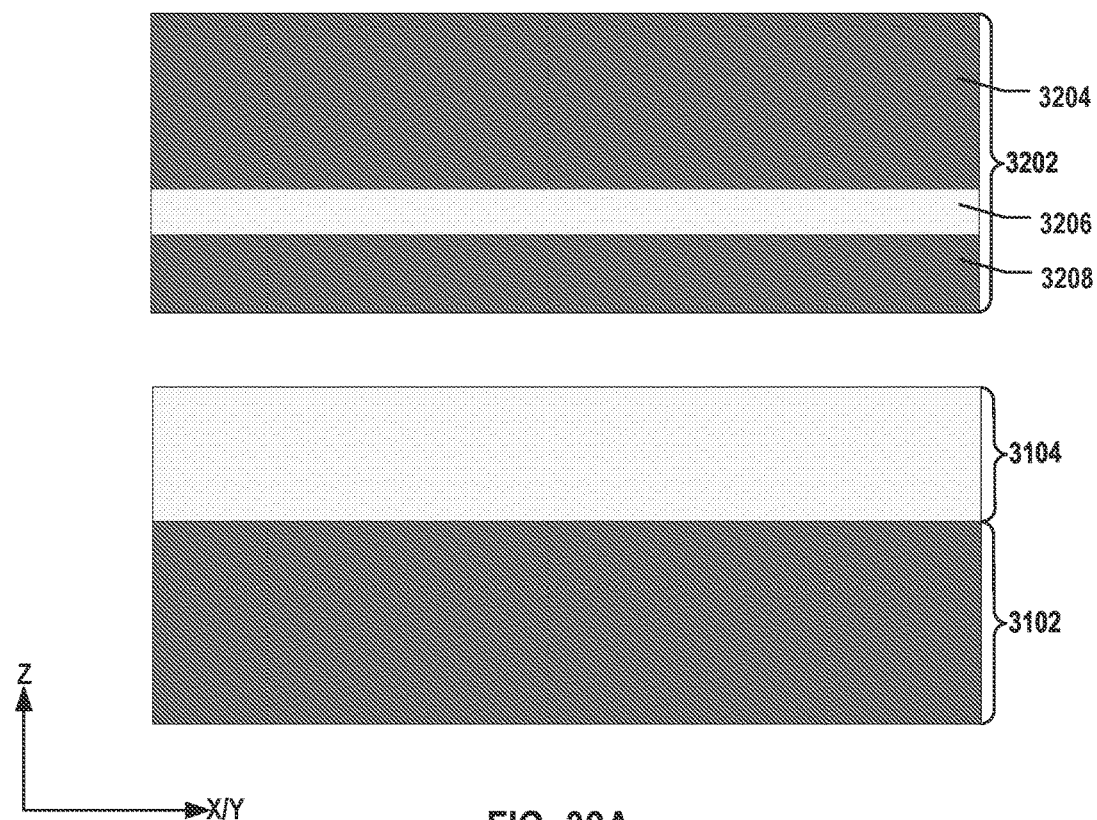
FIGS. 32A-32D illustrate another fabrication process of transfer bonding, according to some aspects of the present disclosure.
Figure 32B:
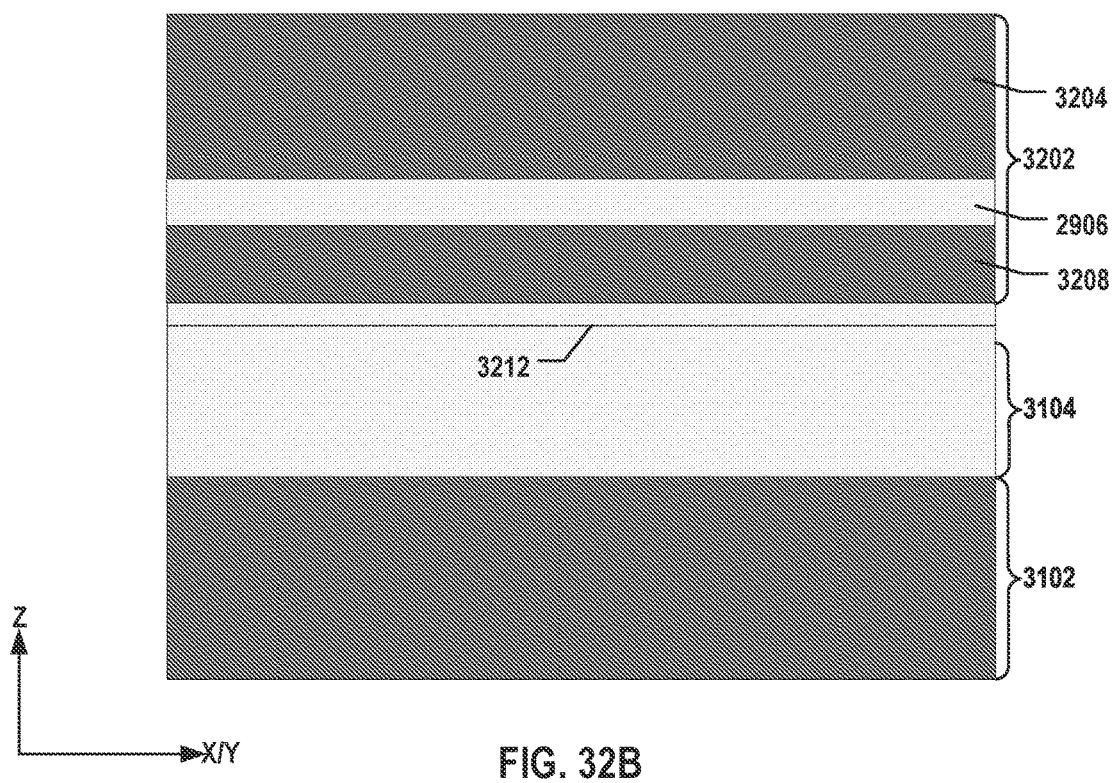

FIGS. 32A-32D illustrate another fabrication process of transfer bonding, according to some aspects of the present disclosure. As illustrated in FIG. 32A, function layer 3104 can be formed on base substrate 3202. Function layer 3204 can include device layers, interconnect layers, and/or any suitable layers disclosed herein. An SOI substrate 3202, including a base/handle layer 3204, a buried oxide layer (BOX) 3206, and a device layer 3208, can be flipped upside down facing toward base substrate 3102. As illustrated in FIG. 32B, SOI substrate 3202 and base substrate 3102 (and function layer 3104 formed thereon) can be bonded in a face-to-face manner using any suitable substrate/wafer bonding processes including, for example, anodic bonding and fusion (direct) bonding, thereby forming a bonding interface 3212 between SOI substrate 3202 and base substrate 3102. In one example, fusion bonding may be performed between layers of silicon and silicon, silicon and silicon oxide, or silicon oxide and silicon oxide with pressure and heat. In another example, anodic bonding may be performed between layers of silicon oxide (in an ionic glass) and silicon with voltage, pressure, and heat. It is understood that depending on the bonding process, dielectric layers (e.g., silicon oxide layers) may be formed on one or both sides of bonding interface 3212. For example, silicon oxide layers may be formed on the top surfaces of both SOI substrate 3202 and function layer 3104 to allow $SiO_2$—$SiO_2$ bonding using fusion bonding. Or silicon oxide layer may be formed only on function layer 3104 to allow $SiO_2$—Si bonding using anodic bonding or fusion bonding.

Figure 32C:
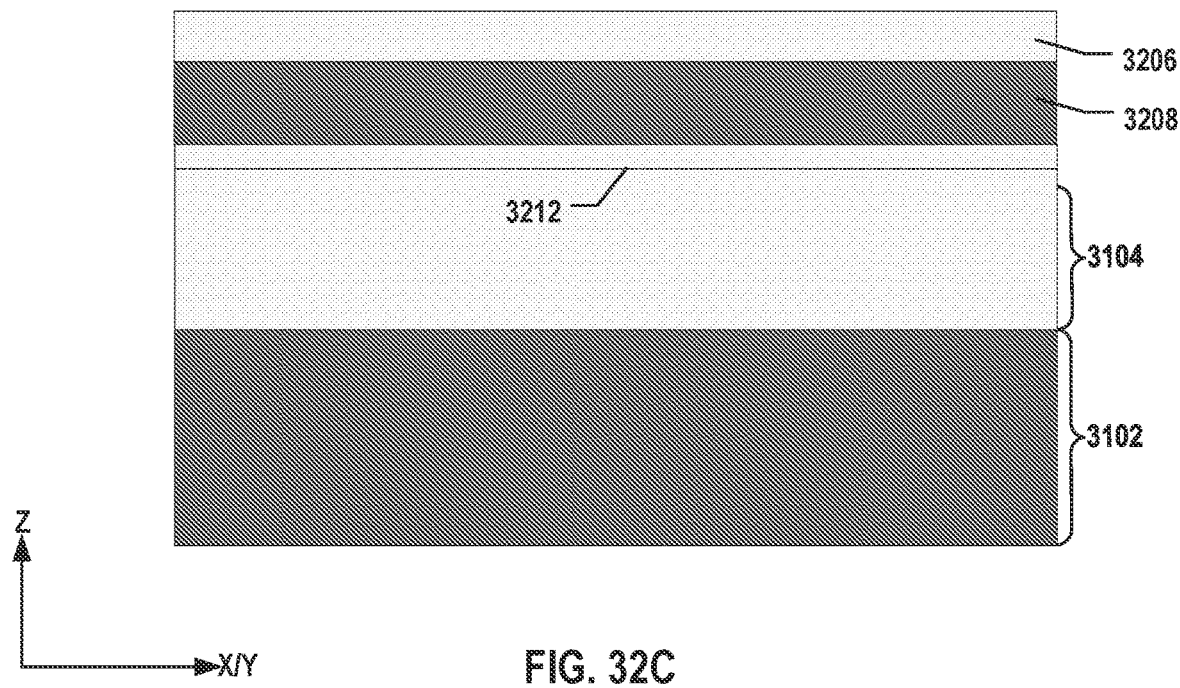
Figure 32D:
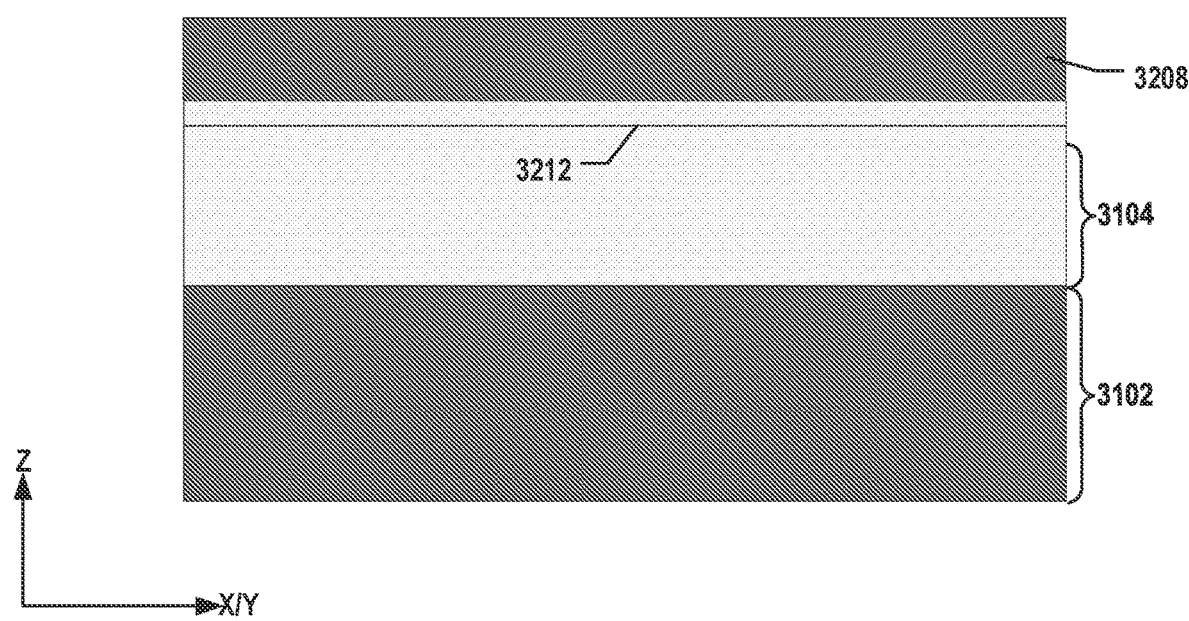

As illustrated in FIGS. 32C and 32D, SOI substrate 3202 (shown in FIG. 32B) can be thinned by sequentially removing base/handle layer 3204 and buried oxide layer 3206, for example, using wet/dry etching and/or CMP processes, to leave only device layer 3208 (as a semiconductor layer) at bonding interface 3212. As a result, device layer 3208 can be transferred from SOI substrate 3202 and bonded onto base substrate 3102 (and function layer 3104) as a semiconductor layer using another transfer bonding process. The transferred semiconductor layer thus can have the same material as device layer 3208, such as single crystalline silicon or polycrystalline silicon. The thickness of the semiconductor layer can be the same as the thickness of device layer 3208. It is understood that in some examples, device layer 3208 may be further thinned using wet/dry etching and/or CMP processes, such that the transferred semiconductor layer may be thinned than device layer 3208.

Referring to FIG. 11, method 1100 proceeds to operation 1106 in which a second semiconductor structure including an array of multi-gate DFM cells disposed on the second semiconductor layer can be formed. In some implementations, to form the array of multi-gate DFM cells, a second memory stack is formed on the second semiconductor layer.

Figure 12C:
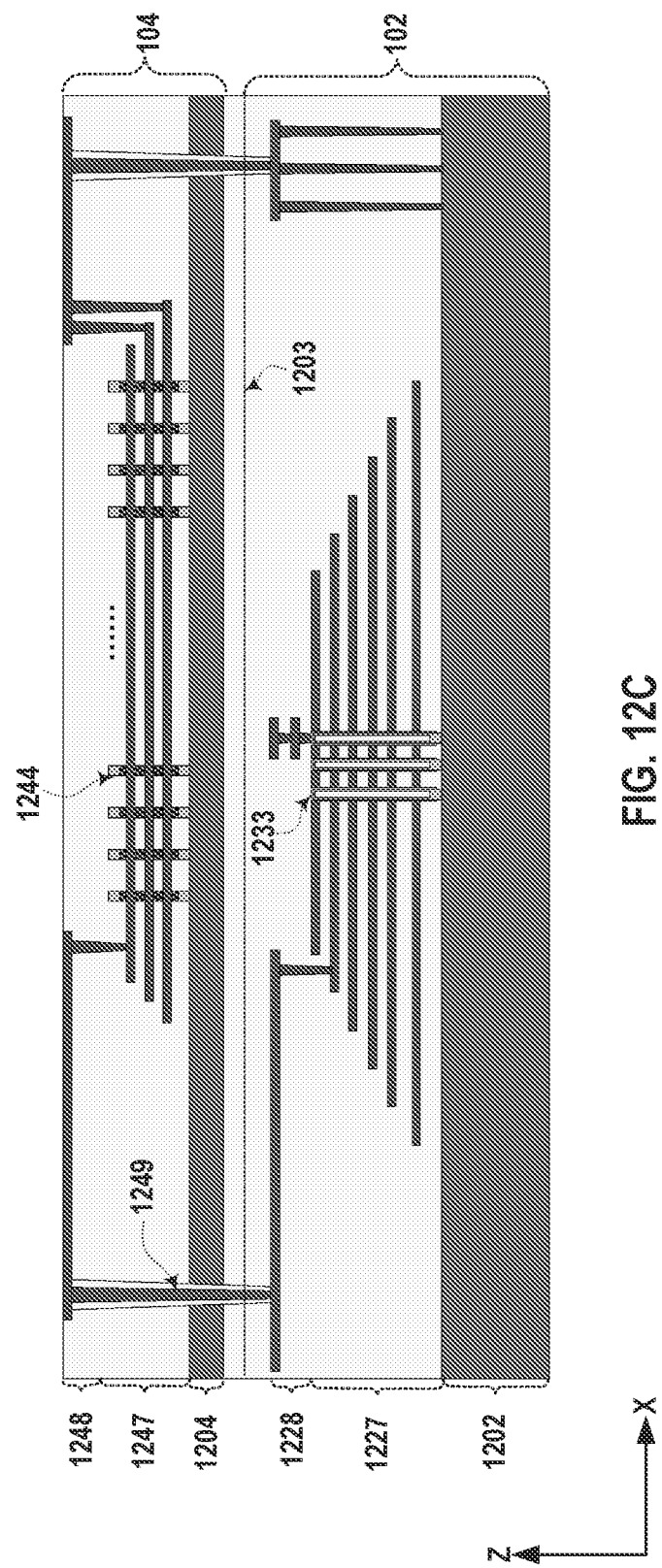

As illustrated in FIG. 12C, a second stack structure, such as a second memory stack 1247 including interleaved conductive layers and dielectric layers, is formed on semiconductor layer 1204. To form second memory stack 1227, in some implementations, a dielectric stack (not shown) including interleaved sacrificial layers (not shown) and the dielectric layers is formed on semiconductor layer 1204. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Second memory stack 1247 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that second memory stack 1247 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between second memory stack 1247 and semiconductor layer 1204.

As illustrated in FIG. 12C, a plurality of multi-gate DFM cells 1244 are formed above semiconductor layer 1204, each of which extends vertically through second memory stack 1247 to be in contact with semiconductor layer 1204. In some implementations, fabrication processes to form multi-gate DFM cells 1244 include forming a channel hole through second memory stack 1247 (or the dielectric stack) to expose semiconductor layer 1204 using dry etching/and or wet etching, such as DRIE, followed by subsequently filling the channel hole with one or more layers, such as a dielectric spacer layer and a semiconductor layer, using thin film deposition processes such as ALD, CVD, PVD, or any combination thereof.

In some implementations, an interconnect layer is formed above the multi-gate DFM cells on the second semiconductor layer. The interconnect layer can include a first plurality of interconnects in one or more ILD layers. As illustrated in FIG. 12C, an interconnect layer 1248 is formed above second memory stack 1247 and multi-gate DFM cells 1244. Interconnect layer 1248 can include interconnects of MEOL and/or BEOL in a plurality of ILD layers to make electrical connections with multi-gate DFM cells 1244 and/or semiconductor layer 1204. In some implementations, interconnect layer 1248 includes multiple ILD layers and interconnects therein formed in multiple processes. For example, the interconnects in interconnect layer 1248 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 12C can be collectively referred to as interconnect layer 1248.

In some implementations, a through contact penetrating the second semiconductor layer is formed. As illustrated in FIG. 12C, one or more through contacts 1249 each extending vertically through semiconductor layer 1204 can be formed. Through contacts 1249 can couple the interconnects in interconnect layers 1248 and 1228. Through contacts 1249 can be formed by first patterning contact holes through semiconductor layer 1204 using patterning process (e.g., photolithography and dry/wet etch processes). The contact holes can be filled with a conductor material (e.g., W or Cu). In some implementations, filling the contact holes includes depositing a spacer (e.g., a silicon oxide layer) before depositing the conductor material.

Method 1100 proceeds to operation 1108, as illustrated in FIG. 11, in which a third semiconductor layer is formed above the array of multi-gate DFM cells. The third semiconductor layer can include single crystalline silicon or polycrystalline silicon. In some implementations, to form the third semiconductor layer, a third substrate and the second semiconductor structure 104 are bonded in a face-to-face manner, and the third substrate is thinned to leave the third semiconductor layer. The bonding can include transfer bonding. The third substrate can be a silicon substrate having single crystalline silicon or polycrystalline silicon.

Figure 12D:
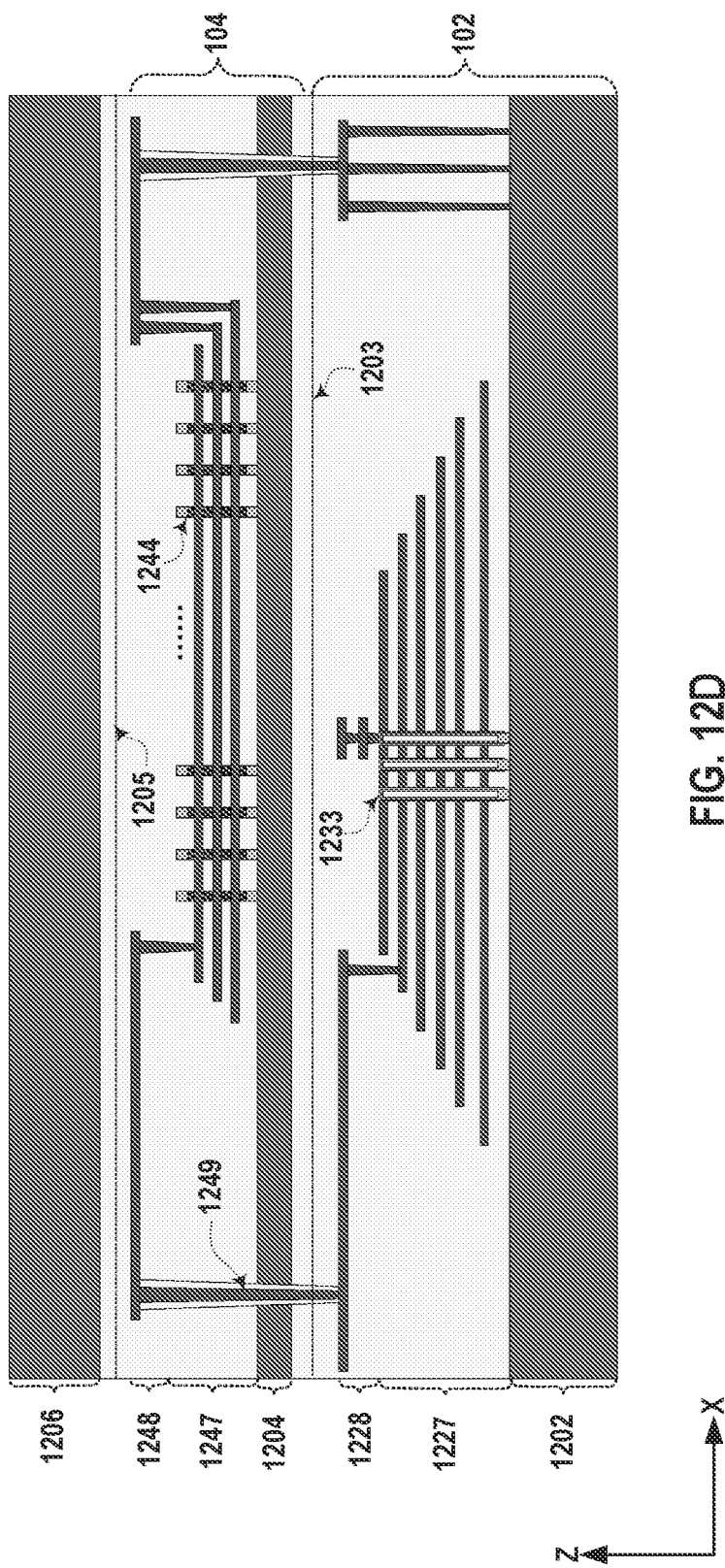

As illustrated in FIG. 12D, a semiconductor layer 1206, such as a single crystalline silicon layer or a polycrystalline silicon layer, is formed above interconnect layer 1248 and multi-gate DFM cells 1244. Semiconductor layer 1206 can be attached above interconnect layer 1248 to form a bonding interface 1205 vertically between semiconductor layer 1206 and interconnect layer 1248. In some implementations, to form semiconductor layer 1206, a third silicon substrate (not shown in FIG. 12C) and the bonded structure including first and second semiconductor structures 102 and 104 are bonded in a face-to-face manner (having the components formed on semiconductor layer 1204, such as multi-gate DFM cells 1244, facing toward the third silicon substrate) using transfer bonding, thereby forming bonding interface 1205. The third silicon substrate can then be thinned using any suitable processes to leave semiconductor layer 1206 attached above interconnect layer 1248. The details of various transfer bonding processes are described above with respect to FIGS. 31A-31D and FIGS. 32A-32D and thus, are not repeated for ease of description.

Figure 12E:
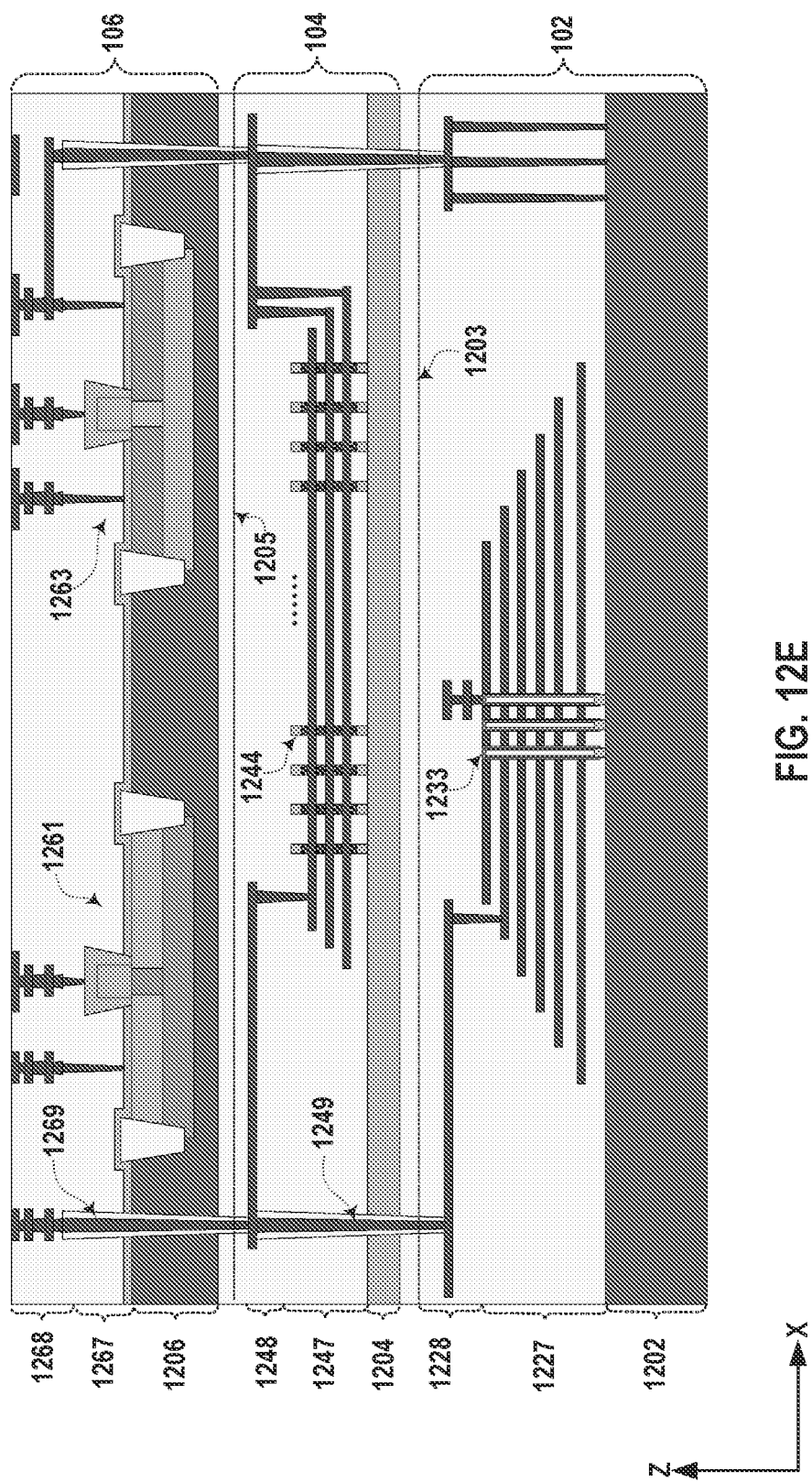

Referring to FIG. 11, method 1100 proceeds to operation 1110 in which a first periphery circuit is formed on the third semiconductor layer. As illustrated in FIG. 12E, the first periphery circuit 1267 including a plurality of transistors 1261 and 1263 can be formed on semiconductor layer 1206 having single crystalline silicon or polycrystalline silicon. In some implementations, transistors 1261 can be HV transistor forming an HV circuit 866, and transistors 1263 can be LV transistor forming an LV circuit 864. Transistors 1261 and 1263 can be formed by a plurality of processes including, but not limited to, photolithography, dry/wet etch, thin film deposition, thermal growth, implantation, CMP, and any other suitable processes. In some implementations, doped regions are formed in semiconductor layer 1206 by ion implantation and/or thermal diffusion, which function, for example, as wells and source/drain regions of transistors 1261 and 1263. In some implementations, isolation regions (e.g., STIs) are also formed in semiconductor layer 1206 by wet/dry etch and thin film deposition. In some implementations, the thickness of gate dielectric of transistor 1261 is different from the thickness of gate dielectric of transistor 1263, for example, by depositing a thicker silicon oxide film in the region of HV transistor 1261 than the region of LV transistor 1263, or by etching back part of the silicon oxide film deposited in the region of transistor 1263. It is understood that the details of fabricating transistors 1261 and 1263 may vary depending on the types of the transistors (e.g., planar transistors 910 or 3D transistors 920 in FIGS. 9A, 9B, 9C, and 9D) and thus, are not elaborated for ease of description.

In some implementations, an interconnect layer 1268 is formed above the transistor on the third semiconductor layer. The interconnect layer can include a plurality of interconnects in one or more ILD layers. As illustrated in FIG. 12E, an interconnect layer 1268 can be formed above transistors 1261 and 1263. Interconnect layer 1268 can include interconnects of MEOL and/or BEOL in a plurality of ILD layers to make electrical connections with transistors 1261 and 1263. In some implementations, interconnect layer 1268 includes multiple ILD layers and interconnects therein formed in multiple processes. For example, the interconnects in interconnect layer 1268 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 12E can be collectively referred to as interconnect layer 1268.

In some implementations, a through contact penetrating the third semiconductor layer is formed. As illustrated in FIG. 12E, one or more through contacts 1269 each extending vertically through semiconductor layer 1206 can be formed. Through contacts 1269 can couple the interconnects in interconnect layers 1268 and 1248. Through contacts 1269 can be formed by first patterning contact holes through semiconductor layer 1206 using patterning process (e.g., photolithography and dry/wet etch processes). The contact holes can be filled with a conductor (e.g., W or Cu). In some implementations, filling the contact holes includes depositing a spacer (e.g., a silicon oxide layer) before depositing the conductor.

Method 1100 proceeds to operation 1112, as illustrated in FIG. 11, in which a fourth semiconductor layer is formed above the first periphery circuit. The fourth semiconductor layer can include single crystalline silicon or polycrystalline silicon. In some implementations, to form the fourth semiconductor layer, a fourth substrate and the third semiconductor structure are bonded in a face-to-face manner, and the fourth substrate is thinned to leave the fourth semiconductor layer. The bonding can include transfer bonding. The fourth substrate can be a silicon substrate having single crystalline silicon or polycrystalline silicon.

Figure 12F:
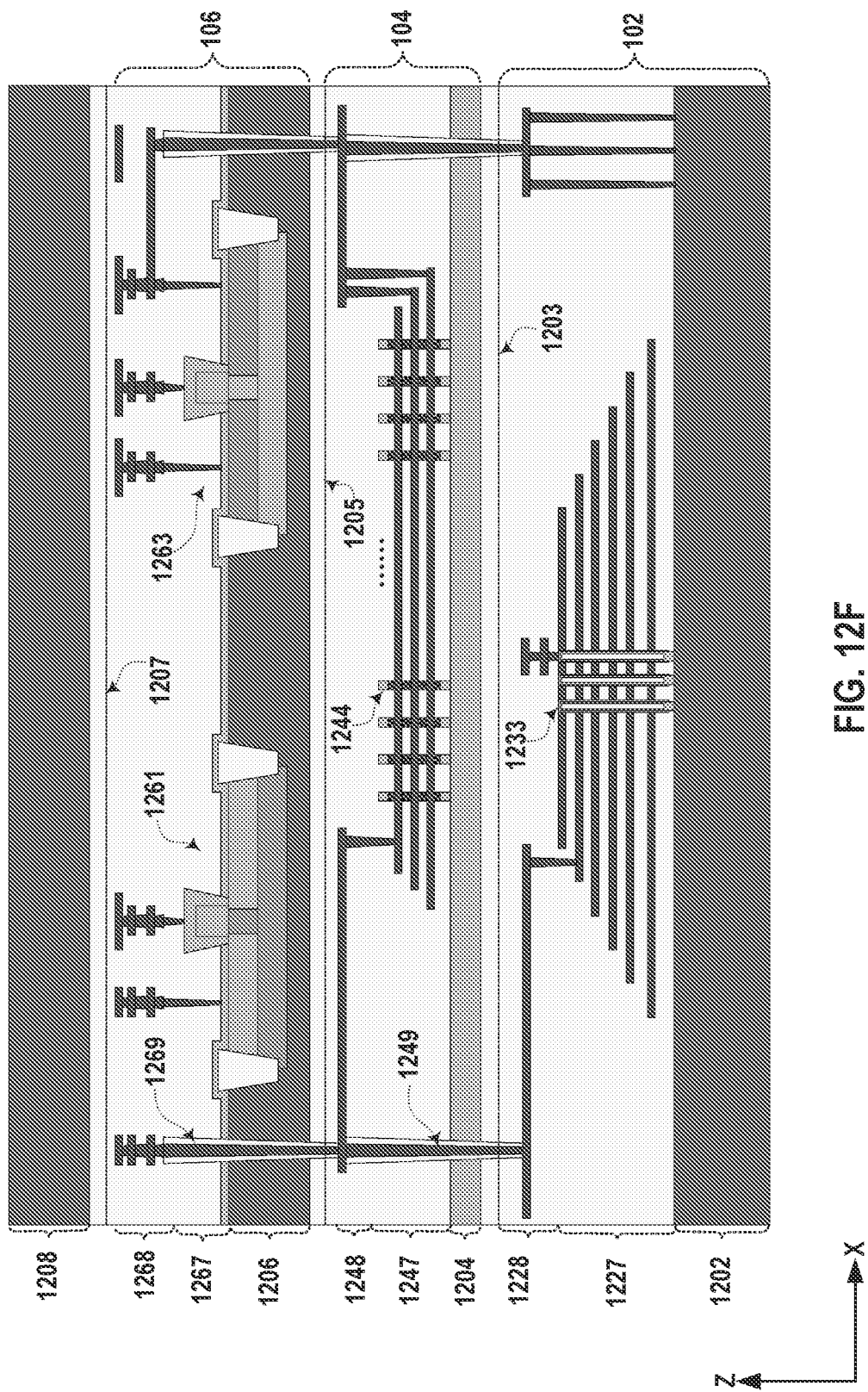

As illustrated in FIG. 12F, a semiconductor layer 1208, such as a single crystalline silicon layer or a polycrystalline silicon layer, is formed above interconnect layer 1268 and transistors 1261 and 1263. Semiconductor layer 1208 can be attached above interconnect layer 1268 to form a bonding interface 1207 vertically between semiconductor layer 1208 and interconnect layer 1268. In some implementations, to form semiconductor layer 1208, a fourth silicon substrate (not shown in FIG. 12G) and the bonded structure including first, second, and third semiconductor structure 102, 104, 106 are bonded in a face-to-face manner (having the components formed on semiconductor layer 1206, such as transistors 1261 and 1263, facing toward the fourth silicon substrate) using transfer bonding, thereby forming bonding interface 1207. The other silicon substrate can then be thinned using any suitable processes to leave semiconductor layer 1208 attached above interconnect layer 1268. The details of various transfer bonding processes are described above with respect to FIGS. 31A-31D and FIGS. 32A-32D and thus, are not repeated for ease of description.

Figure 12G:
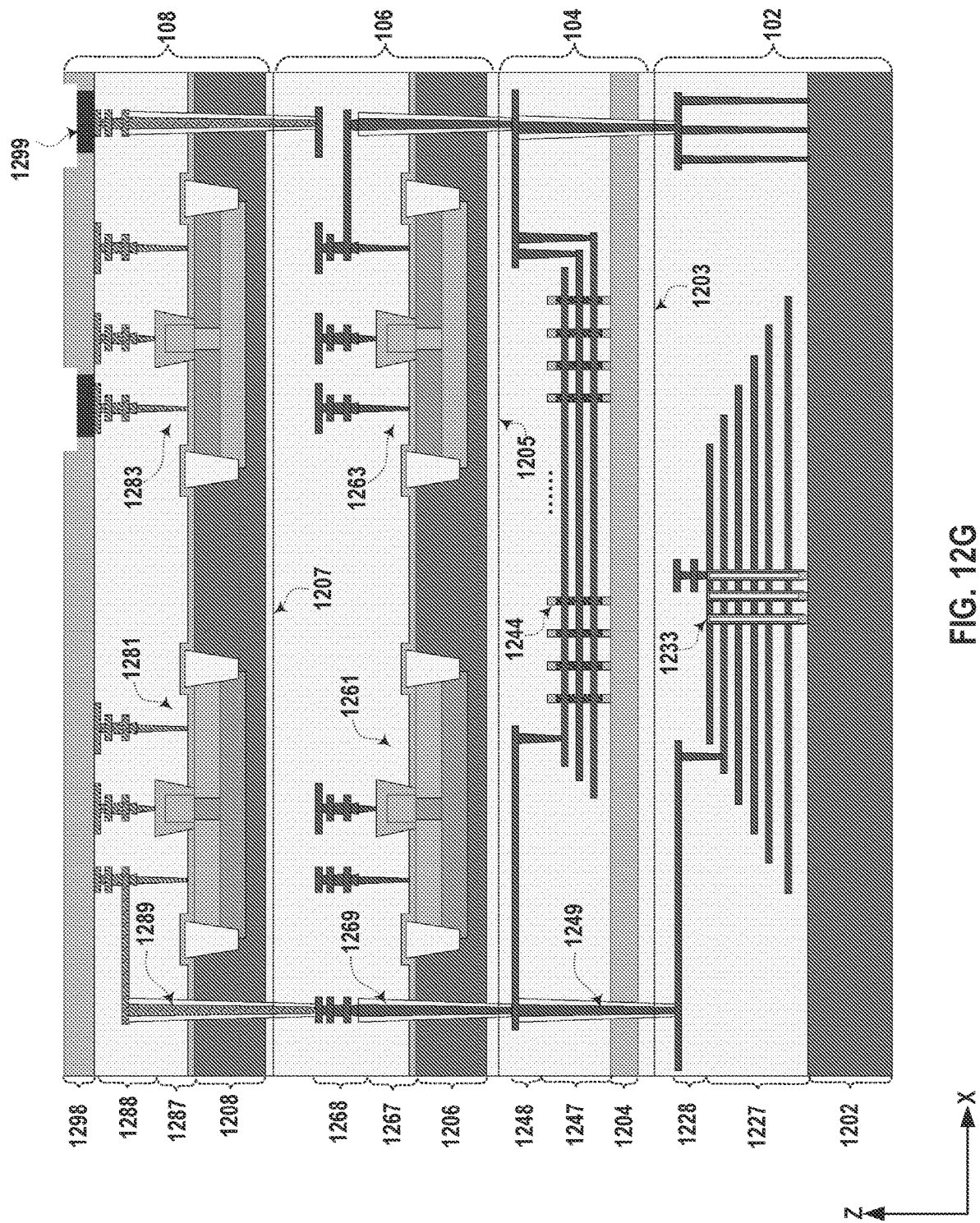

Referring to FIG. 11, method 1100 proceeds to operation 1114 in which a second periphery circuit is formed on the fourth semiconductor layer. As illustrated in FIG. 12G, the second periphery circuit 1287 including a plurality of transistors 1281 and 1283 can be formed on semiconductor layer 1208 having single crystalline silicon or polycrystalline silicon. In some implementations, transistors 1281 can be LV transistor forming an LV circuit 864, and transistors 1283 can be LLV transistor forming an LLV circuit 862. Transistors 1281 and 1283 can be formed by a plurality of processes including, but not limited to, photolithography, dry/wet etch, thin film deposition, thermal growth, implantation, CMP, and any other suitable processes. In some implementations, doped regions are formed in semiconductor layer 1208 by ion implantation and/or thermal diffusion, which function, for example, as wells and source/drain regions of transistors 1281 and 1283. In some implementations, isolation regions (e.g., STIs) are also formed in semiconductor layer 1208 by wet/dry etch and thin film deposition. In some implementations, the thickness of gate dielectric of LV transistor 1281 is different from the thickness of gate dielectric of LLV transistor 1283, for example, by depositing a thicker silicon oxide film in the region of LV transistor 1281 than the region of LLV transistor 1283, or by etching back part of the silicon oxide film deposited in the region of LLV transistor 1283. It is understood that the details of fabricating transistors 1281 and 1283 may vary depending on the types of the transistors (e.g., planar transistors 910 or 3D transistors 920 in FIGS. 9A, 9B, 9C, and 9D) and thus, are not elaborated for ease of description.

In some implementations, an interconnect layer 1288 is formed above the transistor on the semiconductor layer. The interconnect layer can include a plurality of interconnects in one or more ILD layers. As illustrated in FIG. 12G, an interconnect layer 1288 can be formed above transistors 1281 and 1283. Interconnect layer 1288 can include interconnects of MEOL and/or BEOL in a plurality of ILD layers to make electrical connections with transistors 1281 and 1283. In some implementations, interconnect layer 1288 includes multiple ILD layers and interconnects therein formed in multiple processes. For example, the interconnects in interconnect layer 1288 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 12G can be collectively referred to as interconnect layer 1288. Different from interconnect layer 1268, in some implementations, the interconnects in interconnect layer 1288 include Cu, which has a relatively low resistivity among conductive metal materials. It is understood that although Cu has a relatively low thermal budget (incompatible with high-temperature processes), using Cu as the conductive materials of the interconnects in interconnect layer 1288 may become feasible since there are no more high-temperature processes after the fabrication of interconnect layer 1288.

In some implementations, a through contact penetrating the fourth semiconductor layer is formed. As illustrated in FIG. 12G, one or more through contacts 1289 each extending vertically through semiconductor layer 1208 can be formed. Through contacts 1289 can couple the interconnects in interconnect layers 1288 and 1268. Through contacts 1289 can be formed by first patterning contact holes through semiconductor layer 1208 using patterning process (e.g., photolithography and dry/wet etch processes). The contact holes can be filled with a conductor (e.g., Cu). In some implementations, filling the contact holes includes depositing a spacer (e.g., a silicon oxide layer) before depositing the conductor.

Method 1100 proceeds to operation 1116, as illustrated in FIG. 11, in which one or more pad-out interconnect layers can be formed. In some implementations, a pad-out interconnect layer can be formed above the second periphery circuit. In some other implementations, a pad-out interconnect layer can be formed below the first semiconductor layer. In some other implementations, a first pad-out interconnect layer can be formed above the second periphery circuit, and a second pad-out interconnect layer can be formed below the first semiconductor layer.

In some implementations as illustrated in FIG. 12G, a pad-out interconnect layer 1298 is formed above interconnect layer 1288 and transistors 1281 and 1283 on semiconductor layer 1208. Pad-out interconnect layer 1298 can include interconnects, such as contact pads 1299, formed in one or more ILD layers. Contact pads 1299 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

In some other implementations not shown in the figures, to form a pad-out interconnect layer on the first substrate, silicon substrate 1202 is thinned. It is understood that although not shown, in some examples, silicon substrate 1202 may be thinned to become a thinned semiconductor layer having single crystalline silicon or polycrystalline silicon using processes including, but not limited to, wafer grinding, dry etch, wet etch, CMP, any other suitable processes, or any combination thereof. After the thinning, through contacts (not shown) may be formed extending vertically through the thinned silicon substrate 1202, for example, by wet/dry etching followed by depositing dielectric materials as spacers and conductive materials as conductors. It is understood that in some examples, the contact pads may be formed in silicon substrate 1202 before thinning and be exposed from the backside of silicon substrate 1202 (where the thinning occurs) after the thinning. Then a pad-out interconnect layer is formed on the thinned silicon substrate 1202. In some other implementations not shown in the figures, a first pad-out interconnect layer having contact pads may be formed on interconnect layer 1288, and a second pad-out interconnect layer having contact pads may be formed on the thinned silicon substrate 1202.

Figure 13:
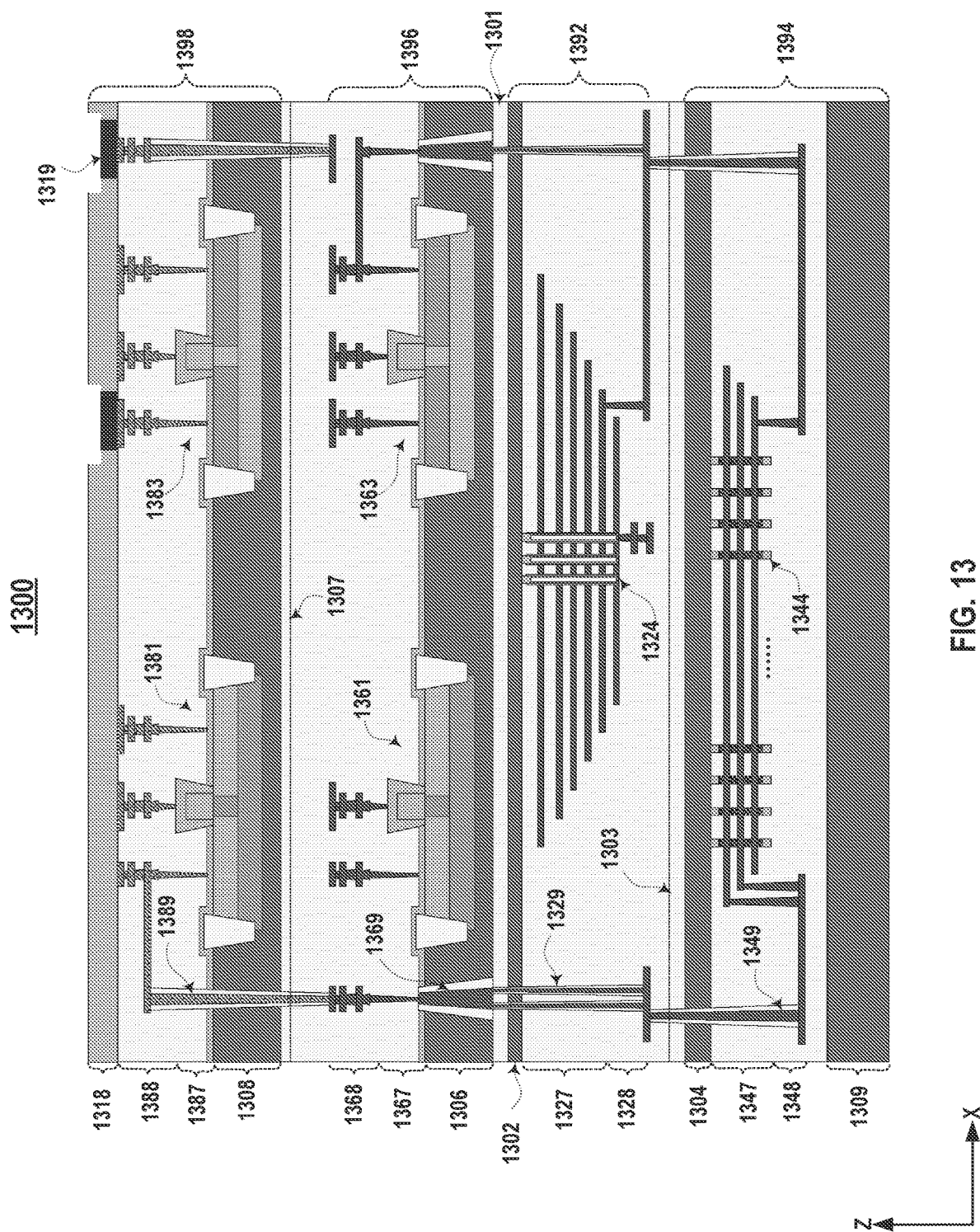
FIG. 13 illustrates a side view of another 3D memory device, according to some aspects of the present disclosure.

FIG. 13 illustrates a schematic diagram of a cross-sectional side view of another exemplary 3D memory device 1300 having four stacked semiconductor structures, according to some other aspects of the present disclosure. 3D memory device 1300 may be an example of 3D memory device 100D in FIG. 1D. 3D memory device 1300 includes four semiconductor structures stacked over one another in different planes in the vertical direction (e.g., the z-direction in FIG. 13). In some implementations, first semiconductor structure 1392 and third semiconductor structure 1396 formed on opposite sides of a same substrate, and second semiconductor structure 1394 bonded on first semiconductor structure 1392, and fourth semiconductor structure 1398 bonded on third semiconductor structure 1396.

As shown in FIG. 13, first semiconductor structure 1392 including the first memory cell array (e.g., 3D NAND Flash memory cell array) can be formed on one side of semiconductor layer 1306, and third semiconductor structure 1396 including the first peripheral circuits (e.g., HV and LV circuits) can be formed on another side of semiconductor layer 1306. Therefore, first semiconductor structure 1392 and third semiconductor structure 1396 are not separated by a bonding interface formed by a bonding process, but are separated by a dielectric spacer layer 1301. Second semiconductor structure 1394 including the second memory array (e.g., 3D DFM cell array) is bonded vertically on first semiconductor structure 1392 in a back-to-face manner, and fourth semiconductor structure 1398 including the second peripheral circuits (e.g., LV and LLV circuits) is bonded vertically on third semiconductor structure 1396 in a back-to-face manner.

In one example shown in FIG. 13, fourth semiconductor structure 1398 including the second peripheral circuit on one side of 3D memory device 1300 may include the pad-out interconnect layer 1318, such that 3D memory device 1300 may be pad-out from the peripheral circuit side to reduce the interconnect distance between contact pads and the peripheral circuits, thereby decreasing the parasitic capacitance from the interconnects and improving the electrical performance of 3D memory device 1300. In another example not shown in the figures, second semiconductor structure 1394 including the second memory cell array on another side of 3D memory device 1000B may include the pad-out interconnect layer 1318, such that 3D memory device may be pad-out from the memory cell array side.

As shown in FIG. 13, first semiconductor structure 1392 can include thin semiconductor layer 1302 having semiconductor materials deposited on one side of semiconductor layer 1306. Thin semiconductor layer 1302 and semiconductor layer 1306 can be isolated from each other by dielectric spacer layer 1301. In some implementations, thin semiconductor layer 1302 is a silicon substrate having single crystalline silicon or polycrystalline silicon. First semiconductor structure 1392 can include a first memory cell array, such as an array of NAND memory strings 1324 on thin semiconductor layer 1302. It is noted that, first and second semiconductor structures 1392 and 1394 are flipped over in FIG. 13. Therefore, some spatial terms such as "on," "above," "below," etc., in descriptions about first and second semiconductor structures 1392 and 1394 below may be upside down.

The sources of NAND memory strings 1324 can be in contact with semiconductor layer 1302. In some implementations, NAND memory strings 1324 are disposed vertically between bonding interface 1303 and thin semiconductor layer 1302. Each NAND memory string 1324 extends vertically through a plurality of pairs each including a conductive layer and a dielectric layer, according to some implementations. The stacked and interleaved conductive layers and dielectric layers are also referred to herein as a stack structure, e.g., a memory stack 1327. Memory stack 1327 may be an example of memory stack 304 in FIGS. 3A-3C, and the conductive layer and dielectric layer in memory stack 1327 may be examples of gate conductive layers 306 and dielectric layer 308, respectively, in memory stack 304. The interleaved conductive layers and dielectric layers in memory stack 1327 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 1327. It is understood that in some examples, trench isolations and doped regions (not shown) may be formed in thin semiconductor layer 1302 as well.

In some implementations, each NAND memory string 1324 is a "charge trap" type of NAND memory string including any suitable channel structures disclosed herein, such as bottom plug channel structure 312A, sidewall plug channel structure 312B, or bottom open channel structure 312C, described above in detail with respect to FIGS. 3A-3C. It is understood that NAND memory strings 1324 are not limited to the "charge trap" type of NAND memory strings and may be "floating gate" type of NAND memory strings in other examples.

As shown in FIG. 13, first semiconductor structure 1392 can further include an interconnect layer 1328 on and in contact with NAND memory strings 1324 to transfer electrical signals to and from NAND memory strings 1324. Interconnect layer 1328 can include a plurality of interconnects, such as MEOL interconnects and BEOL interconnects. In some implementations, the interconnects in interconnect layer 1328 also include local interconnects, such as bit line contacts and word line contacts. Interconnect layer 1328 can further include one or more interlayer dielectric (ILD) layers in which the lateral lines and vias can form. The interconnects in interconnect layer 1328 can include conductive materials including, but not limited to W, Co, Cu, Al, silicides, or any combination thereof. The ILD layers in interconnect layer 1328 can include dielectric materials including, but not limited to, silicon oxide, silicon nitride, silicon oxynitride, low-k dielectrics, or any combination thereof.

As shown in FIG. 13, first semiconductor structure 1392 can further include one or more through contacts 1329 extending vertically through thin semiconductor layer 1302. In some implementations, through contact 1329 couples the interconnects in interconnect layer 1328 to through contact 1369 of third semiconductor structure 1396 to make an electrical connection between first and third semiconductor structures 1392 and 1396. Through contact 1329 can include conductive materials including, but not limited to, W, Co, Cu, Al, silicides, or any combination thereof. In some implementations, through contact 1329 includes W. In some implementations, through contact 1329 includes a via surrounded by a dielectric spacer (e.g., having silicon oxide) to electrically separate the via from thin semiconductor layer 1302. Depending on the thickness of semiconductor layer 1302, through contact 1329 can be an ILV having a depth in the submicron-level (e.g., between 10 nm and 1 μm).

Third semiconductor structure 1396 can be formed on another side of semiconductor layer 1306. That is, first semiconductor structure 1392 and third semiconductor structure 1396 are formed on opposite sides of semiconductor layer 1306 in a back-to-back manner. In some implementations, semiconductor layer 1306 can be a semiconductor layer 1306 of single crystalline silicon or polycrystalline silicon thinned from a silicon substrate. In some implementations, dielectric spacer layer 1301 (e.g., silicon oxide layer) is formed vertically between semiconductor layer 1306 and thin semiconductor layer 1302. As shown in FIG. 13, third semiconductor structure 1396 can also include a device layer 1367 above and in contact with semiconductor layer 1306. In some implementations, device layer 1367 includes a first peripheral circuit 1361 and a second peripheral circuit 1363. First peripheral circuit 1361 can include HV circuits 866, such as driving circuits, and second peripheral circuit 1363 can include LV circuits 864, such as page buffer circuits and logic circuits. In some implementations, first peripheral circuit 1361 includes a plurality of HV transistors in contact with semiconductor layer 1306, and second peripheral circuit 1363 includes a plurality of LV transistors in contact with semiconductor layer 1306. In some implementations, each HV transistor or LV transistor includes a gate dielectric, and the thickness of the gate dielectric of HV transistor (e.g., in HV circuit 866) is larger than the thickness of the gate dielectric of LV transistor (e.g., in LV circuit 864) due to the higher voltage applied to the HV transistor than the LV transistor. Trench isolations (e.g., STIs) and doped regions (e.g., wells, sources, and drains of HV transistors and LV transistors) can be formed on or in semiconductor layer 1306 as well.

In some implementations, third semiconductor structure 1396 further includes an interconnect layer 1368 above device layer 1367 to transfer electrical signals to and from peripheral circuits 1061 and 1063. As shown in FIG. 13, interconnect layer 1368 can be vertically between bonding interface 1307 and device layer 1367 (including HV transistors and LV transistors of peripheral circuits 1361 and 1363). Interconnect layer 1368 can include a plurality of interconnects, such as MEOL interconnects and BEOL interconnects. The interconnects in interconnect layer 1368 can be coupled to HV transistors and LV transistors of peripheral circuits 1361 and 1363 in device layer 1367. Interconnect layer 1368 can further include one or more ILD layers in which the lateral lines and vias can form. That is, interconnect layer 1368 can include lateral lines and vias in multiple ILD layers. In some implementations, the devices in device layer 1367 are coupled to one another through the interconnects in interconnect layer 1368. For example, peripheral circuit 1361 may be coupled to peripheral circuit 1363 through interconnect layer 1368. The interconnects in interconnect layer 1368 can include conductive materials including, but not limited to, W, Co, Cu, Al, silicides, or any combination thereof. The ILD layers in interconnect layer 1368 can include dielectric materials including, but not limited to, silicon oxide, silicon nitride, silicon oxynitride, low-k dielectrics, or any combination thereof. In some implementations, the interconnects in interconnect layer 1368 include W, which has a relatively high thermal budget (compatible with high-temperature processes) and good quality (fewer detects, e.g., voids) among conductive metal materials.

As shown in FIG. 13, third semiconductor structure 1396 can further include one or more through contacts 1369 extending vertically through semiconductor layer 1306. In some implementations, through contact 1369 couples the interconnects in interconnect layer 1368 to through contacts 1329 to make an electrical connection between third and first semiconductor structures 1396 and 1392. Through contact 1369 can include conductive materials including, but not limited to, W, Co, Cu, Al, silicides, or any combination thereof. In some implementations, through contact 1369 includes W. In some implementations, through contact 1369 includes a via surrounded by a dielectric spacer (e.g., having silicon oxide) to electrically separate the via from semiconductor layer 1306. Depending on the thickness of semiconductor layer 1306, through contact 1369 can be an ILV having a depth in the submicron-level (e.g., between 10 nm and 1 μm), or a TSV having a depth in the micron- or tens micron-level (e.g., between 1 μm and 100 μm).

Second semiconductor structure 1394 can be bonded on first semiconductor structure 1392 in a back-to-face manner at bonding interface 1303. Second semiconductor structure 1394 can include semiconductor layer 1304 having semiconductor materials. In some implementations, semiconductor layer 1304 is a layer of single crystalline silicon or polycrystalline silicon transferred from a silicon substrate or a SOI substrate and attached to the top surface of first semiconductor structure 1392 by transfer bonding. In some implementations, bonding interface 1303 is disposed vertically between interconnect layer 1328 and semiconductor layer 1304 as a result of transfer bonding, which transfers semiconductor layer 1304 from another substrate and bonds semiconductor layer 1304 onto first semiconductor structure 1392 as described below in detail. In some implementations, bonding interface 1303 is the place at which interconnect layer 1328 and semiconductor layer 1304 are met and bonded. In practice, bonding interface 1303 can be a layer with a certain thickness that includes the top surface of interconnect layer 1328 of first semiconductor structure 1392 and the bottom surface of semiconductor layer 1304 of second semiconductor structure 1304. In some implementations, dielectric layer(s) (e.g., silicon oxide layer) are formed vertically between bonding interface 1303 and semiconductor layer 1304 and/or between bonding interface 1303 and interconnect layer 1328 to facilitate the transfer bonding of semiconductor layer 1304 onto interconnect layer 1328. Thus, it is understood that bonding interface 1303 may include the surfaces of the dielectric layer(s) in some examples.

As shown in FIG. 13, second semiconductor structure 1394 can include a second memory cell array, such as an array of multi-gate DFM cells 1344 on semiconductor layer 1304. In some implementations, each multi-gate DFM cell 1344 can be referred to DFM memory cell 600A/600B described above in connection with FIGS. 6A and 6B, and the array of multi-gate DFM cells can be referred to DFM memory array 700 described above in connection with FIG. 7. The sources of multi-gate DFM cells 1344 can be in contact with semiconductor layer 1304. In some implementations, multi-gate DFM cells 1344 are disposed vertically between substrate 1309 and semiconductor layer 1304. Each multi-gate DFM cell 1344 extends vertically through a memory stack 1347 including a plurality of pairs each including a conductive layer and a dielectric layer, according to some implementations. The interleaved conductive layers and dielectric layers alternate in the vertical direction, according to some implementations. Each conductive layer can include a gate electrode surrounded by an adhesive layer and a gate dielectric layer. The gate electrode of the conductive layer can extend laterally as a word line or a plate line, ending at one or more staircase structures of the memory stack 1347. It is understood that in some examples, trench isolations and doped regions (not shown) may be formed in semiconductor layer 1304 as well.

As shown in FIG. 13, second semiconductor structure 1394 can further include an interconnect layer 1348 above and in contact with multi-gate DFM cells 1344 to transfer electrical signals to and from multi-gate DFM cells 1344. Interconnect layer 1348 can include a plurality of interconnects, such as MEOL interconnects and BEOL interconnects. In some implementations, the interconnects in interconnect layer 1348 also include local interconnects, such as bit line connections, word line connections, plate line connections, and/or source line connections. Interconnect layer 1348 can further include one or more interlayer dielectric (ILD) layers in which the lateral lines and vias can form. The interconnects in interconnect layer 1348 can include conductive materials including, but not limited to W, Co, Cu, Al, silicides, or any combination thereof. The ILD layers in interconnect layer 1348 can include dielectric materials including, but not limited to, silicon oxide, silicon nitride, silicon oxynitride, low-k dielectrics, or any combination thereof.

As shown in FIG. 13, second semiconductor structure 1394 can further include one or more through contacts 1349 extending vertically through semiconductor layer 1304. In some implementations, through contact 1349 couples the interconnects in interconnect layer 1348 to the interconnects in interconnect layer 1328 to make an electrical connection across bonding interface 1303 between second and first semiconductor structures 1394 and 1392. Through contact 1349 can include conductive materials including, but not limited to, W, Co, Cu, Al, silicides, or any combination thereof. In some implementations, through contact 1349 includes W. In some implementations, through contact 1349 includes a via surrounded by a dielectric spacer (e.g., having silicon oxide) to electrically separate the via from semiconductor layer 1304. Depending on the thickness of semiconductor layer 1304, through contact 1349 can be an ILV having a depth in the submicron-level (e.g., between 10 nm and 1 μm), or a TSV having a depth in the micron- or tens micron-level (e.g., between 1 μm and 100 μm).

Fourth semiconductor structure 1398 can be bonded on top of third semiconductor structure 1396 in a back-to-face manner at bonding interface 1307. Fourth semiconductor structure 1398 can include semiconductor layer 1308 having semiconductor materials. In some implementations, semiconductor layer 1308 is a layer of single crystalline silicon or polycrystalline silicon transferred from a silicon substrate or an SOI substrate and attached to the top surface of third semiconductor structure 1396 by transfer bonding. In some implementations, bonding interface 1307 is disposed vertically between interconnect layer 1368 and semiconductor layer 1308 as a result of transfer bonding, which transfers semiconductor layer 1308 from another substrate and bonds semiconductor layer 1308 onto third semiconductor structure 1396 as described below in detail. In some implementations, bonding interface 1307 is the place at which interconnect layer 1368 and semiconductor layer 1308 are met and bonded. In practice, bonding interface 1307 can be a layer with a certain thickness that includes the top surface of interconnect layer 1368 of third semiconductor structure 1396 and the bottom surface of semiconductor layer 1308 of fourth semiconductor structure 1308. In some implementations, dielectric layer(s) (e.g., silicon oxide layer) are formed vertically between bonding interface 1307 and semiconductor layer 1308 and/or between bonding interface 1307 and interconnect layer 1368 to facilitate the transfer bonding of semiconductor layer 1308 onto interconnect layer 1368. Thus, it is understood that bonding interface 1307 may include the surfaces of the dielectric layer(s) in some examples.

Fourth semiconductor structure 1398 can include a device layer 1387 above and in contact with semiconductor layer 1308. In some implementations, device layer 1387 includes a third peripheral circuit 1381 and a fourth peripheral circuit 1383. Third peripheral circuit 1381 can include LLV circuits 862, such as I/O circuits, and fourth peripheral circuit 1383 can include LV circuits 864, such as page buffer circuits and logic circuits. In some implementations, third peripheral circuit 1381 includes a plurality of LLV transistors, and fourth peripheral circuit 1383 includes a plurality of LV transistors as well. In some implementations, each LLV and LV transistor includes a gate dielectric, and the thickness of the gate dielectric of LLV transistor (e.g., in LLV circuit 862) is smaller than the thickness of the gate dielectric of LV transistor (e.g., in LV circuit 864) due to the lower voltage applied to the LLV transistor than the LV transistor. Trench isolations (e.g., STIs) and doped regions (e.g., wells, sources, and drains of the LLV transistor and the LV transistor can be formed on or in semiconductor layer 1308 as well.

Moreover, the different voltages applied to different HV transistors, LV transistors, and LLV transistors in third and fourth semiconductor structures 1396 and 1398 can lead to differences in device dimensions between second and third semiconductor structures 1396 and 1398. In some implementations, the thickness of the gate dielectric of HV transistor (e.g., in HV circuit 866) is larger than the thickness of the gate dielectric of LLV transistor (e.g., in LLV circuit 862) due to the higher voltage applied to the HV transistor than the LLV transistor. In some implementations, the thickness of the gate dielectric of the LV transistor (e.g., in LV circuit 864) in fourth semiconductor structure 1398 is the same as the thickness of the gate dielectric of the LV transistor (e.g., in LV circuit 864) in third semiconductor structure 1396 due to the same operation voltage. In some implementations, the thickness of semiconductor layer 1306 in which the HV transistor (e.g., in HV circuit 866) is formed is larger than the thickness of semiconductor layer 1308 in which the LLV transistor (e.g., in LLV circuit 862) is formed due to the higher voltage applied to the HV transistor than the LLV transistor.

As shown in FIG. 13, fourth semiconductor structure 1398 can further include an interconnect layer 1388 above device layer 1387 to transfer electrical signals to and from peripheral circuits 1381 and 1383. As shown in FIG. 13, device layer 1387 (including HV transistors and LV transistors of peripheral circuits 1381 and 1383) can be vertically between bonding interface 1307 and interconnect layer 1388. Interconnect layer 1388 can include a plurality of interconnects coupled to the HV transistors of peripheral circuit 1381 and the LV transistors of peripheral circuit 1383 in device layer 1387. Interconnect layer 1388 can further include one or more ILD layers in which the interconnects can form. That is, interconnect layer 1388 can include lateral lines and vias in multiple ILD layers. In some implementations, the devices in device layer 1387 are coupled to one another through the interconnects in interconnect layer 1388. For example, peripheral circuit 1381 may be coupled to peripheral circuit 1383 through interconnect layer 1388. The interconnects in interconnect layer 1388 can include conductive materials including, but not limited to, W, Co, Cu, Al, silicides, or any combination thereof. The ILD layers in interconnect layer 1388 can include dielectric materials including, but not limited to, silicon oxide, silicon nitride, silicon oxynitride, low-k dielectrics, or any combination thereof.

In some implementations, the interconnects in interconnect layer 1388 include Cu, which has a relatively low resistivity (better electrical performance) among conductive metal materials. As described below with respect to the fabrication process, although Cu has a relatively low thermal budget (incompatible with high-temperature processes), since the fabrication of interconnect layer 1388 can occur after the high-temperature processes in forming device layers 1367 and 1387 in third and fourth semiconductor structures 1396 and 1398, as well as after the high-temperature processes in forming first and second semiconductor structures 1392 and 1394, the interconnects of interconnect layer 1088 having Cu can become feasible. In some implementations, the interconnects in interconnect layer 1388 include Cu as the conductive metal material, but not other conductive metal materials, such as W.

As shown in FIG. 13, fourth semiconductor structure 1398 can further include one or more through contacts 1389 extending vertically through semiconductor layer 1308. In some implementations, through contact 1389 couples the interconnects in interconnect layer 1388 to the interconnects in interconnect layer 1368 to make an electrical connection across bonding interface 1307 between third and fourth semiconductor structures 1396 and 1398. Through contact 1389 can include conductive materials including, but not limited to, W, Co, Cu, Al, silicides, or any combination thereof. In some implementations, through contact 1389 includes Cu. For example, through contact 1389 may include Cu as the conductive metal material, but not other conductive metal materials, such as W. In some implementations, through contact 1389 includes a via surrounded by a dielectric spacer (e.g., having silicon oxide) to electrically separate the via from semiconductor layer 1308. Depending on the thickness of semiconductor layer 1308, through contact 1389 can be an ILV having a depth in the submicron-level (e.g., between 10 nm and 1 µm), or a TSV having a depth in the micron- or tens micron-level (e.g., between 1 µm and 100 µm).

As shown in FIG. 13, fourth semiconductor structure 1398 can further include a pad-out interconnect layer 1318 above and in contact with interconnect layer 1388. In some implementations, interconnect layer 1388 is disposed vertically between pad-out interconnect layer 1318 and device layer 1387 including peripheral circuits 1381 and 1383. Pad-out interconnect layer 1318 can include interconnects, e.g., contact pads 1319, in one or more ILD layers. In some implementations, the interconnects in pad-out interconnect layer 1318 can transfer electrical signals between 3D memory device 1300 and external devices, e.g., for pad-out purposes.

As a result, peripheral circuits 1361, 1363, 1381, and 1383 in third and fourth semiconductor structures 1396 and 1398 can be coupled to NAND memory strings 1324 in first semiconductor structure 1392 and multi-gate DFM cells 1344 in second semiconductor structure 1394 through various interconnection structures, including interconnect layers 1388, 1368, 1348, and 1328, as well as through contacts 1389, 1369, 1349, and 1329. Moreover, peripheral circuits 1381, 1383, 1361, and 1363, as well as NAND memory strings 1324 and multi-gate DFM cells 1344 in 3D memory device 1300 can be further coupled to external devices through pad-out interconnect layer 1318.

It is understood that the pad-out of 3D memory devices is not limited to from fourth semiconductor structure 1398 having peripheral circuits 1381 and 1383 as shown in FIG. 13 and may be from second semiconductor structure 1392 having multi-gate DFM cells 1344. For example, although not shown in the figures, 3D memory device 1300 may include pad-out interconnect layer 1318 in second semiconductor structure 1394. Pad-out interconnect layer 1318 can be in contact with substrate 1309 of second semiconductor structure 1394 on which multi-gate DFM cells 1344 are formed. In some implementations, second semiconductor structure 1394 further includes one or more through contacts (not shown) extending vertically through substrate 1309. In some implementations, the through contact penetrating substrate 1309 can be coupled with the interconnects in interconnect layer 1348 in second semiconductor structure 1394 to contact pads 1319 in pad-out interconnect layer 1318 to make an electrical connection through substrate 1309. In some other implementations, the pad-out of 3D memory devices can be from both sides of 3D memory devices. That is, a first pad-out interconnect layer can be formed in fourth semiconductor structure 1398 having peripheral circuits 1381 and 1383, and a second pad-out interconnect layer can be formed in second semiconductor structure 1394 having multi-gate DFM cells 1344. It is also understood that, although not shown in FIG. 13, it is understood that in some examples, bonding interface(s) 1303 or 1307 may result from hybrid bonding and thus, be disposed vertically between two bonding layers each including bonding contacts in a corresponding semiconductor structure, respectively, as described above in detail.

Figure 14:
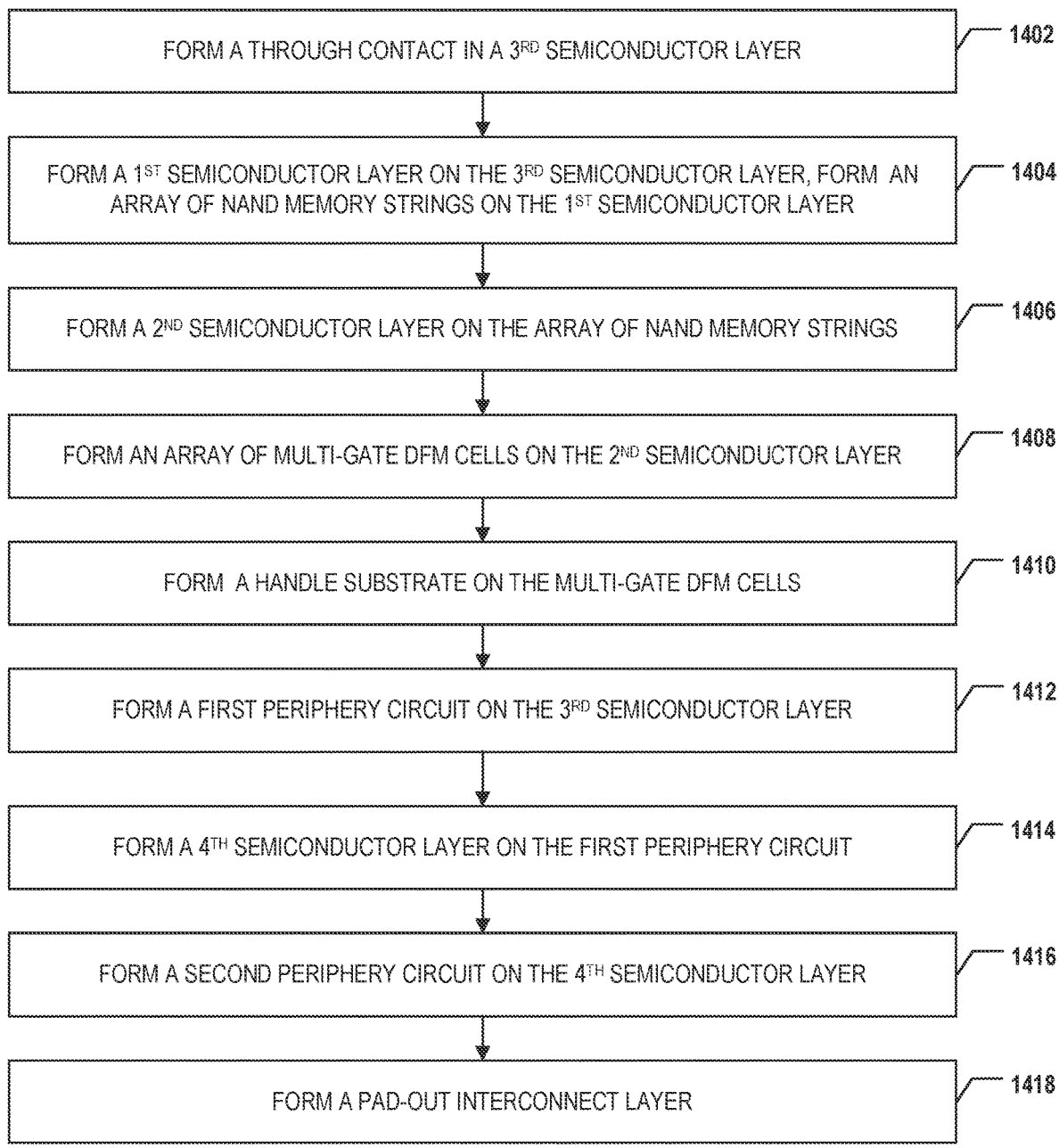
FIG. 14 illustrates a flowchart of a method for forming the 3D memory device in FIG. 13, according to some aspects of the present disclosure.

FIG. 14 illustrates a flowchart of a method 1400 for forming the 3D memory device 1300 shown in FIG. 13, according to some aspects of the present disclosure. FIGS. 15A-15H illustrate the 3D memory device 1300 at certain stages of the fabrication process of method 1400 as shown in FIG. 14, according to some aspects of the present disclosure. It is understood that the operations shown in method 1400 are not exhaustive and that other operations can be performed as well before, after, or between any of the illustrated operations. Further, some of the operations may be performed simultaneously, or in a different order than shown in FIG. 14.

Figure 15A:
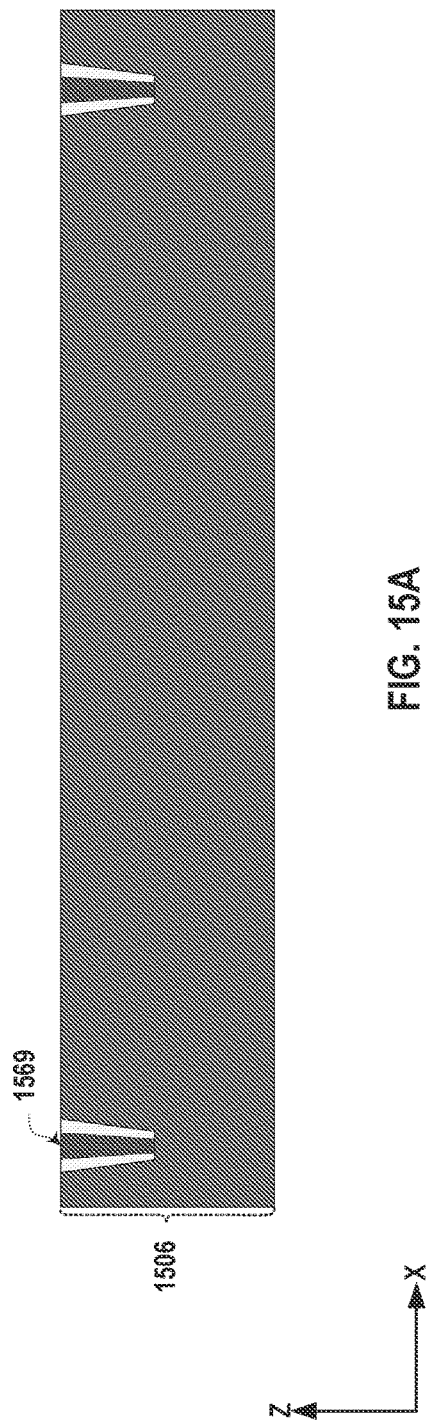
FIGS. 15A-15H illustrate a fabrication process for forming the 3D memory device in FIG. 13, according to some aspects of the present disclosure.

Referring to FIG. 14, method 1400 starts at operation 1402, in which one or more through contacts can be formed in an upper portion of a third semiconductor layer. As shown in FIG. 15A, semiconductor layer 1506 can be a silicon substrate having single crystalline silicon or polycrystalline silicon. In some implementations, one or more through contacts 1569 extending vertically in an upper portion of semiconductor layer 1506. In some implementations, through contact 1569 is used for making an electrical connection across semiconductor layer 1506 between two semiconductor structures formed on opposite sides of semiconductor layer 1506 in subsequent processes. Through contact 1569 can include conductive materials including, but not limited to, W, Co, Cu, Al, silicides, or any combination thereof. In some implementations, through contact 1569 includes W. In some implementations, through contact 1569 includes a via surrounded by a dielectric spacer (e.g., having silicon oxide) to electrically separate the via from semiconductor layer 1506 in the lateral directions. Through contact 1569 can be an ILV having a depth in the submicron-level (e.g., between 10 nm and 1 µm), or a TSV having a depth in the micron- or tens micron-level (e.g., between 1 µm and 100 µm).

Referring to FIG. 14, method 1400 proceeds to operation 1404, in which a first semiconductor structure including an array of NAND memory strings disposed on a first semiconductor layer can be formed on the third semiconductor layer. The first semiconductor layer can be a silicon substrate having single crystalline silicon or polycrystalline silicon. In some implementations, to form the array of NAND memory strings, a first memory stack is formed on the second semiconductor layer.

Figure 15B:
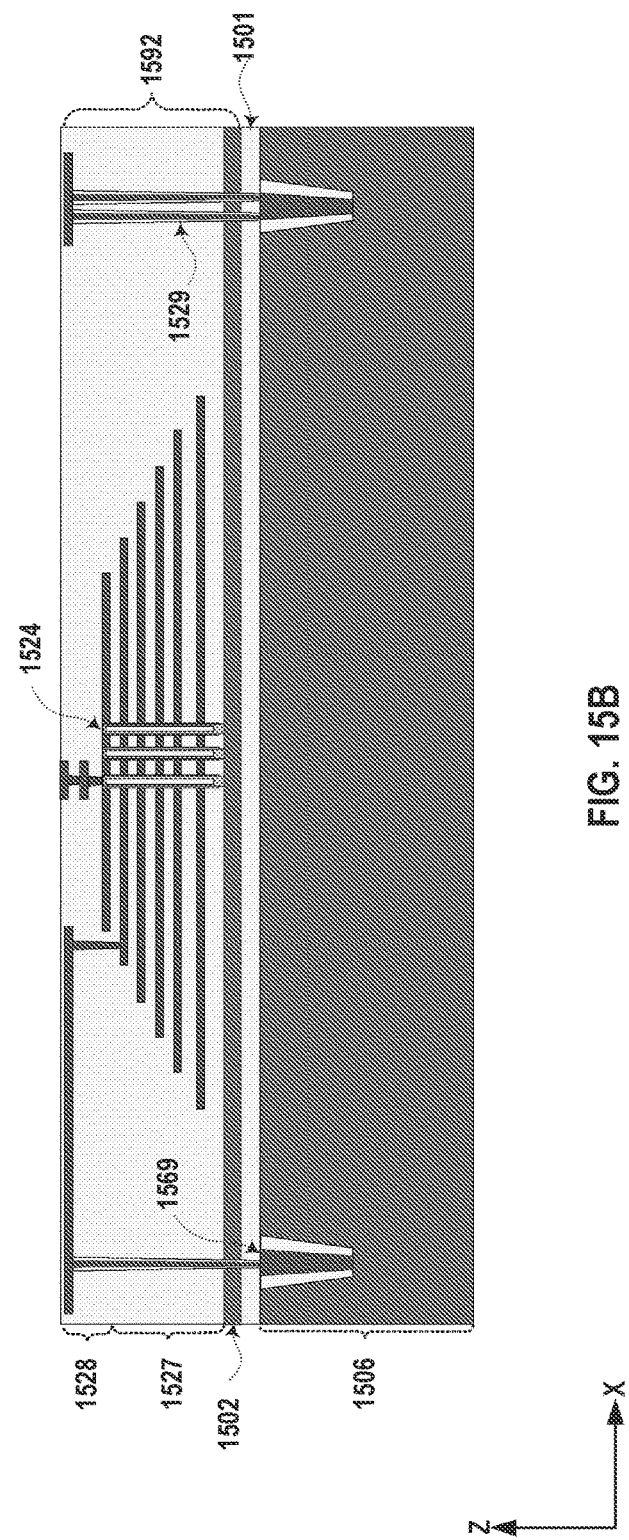

As illustrated in FIG. 15B, dielectric spacer layer 1501 can be formed on semiconductor layer 1569, and semiconductor layer 1502 can be formed on dielectric spacer layer 1501 using thin film deposition processes such as ALD, CVD, PVD, or any combination thereof. In some implementations, second semiconductor layer 1502 can be a thinned semiconductor layer having single crystalline silicon or polycrystalline silicon form by any suitable thinning processes including, but not limited to, wafer grinding, dry etch, wet etch, CMP, any other suitable processes, or any combination thereof. Dielectric spacer layer 1501 can include any suitable dielectric materials, such as silicon oxide, silicon nitride, silicon oxynitride, or high-k dielectrics, and can be used for isolating semiconductor layer 1502 from semiconductor layer 1506.

A first stack structure, such as a first memory stack 1527 including interleaved conductive layers and dielectric layers, is formed on semiconductor layer 1502. To form first memory stack 1527, in some implementations, a dielectric stack (not shown) including interleaved sacrificial layers (not shown) and the dielectric layers is formed on semiconductor layer 1502. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. First memory stack 1527 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that first memory stack 1527 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between first memory stack 1527 and semiconductor layer 1502.

As illustrated in FIG. 15B, NAND memory strings 1524 are formed above semiconductor layer 1502, each of which extends vertically through first memory stack 1527 to be in contact with semiconductor layer 1502. In some implementations, fabrication processes to form NAND memory string 1524 include forming a channel hole through first memory stack 1527 (or the dielectric stack) and into semiconductor layer 1502 using dry etching/and or wet etching, such as deep reactive-ion etching (DRIE), followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 1524 may vary depending on the types of channel structures of NAND memory strings 1524 (e.g., bottom plug channel structure 312A, sidewall plug channel structure 312B, or bottom open channel structure 312C in FIGS. 3A-3C) and thus, are not elaborated for ease of description.

In some implementations, an interconnect layer is formed above the array of NAND memory strings on the first semiconductor layer. The interconnect layer can include a first plurality of interconnects in one or more ILD layers. As illustrated in FIG. 15B, an interconnect layer 1528 is formed above first memory stack 1527 and NAND memory strings 1524. Interconnect layer 1528 can include interconnects of MEOL and/or BEOL in a plurality of ILD layers to make electrical connections with NAND memory strings 1524 and/or semiconductor layer 1502. In some implementations, interconnect layer 1528 includes multiple ILD layers and interconnects therein formed in multiple processes. For example, the interconnects in interconnect layer 1528 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 15B can be collectively referred to as interconnect layer 1528.

Figure 15C:
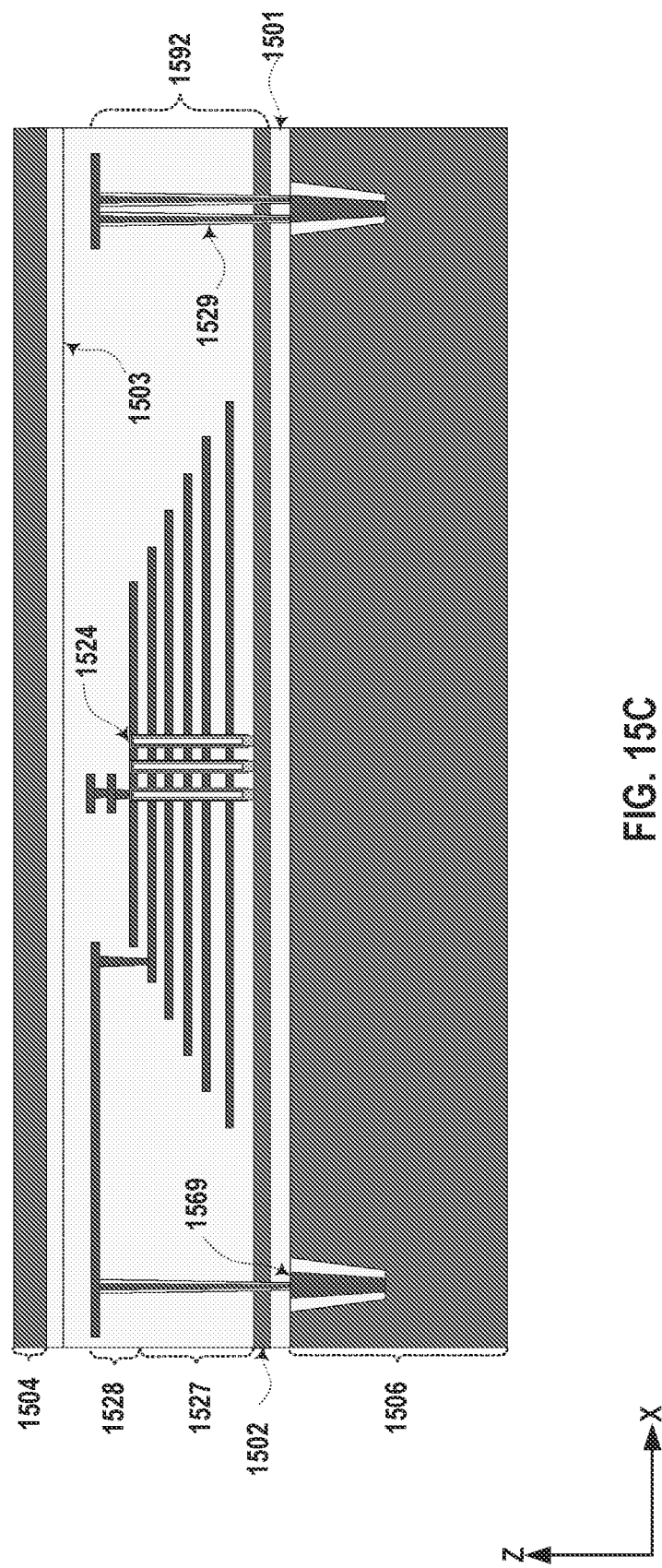

In some implementations, a through contact penetrating the second semiconductor layer is formed. As illustrated in FIG. 15C, one or more through contacts 1529 each extending vertically through semiconductor layer 1502 can be formed. Through contacts 1529 can couple the interconnects in interconnect layers 1528 and through contacts 1596. Through contacts 1529 can be formed by first patterning contact holes through semiconductor layer 1502 using patterning process (e.g., photolithography and dry/wet etch processes). The contact holes can be filled with a conductor material (e.g., W or Cu). In some implementations, filling the contact holes includes depositing a spacer (e.g., a silicon oxide layer) before depositing the conductor material.

Method 1400 proceeds to operation 1406, as illustrated in FIG. 14, in which a second semiconductor layer is formed above the array of NAND memory strings. The second semiconductor layer can include single crystalline silicon or polycrystalline silicon. In some implementations, to form the second semiconductor layer, a second substrate and the first semiconductor structure 1592 are bonded in a face-to-face manner, and the second substrate is thinned to leave the second semiconductor layer. The bonding can include transfer bonding. The third substrate can be a silicon substrate having single crystalline silicon or polycrystalline silicon.

As illustrated in FIG. 15C, a semiconductor layer 1504, such as a single crystalline silicon layer or a polycrystalline silicon layer, is formed above interconnect layer 1528 and NAND memory strings 1524. Semiconductor layer 1504 can be attached above interconnect layer 1528 to form a bonding interface 1503 vertically between semiconductor layer 1504 and interconnect layer 1528. In some implementations, to form semiconductor layer 1504, a second silicon substrate (not shown in FIG. 15C) and first semiconductor structure 1592 are bonded in a face-to-face manner (having the components formed on semiconductor layer 1502, such as NAND memory strings 1524, facing toward the second silicon substrate) using transfer bonding, thereby forming bonding interface 1503. The second silicon substrate can then be thinned using any suitable processes to leave semiconductor layer 1504 attached above interconnect layer 1528.

Referring to FIG. 14, method 1400 proceeds to operation 1408 in which a second semiconductor structure including an array of multi-gate DFM cells disposed on the second semiconductor layer can be formed. In some implementations, to form the array of multi-gate DFM cells, a second memory stack is formed on the second semiconductor layer.

Figure 15D:
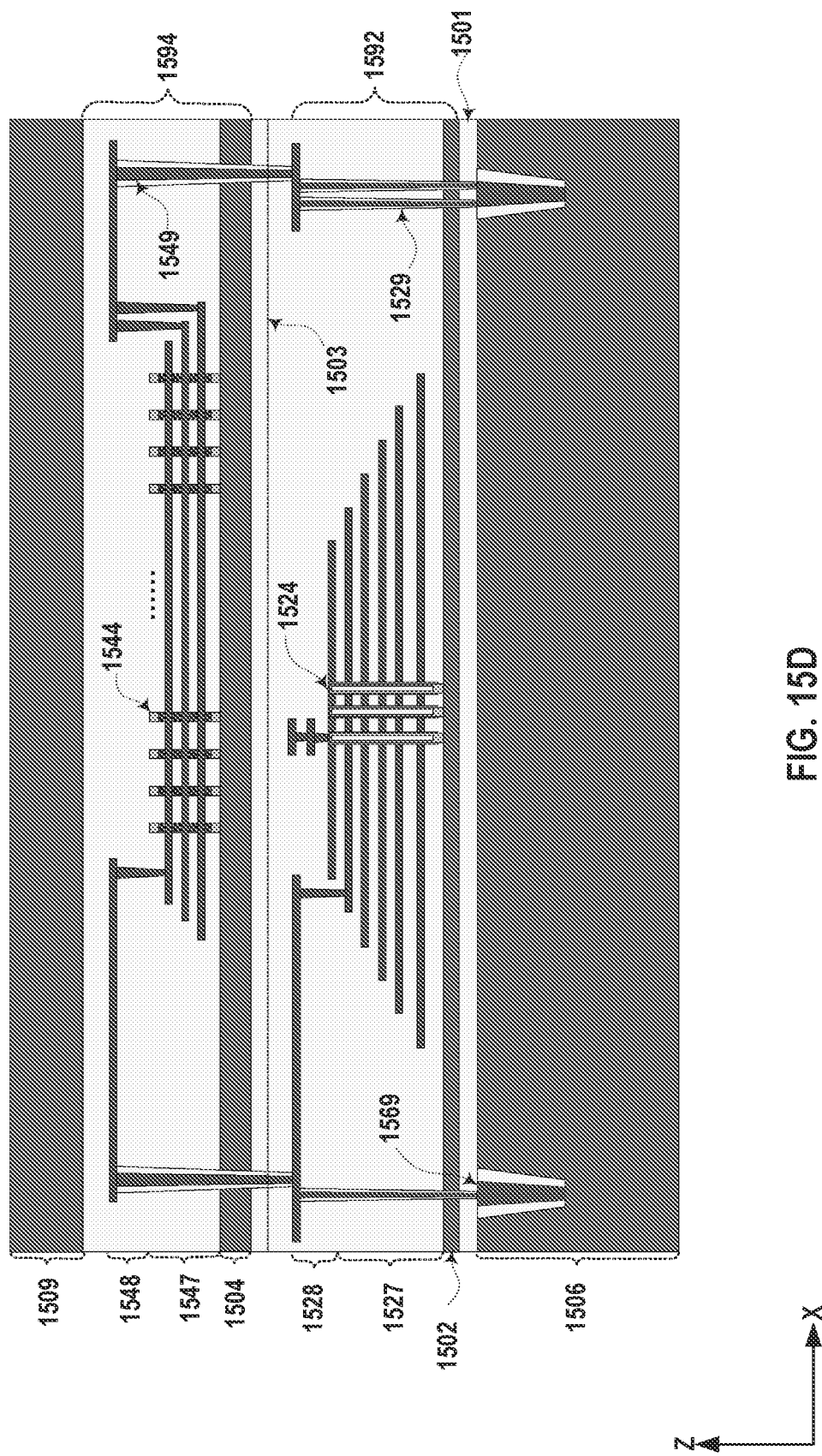

As illustrated in FIG. 15D, a second stack structure, such as a second memory stack 1547 including interleaved conductive layers and dielectric layers, is formed on semiconductor layer 1504. To form second memory stack 1527, in some implementations, a dielectric stack (not shown) including interleaved sacrificial layers (not shown) and the dielectric layers is formed on semiconductor layer 1504. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Second memory stack 1547 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that second memory stack 1547 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between second memory stack 1547 and semiconductor layer 1504.

As illustrated in FIG. 15D, a plurality of multi-gate DFM cells 1544 are formed above semiconductor layer 1504, each of which extends vertically through second memory stack 1547 to be in contact with semiconductor layer 1504. In some implementations, fabrication processes to form multi-gate DFM cells 1544 include forming a channel hole through second memory stack 1547 (or the dielectric stack) to expose semiconductor layer 1504 using dry etching/and or wet etching, such as DRIE, followed by subsequently filling the channel hole with one or more layers, such as a dielectric spacer layer and a semiconductor layer, using thin film deposition processes such as ALD, CVD, PVD, or any combination thereof.

In some implementations, an interconnect layer is formed above the array of multi-gate DFM cells on the third semiconductor layer. The interconnect layer can include a first plurality of interconnects in one or more ILD layers. As illustrated in FIG. 15D, an interconnect layer 1548 is formed above second memory stack 1547 and multi-gate DFM cells 1544. Interconnect layer 1548 can include interconnects of MEOL and/or BEOL in a plurality of ILD layers to make electrical connections with multi-gate DFM cells 1544 and/or semiconductor layer 1504. In some implementations, interconnect layer 1548 includes multiple ILD layers and interconnects therein formed in multiple processes. For example, the interconnects in interconnect layer 1548 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 15D can be collectively referred to as interconnect layer 1548.

In some implementations, a through contact penetrating the third semiconductor layer is formed. As illustrated in FIG. 15D, one or more through contacts 1549 each extending vertically through semiconductor layer 1504 can be formed. Through contacts 1549 can couple the interconnects in interconnect layers 1548 and 1528. Through contacts 1549 can be formed by first patterning contact holes through semiconductor layer 1504 using patterning process (e.g., photolithography and dry/wet etch processes). The contact holes can be filled with a conductor material (e.g., W or Cu). In some implementations, filling the contact holes includes depositing a spacer (e.g., a silicon oxide layer) before depositing the conductor material.

Method 1400 proceeds to operation 1410, as illustrated in FIG. 14, in which a handle substrate can be formed on the array of multi-gate DFM cells, and the first semiconductor layer can be thinned to expose the through contacts embedded in the first semiconductor layer.

Figure 15E:
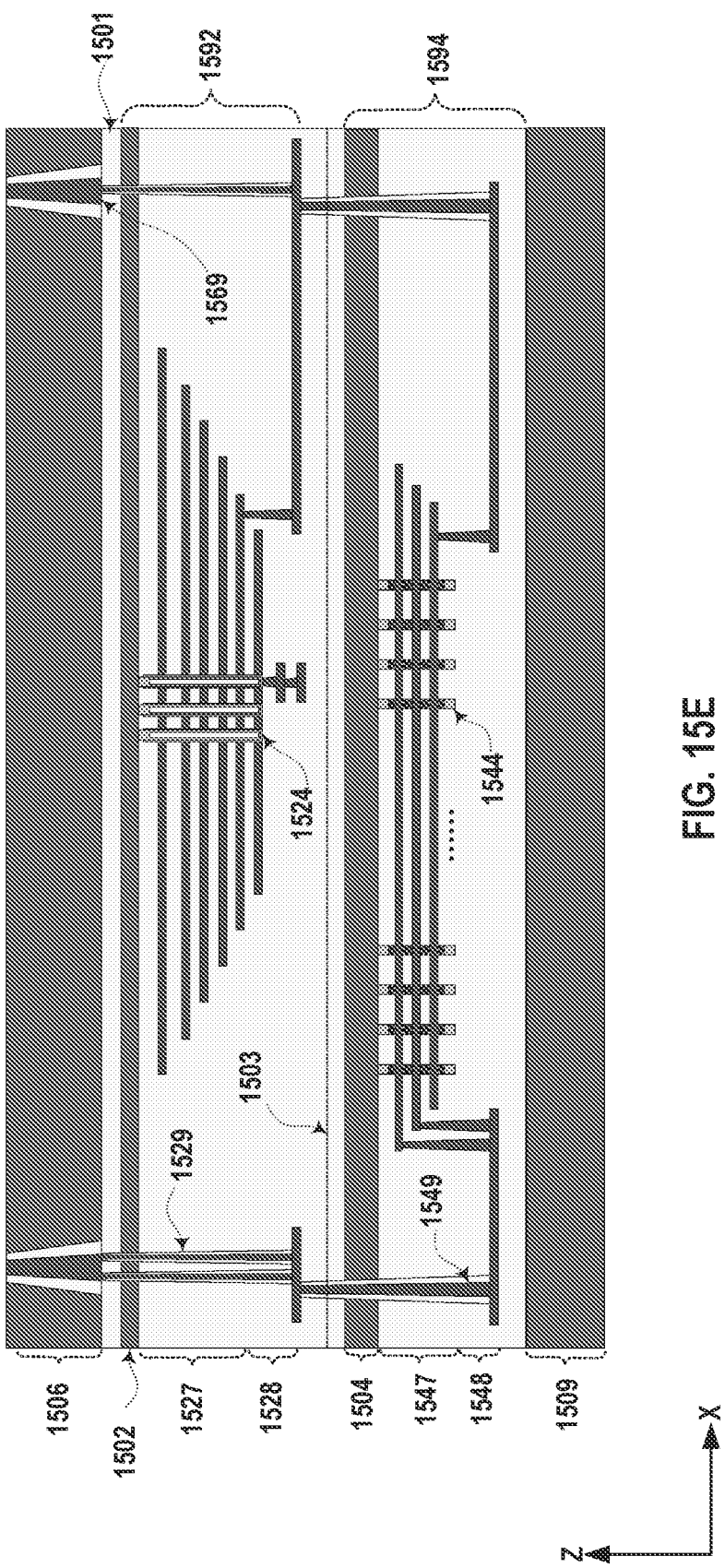

As shown in FIG. 15D, a handle substrate 1509 can be formed on top of second semiconductor structure 1594. Handle substrate 1509 (a.k.a., carrier wafer) can include any suitable materials and formed by any suitable deposition process. The bonded structure including first and second semiconductor structures 1592 and 1594, as well as handle substrate 1509 can be flipped over, as shown in FIG. 15E. A thinning process, such as wafer grinding, dry etch, wet etch, CMP, and/or any combination thereof, can be performed to semiconductor layer 1506 until through contacts 1569 are exposed.

Method 1400 proceeds to operation 1412, as illustrated in FIG. 14, in which a first periphery circuit is formed on the thinned first semiconductor layer. As illustrated in FIG. 15E, the first periphery circuit 1567 including a plurality of transistors 1561 and 1563 can be formed on semiconductor layer 1506 having single crystalline silicon or polycrystalline silicon. In some implementations, transistors 1561 can be HV transistor forming an HV circuit 866, and transistors 1563 can be LV transistor forming an LV circuit 864. Transistors 1561 and 1563 can be formed by a plurality of processes including, but not limited to, photolithography, dry/wet etch, thin film deposition, thermal growth, implantation, CMP, and any other suitable processes. In some implementations, doped regions are formed in semiconductor layer 1506 by ion implantation and/or thermal diffusion, which function, for example, as wells and source/drain regions of transistors 1561 and 1563. In some implementations, isolation regions (e.g., STIs) are also formed in semiconductor layer 1506 by wet/dry etch and thin film deposition. In some implementations, the thickness of gate dielectric of transistor 1561 is different from the thickness of gate dielectric of transistor 1563, for example, by depositing a thicker silicon oxide film in the region of HV transistor 1561 than the region of LV transistor 1563, or by etching back part of the silicon oxide film deposited in the region of transistor 1563. It is understood that the details of fabricating transistors 1561 and 1563 may vary depending on the types of the transistors (e.g., planar transistors 910 or 3D transistors 920 in FIGS. 9A, 9B, 9C, and 9D) and thus, are not elaborated for ease of description.

Figure 15F:
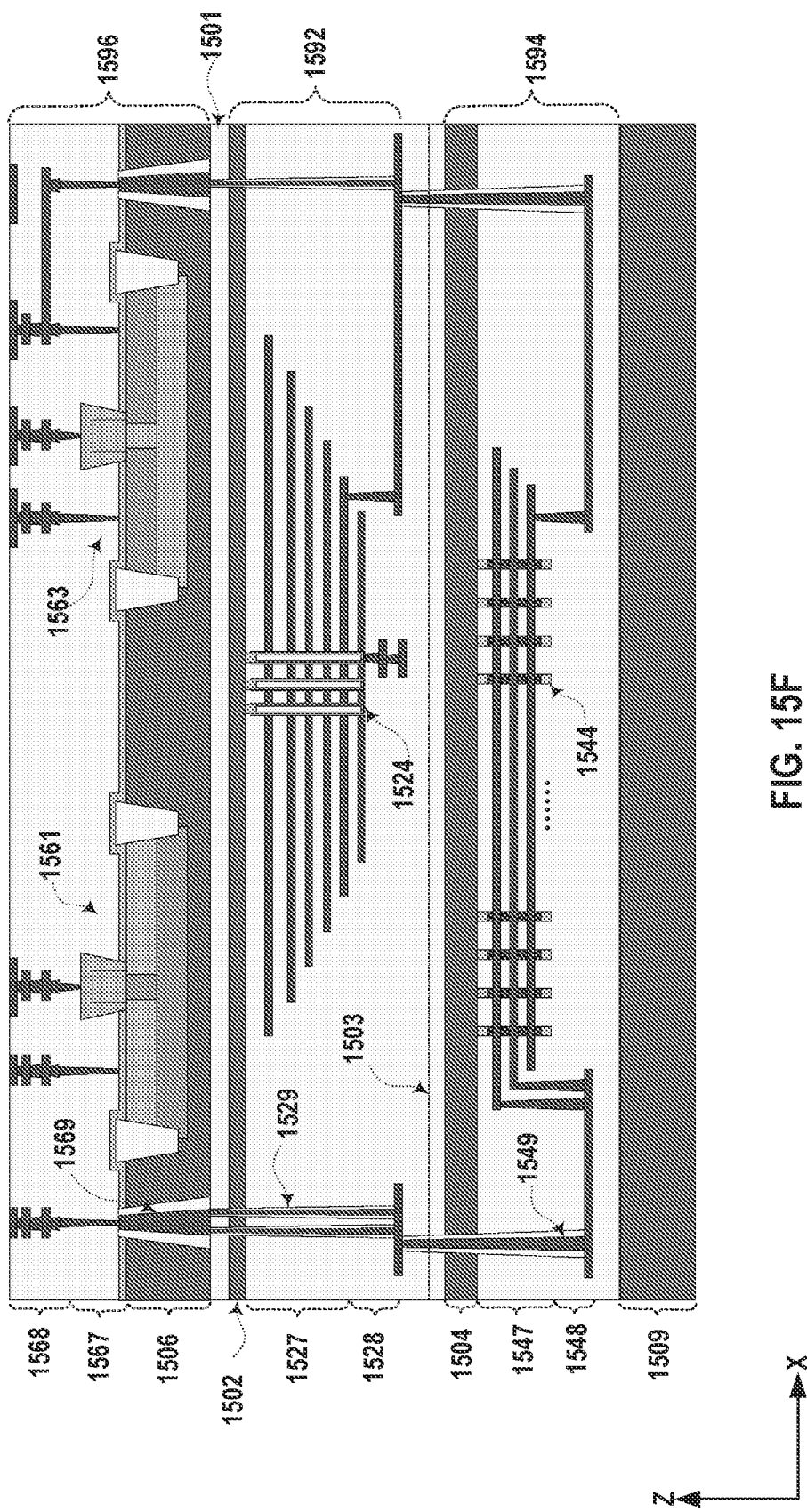

In some implementations, an interconnect layer 1568 is formed above the transistor on the thinned first semiconductor layer. The interconnect layer can include a plurality of interconnects in one or more ILD layers. As illustrated in FIG. 15F, an interconnect layer 1568 can be formed above transistors 1561 and 1563. Interconnect layer 1568 can include interconnects of MEOL and/or BEOL in a plurality of ILD layers to make electrical connections with transistors 1561 and 1563, as well as through contacts 1569. In some implementations, interconnect layer 1568 includes multiple ILD layers and interconnects therein formed in multiple processes. For example, the interconnects in interconnect layer 1568 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 15F can be collectively referred to as interconnect layer 1568.

Method 1400 proceeds to operation 1414, as illustrated in FIG. 14, in which a fourth semiconductor layer is formed above the first periphery circuit. The fourth semiconductor layer can include single crystalline silicon or polycrystalline silicon. In some implementations, to form the fourth semiconductor layer, a fourth substrate and the third semiconductor structure are bonded in a face-to-face manner, and the fourth substrate is thinned to leave the fourth semiconductor layer. The bonding can include transfer bonding. The fourth substrate can be a silicon substrate having single crystalline silicon or polycrystalline silicon.

Figure 15G:
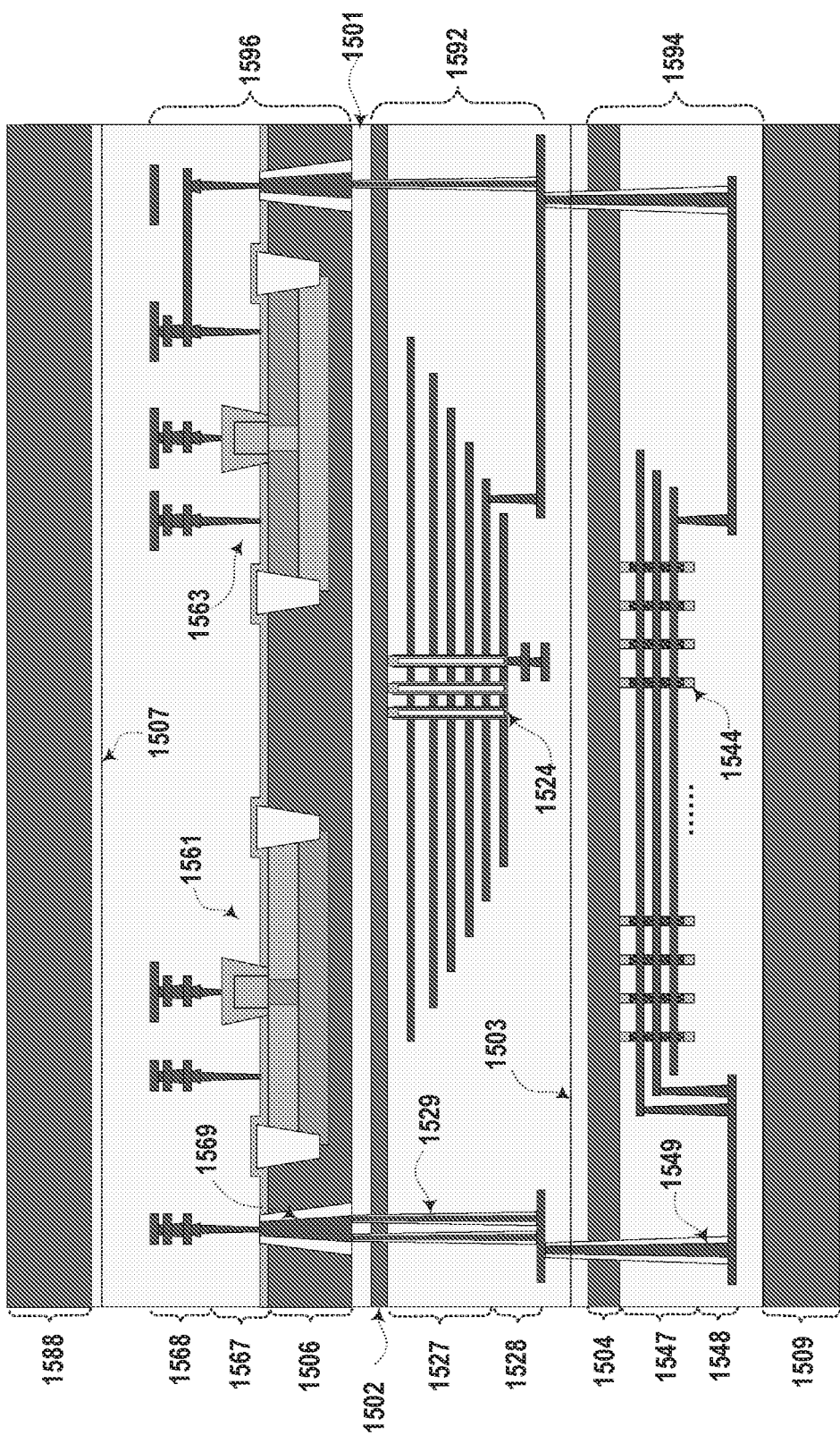

As illustrated in FIG. 15G, a semiconductor layer 1508, such as a single crystalline silicon layer or a polycrystalline silicon layer, is formed above interconnect layer 1568 and transistors 1561 and 1563. Semiconductor layer 1508 can be attached above interconnect layer 1568 to form a bonding interface 1507 vertically between semiconductor layer 1508 and interconnect layer 1568. In some implementations, to form semiconductor layer 1508, a fourth silicon substrate (not shown in FIG. 15G) and the bonded structure including first, second, and third semiconductor structure 1592, 1594, 1596 are bonded in a face-to-face manner (having the components formed on semiconductor layer 1506, such as transistors 1561 and 1563, facing toward the fourth silicon substrate) using transfer bonding, thereby forming bonding interface 1507. The other silicon substrate can then be thinned using any suitable processes to leave semiconductor layer 1508 attached above interconnect layer 1568. The details of various transfer bonding processes are described above with respect to FIGS. 31A-31D and FIGS. 32A-32D and thus, are not repeated for ease of description.

Figure 15H:
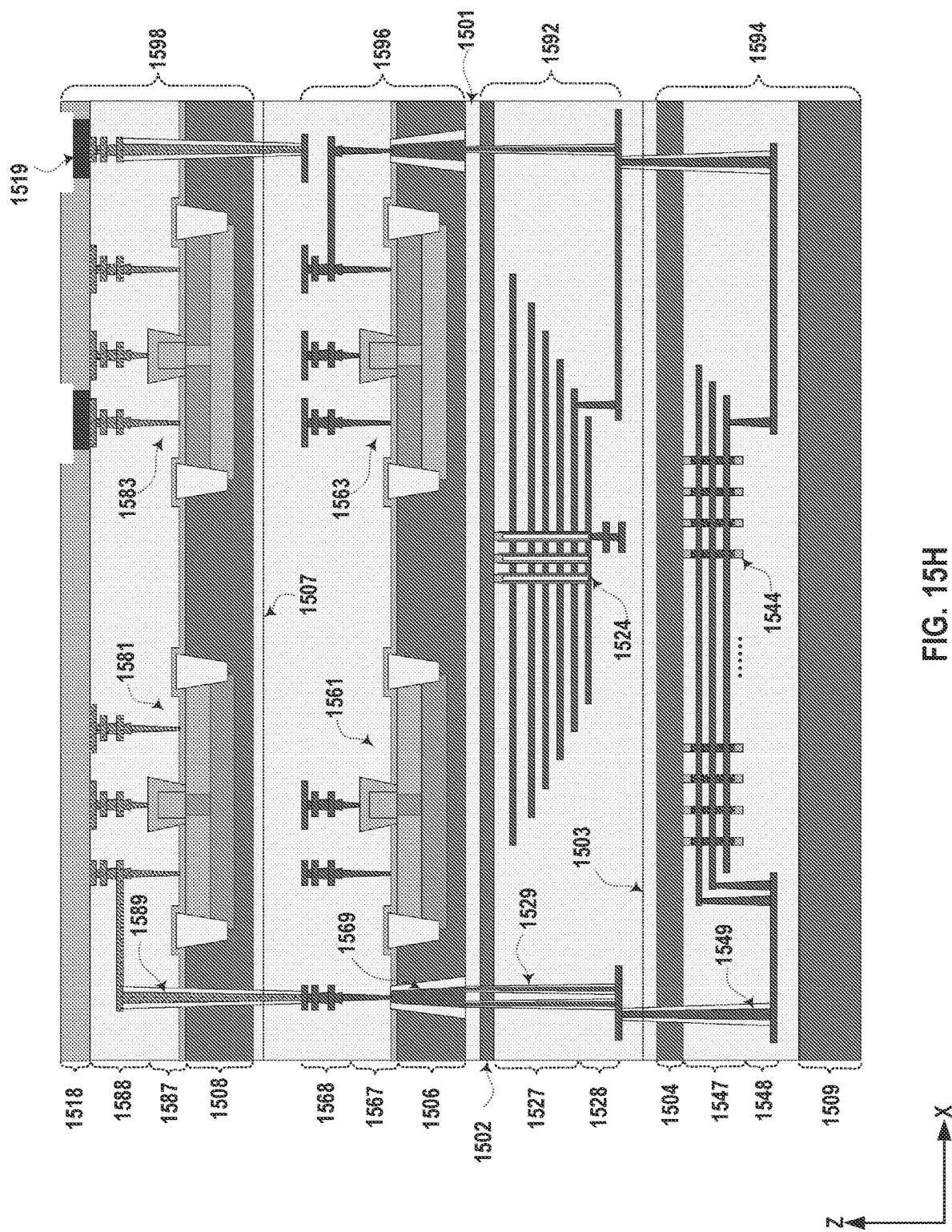

Referring to FIG. 14, method 1400 proceeds to operation 1416 in which a second periphery circuit is formed on the fourth semiconductor layer. As illustrated in FIG. 15H, the second periphery circuit 1587 including a plurality of transistors 1581 and 1583 can be formed on semiconductor layer 1508 having single crystalline silicon or polycrystalline silicon. In some implementations, transistors 1581 can be LV transistor forming an LV circuit 864, and transistors 1583 can be LLV transistor forming an LLV circuit 862. Transistors 1581 and 1583 can be formed by a plurality of processes including, but not limited to, photolithography, dry/wet etch, thin film deposition, thermal growth, implantation, CMP, and any other suitable processes. In some implementations, doped regions are formed in semiconductor layer 1508 by ion implantation and/or thermal diffusion, which function, for example, as wells and source/drain regions of transistors 1581 and 1583. In some implementations, isolation regions (e.g., STIs) are also formed in semiconductor layer 1508 by wet/dry etch and thin film deposition. In some implementations, the thickness of gate dielectric of LV transistor 1581 is different from the thickness of gate dielectric of LLV transistor 1583, for example, by depositing a thicker silicon oxide film in the region of LV transistor 1581 than the region of LLV transistor 1583, or by etching back part of the silicon oxide film deposited in the region of LLV transistor 1583. It is understood that the details of fabricating transistors 1581 and 1583 may vary depending on the types of the transistors (e.g., planar transistors 910 or 3D transistors 920 in FIGS. 9A, 9B, 9C, and 9D) and thus, are not elaborated for ease of description.

In some implementations, an interconnect layer 1588 is formed above the transistor on the fourth semiconductor layer. The interconnect layer can include a plurality of interconnects in one or more ILD layers. As illustrated in FIG. 15H, an interconnect layer 1588 can be formed above transistors 1581 and 1583. Interconnect layer 1588 can include interconnects of MEOL and/or BEOL in a plurality of ILD layers to make electrical connections with transistors 1581 and 1583. In some implementations, interconnect layer 1588 includes multiple ILD layers and interconnects therein formed in multiple processes. For example, the interconnects in interconnect layer 1588 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 15H can be collectively referred to as interconnect layer 1588. Different from interconnect layer 1568, in some implementations, the interconnects in interconnect layer 1588 include Cu, which has a relatively low resistivity among conductive metal materials. It is understood that although Cu has a relatively low thermal budget (incompatible with high-temperature processes), using Cu as the conductive materials of the interconnects in interconnect layer 1588 may become feasible since there are no more high-temperature processes after the fabrication of interconnect layer 1588.

In some implementations, a through contact penetrating the fourth semiconductor layer is formed. As illustrated in FIG. 15H, one or more through contacts 1589 each extending vertically through semiconductor layer 1508 can be formed. Through contacts 1589 can couple the interconnects in interconnect layers 1588 and 1568. Through contacts 1589 can be formed by first patterning contact holes through semiconductor layer 1508 using patterning process (e.g., photolithography and dry/wet etch processes). The contact holes can be filled with a conductor (e.g., Cu). In some implementations, filling the contact holes includes depositing a spacer (e.g., a silicon oxide layer) before depositing the conductor.

Method 1400 proceeds to operation 1418, as illustrated in FIG. 14, in which one or more pad-out interconnect layers can be formed. In some implementations, a pad-out interconnect layer can be formed above the second periphery circuit. In some other implementations, a pad-out interconnect layer can be formed below the handle substrate. In some other implementations, a first pad-out interconnect layer can be formed above the second periphery circuit, and a second pad-out interconnect layer can be formed below the handle substrate.

In some implementations as illustrated in FIG. 15H, a pad-out interconnect layer 1518 is formed above interconnect layer 1588 and transistors 1581 and 1583 on semiconductor layer 1508. Pad-out interconnect layer 1518 can include interconnects, such as contact pads 1519, formed in one or more ILD layers. Contact pads 1519 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

In some other implementations not shown in the figures, to form a pad-out interconnect layer on the handle substrate, handle substrate 1509 is thinned to become a thinned semiconductor layer having single crystalline silicon or polycrystalline silicon using processes including, but not limited to, wafer grinding, dry etch, wet etch, CMP, any other suitable processes, or any combination thereof. After the thinning, through contacts (not shown) may be formed extending vertically through the thinned handle substrate 1509, for example, by wet/dry etching followed by depositing dielectric materials as spacers and conductive materials as conductors. It is understood that in some examples, the contact pads may be formed in handle substrate 1509 before thinning and be exposed from the backside of handle substrate 1509 (where the thinning occurs) after the thinning. Then a pad-out interconnect layer is formed on the thinned handle substrate. In some other implementations not shown in the figures, a first pad-out interconnect layer having contact pads may be formed on interconnect layer 1588, and a second pad-out interconnect layer having contact pads may be formed on the thinned handle substrate 1509.

Figure 16:
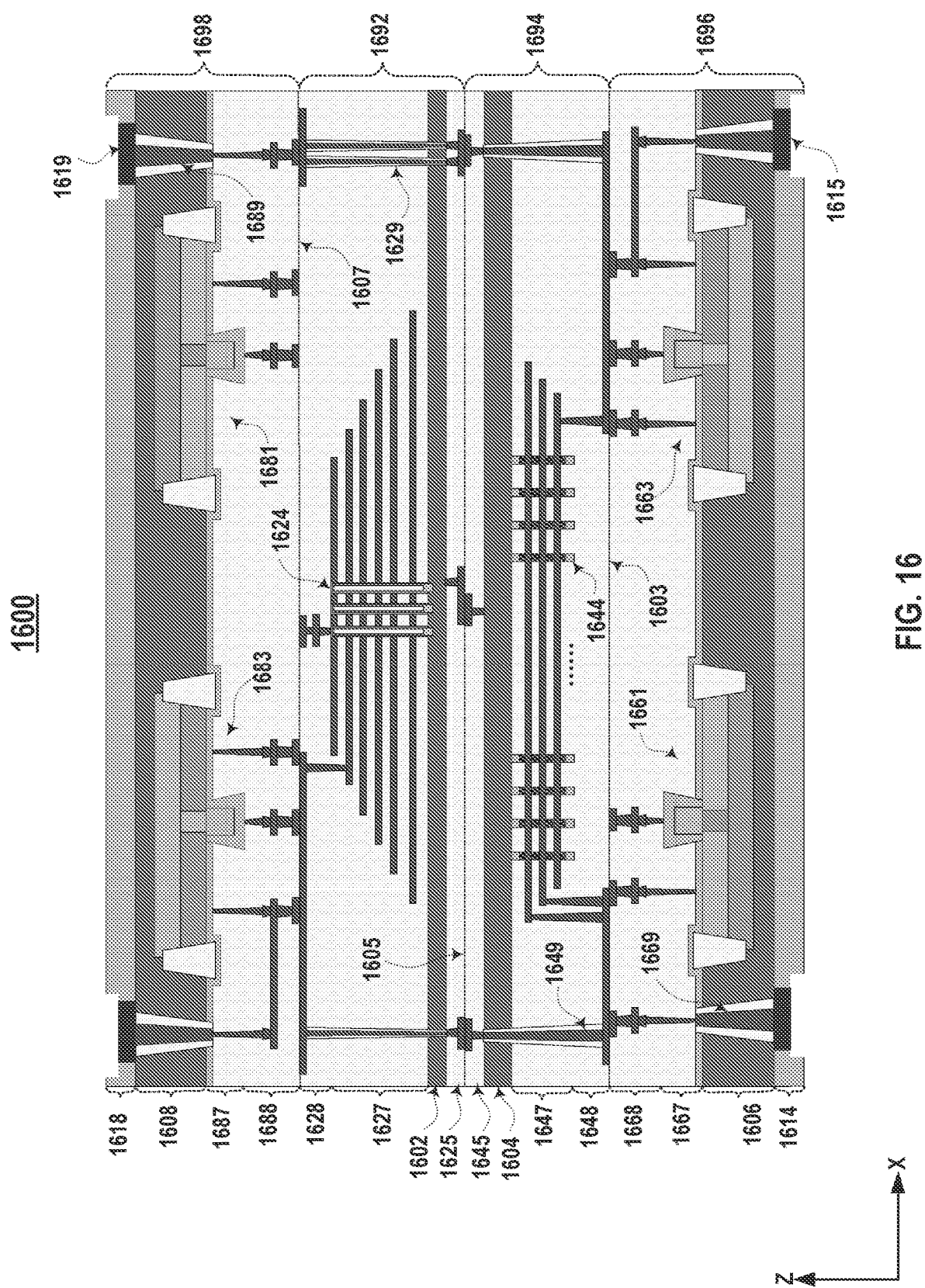
FIG. 16 illustrates a side view of another 3D memory device, according to some aspects of the present disclosure.

FIG. 16 illustrates a schematic diagram of a cross-sectional side view of another exemplary 3D memory device 1600 having four stacked semiconductor structures, according to some other aspects of the present disclosure. 3D memory device 1600 may be an example of 3D memory device 100B in FIG. 1B. 3D memory device 1600 includes four semiconductor structures stacked over one another in different planes in the vertical direction (e.g., the z-direction in FIG. 16). In some implementations, first semiconductor structure 1692 including a first memory cell array can be bonded between second semiconductor structure 1694 including a second memory cell array and fourth semiconductor structure 1698 including a second periphery circuit, and second semiconductor structure 1694 including a second memory cell array can be bonded between first semiconductor structure 1692 including the first memory cell array and third semiconductor structure 1696 including a first periphery circuit.

That is, As shown in FIG. 16, third semiconductor structure 1696 including the first peripheral circuits (e.g., HV and LV circuits) can be formed on one side of 3D memory device 1600, and fourth semiconductor structure 1698 including the second peripheral circuits (e.g., LV and LLV circuits) can be formed on another side of 3D memory device 1600. First semiconductor structure 1692 including the first memory cell array (e.g., 3D NAND Flash memory cell array) and second semiconductor structure 1694 including the second memory cell array (e.g., 3D DFM cell array) can be sandwiched between third semiconductor structure 1696 and fourth semiconductor structure 1698. In some implementations, first semiconductor structure 1692 and fourth semiconductor structure 1698 can be bonded in a face-to-face manner, first semiconductor structure 1692 and second semiconductor structure 1694 can be bonded in a back-to-back manner, while second semiconductor structure 1694 and third semiconductor structure 1696 can be bonded in a face-to-face manner.

In some implementations shown in FIG. 16, fourth semiconductor structure 1698 including the second peripheral circuit on one side of 3D memory device 1600 may include a first pad-out interconnect layer 1618, and third semiconductor structure 1696 including the first peripheral circuit on the other side of 3D memory device 1600 may include a second pad-out interconnect layer 1614, such that 3D memory device 1600 may be pad-out from both sides of 3D memory device 1600. In some other implementations not shown in the figures, one of first pad-out interconnect layer 1618 and second pad-out interconnect layer 1614 can be omitted, such that 3D memory device may be pad-out from a single side of the 3D memory device.

As shown in FIG. 16, first semiconductor structure 1692 can include semiconductor layer 1602 having semiconductor materials. In some implementations, semiconductor layer 1602 is a silicon substrate having single crystalline silicon or polycrystalline silicon. First semiconductor structure 1692 can include a first memory cell array, such as an array of NAND memory strings 1624 on one side of semiconductor layer 1602. The sources of NAND memory strings 1624 can be in contact with semiconductor layer 1602. In some implementations, NAND memory strings 1624 are disposed vertically between bonding interface 1607 and semiconductor layer 1602. Each NAND memory string 1624 extends vertically through a plurality of pairs each including a conductive layer and a dielectric layer, according to some implementations. The stacked and interleaved conductive layers and dielectric layers are also referred to herein as a stack structure, e.g., a memory stack 1627.

Memory stack 1627 may be an example of memory stack 304 in FIGS. 3A-3C, and the conductive layer and dielectric layer in memory stack 1627 may be examples of gate conductive layers 306 and dielectric layer 308, respectively, in memory stack 304. The interleaved conductive layers and dielectric layers in memory stack 1627 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 1627. It is understood that in some examples, trench isolations and doped regions (not shown) may be formed in semiconductor layer 1602 as well.

In some implementations, each NAND memory string 1624 is a "charge trap" type of NAND memory string including any suitable channel structures disclosed herein, such as bottom plug channel structure 312A, sidewall plug channel structure 312B, or bottom open channel structure 312C, described above in detail with respect to FIGS. 3A-3C. It is understood that NAND memory strings 1624 are not limited to the "charge trap" type of NAND memory strings and may be "floating gate" type of NAND memory strings in other examples.

As shown in FIG. 16, first semiconductor structure 1692 can further include bonding layer 1625 on another side of semiconductor layer 1602. Bonding layer 1625 can include conductive bonding contacts and dielectrics electrically isolating the bonding contacts, which can be used, for example, for hybrid bonding as described below in detail. Conductive bonding contacts can be MEOL/BEOL interconnects and/or contact pads including any suitable conductive materials including, but not limited to, W, Co, Cu, Al, silicides, or any combination thereof.

As shown in FIG. 16, first semiconductor structure 1692 can further include an interconnect layer 1628 on and in contact with NAND memory strings 1624 to transfer electrical signals to and from NAND memory strings 1624. Interconnect layer 1628 can include a plurality of interconnects, such as MEOL interconnects and BEOL interconnects. In some implementations, the interconnects in interconnect layer 1628 also include local interconnects, such as bit line contacts and word line contacts. Interconnect layer 1628 can further include one or more interlayer dielectric (ILD) layers in which the lateral lines and vias can form. The interconnects in interconnect layer 1628 can include conductive materials including, but not limited to, W, Co, Cu, Al, silicides, or any combination thereof. The ILD layers in interconnect layer 1628 can include dielectric materials including, but not limited to, silicon oxide, silicon nitride, silicon oxynitride, low-k dielectrics, or any combination thereof. Interconnect layer 1628 can further include a bonding layer comprising a plurality of conductive bonding contacts and dielectrics electrically isolating the bonding contacts, which can be used, for example, for hybrid bonding as described below in detail.

As shown in FIG. 16, first semiconductor structure 1692 can further include one or more through contacts 1629 extending vertically through semiconductor layer 1602. In some implementations, through contact 1629 couples the interconnects in interconnect layer 1628 to the bonding contacts of bonding layer 1625 to make an electrical connection between components on opposite sides of semiconductor layer 1602. Through contact 1629 can include conductive materials including, but not limited to, W, Co, Cu, Al, silicides, or any combination thereof. In some implementations, through contact 1629 includes W. In some implementations, through contact 1629 includes a via surrounded by a dielectric spacer (e.g., having silicon oxide) to electrically separate the via from semiconductor layer 1602. Depending on the thickness of semiconductor layer 1602, through contact 1629 can be an ILV having a depth in the submicron-level (e.g., between 10 nm and 1 μm).

Second semiconductor structure 1694 can be bonded on first semiconductor structure 1692 in a back-to-back manner at bonding interface 1605. It is noted that, second semiconductor structure 1694 is flipped over in FIG. 16. Therefore, some spatial terms such as "on," "above," "below," etc., in descriptions of second semiconductor structure 1694 below may be upside down.

Second semiconductor structure 1694 can include semiconductor layer 1604 having semiconductor materials. In some implementations, semiconductor layer 1604 is a layer of single crystalline silicon or polycrystalline silicon. A bonding layer 1645 is formed on one side of semiconductor layer 1604. Bonding layer 1645 can include conductive bonding contacts and dielectrics electrically isolating the bonding contacts, which can be used, for example, for hybrid bonding as described below in detail. Conductive bonding contacts can be MEOL/BEOL interconnects and/or contact pads including any suitable conductive materials including, but not limited to W, Co, Cu, Al, silicides, or any combination thereof. Bonding interface 1605 is vertically between and in contact with bonding layers 1625 and 1645, respectively, according to some implementations. That is, bonding layers 1625 and 1645 can be disposed on opposite sides of bonding interface 1605, and the bonding contacts of bonding layer 1625 can be in contact with the bonding contacts of bonding layer 1645 at bonding interface 1605. As a result, a plurality of bonding contacts across bonding interface 1605 can make direct, short-distance (e.g., micron-level) electrical connections between adjacent semiconductor structures 1692 and 1694. In practice, bonding interface 1605 can be a layer with a certain thickness that includes the bottom surface of bonding layer 1625 of first semiconductor structure 1692 and the top surface of bonding layer 1645 of second semiconductor structure 1694. In some implementations, dielectric layer(s) (e.g., silicon oxide layer) are formed vertically between bonding interface 1605 and bonding layers 1625, 1645. Thus, it is understood that bonding interface 1605 may include the surfaces of the dielectric layer(s) in some examples.

As shown in FIG. 16, second semiconductor structure 1694 can include a second memory cell array, such as an array of multi-gate DFM cells 1644 on semiconductor layer 1604. In some implementations, each multi-gate DFM cell 1644 can be referred to DFM memory cell 600A/600B described above in connection with FIGS. 6A and 6B, and the array of multi-gate DFM cells can be referred to DFM memory array 700 described above in connection with FIG. 7. The sources of multi-gate DFM cells 1644 can be in contact with semiconductor layer 1604. In some implementations, multi-gate DFM cells 1644 are disposed vertically between semiconductor layer 1604 and bonding interface 1603. Each multi-gate DFM cell 1644 extends vertically through a memory stack 1647 including a plurality of pairs each including a conductive layer and a dielectric layer, according to some implementations. The interleaved conductive layers and dielectric layers alternate in the vertical direction, according to some implementations. Each conductive layer can include a gate electrode surrounded by an adhesive layer and a gate dielectric layer. The gate electrode of the conductive layer can extend laterally as a word line or a plate line, ending at one or more staircase structures of the memory stack 1647. It is understood that in some examples, trench isolations and doped regions (not shown) may be formed in semiconductor layer 1604 as well.

As shown in FIG. 16, second semiconductor structure 1694 can further include an interconnect layer 1648 above and in contact with multi-gate DFM cells 1644 to transfer electrical signals to and from multi-gate DFM cells 1644. Interconnect layer 1648 can include a plurality of interconnects, such as MEOL interconnects and BEOL interconnects. In some implementations, the interconnects in interconnect layer 1648 also include local interconnects, such as bit line connections, word line connections, plate line connections, and/or source line connections. Interconnect layer 1648 can further include one or more interlayer dielectric (ILD) layers in which the lateral lines and vias can form. The interconnects in interconnect layer 1648 can include conductive materials including, but not limited to W, Co, Cu, Al, silicides, or any combination thereof. The ILD layers in interconnect layer 1648 can include dielectric materials including, but not limited to, silicon oxide, silicon nitride, silicon oxynitride, low-k dielectrics, or any combination thereof. Interconnect layer 1648 can further include a bonding layer comprising a plurality of conductive bonding contacts and dielectrics electrically isolating the bonding contacts, which can be used, for example, for hybrid bonding as described below in detail.

As shown in FIG. 16, second semiconductor structure 1694 can further include one or more through contacts 1649 extending vertically through semiconductor layer 1604. In some implementations, through contact 1649 couples the interconnects in interconnect layer 1648 to the bonding contacts in bonding layer 1645 to make an electrical connection across semiconductor layer 1604 between components formed on opposite sides of semiconductor layer 1604. Through contact 1649 can include conductive materials including, but not limited to, W, Co, Cu, Al, silicides, or any combination thereof. In some implementations, through contact 1649 includes W. In some implementations, through contact 1649 includes a via surrounded by a dielectric spacer (e.g., having silicon oxide) to electrically separate the via from semiconductor layer 1604. Depending on the thickness of semiconductor layer 1604, through contact 1649 can be an ILV having a depth in the submicron-level (e.g., between 10 nm and 1 μm), or a TSV having a depth in the micron- or tens micron-level (e.g., between 1 μm and 100 μm).

As shown in FIG. 16, third semiconductor structure 1396 includes semiconductor layer 1606 of single crystalline silicon or polycrystalline silicon thinned from a silicon substrate. Third semiconductor structure 1696 can include a device layer 1667 above and in contact with semiconductor layer 1606. In some implementations, device layer 1667 includes a first peripheral circuit 1661 and a second peripheral circuit 1663. First peripheral circuit 1661 can include HV circuits 866, such as driving circuits, and second peripheral circuit 1663 can include LV circuits 864, such as page buffer circuits and logic circuits. In some implementations, first peripheral circuit 1661 includes a plurality of HV transistors in contact with semiconductor layer 1606, and second peripheral circuit 1663 includes a plurality of LV transistors in contact with semiconductor layer 1606. In some implementations, each HV transistor or LV transistor includes a gate dielectric, and the thickness of the gate dielectric of HV transistor (e.g., in HV circuit 866) is larger than the thickness of the gate dielectric of LV transistor (e.g., in LV circuit 864) due to the higher voltage applied to the HV transistor than the LV transistor. Trench isolations (e.g., STIs) and doped regions (e.g., wells, sources, and drains of HV transistors and LV transistors) can be formed on or in semiconductor layer 1606 as well.

In some implementations, third semiconductor structure 1696 further includes an interconnect layer 1668 above device layer 1667 to transfer electrical signals to and from peripheral circuits 1661 and 1663. As shown in FIG. 16, interconnect layer 1668 can be vertically between bonding interface 1603 and device layer 1667 (including HV transistors and LV transistors of peripheral circuits 1661 and 1663). Interconnect layer 1668 can include a plurality of interconnects, such as MEOL interconnects and BEOL interconnects. The interconnects in interconnect layer 1668 can be coupled to HV transistors and LV transistors of peripheral circuits 1661 and 1663 in device layer 1667. Interconnect layer 1668 can further include one or more ILD layers in which the lateral lines and vias can form. That is, interconnect layer 1668 can include lateral lines and vias in multiple ILD layers. In some implementations, the devices in device layer 1667 are coupled to one another through the interconnects in interconnect layer 1668. For example, peripheral circuit 1661 may be coupled to peripheral circuit 1663 through interconnect layer 1668. The interconnects in interconnect layer 1668 can include conductive materials including, but not limited to, W, Co, Cu, Al, silicides, or any combination thereof. The ILD layers in interconnect layer 1668 can include dielectric materials including, but not limited to, silicon oxide, silicon nitride, silicon oxynitride, low-k dielectrics, or any combination thereof. In some implementations, the interconnects in interconnect layer 1668 include W, which has a relatively high thermal budget (compatible with high-temperature processes) and good quality (fewer detects, e.g., voids) among conductive metal materials.

Interconnect layer 1668 can further include a bonding layer comprising a plurality of conductive bonding contacts and dielectrics electrically isolating the bonding contacts, which can be used, for example, for hybrid bonding as described below in detail. As shown in FIG. 16, third semiconductor structure 1696 can be bonded to second semiconductor structure 1694 in a face-to-face manner at bonding interface 1603. That is, the bonding layer of interconnect layer 1668 of third semiconductor structure 1696 can be bonded to the bonding layer of interconnect layer 1648 of second semiconductor structure 1694. The bonding contacts in the bonding layer of interconnect layer 1648 can be in contact with the bonding contacts in the bonding layer of interconnect layer 1668 at bonding interface 1603. As a result, a plurality of bonding contacts across bonding interface 1603 can make direct, short-distance (e.g., micron-level) electrical connections between adjacent semiconductor structures 1692 and 1694. In some implementations, dielectric layer(s) (e.g., silicon oxide layer) are formed vertically between bonding interface 1603 and the bonding layers of interconnect layers 1648, 1668. Thus, it is understood that bonding interface 1603 may include the surfaces of the dielectric layer(s) in some examples.

As shown in FIG. 16, third semiconductor structure 1396 can further include one or more through contacts 1669 extending vertically through semiconductor layer 1606. In some implementations, through contact 1669 couples the interconnects in interconnect layer 1668 to contact pads 1615. Through contact 1669 can include conductive materials including, but not limited to, W, Co, Cu, Al, silicides, or any combination thereof. In some implementations, through contact 1669 includes W. In some implementations, through contact 1669 includes a via surrounded by a dielectric spacer (e.g., having silicon oxide) to electrically separate the via from semiconductor layer 1606. Depending on the thickness of semiconductor layer 1606, through contact 1669 can be an ILV having a depth in the submicron-level (e.g., between 10 nm and 1 µm), or a TSV having a depth in the micron- or tens micron-level (e.g., between 1 µm and 100 µm). As shown in FIG. 16, third semiconductor structure 1696 can further include a pad-out interconnect layer 1614 on semiconductor layer 1606. Pad-out interconnect layer 1614 can include interconnects, e.g., contact pads 1615, in one or more ILD layers. In some implementations, the interconnects in pad-out interconnect layer 1614 can transfer electrical signals between 3D memory device 1600 and external devices, e.g., for pad-out purposes.

Fourth semiconductor structure 1698 can be bonded on top of first semiconductor structure 1692 in a face-to-face manner at bonding interface 1607. It is noted that, fourth semiconductor structure 1698 is flipped over in FIG. 16. Therefore, some spatial terms such as "on," "above," "below," etc., in descriptions of fourth semiconductor structure 1698 may be upside down.

Fourth semiconductor structure 1698 can include semiconductor layer 1608 having semiconductor materials, such as single crystalline silicon or polycrystalline silicon. Fourth semiconductor structure 1698 can include a device layer 1687 above and in contact with semiconductor layer 1608. In some implementations, device layer 1687 includes a third peripheral circuit 1681 and a fourth peripheral circuit 1683. Third peripheral circuit 1681 can include LLV circuits 862, such as I/O circuits, and fourth peripheral circuit 1683 can include LV circuits 864, such as page buffer circuits and logic circuits. In some implementations, third peripheral circuit 1681 includes a plurality of LLV transistors, and fourth peripheral circuit 1683 includes a plurality of LV transistors as well. In some implementations, each LLV and LV transistor includes a gate dielectric, and the thickness of the gate dielectric of LLV transistor (e.g., in LLV circuit 862) is smaller than the thickness of the gate dielectric of LV transistor (e.g., in LV circuit 864) due to the lower voltage applied to the LLV transistor than the LV transistor. Trench isolations (e.g., STIs) and doped regions (e.g., wells, sources, and drains of the LLV transistor and the LV transistor can be formed on or in semiconductor layer 1608 as well.

Moreover, the different voltages applied to different HV transistors, LV transistors, and LLV transistors in third and fourth semiconductor structures 1696 and 1698 can lead to differences in device dimensions between second and third semiconductor structures 1696 and 1698. In some implementations, the thickness of the gate dielectric of HV transistor (e.g., in HV circuit 866) is larger than the thickness of the gate dielectric of LLV transistor (e.g., in LLV circuit 862) due to the higher voltage applied to the HV transistor than the LLV transistor. In some implementations, the thickness of the gate dielectric of the LV transistor (e.g., in LV circuit 864) in fourth semiconductor structure 1698 is the same as the thickness of the gate dielectric of the LV transistor (e.g., in LV circuit 864) in third semiconductor structure 1696 due to the same operation voltage. In some implementations, the thickness of semiconductor layer 1606 in which the HV transistor (e.g., in HV circuit 866) is formed is larger than the thickness of semiconductor layer 1608 in which the LLV transistor (e.g., in LLV circuit 862) is formed due to the higher voltage applied to the HV transistor than the LLV transistor.

As shown in FIG. 16, fourth semiconductor structure 1698 can further include an interconnect layer 1688 above device layer 1687 to transfer electrical signals to and from peripheral circuits 1681 and 1683. As shown in FIG. 16, device layer 1687 (including HV transistors and LV transistors of peripheral circuits 1681 and 1683) can be vertically between bonding interface 1607 and interconnect layer 1688. Interconnect layer 1688 can include a plurality of interconnects coupled to the HV transistors of peripheral circuit 1681 and the LV transistors of peripheral circuit 1683 in device layer 1687. Interconnect layer 1688 can further include one or more ILD layers in which the interconnects can form. That is, interconnect layer 1688 can include lateral lines and vias in multiple ILD layers. In some implementations, the devices in device layer 1687 are coupled to one another through the interconnects in interconnect layer 1688. For example, peripheral circuit 1681 may be coupled to peripheral circuit 1683 through interconnect layer 1688. The interconnects in interconnect layer 1688 can include conductive materials including, but not limited to, W, Co, Cu, Al, silicides, or any combination thereof. The ILD layers in interconnect layer 1688 can include dielectric materials including, but not limited to, silicon oxide, silicon nitride, silicon oxynitride, low-k dielectrics, or any combination thereof.

Interconnect layer 1688 can further include a bonding layer comprising a plurality of conductive bonding contacts and dielectrics electrically isolating the bonding contacts, which can be used, for example, for hybrid bonding as described below in detail. As shown in FIG. 16, fourth semiconductor structure 1698 can be bonded to first semiconductor structure 1692 in a face-to-face manner at bonding interface 1607. That is, the bonding layer of interconnect layer 1688 of fourth semiconductor structure 1698 can be bonded to the bonding layer of interconnect layer 1628 of first semiconductor structure 1692. The bonding contacts in the bonding layer of interconnect layer 1688 can be in contact with the bonding contacts in the bonding layer of interconnect layer 1628 at bonding interface 1607. As a result, a plurality of bonding contacts across bonding interface 1607 can make direct, short-distance (e.g., micron-level) electrical connections between adjacent semiconductor structures 1698 and 1692. In some implementations, dielectric layer(s) (e.g., silicon oxide layer) are formed vertically between bonding interface 1607 and the bonding layers of interconnect layers 1688, 1628. Thus, it is understood that bonding interface 1607 may include the surfaces of the dielectric layer(s) in some examples.

As shown in FIG. 16, fourth semiconductor structure 1698 can further include one or more through contacts 1689 extending vertically through semiconductor layer 1608. In some implementations, through contact 1689 couples the interconnects in interconnect layer 1688 to the contact pads 1619 in pad-out interconnect layer 1618. Through contact 1689 can include conductive materials including, but not limited to, W, Co, Cu, Al, silicides, or any combination thereof. In some implementations, through contact 1689 includes a via surrounded by a dielectric spacer (e.g., having silicon oxide) to electrically separate the via from semiconductor layer 1608. Depending on the thickness of semiconductor layer 1608, through contact 1689 can be an ILV having a depth in the submicron-level (e.g., between 10 nm and 1 µm), or a TSV having a depth in the micron- or tens micron-level (e.g., between 1 µm and 100 µm). As shown in FIG. 16, fourth semiconductor structure 1698 can further include a pad-out interconnect layer 1618 on semiconductor layer 1608. Pad-out interconnect layer 1618 can include interconnects, e.g., contact pads 1619, in one or more ILD layers. In some implementations, the interconnects in pad-out interconnect layer 1618 can transfer electrical signals between 3D memory device 1600 and external devices, e.g., for pad-out purposes.

As a result, peripheral circuits 1661, 1663, 1681, and 1683 in third and fourth semiconductor structures 1696 and 1698 can be coupled to NAND memory strings 1624 in first semiconductor structure 1692 and multi-gate DFM cells 1644 in second semiconductor structure 1694 through various interconnection structures, including interconnect layers 1688, 1668, 1648, and 1628, bonding contacts in bonding layers 1625 and 1645, and through contacts 1649 and 1629. Moreover, peripheral circuits 1681, 1683, 1661, and 1663, as well as NAND memory strings 1624 and multi-gate DFM cells 1644 in 3D memory device 1600 can be further coupled to external devices through pad-out interconnect layer 1614 and/or pad-out interconnect layer 1618.

Figure 17:
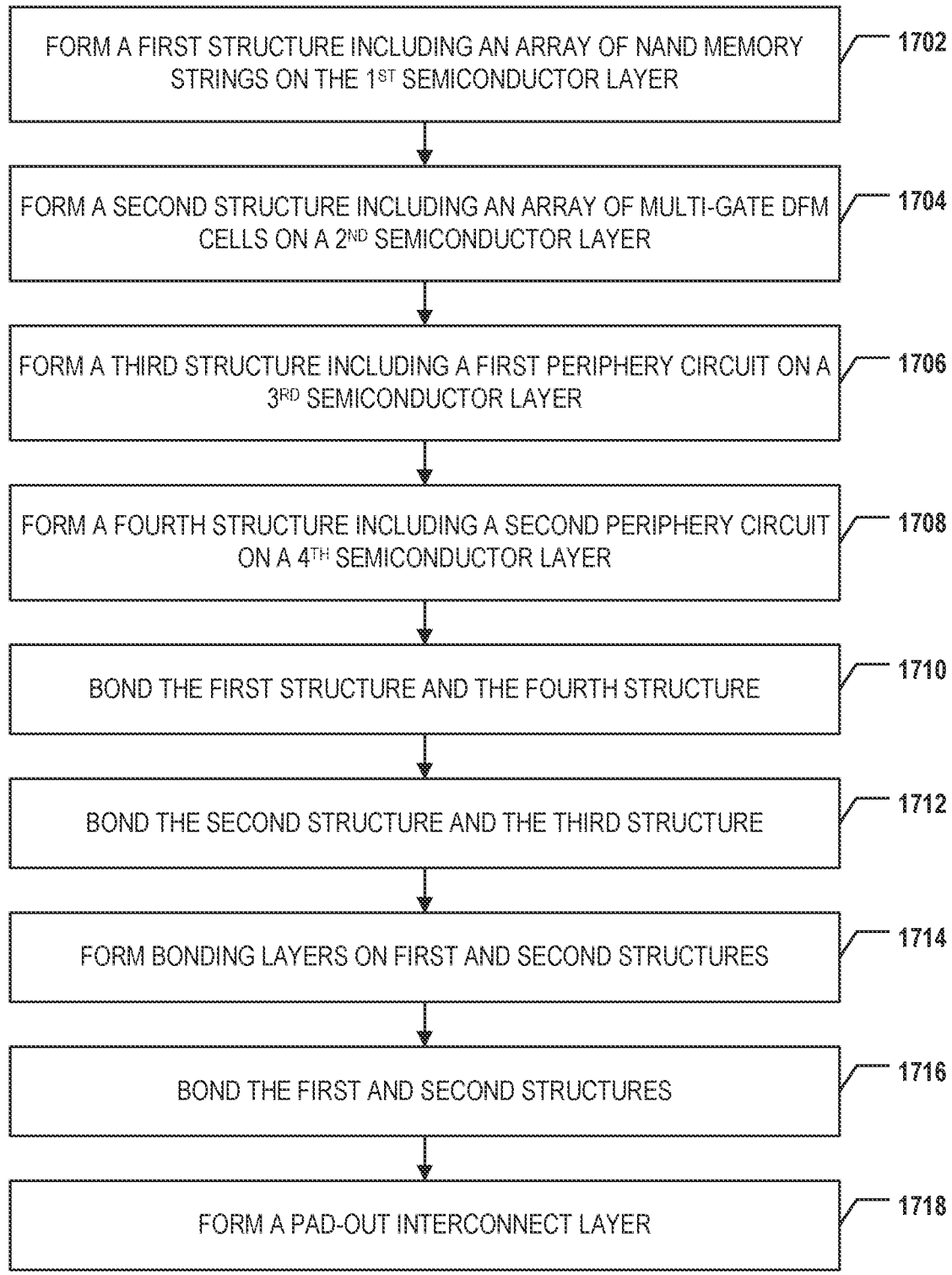
FIG. 17 illustrates a flowchart of a method for forming the 3D memory device in FIG. 16, according to some aspects of the present disclosure.

FIG. 17 illustrates a flowchart of a method 1700 for forming the 3D memory device 1600 shown in FIG. 16, according to some aspects of the present disclosure. FIGS. 18A-18J illustrate the 3D memory device 1600 at certain stages of the fabrication process of method 1700 as shown in FIG. 17, according to some aspects of the present disclosure. It is understood that the operations shown in method 1700 are not exhaustive and that other operations can be performed as well before, after, or between any of the illustrated operations. Further, some of the operations may be performed simultaneously, or in a different order than shown in FIG. 17. For example, operations 1702, 1704, 1706, and 1708 may be performed in parallel, and operations 1710 and 1712 may be performed in parallel.

Referring to FIG. 17, method 1700 starts at operation 1702, in which a first semiconductor structure including an array of NAND memory strings disposed on a first semiconductor layer can be formed. The first semiconductor layer can be a silicon substrate having single crystalline silicon or polycrystalline silicon. In some implementations, to form the array of NAND memory strings, a first memory stack is formed on the first semiconductor layer.

Figure 18A:
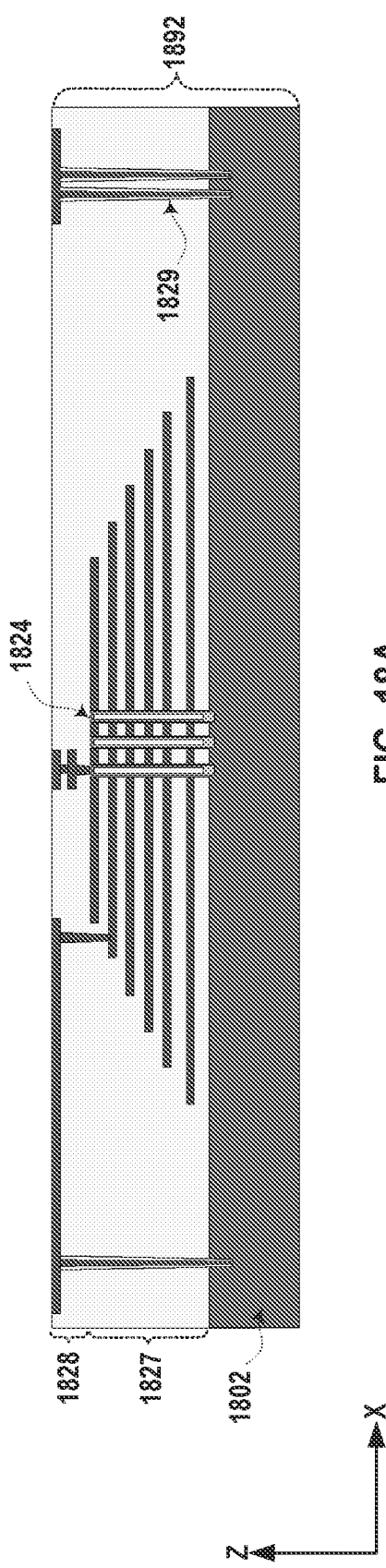
FIGS. 18A-18J illustrate a fabrication process for forming the 3D memory device in FIG. 16, according to some aspects of the present disclosure.

As illustrated in FIG. 18A, first semiconductor layer 1802 can be a semiconductor layer having single crystalline silicon or polycrystalline silicon. A first stack structure, such as a first memory stack 1827 including interleaved conductive layers and dielectric layers, is formed on semiconductor layer 1802. To form first memory stack 1827, in some implementations, a dielectric stack (not shown) including interleaved sacrificial layers (not shown) and the dielectric layers is formed on semiconductor layer 1802. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. First memory stack 1827 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that first memory stack 1827 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between first memory stack 1827 and semiconductor layer 1802.

As illustrated in FIG. 18A, NAND memory strings 1824 are formed above semiconductor layer 1802, each of which extends vertically through first memory stack 1827 to be in contact with semiconductor layer 1802. In some implementations, fabrication processes to form NAND memory string 1824 include forming a channel hole through first memory stack 1827 (or the dielectric stack) and into semiconductor layer 1802 using dry etching/and or wet etching, such as deep reactive-ion etching (DRIE), followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 1824 may vary depending on the types of channel structures of NAND memory strings 1824 (e.g., bottom plug channel structure 312A, sidewall plug channel structure 312B, or bottom open channel structure 312C in FIGS. 3A-3C) and thus, are not elaborated for ease of description.

In some implementations, an interconnect layer is formed above the array of NAND memory strings on the first semiconductor layer. The interconnect layer can include a first plurality of interconnects in one or more ILD layers. As illustrated in FIG. 18A, an interconnect layer 1828 is formed above first memory stack 1827 and NAND memory strings 1824. Interconnect layer 1828 can include interconnects of MEOL and/or BEOL in a plurality of ILD layers to make electrical connections with NAND memory strings 1824 and/or semiconductor layer 1802. In some implementations, interconnect layer 1828 includes multiple ILD layers and interconnects therein formed in multiple processes. For example, the interconnects in interconnect layer 1828 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. In some implementations, interconnect layer 1828 can further include a bonding layer comprising a plurality of conductive bonding contacts and dielectrics electrically isolating the bonding contacts, which can be used, for example, for hybrid bonding as described below in detail. The ILD layers, bonding layer, interconnects, and bonding contacts illustrated in FIG. 18A can be collectively referred to as interconnect layer 1828.

In some implementations, a through contact extending into an upper portion of the first semiconductor layer is formed. As illustrated in FIG. 18A, one or more through contacts 1829 each extending vertically into an upper portion of semiconductor layer 1802 can be formed. Through contacts 1829 can be connected with the interconnects in interconnect layers 1828. Through contacts 1829 can be formed by first patterning contact holes in an upper portion of semiconductor layer 1802 using patterning process (e.g., photolithography and dry/wet etch processes). The contact holes can be filled with a conductor material (e.g., W or Cu). In some implementations, filling the contact holes includes depositing a spacer (e.g., a silicon oxide layer) before depositing the conductor material.

Method 1700 proceeds to operation 1704, as illustrated in FIG. 17, in which a second semiconductor structure including an array of multi-gate DFM cells disposed on a second semiconductor layer can be formed. In some implementations, to form the array of multi-gate DFM cells, a second memory stack is formed on the second semiconductor layer.

Figure 18B:
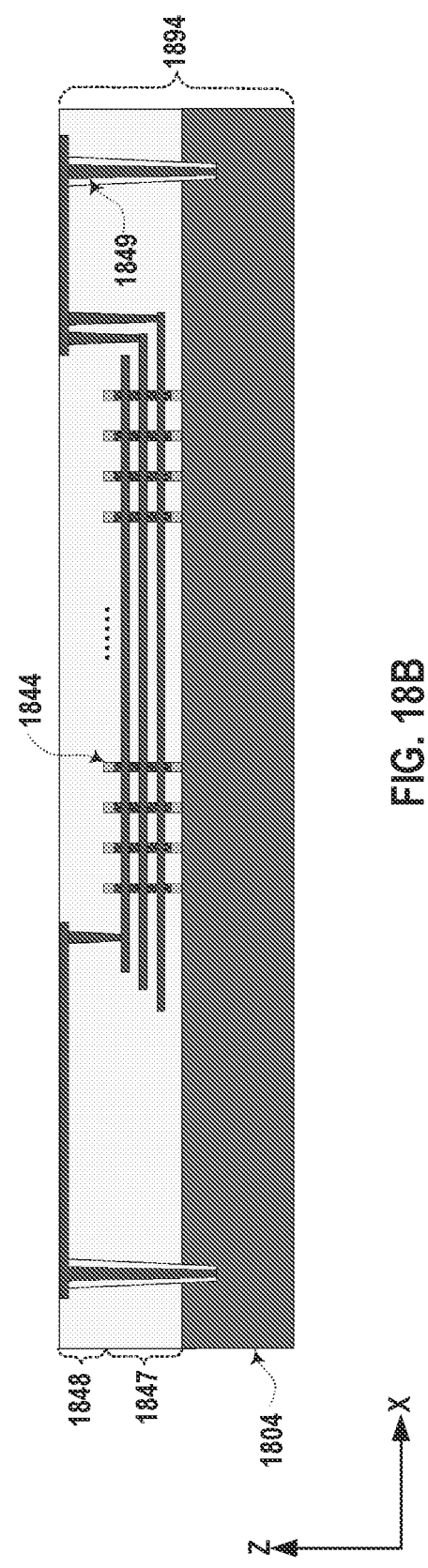

As illustrated in FIG. 18B, second semiconductor layer 1804 can be a semiconductor layer having single crystalline silicon or polycrystalline silicon. A second stack structure, such as a second memory stack 1847 including interleaved conductive layers and dielectric layers, is formed on semiconductor layer 1804. To form second memory stack 1847, in some implementations, a dielectric stack (not shown) including interleaved sacrificial layers (not shown) and the dielectric layers is formed on semiconductor layer 1804. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Second memory stack 1847 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that second memory stack 1847 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between second memory stack 1847 and semiconductor layer 1804.

As illustrated in FIG. 18B, a plurality of multi-gate DFM cells 1844 are formed above semiconductor layer 1804, each of which extends vertically through second memory stack 1847 to be in contact with semiconductor layer 1804. In some implementations, fabrication processes to form multi-gate DFM cells 1844 include forming a channel hole through second memory stack 1847 (or the dielectric stack) to expose semiconductor layer 1804 using dry etching/and or wet etching, such as DRIE, followed by subsequently filling the channel hole with one or more layers, such as a dielectric spacer layer and a semiconductor layer, using thin film deposition processes such as ALD, CVD, PVD, or any combination thereof.

In some implementations, an interconnect layer is formed above the array of multi-gate DFM cells on the third semiconductor layer. The interconnect layer can include a first plurality of interconnects in one or more ILD layers. As illustrated in FIG. 18B, an interconnect layer 1848 is formed above second memory stack 1847 and multi-gate DFM cells 1844. Interconnect layer 1848 can include interconnects of MEOL and/or BEOL in a plurality of ILD layers to make electrical connections with multi-gate DFM cells 1844 and/or semiconductor layer 1804. In some implementations, interconnect layer 1848 includes multiple ILD layers and interconnects therein formed in multiple processes. For example, the interconnects in interconnect layer 1848 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. In some implementations, interconnect layer 1848 can further include a bonding layer comprising a plurality of conductive bonding contacts and dielectrics electrically isolating the bonding contacts, which can be used, for example, for hybrid bonding as described below in detail. The ILD layers, bonding layer, interconnects, and bonding contacts illustrated in FIG. 18B can be collectively referred to as interconnect layer 1848.

In some implementations, a through contact penetrating the second semiconductor layer is formed. As illustrated in FIG. 18B, one or more through contacts 1849 each extending vertically into an upper portion of semiconductor layer 1804 can be formed. Through contacts 1849 can be connected with the interconnects in interconnect layers 1848. Through contacts 1849 can be formed by first patterning contact holes in an upper portion of semiconductor layer 1804 using patterning process (e.g., photolithography and dry/wet etch processes). The contact holes can be filled with a conductor material (e.g., W or Cu). In some implementations, filling the contact holes includes depositing a spacer (e.g., a silicon oxide layer) before depositing the conductor material.

Figure 18C:
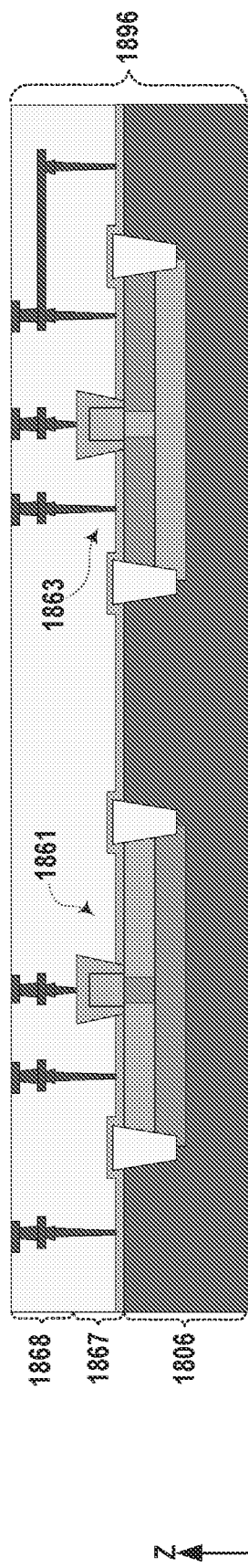

Method 1700 proceeds to operation 1706, as illustrated in FIG. 17, in which a first periphery circuit is formed on a third semiconductor layer. As illustrated in FIG. 18C, the first periphery circuit 1867 including a plurality of transistors 1861 and 1863 can be formed on semiconductor layer 1806 having single crystalline silicon or polycrystalline silicon. In some implementations, transistors 1861 can be HV transistor forming an HV circuit 866, and transistors 1863 can be LV transistor forming an LV circuit 864. Transistors 1861 and 1863 can be formed by a plurality of processes including, but not limited to, photolithography, dry/wet etch, thin film deposition, thermal growth, implantation, CMP, and any other suitable processes. In some implementations, doped regions are formed in semiconductor layer 1806 by ion implantation and/or thermal diffusion, which function, for example, as wells and source/drain regions of transistors 1861 and 1863. In some implementations, isolation regions (e.g., STIs) are also formed in semiconductor layer 1806 by wet/dry etch and thin film deposition. In some implementations, the thickness of gate dielectric of transistor 1861 is different from the thickness of gate dielectric of transistor 1863, for example, by depositing a thicker silicon oxide film in the region of HV transistor 1861 than the region of LV transistor 1863, or by etching back part of the silicon oxide film deposited in the region of transistor 1863. It is understood that the details of fabricating transistors 1861 and 1863 may vary depending on the types of the transistors (e.g., planar transistors 910 or 3D transistors 920 in FIGS. 9A, 9B, 9C, and 9D) and thus, are not elaborated for ease of description.

In some implementations, an interconnect layer 1868 is formed above the transistors on the third semiconductor layer. The interconnect layer can include a plurality of interconnects in one or more ILD layers. As illustrated in FIG. 18C, an interconnect layer 1868 can be formed above transistors 1861 and 1863. Interconnect layer 1868 can include interconnects of MEOL and/or BEOL in a plurality of ILD layers to make electrical connections with transistors 1861 and 1863. In some implementations, interconnect layer 1868 includes multiple ILD layers and interconnects therein formed in multiple processes. For example, the interconnects in interconnect layer 1868 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. In some implementations, interconnect layer 1868 can further include a bonding layer comprising a plurality of conductive bonding contacts and dielectrics electrically isolating the bonding contacts, which can be used, for example, for hybrid bonding as described below in detail. The ILD layers, bonding layer, interconnects, and bonding contacts illustrated in FIG. 18C can be collectively referred to as interconnect layer 1868.

Figure 18D:
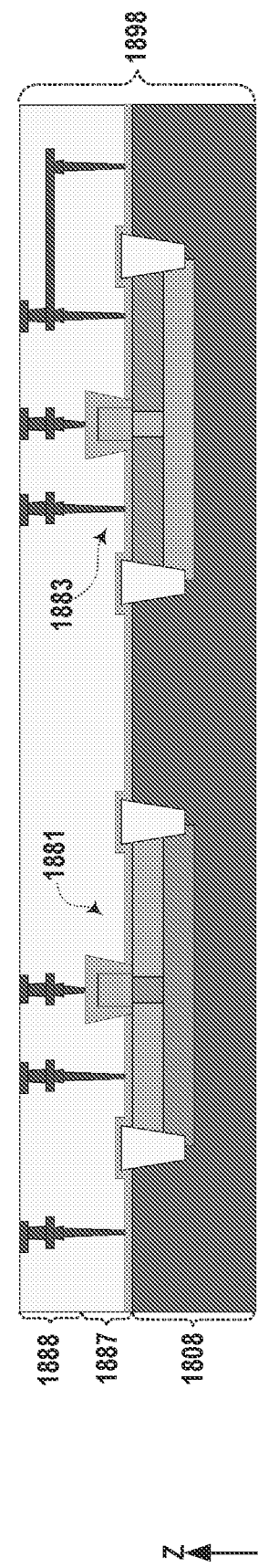

Method 1700 proceeds to operation 1708, as illustrated in FIG. 17, in which a second periphery circuit is formed on a fourth semiconductor layer. As illustrated in FIG. 18D, the second periphery circuit 1887 including a plurality of transistors 1881 and 1883 can be formed on semiconductor layer 1808 having single crystalline silicon or polycrystalline silicon. In some implementations, transistors 1881 can be LV transistor forming an LV circuit 864, and transistors 1883 can be LLV transistor forming an LLV circuit 862. Transistors 1881 and 1883 can be formed by a plurality of processes including, but not limited to, photolithography, dry/wet etch, thin film deposition, thermal growth, implantation, CMP, and any other suitable processes. In some implementations, doped regions are formed in semiconductor layer 1808 by ion implantation and/or thermal diffusion, which function, for example, as wells and source/drain regions of transistors 1881 and 1883. In some implementations, isolation regions (e.g., STIs) are also formed in semiconductor layer 1808 by wet/dry etch and thin film deposition. In some implementations, the thickness of gate dielectric of LV transistor 1881 is different from the thickness of gate dielectric of LLV transistor 1883, for example, by depositing a thicker silicon oxide film in the region of LV transistor 1881 than the region of LLV transistor 1883, or by etching back part of the silicon oxide film deposited in the region of LLV transistor 1883. It is understood that the details of fabricating transistors 1881 and 1883 may vary depending on the types of the transistors (e.g., planar transistors 910 or 3D transistors 920 in FIGS. 9A, 9B, 9C, and 9D) and thus, are not elaborated for ease of description.

In some implementations, an interconnect layer 1888 is formed above the transistor on the fourth semiconductor layer. The interconnect layer can include a plurality of interconnects in one or more ILD layers. As illustrated in FIG. 18D, an interconnect layer 1888 can be formed above transistors 1881 and 1883. Interconnect layer 1888 can include interconnects of MEOL and/or BEOL in a plurality of ILD layers to make electrical connections with transistors 1881 and 1883. In some implementations, interconnect layer 1888 includes multiple ILD layers and interconnects therein formed in multiple processes. For example, the interconnects in interconnect layer 1888 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. In some implementations, interconnect layer 1888 can further include a bonding layer comprising a plurality of conductive bonding contacts and dielectrics electrically isolating the bonding contacts, which can be used, for example, for hybrid bonding as described below in detail. The ILD layers, bonding layer, interconnects, and bonding contacts illustrated in FIG. 18D can be collectively referred to as interconnect layer 1888.

Method 1700 proceeds to operation 1710, as illustrated in FIG. 17, in which the first semiconductor structure and the fourth semiconductor structure are bonded in a face-to-face manner. The bonding can include hybrid bonding.

Figure 18E:
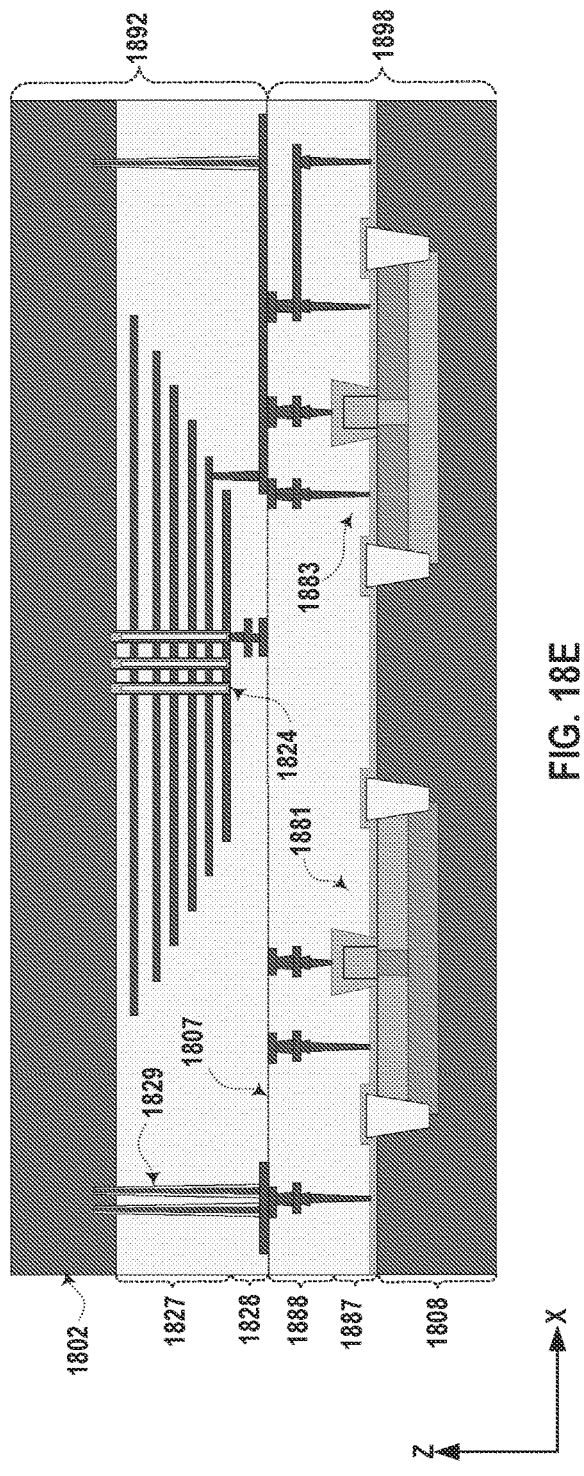

As illustrated in FIG. 18E, first semiconductor structure 1892 including semiconductor layer 1802 and components formed thereon (e.g., memory stack 1827 and NAND memory strings 1824 formed therethrough) can be flipped upside down. The bonding layer in interconnect layers 1828 of first semiconductor structure 1892 facing down is bonded with the bonding layer in interconnect layer 1888 of fourth semiconductor structure 1898 facing up, i.e., in a face-to-face manner, thereby forming a bonding interface 1807. The bonding contacts in bonding layer of interconnect layers 1828 are in contact with the bonding contacts in bonding layer of interconnect layer 1888 at bonding interface 1807. In some implementations, a treatment process, e.g., plasma treatment, wet treatment and/or thermal treatment, is applied to bonding surfaces prior to bonding.

As a result of the bonding, e.g., hybrid bonding, the bonding contacts on opposite sides of bonding interface 1807 can be inter-mixed. After the bonding, bonding contacts in bonding layer of interconnect layers 1828 and the bonding contacts in bonding layer of interconnect layer 1888 are aligned and in contact with one another, such that memory stack 1827 and NAND memory strings 1824 formed therethrough can be coupled to transistors 1881 and 1883 through the bonded bonding contacts across bonding interface 1807, according to some implementations.

Method 1700 proceeds to operation 1712, as illustrated in FIG. 17, in which the second semiconductor structure and the third semiconductor structure are bonded in a face-to-face manner. The bonding can include hybrid bonding.

Figure 18F:
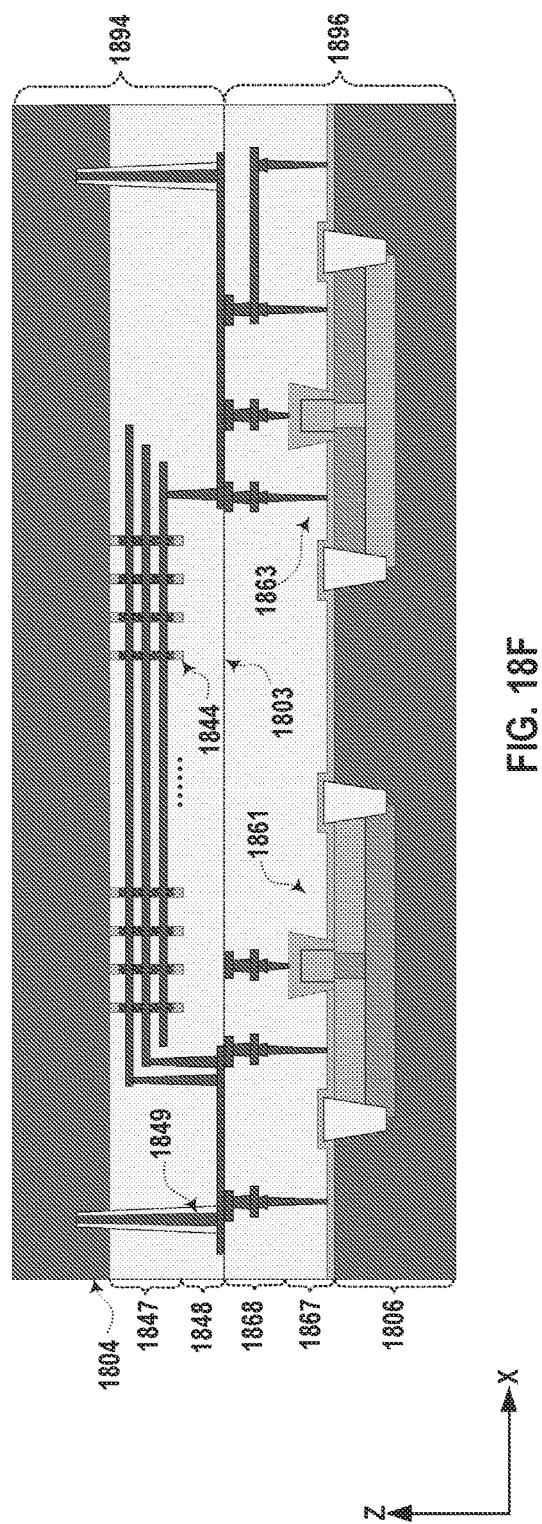

As illustrated in FIG. 18F, second semiconductor structure 1894 including semiconductor layer 1804 and components formed thereon (e.g., memory stack 1847 and multi-gate DFM cells 1844 formed therethrough) can be flipped upside down. The bonding layer in interconnect layers 1848 of second semiconductor structure 1894 facing down is bonded with the bonding layer in interconnect layer 1868 of third semiconductor structure 1896 facing up, i.e., in a face-to-face manner, thereby forming a bonding interface 1803. The bonding contacts in bonding layer of interconnect layers 1848 are in contact with the bonding contacts in bonding layer of interconnect layers 1868 at bonding interface 1803. In some implementations, a treatment process, e.g., plasma treatment, wet treatment and/or thermal treatment, is applied to bonding surfaces prior to bonding.

As a result of the bonding, e.g., hybrid bonding, the bonding contacts on opposite sides of bonding interface 1803 can be inter-mixed. After the bonding, bonding contacts in bonding layer of interconnect layers 1848 and the bonding contacts in bonding layer of interconnect layers 1868 are aligned and in contact with one another, such that memory stack 1847 and multi-gate DFM cells 1844 formed therethrough can be coupled to transistors 1861 and 1863 through the bonded bonding contacts across bonding interface 1803, according to some implementations.

Method 1700 proceeds to operation 1714, as illustrated in FIG. 17, in which a bonding layer can be formed on a backside of the first semiconductor structure and the second semiconductor structure, respectively.

Figure 18G:
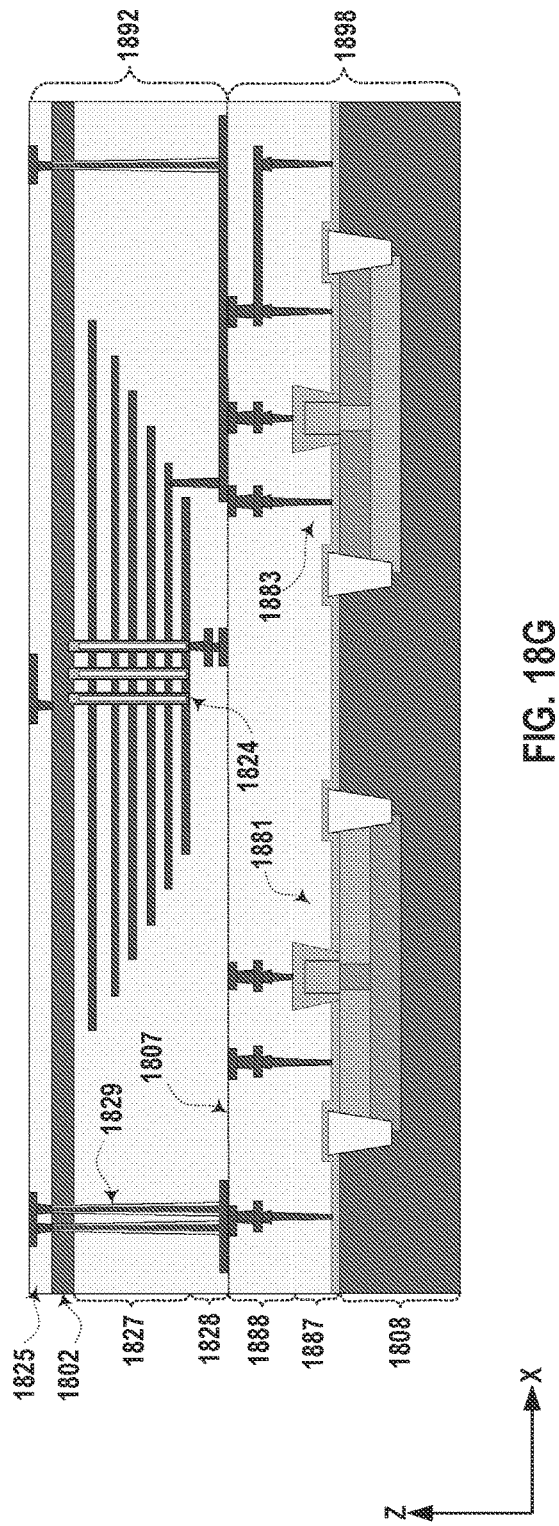

As shown in FIG. 18G, a thinning process, such as wafer grinding, dry etch, wet etch, CMP, and/or any combination thereof, can be performed to semiconductor layer 1802 of first semiconductor structure 1892, until through contacts 1829 are exposed. Bonding layer 1825 can be formed on semiconductor layer 1802. Bonding layer 1825 can include conductive bonding contacts and dielectrics electrically isolating the bonding contacts, which can be used, for example, for hybrid bonding as described below in detail. Conductive bonding contacts can be MEOL/BEOL interconnects and/or contact pads including any suitable conductive materials including, but not limited to W, Co, Cu, Al, silicides, or any combination thereof. Bonding contacts of bonding layer 1825 can be in contact with through contacts 1829 embedded in semiconductor layer 1802.

Figure 18H:
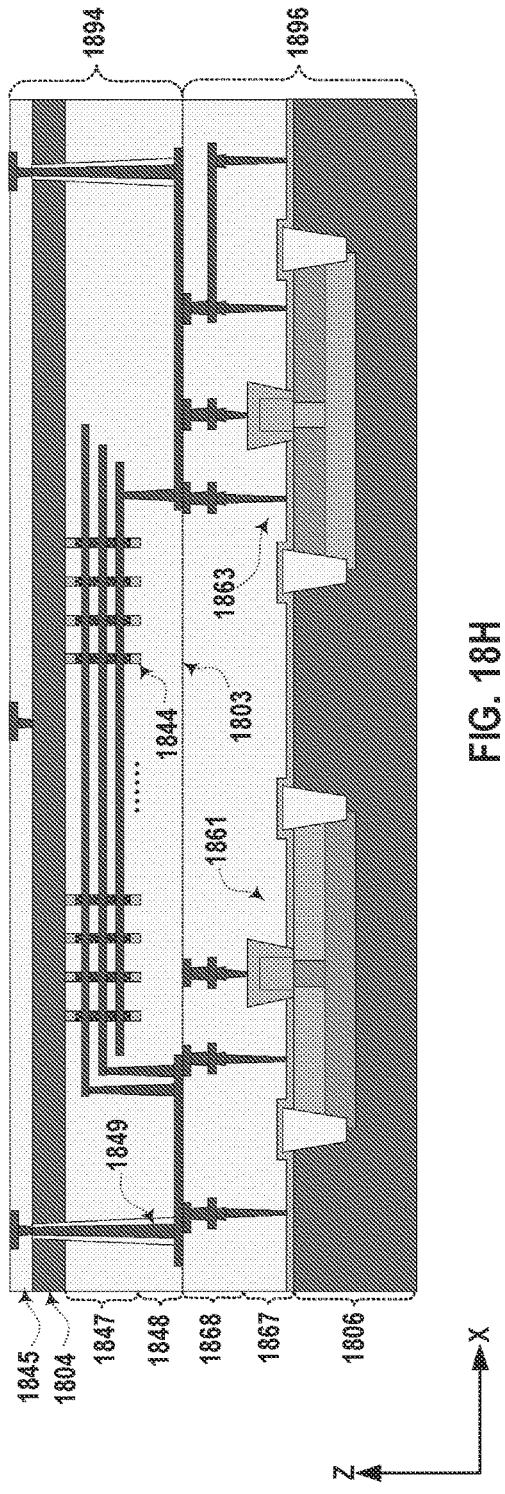

As shown in FIG. 18H, a thinning process, such as wafer grinding, dry etch, wet etch, CMP, and/or any combination thereof, can be performed to semiconductor layer 1804 of second semiconductor structure 1894, until through contacts 1849 are exposed. Bonding layer 1845 can be formed on semiconductor layer 1804. Bonding layer 1845 can include conductive bonding contacts and dielectrics electrically isolating the bonding contacts, which can be used, for example, for hybrid bonding as described below in detail. Conductive bonding contacts can be MEOL/BEOL interconnects and/or contact pads including any suitable conductive materials including, but not limited to W, Co, Cu, Al, silicides, or any combination thereof. Bonding contacts of bonding layer 1845 can be in contact with through contacts 1849 embedded in semiconductor layer 1804.

Method 1700 proceeds to operation 1716, as illustrated in FIG. 17, in which the bonded structure including the first and fourth semiconductor structures are bonding to the bonded structure including the second and third semiconductor structures in a face-to-face manner. The bonding can include hybrid bonding.

Figure 18I:
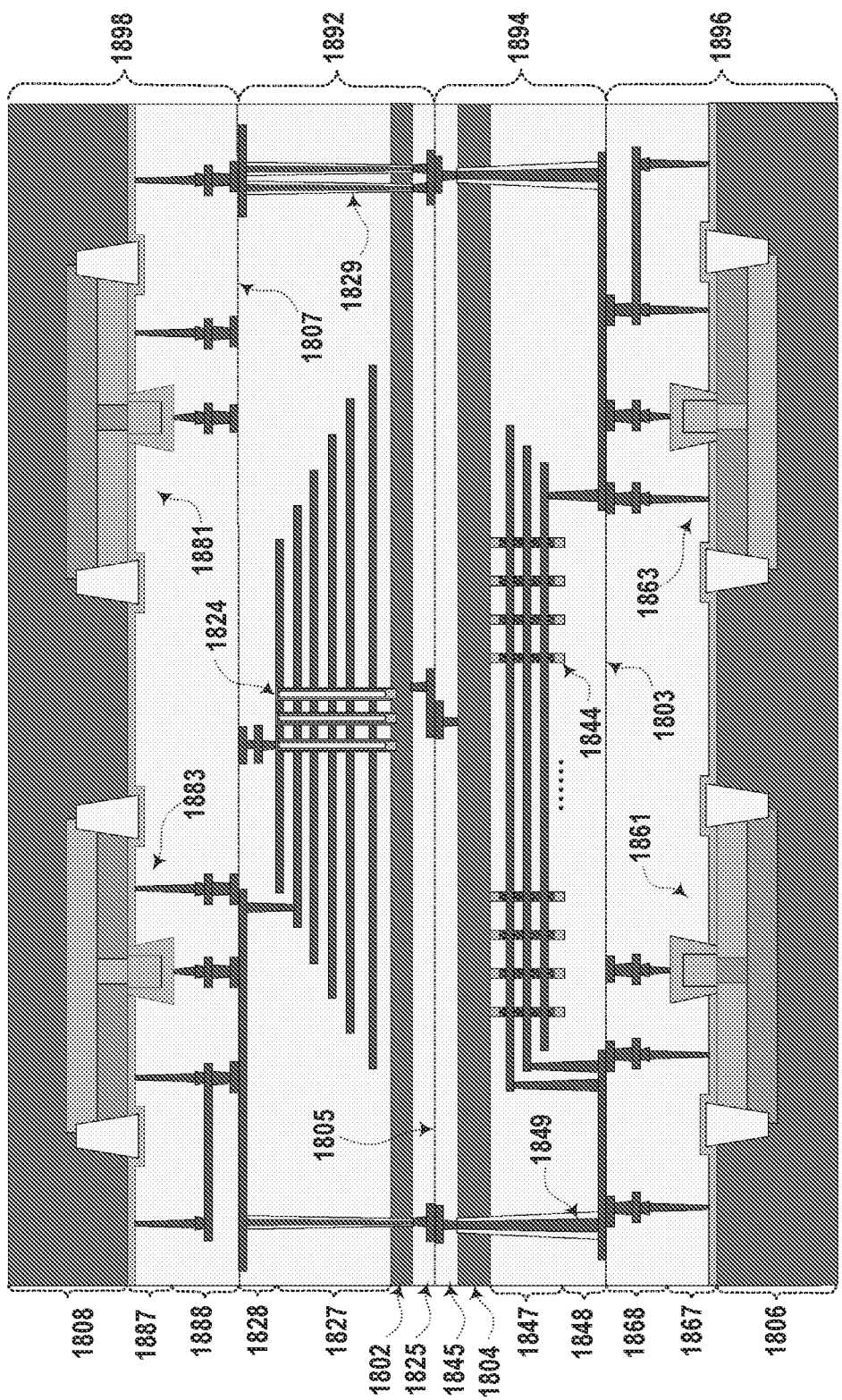

As illustrated in FIG. 18I, the bonded structure including the first and fourth semiconductor structures 1892 and 1898 can be flipped upside down. The bonding layer 1825 facing down is bonded with the bonding layer 1845 facing up, i.e., in a face-to-face manner, thereby forming a bonding interface 1805. The bonding contacts in bonding layer 1825 are in contact with the bonding contacts in bonding layer 1845 at bonding interface 1805. In some implementations, a treatment process, e.g., plasma treatment, wet treatment and/or thermal treatment, is applied to bonding surfaces 1825 and 1845 prior to bonding. As a result of the bonding, e.g., hybrid bonding, the bonding contacts on opposite sides of bonding interface 1805 can be inter-mixed. After the bonding, bonding contacts in bonding layer 1825 are in contact with the bonding contacts in bonding layer 1845 are aligned and in contact with one another. In some implementations, dielectric layer(s) (e.g., silicon oxide layer) are formed vertically between bonding interface 1605 and bonding layers 1625, 1645. Thus, it is understood that bonding interface 1605 may include the surfaces of the dielectric layer(s) in some examples.

Method 1700 proceeds to operation 1718, as illustrated in FIG. 17, in which one or more pad-out interconnect layers can be formed. In some implementations, a pad-out interconnect layer can be formed above the fourth semiconductor structure. In some other implementations, a pad-out interconnect layer can be formed below the third semiconductor structure. In some other implementations, a first pad-out interconnect layer can be formed above the fourth semiconductor structure, and a second pad-out interconnect layer can be formed below the third semiconductor structure.

Figure 18J:
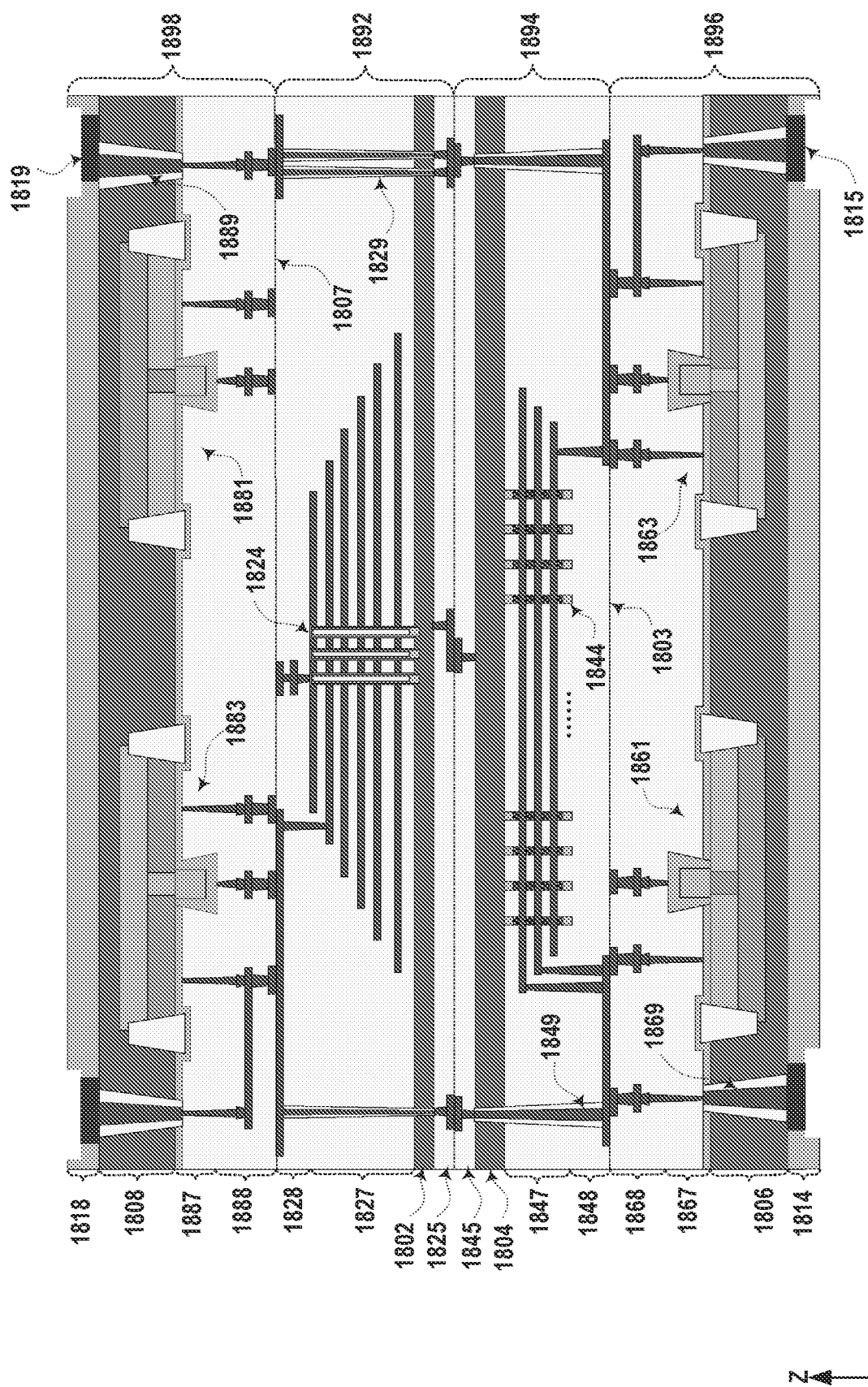

As illustrated in FIG. 18J, in some implementations, a thinning process, such as wafer grinding, dry etch, wet etch, CMP, and/or any combination thereof, can be performed to semiconductor layer 1808 of fourth semiconductor structure 1898. One or more through contacts 1889 each extending vertically through semiconductor layer 1808 can be formed. Through contacts 1889 can couple the interconnects in interconnect layer 1888. Through contacts 1889 can be formed by first patterning contact holes through semiconductor layer 1808 using patterning process (e.g., photolithography and dry/wet etch processes). The contact holes can be filled with a conductor (e.g., Cu). In some implementations, filling the contact holes includes depositing a spacer (e.g., a silicon oxide layer) before depositing the conductor. A first pad-out interconnect layer 1818 is formed on semiconductor layer 1808. Pad-out interconnect layer 1818 can include interconnects, such as contact pads 1819, formed in one or more ILD layers, and in contact with through contacts 1889. Contact pads 1819 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

As illustrated in FIG. 18J, in some implementations, a thinning process, such as wafer grinding, dry etch, wet etch, CMP, and/or any combination thereof, can be performed to semiconductor layer 1806 of third semiconductor structure 1896. One or more through contacts 1869 each extending vertically through semiconductor layer 1806 can be formed. Through contacts 1869 can couple the interconnects in interconnect layer 1868. Through contacts 1869 can be formed by first patterning contact holes through semiconductor layer 1806 using patterning process (e.g., photolithography and dry/wet etch processes). The contact holes can be filled with a conductor (e.g., Cu). In some implementations, filling the contact holes includes depositing a spacer (e.g., a silicon oxide layer) before depositing the conductor. A second pad-out interconnect layer 1814 is formed on semiconductor layer 1806. Pad-out interconnect layer 1814 can include interconnects, such as contact pads 1815, formed in one or more ILD layers, and in contact with through contacts 1869. Contact pads 1815 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

Figure 19:
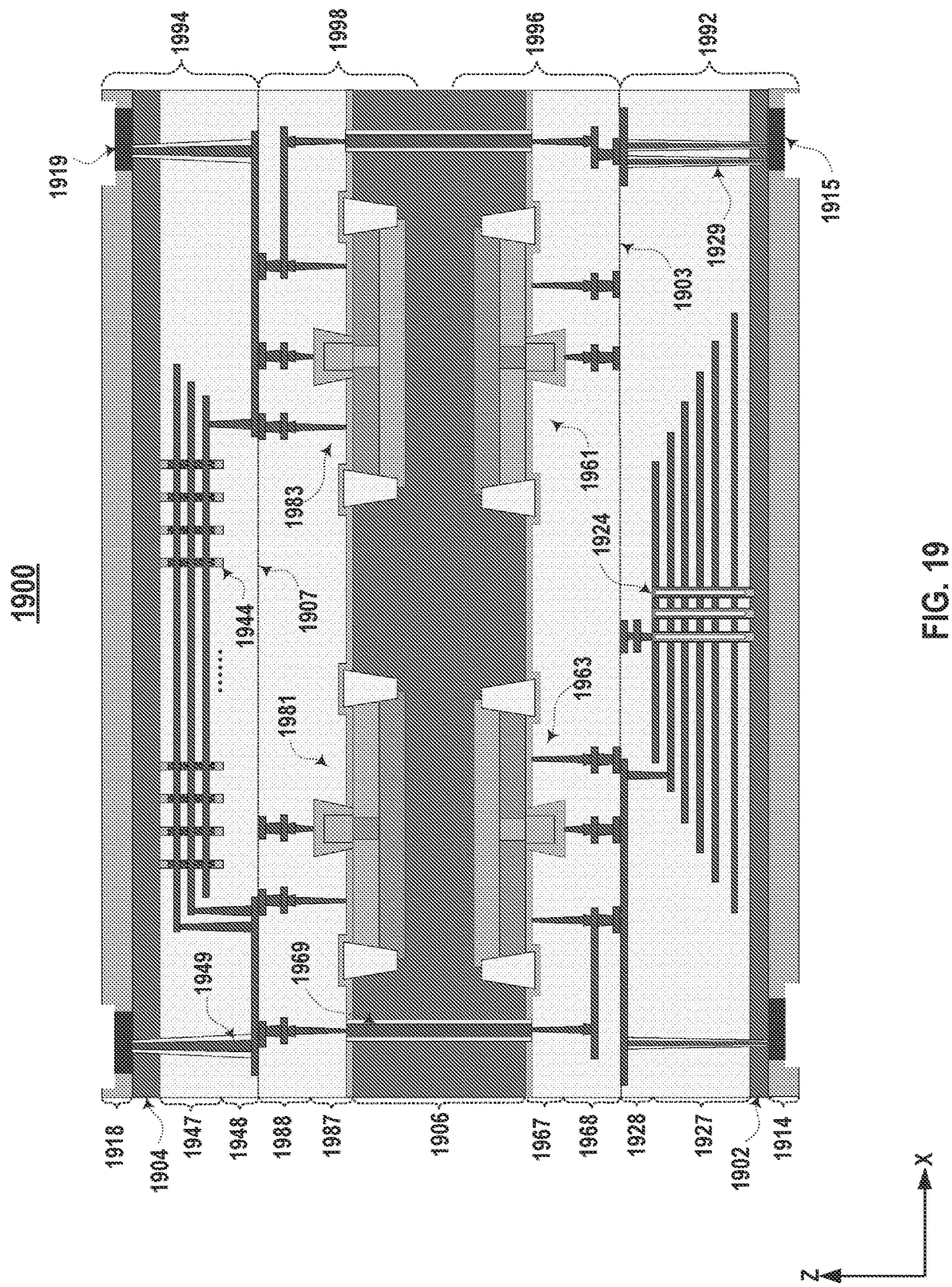
FIG. 19 illustrates a side view of another 3D memory device, according to some aspects of the present disclosure.

FIG. 19 illustrate a schematic diagram of a cross-sectional side view of another exemplary 3D memory device 1900, according to some other aspects of the present disclosure. 3D memory device 1900 may be an example of 3D memory device 100F in FIG. 1F. 3D memory device 1900 includes four semiconductor structures stacked over one another in different planes in the vertical direction (e.g., the z-direction in FIG. 19).

As shown in FIG. 19, first semiconductor structure 1992 including the first memory cell array (e.g., 3D NAND Flash memory cell array) can be formed on one side of 3D memory device 1900, and second semiconductor structure 1994 including the second memory cell array (e.g., 3D DFM cell array) can be formed on another side of 3D memory device 1900. Third semiconductor structure 1996 including the first peripheral circuits (e.g., HV and LV circuits) and fourth semiconductor structure 1998 including the second peripheral circuits (e.g., LV and LLV circuits) are formed in a back-to-back manner on opposite sides of a same substrate, and sandwiched between first semiconductor structure 1992 and second semiconductor structure 1994. In some implementations, first semiconductor structure 1992 and third semiconductor structure 1996 can be bonded in a face-to-face manner, second semiconductor structure 1994 and fourth semiconductor structure 1998 can be bonded in a face-to-face manner.

In some implementation, as shown in FIG. 19, third semiconductor structure 1996 can include a device layer 1967 form on one side of semiconductor layer 1906. It is noted that, third semiconductor structure 1996 is flipped over in FIG. 19. Therefore, some spatial terms such as "on," "above," "below," etc., in descriptions about fourth semiconductor structure 1698 may be upside down.

In some implementations, semiconductor layer 1906 can include any suitable semiconductor material such as single crystalline silicon or polycrystalline silicon. In some implementations, device layer 1967 includes a first peripheral circuit 1961 and a second peripheral circuit 1963. First peripheral circuit 1961 can include HV circuits 866, such as driving circuits, and second peripheral circuit 1963 can include LV circuits 864, such as page buffer circuits and logic circuits. In some implementations, first peripheral circuit 1961 includes a plurality of HV transistors in contact with semiconductor layer 1906, and second peripheral circuit 1963 includes a plurality of LV transistors in contact with semiconductor layer 1906. In some implementations, each HV transistor or LV transistor includes a gate dielectric, and the thickness of the gate dielectric of HV transistor (e.g., in HV circuit 866) is larger than the thickness of the gate dielectric of LV transistor (e.g., in LV circuit 864) due to the higher voltage applied to the HV transistor than the LV transistor. Trench isolations (e.g., STIs) and doped regions (e.g., wells, sources, and drains of HV transistors and LV transistors) can be formed on or in semiconductor layer 1906 as well.

In some implementations, third semiconductor structure 1996 further includes an interconnect layer 1968 above device layer 1967 to transfer electrical signals to and from peripheral circuits 1961 and 1963. As shown in FIG. 19, interconnect layer 1968 can be vertically between bonding interface 1903 and device layer 1967 (including HV transistors and LV transistors of peripheral circuits 1961 and 1963). Interconnect layer 1968 can include a plurality of interconnects, such as MEOL interconnects and BEOL interconnects. The interconnects in interconnect layer 1968 can be coupled to HV transistors and LV transistors of peripheral circuits 1961 and 1963 in device layer 1967. Interconnect layer 1968 can further include one or more ILD layers in which the lateral lines and vias can form. That is, interconnect layer 1968 can include lateral lines and vias in multiple ILD layers. In some implementations, the devices in device layer 1967 are coupled to one another through the interconnects in interconnect layer 1968. For example, peripheral circuit 1961 may be coupled to peripheral circuit 1963 through interconnect layer 1968. The interconnects in interconnect layer 1968 can include conductive materials including, but not limited to, W, Co, Cu, Al, silicides, or any combination thereof. The ILD layers in interconnect layer 1968 can include dielectric materials including, but not limited to, silicon oxide, silicon nitride, silicon oxynitride, low-k dielectrics, or any combination thereof. In some implementations, the interconnects in interconnect layer 1968 include W, which has a relatively high thermal budget (compatible with high-temperature processes) and good quality (fewer detects, e.g., voids) among conductive metal materials. Interconnect layer 1968 can further include a bonding layer comprising a plurality of conductive bonding contacts and dielectrics electrically isolating the bonding contacts, which can be used, for example, for hybrid bonding as described below in detail.

As shown in FIG. 19, fourth semiconductor structure 1998 can be formed on another side of semiconductor structure 1906. Fourth semiconductor structure 1998 can include a device layer 1987 above and in contact with semiconductor layer 1906. In some implementations, device layer 1987 includes a third peripheral circuit 1981 and a fourth peripheral circuit 1983. Third peripheral circuit 1981 can include LLV circuits 862, such as I/O circuits, and fourth peripheral circuit 1983 can include LV circuits 864, such as page buffer circuits and logic circuits. In some implementations, third peripheral circuit 1981 includes a plurality of LLV transistors, and fourth peripheral circuit 1983 includes a plurality of LV transistors as well. In some implementations, each LLV and LV transistor includes a gate dielectric, and the thickness of the gate dielectric of LLV transistor (e.g., in LLV circuit 862) is smaller than the thickness of the gate dielectric of LV transistor (e.g., in LV circuit 864) due to the lower voltage applied to the LLV transistor than the LV transistor. Trench isolations (e.g., STIs) and doped regions (e.g., wells, sources, and drains of the LLV transistor and the LV transistor can be formed on or in semiconductor layer 1906 as well.

Moreover, the different voltages applied to different HV transistors, LV transistors, and LLV transistors in third and fourth semiconductor structures 1996 and 1998 can lead to differences in device dimensions between second and third semiconductor structures 1996 and 1998. In some implementations, the thickness of the gate dielectric of HV transistor (e.g., in HV circuit 866) is larger than the thickness of the gate dielectric of LL V transistor (e.g., in LLV circuit 862) due to the higher voltage applied to the HV transistor than the LLV transistor. In some implementations, the thickness of the gate dielectric of the LV transistor (e.g., in LV circuit 864) in fourth semiconductor structure 1998 is the same as the thickness of the gate dielectric of the LV transistor (e.g., in LV circuit 864) in third semiconductor structure 1996 due to the same operation voltage.

As shown in FIG. 19, fourth semiconductor structure 1998 can further include an interconnect layer 1988 above device layer 1987 to transfer electrical signals to and from peripheral circuits 1981 and 1983. As shown in FIG. 19, device layer 1987 (including HV transistors and LV transistors of peripheral circuits 1981 and 1983) can be vertically between bonding interface 1907 and interconnect layer 1988. Interconnect layer 1988 can include a plurality of interconnects coupled to the HV transistors of peripheral circuit 1981 and the LV transistors of peripheral circuit 1983 in device layer 1987. Interconnect layer 1988 can further include one or more ILD layers in which the interconnects can form. That is, interconnect layer 1988 can include lateral lines and vias in multiple ILD layers. In some implementations, the devices in device layer 1987 are coupled to one another through the interconnects in interconnect layer 1988. For example, peripheral circuit 1981 may be coupled to peripheral circuit 1983 through interconnect layer 1988. The interconnects in interconnect layer 1988 can include conductive materials including, but not limited to, W, Co, Cu, Al, silicides, or any combination thereof. The ILD layers in interconnect layer 1688 can include dielectric materials including, but not limited to, silicon oxide, silicon nitride, silicon oxynitride, low-k dielectrics, or any combination thereof. Interconnect layer 1988 can further include a bonding layer comprising a plurality of conductive bonding contacts and dielectrics electrically isolating the bonding contacts, which can be used, for example, for hybrid bonding as described below in detail.

As shown in FIG. 19, one or more through contacts 1969 can be formed extending vertically through semiconductor layer 1906. In some implementations, through contact 1969 couples the interconnects in interconnect layer 1988 to the interconnects in interconnect layer 1968 to make electric connections between peripheral circuits 1981, 1983 and 1961, 1963 formed on opposite sides of semiconductor layer 1906. Through contact 1969 can include conductive materials including, but not limited to, W, Co, Cu, Al, silicides, or any combination thereof. In some implementations, through contact 1969 includes a via surrounded by a dielectric spacer (e.g., having silicon oxide) to electrically separate the via from semiconductor layer 1906. Depending on the thickness of semiconductor layer 1906, through contact 1969 can be an ILV having a depth in the submicron-level (e.g., between 10 nm and 1 µm), or a TSV having a depth in the micron- or tens micron-level (e.g., between 1 µm and 100 µm).

In some implementations shown in FIG. 19, first semiconductor structure 1992 including the first memory cell array on one side of 3D memory device 1900 may include a first pad-out interconnect layer 1914, and second semiconductor structure 1994 including the second memory cell array on the other side of 3D memory device 1900 may include a second pad-out interconnect layer 1918, such that 3D memory device 1900 may be pad-out from both sides of 3D memory device 1900. In some other implementations not shown in the figures, one of first pad-out interconnect layer 1914 and second pad-out interconnect layer 1918 can be omitted, such that 3D memory device may be pad-out from a single side of the 3D memory device.

As shown in FIG. 19, first semiconductor structure 1992 can include semiconductor layer 1902 having semiconductor materials. In some implementations, semiconductor layer 1902 is a silicon substrate having single crystalline silicon or polycrystalline silicon. First semiconductor structure 1992 can include a first memory cell array, such as an array of NAND memory strings 1924 on one side of semiconductor layer 1902. The sources of NAND memory strings 1924 can be in contact with semiconductor layer 1902. In some implementations, NAND memory strings 1924 are disposed vertically between bonding interface 1907 and semiconductor layer 1902. Each NAND memory string 1924 extends vertically through a plurality of pairs each including a conductive layer and a dielectric layer, according to some implementations. The stacked and interleaved conductive layers and dielectric layers are also referred to herein as a stack structure, e.g., a memory stack 1927.

Memory stack 1927 may be an example of memory stack 304 in FIGS. 3A-3C, and the conductive layer and dielectric layer in memory stack 1927 may be examples of gate conductive layers 306 and dielectric layer 308, respectively, in memory stack 304. The interleaved conductive layers and dielectric layers in memory stack 1927 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 1927. It is understood that in some examples, trench isolations and doped regions (not shown) may be formed in semiconductor layer 1902 as well.

In some implementations, each NAND memory string 1924 is a "charge trap" type of NAND memory string including any suitable channel structures disclosed herein, such as bottom plug channel structure 312A, sidewall plug channel structure 312B, or bottom open channel structure 312C, described above in detail with respect to FIGS. 3A-3C. It is understood that NAND memory strings 1924 are not limited to the "charge trap" type of NAND memory strings and may be "floating gate" type of NAND memory strings in other examples.

As shown in FIG. 19, first semiconductor structure 1992 can further include an interconnect layer 1928 on and in contact with NAND memory strings 1924 to transfer electrical signals to and from NAND memory strings 1924. Interconnect layer 1928 can include a plurality of interconnects, such as MEOL interconnects and BEOL interconnects. In some implementations, the interconnects in interconnect layer 1928 also include local interconnects, such as bit line contacts and word line contacts. Interconnect layer 1928 can further include one or more interlayer dielectric (ILD) layers in which the lateral lines and vias can form. The interconnects in interconnect layer 1928 can include conductive materials including, but not limited to W, Co, Cu, Al, silicides, or any combination thereof. The ILD layers in interconnect layer 1928 can include dielectric materials including, but not limited to, silicon oxide, silicon nitride, silicon oxynitride, low-k dielectrics, or any combination thereof. Interconnect layer 1928 can further include a bonding layer comprising a plurality of conductive bonding contacts and dielectrics electrically isolating the bonding contacts, which can be used, for example, for hybrid bonding as described below in detail.

As shown in FIG. 19, first semiconductor structure 1992 can further include one or more through contacts 1929 extending vertically through semiconductor layer 1902. In some implementations, through contact 1929 couples the interconnects in interconnect layer 1928 to contact pads 1915. Through contact 1929 can include conductive materials including, but not limited to, W, Co, Cu, Al, silicides, or any combination thereof. In some implementations, through contact 1929 includes W. In some implementations, through contact 1929 includes a via surrounded by a dielectric spacer (e.g., having silicon oxide) to electrically separate the via from semiconductor layer 1902. Depending on the thickness of semiconductor layer 1902, through contact 1929 can be an ILV having a depth in the submicron-level (e.g., between 10 nm and 1 µm). As shown in FIG. 19, first semiconductor structure 1992 can further include a pad-out interconnect layer 1914 on semiconductor layer 1902. Pad-out interconnect layer 1914 can include interconnects, e.g., contact pads 1915, in one or more ILD layers. In some implementations, the interconnects in pad-out interconnect layer 1914 can transfer electrical signals between 3D memory device 1900 and external devices, e.g., for pad-out purposes.

As shown in FIG. 19, first semiconductor structure 1992 can be bonded to third semiconductor structure 1996 in a face-to-face manner at bonding interface 1903. That is, the bonding layer of interconnect layer 1928 of first semiconductor structure 1992 can be bonded to the bonding layer of interconnect layer 1968 of third semiconductor structure 1996. The bonding contacts in the bonding layer of interconnect layer 1928 can be in contact with the bonding contacts in the bonding layer of interconnect layer 1948 at bonding interface 1903. As a result, a plurality of bonding contacts across bonding interface 1903 can make direct, short-distance (e.g., micron-level) electrical connections between adjacent semiconductor structures 1992 and 1996. In some implementations, dielectric layer(s) (e.g., silicon oxide layer) are formed vertically between bonding interface 1903 and the bonding layers of interconnect layers 1928, 1968. Thus, it is understood that bonding interface 1903 may include the surfaces of the dielectric layer(s) in some examples.

As shown in FIG. 19, second semiconductor structure 1994 can be bonded on fourth semiconductor structure 1998 in a face-to-face manner at bonding interface 1907. It is noted that, second semiconductor structure 1994 is flipped over in FIG. 19. Therefore, some spatial terms such as "on," "above," "below," etc., in descriptions of second semiconductor structure 1994 below may be upside down.

Second semiconductor structure 1994 can include semiconductor layer 1904 having semiconductor materials. In some implementations, semiconductor layer 1904 is a layer of single crystalline silicon or polycrystalline silicon. As shown in FIG. 19, second semiconductor structure 1994 can include a second memory cell array, such as an array of multi-gate DFM cells 1944 on semiconductor layer 1904. In some implementations, each multi-gate DFM cell 1944 can be referred to DFM memory cell 600A/600B described above in connection with FIGS. 6A and 6B, and the array of multi-gate DFM cells can be referred to DFM memory array 700 described above in connection with FIG. 7. The sources of multi-gate DFM cells 1944 can be in contact with semiconductor layer 1904. In some implementations, multi-gate DFM cells 1944 are disposed vertically between semiconductor layer 1904 and bonding interface 1907. Each multi-gate DFM cell 1944 extends vertically through a memory stack 1947 including a plurality of pairs each including a conductive layer and a dielectric layer, according to some implementations. The interleaved conductive layers and dielectric layers alternate in the vertical direction, according to some implementations. Each conductive layer can include a gate electrode surrounded by an adhesive layer and a gate dielectric layer. The gate electrode of the conductive layer can extend laterally as a word line or a plate line, ending at one or more staircase structures of the memory stack 1947. It is understood that in some examples, trench isolations and doped regions (not shown) may be formed in semiconductor layer 1904 as well.

As shown in FIG. 19, second semiconductor structure 1994 can further include an interconnect layer 1948 above and in contact with multi-gate DFM cells 1944 to transfer electrical signals to and from multi-gate DFM cells 1944. Interconnect layer 1948 can include a plurality of interconnects, such as MEOL interconnects and BEOL interconnects. In some implementations, the interconnects in interconnect layer 1948 also include local interconnects, such as bit line connections, word line connections, plate line connections, and/or source line connections. Interconnect layer 1948 can further include one or more interlayer dielectric (ILD) layers in which the lateral lines and vias can form. The interconnects in interconnect layer 1948 can include conductive materials including, but not limited to W, Co, Cu, Al, silicides, or any combination thereof. The ILD layers in interconnect layer 1948 can include dielectric materials including, but not limited to, silicon oxide, silicon nitride, silicon oxynitride, low-k dielectrics, or any combination thereof. Interconnect layer 1948 can further include a bonding layer comprising a plurality of conductive bonding contacts and dielectrics electrically isolating the bonding contacts, which can be used, for example, for hybrid bonding as described below in detail.

As shown in FIG. 19, second semiconductor structure 1994 can further include one or more through contacts 1949 extending vertically through semiconductor layer 1904. In some implementations, through contact 1949 couples the interconnects in interconnect layer 1948 to contact pads 1919. Through contact 1949 can include conductive materials including, but not limited to, W, Co, Cu, Al, silicides, or any combination thereof. In some implementations, through contact 1949 includes W. In some implementations, through contact 1949 includes a via surrounded by a dielectric spacer (e.g., having silicon oxide) to electrically separate the via from semiconductor layer 1904. Depending on the thickness of semiconductor layer 1904, through contact 1949 can be an ILV having a depth in the submicron-level (e.g., between 10 nm and 1 µm), or a TSV having a depth in the micron- or tens micron-level (e.g., between 1 µm and 100 µm). As shown in FIG. 19, second semiconductor structure 1994 can further include a pad-out interconnect layer 1918 on semiconductor layer 1904. Pad-out interconnect layer 1918 can include interconnects, e.g., contact pads 1919, in one or more ILD layers. In some implementations, the interconnects in pad-out interconnect layer 1918 can transfer electrical signals between 3D memory device 1900 and external devices, e.g., for pad-out purposes.

As shown in FIG. 19, second semiconductor structure 1994 can be bonded to fourth semiconductor structure 1998 in a face-to-face manner at bonding interface 1907. That is, the bonding layer of interconnect layer 1948 of second semiconductor structure 1994 can be bonded to the bonding layer of interconnect layer 1988 of fourth semiconductor structure 1998. The bonding contacts in the bonding layer of interconnect layer 1948 can be in contact with the bonding contacts in the bonding layer of interconnect layer 1988 at bonding interface 1907. As a result, a plurality of bonding contacts across bonding interface 1907 can make direct, short-distance (e.g., micron-level) electrical connections between adjacent semiconductor structures 1994 and 1998. In some implementations, dielectric layer(s) (e.g., silicon oxide layer) are formed vertically between bonding interface 1907 and the bonding layers of interconnect layers 1948, 1988. Thus, it is understood that bonding interface 1907 may include the surfaces of the dielectric layer(s) in some examples.

As a result, peripheral circuits 1961, 1963, 1981, and 1983 in third and fourth semiconductor structures 1996 and 1998 can be coupled to NAND memory strings 1924 in first semiconductor structure 1992 and multi-gate DFM cells 1944 in second semiconductor structure 1994 through various interconnection structures, including interconnect layers 1988, 1968, 1948, and 1968, and through contacts 1969. Moreover, peripheral circuits 1981, 1983, 1961, and 1963, as well as NAND memory strings 1924 and multi-gate DFM cells 1944 in 3D memory device 1900 can be further coupled to external devices through pad-out interconnect layer 1914 and/or pad-out interconnect layer 1918.

Figure 20:
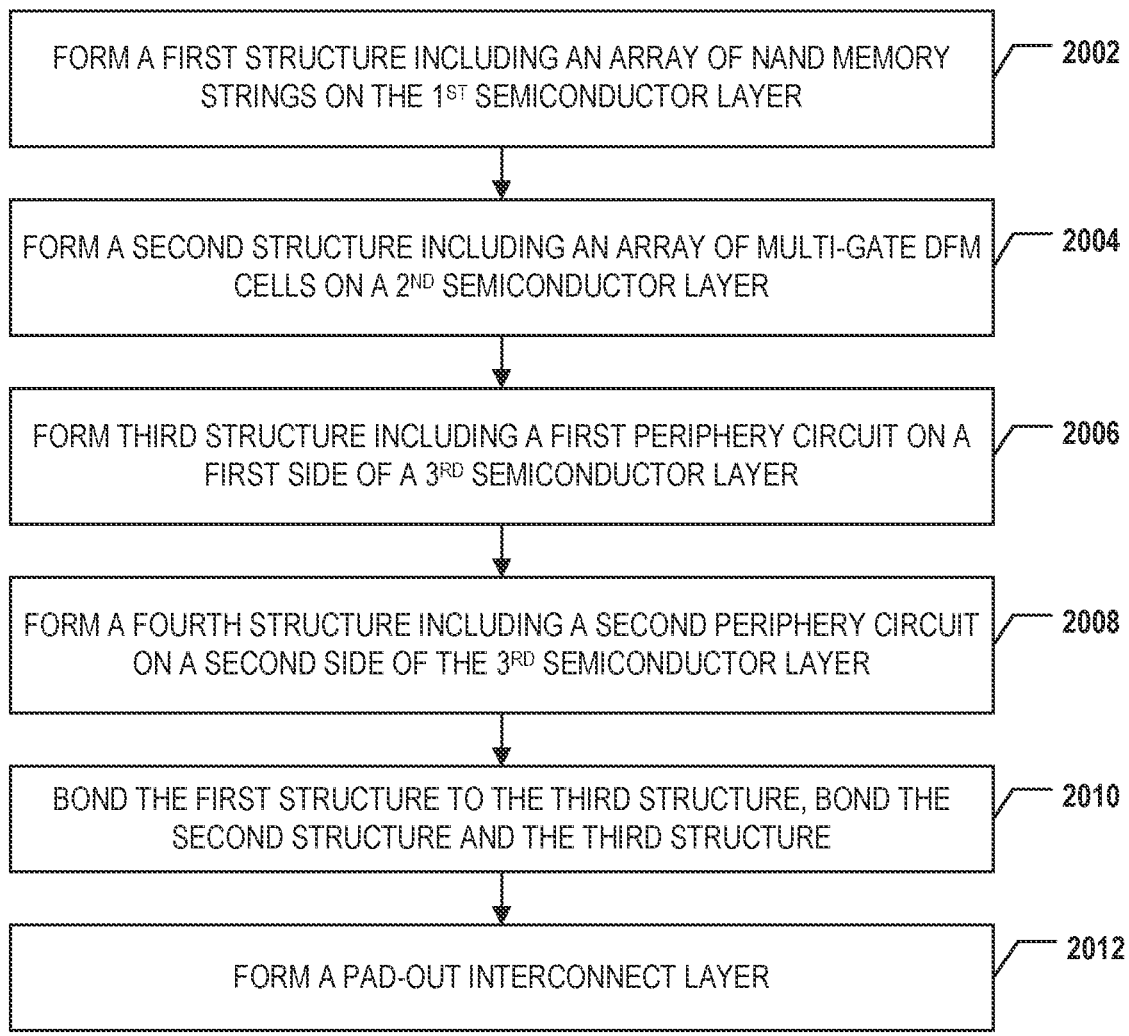
FIG. 20 illustrates a flowchart of a method for forming the 3D memory device in FIG. 19, according to some aspects of the present disclosure.

FIG. 20 illustrates a flowchart of a method 2000 for forming the 3D memory device 1900 shown in FIG. 19, according to some aspects of the present disclosure. FIGS. 21A-21F illustrate the 3D memory device 1900 at certain stages of the fabrication process of method 2000 as shown in FIG. 20, according to some aspects of the present disclosure. It is understood that the operations shown in method 2000 are not exhaustive and that other operations can be performed as well before, after, or between any of the illustrated operations. Further, some of the operations may be performed simultaneously, or in a different order than shown in FIG. 20.

Referring to FIG. 20, method 2000 starts at operation 2002, in which a first semiconductor structure including an array of NAND memory strings disposed on a first semiconductor layer can be formed. The first semiconductor layer can be a silicon substrate having single crystalline silicon or polycrystalline silicon. In some implementations, to form the array of NAND memory strings, a first memory stack is formed on the first semiconductor layer.

Figure 21A:
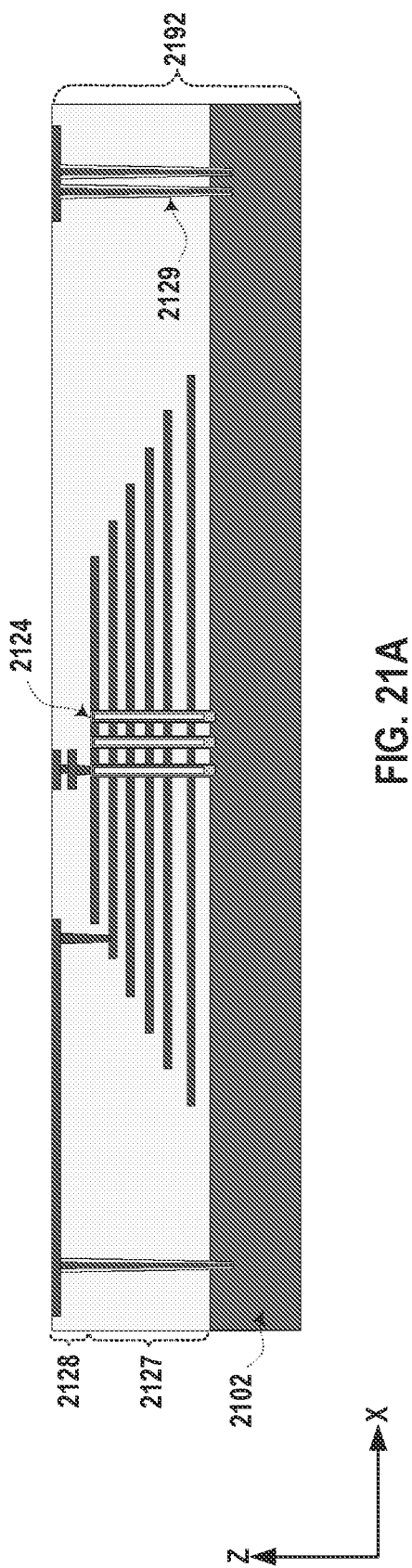
FIGS. 21A-21F illustrate a fabrication process for forming the 3D memory device in FIG. 19, according to some aspects of the present disclosure.

As illustrated in FIG. 21A, first semiconductor layer 2102 can be a semiconductor layer having single crystalline silicon or polycrystalline silicon. A first stack structure, such as a first memory stack 2127 including interleaved conductive layers and dielectric layers, is formed on semiconductor layer 2102. To form first memory stack 2127, in some implementations, a dielectric stack (not shown) including interleaved sacrificial layers (not shown) and the dielectric layers is formed on semiconductor layer 2102. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. First memory stack 2127 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that first memory stack 2127 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between first memory stack 2127 and semiconductor layer 2102.

As illustrated in FIG. 21A, NAND memory strings 2124 are formed above semiconductor layer 2102, each of which extends vertically through first memory stack 2127 to be in contact with semiconductor layer 2102. In some implementations, fabrication processes to form NAND memory string 2124 include forming a channel hole through first memory stack 2127 (or the dielectric stack) and into semiconductor layer 2102 using dry etching/and or wet etching, such as deep reactive-ion etching (DRIE), followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 2124 may vary depending on the types of channel structures of NAND memory strings 2124 (e.g., bottom plug channel structure 312A, sidewall plug channel structure 312B, or bottom open channel structure 312C in FIGS. 3A-3C) and thus, are not elaborated for ease of description.

In some implementations, an interconnect layer is formed above the array of NAND memory strings on the first semiconductor layer. The interconnect layer can include a first plurality of interconnects in one or more ILD layers. As illustrated in FIG. 21A, an interconnect layer 2128 is formed above first memory stack 2127 and NAND memory strings 2124. Interconnect layer 2128 can include interconnects of MEOL and/or BEOL in a plurality of ILD layers to make electrical connections with NAND memory strings 2124 and/or semiconductor layer 2102. In some implementations, interconnect layer 2128 includes multiple ILD layers and interconnects therein formed in multiple processes. For example, the interconnects in interconnect layer 2128 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. In some implementations, interconnect layer 2128 can further include a bonding layer comprising a plurality of conductive bonding contacts and dielectrics electrically isolating the bonding contacts, which can be used, for example, for hybrid bonding as described below in detail. The ILD layers, bonding layer, interconnects, and bonding contacts illustrated in FIG. 21A can be collectively referred to as interconnect layer 2128.

In some implementations, a through contact extending into an upper portion of the first semiconductor layer is formed. As illustrated in FIG. 21A, one or more through contacts 2129 each extending vertically into an upper portion of semiconductor layer 2102 can be formed. Through contacts 2129 can be connected to the interconnects in interconnect layers 2128. Through contacts 2129 can be formed by first patterning contact holes in an upper portion of semiconductor layer 2102 using patterning process (e.g., photolithography and dry/wet etch processes). The contact holes can be filled with a conductor material (e.g., W or Cu). In some implementations, filling the contact holes includes depositing a spacer (e.g., a silicon oxide layer) before depositing the conductor material.

Method 2000 proceeds to operation 2004, as illustrated in FIG. 20, in which a second semiconductor structure including an array of multi-gate DFM cells disposed on a second semiconductor layer can be formed. In some implementations, to form the array of multi-gate DFM cells, a second memory stack is formed on the second semiconductor layer.

Figure 21B:
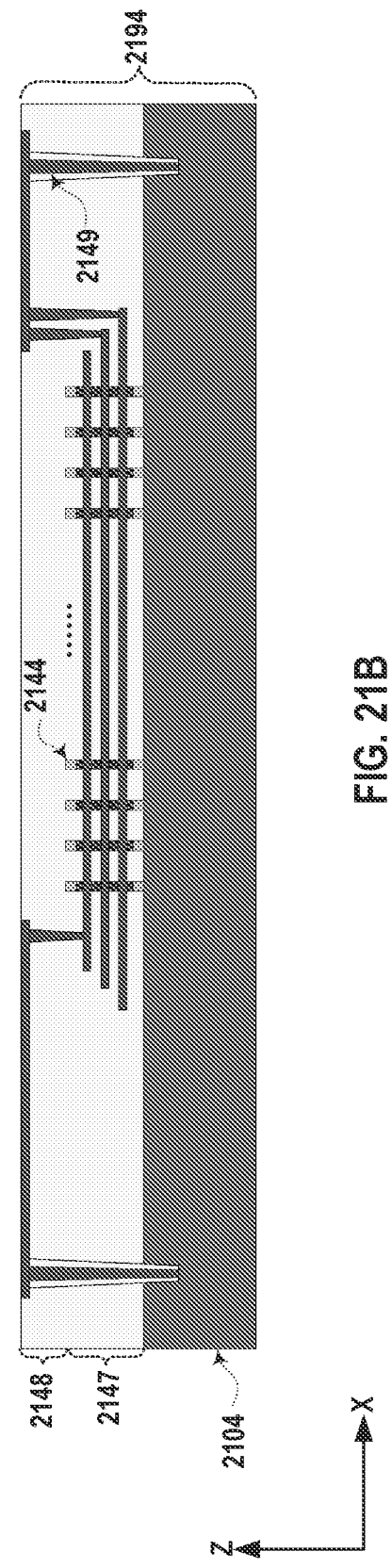

As illustrated in FIG. 21B, second semiconductor layer 2104 can be a semiconductor layer having single crystalline silicon or polycrystalline silicon. A second stack structure, such as a second memory stack 2147 including interleaved conductive layers and dielectric layers, is formed on semiconductor layer 2104. To form second memory stack 2147, in some implementations, a dielectric stack (not shown) including interleaved sacrificial layers (not shown) and the dielectric layers is formed on semiconductor layer 2104. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Second memory stack 2147 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that second memory stack 2147 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between second memory stack 2147 and semiconductor layer 2104.

As illustrated in FIG. 21B, a plurality of multi-gate DFM cells 2144 are formed above semiconductor layer 2104, each of which extends vertically through second memory stack 2147 to be in contact with semiconductor layer 2104. In some implementations, fabrication processes to form multi-gate DFM cells 2144 include forming a channel hole through second memory stack 2147 (or the dielectric stack) to expose semiconductor layer 2104 using dry etching/and or wet etching, such as DRIE, followed by subsequently filling the channel hole with one or more layers, such as a dielectric spacer layer and a semiconductor layer, using thin film deposition processes such as ALD, CVD, PVD, or any combination thereof.

In some implementations, an interconnect layer is formed above the array of multi-gate DFM cells on the third semiconductor layer. The interconnect layer can include a first plurality of interconnects in one or more ILD layers. As illustrated in FIG. 21B, an interconnect layer 2148 is formed above second memory stack 2147 and multi-gate DFM cells 2144. Interconnect layer 2148 can include interconnects of MEOL and/or BEOL in a plurality of ILD layers to make electrical connections with multi-gate DFM cells 2144 and/or semiconductor layer 2104. In some implementations, interconnect layer 2148 includes multiple ILD layers and interconnects therein formed in multiple processes. For example, the interconnects in interconnect layer 2148 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. In some implementations, interconnect layer 2148 can further include a bonding layer comprising a plurality of conductive bonding contacts and dielectrics electrically isolating the bonding contacts, which can be used, for example, for hybrid bonding as described below in detail. The ILD layers, bonding layer, interconnects, and bonding contacts illustrated in FIG. 21B can be collectively referred to as interconnect layer 2148.

In some implementations, a through contact penetrating the second semiconductor layer is formed. As illustrated in FIG. 21B, one or more through contacts 2149 each extending vertically into an upper portion of semiconductor layer 2104 can be formed. Through contacts 2149 can be connected to the interconnects in interconnect layers 2148. Through contacts 2149 can be formed by first patterning contact holes in an upper portion of semiconductor layer 2104 using patterning process (e.g., photolithography and dry/wet etch processes). The contact holes can be filled with a conductor material (e.g., W or Cu). In some implementations, filling the contact holes includes depositing a spacer (e.g., a silicon oxide layer) before depositing the conductor material.

Method 2000 proceeds to operation 2006, as illustrated in FIG. 20, in which a first periphery circuit is formed on a first side of a third semiconductor layer. It is noted that, third semiconductor structure 2196 is upside down in FIG. 21C. Therefore, some spatial terms such as "on," "above," "below," etc., in descriptions of second semiconductor structure 1994 below may be opposite to FIG. 21C.

Figure 21C:
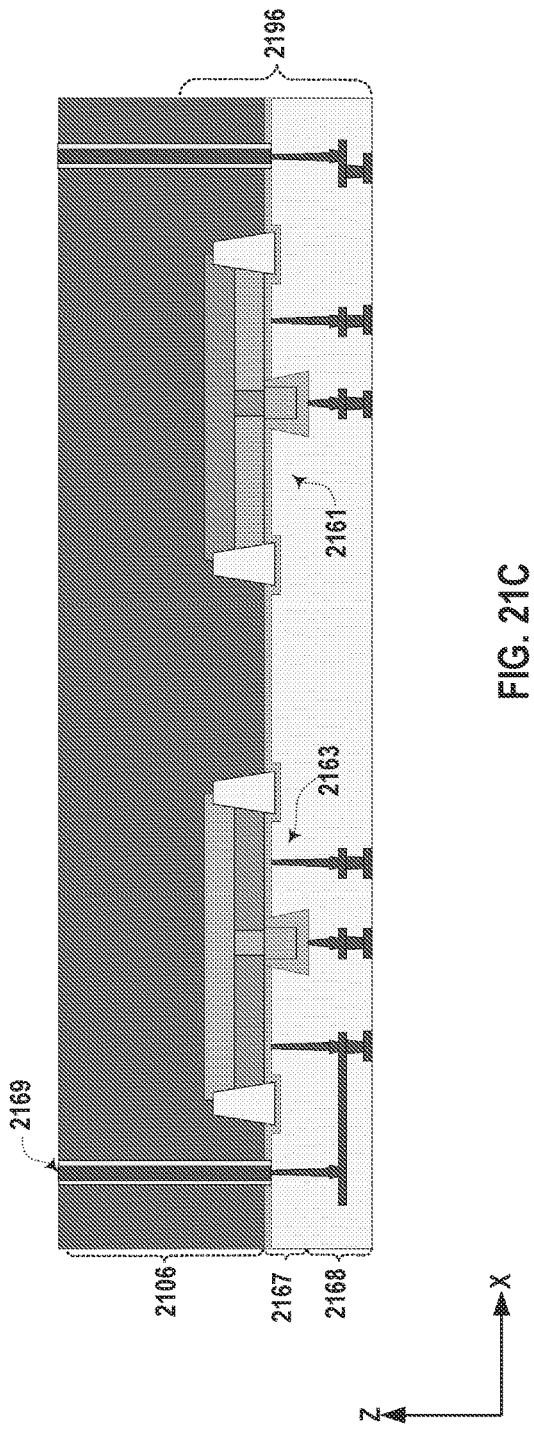

As illustrated in FIG. 21C, the first periphery circuit 2167 including a plurality of transistors 2161 and 2163 can be formed on semiconductor layer 2106 having single crystalline silicon or polycrystalline silicon. In some implementations, transistors 2161 can be HV transistor forming an HV circuit 866, and transistors 2163 can be LV transistor forming an LV circuit 864. Transistors 2161 and 2163 can be formed by a plurality of processes including, but not limited to, photolithography, dry/wet etch, thin film deposition, thermal growth, implantation, CMP, and any other suitable processes. In some implementations, doped regions are formed in semiconductor layer 2106 by ion implantation and/or thermal diffusion, which function, for example, as wells and source/drain regions of transistors 2161 and 2163. In some implementations, isolation regions (e.g., STIs) are also formed in semiconductor layer 2106 by wet/dry etch and thin film deposition. In some implementations, the thickness of gate dielectric of transistor 2161 is different from the thickness of gate dielectric of transistor 2163, for example, by depositing a thicker silicon oxide film in the region of HV transistor 2161 than the region of LV transistor 2163, or by etching back part of the silicon oxide film deposited in the region of transistor 2163. It is understood that the details of fabricating transistors 2161 and 2163 may vary depending on the types of the transistors (e.g., planar transistors 910 or 3D transistors 920 in FIGS. 9A, 9B, 9C, and 9D) and thus, are not elaborated for ease of description.

In some implementations, an interconnect layer 2168 is formed above the first periphery circuit on the third semiconductor layer. The interconnect layer can include a plurality of interconnects in one or more ILD layers. As illustrated in FIG. 21C, an interconnect layer 2168 can be formed above transistors 2161 and 2163. Interconnect layer 2168 can include interconnects of MEOL and/or BEOL in a plurality of ILD layers to make electrical connections with transistors 2161 and 2163. In some implementations, interconnect layer 2168 includes multiple ILD layers and interconnects therein formed in multiple processes. For example, the interconnects in interconnect layer 2168 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. In some implementations, interconnect layer 2168 can further include a bonding layer comprising a plurality of conductive bonding contacts and dielectrics electrically isolating the bonding contacts, which can be used, for example, for hybrid bonding as described below in detail. The ILD layers, bonding layer, interconnects, and bonding contacts illustrated in FIG. 21C can be collectively referred to as interconnect layer 2168.

In some implementations, a through contact penetrating the third semiconductor layer is formed. As illustrated in FIG. 21C, one or more through contacts 2169 each extending vertically through semiconductor layer 2106 can be formed. Through contacts 2169 can be connected with the interconnects in interconnect layers 2168. Through contacts 2169 can be formed by first patterning contact holes in an upper portion of semiconductor layer 2106 using patterning process (e.g., photolithography and dry/wet etch processes). The contact holes can be filled with a conductor material (e.g., W or Cu). In some implementations, filling the contact holes includes depositing a spacer (e.g., a silicon oxide layer) before depositing the conductor material.

Figure 21D:
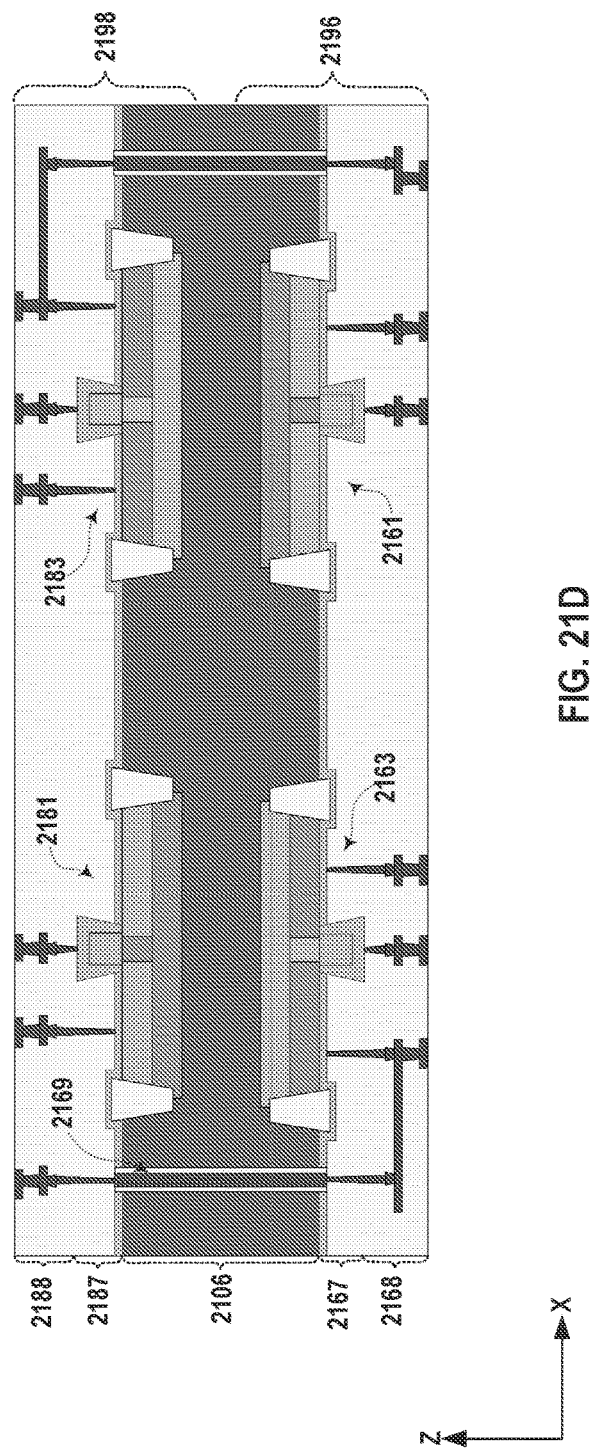

Method 2000 proceeds to operation 2008, as illustrated in FIG. 20, in which a second periphery circuit is formed on another side of the third semiconductor layer. As illustrated in FIG. 21D, the second periphery circuit 2187 including a plurality of transistors 2181 and 2183 can be formed on another side of semiconductor layer 2106 that is opposite to third semiconductor structure 2196. In some implementations, transistors 2181 can be LV transistor forming an LV circuit 864, and transistors 2183 can be LLV transistor forming an LLV circuit 862. Transistors 2181 and 2183 can be formed by a plurality of processes including, but not limited to, photolithography, dry/wet etch, thin film deposition, thermal growth, implantation, CMP, and any other suitable processes. In some implementations, doped regions are formed in semiconductor layer 2106 by ion implantation and/or thermal diffusion, which function, for example, as wells and source/drain regions of transistors 2181 and 2183. In some implementations, isolation regions (e.g., STIs) are also formed in semiconductor layer 2106 by wet/dry etch and thin film deposition. In some implementations, the thickness of gate dielectric of LV transistor 2181 is different from the thickness of gate dielectric of LLV transistor 2183, for example, by depositing a thicker silicon oxide film in the region of LV transistor 2181 than the region of LLV transistor 2183, or by etching back part of the silicon oxide film deposited in the region of LLV transistor 2183. It is understood that the details of fabricating transistors 2181 and 2183 may vary depending on the types of the transistors (e.g., planar transistors 910 or 3D transistors 920 in FIGS. 9A, 9B, 9C, and 9D) and thus, are not elaborated for ease of description.

In some implementations, an interconnect layer 2188 is formed above the second periphery circuit on the third semiconductor layer. The interconnect layer can include a plurality of interconnects in one or more ILD layers. As illustrated in FIG. 21D, an interconnect layer 2188 can be formed above transistors 2181 and 2183. Interconnect layer 2188 can include interconnects of MEOL and/or BEOL in a plurality of ILD layers to make electrical connections with transistors 2181 and 2183. In some implementations, interconnect layer 2188 includes multiple ILD layers and interconnects therein formed in multiple processes. For example, the interconnects in interconnect layer 2188 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. In some implementations, interconnect layer 2188 can further include a bonding layer comprising a plurality of conductive bonding contacts and dielectrics electrically isolating the bonding contacts, which can be used, for example, for hybrid bonding as described below in detail. The ILD layers, bonding layer, interconnects, and bonding contacts illustrated in FIG. 21D can be collectively referred to as interconnect layer 2188.

Method 2000 proceeds to operation 2010, as illustrated in FIG. 20, in which the first semiconductor structure and the second semiconductor structure are bonded to both sides of the combination of the third and fourth semiconductor structures in a face-to-face manner, respectively. The bonding can include hybrid bonding.

Figure 21E:
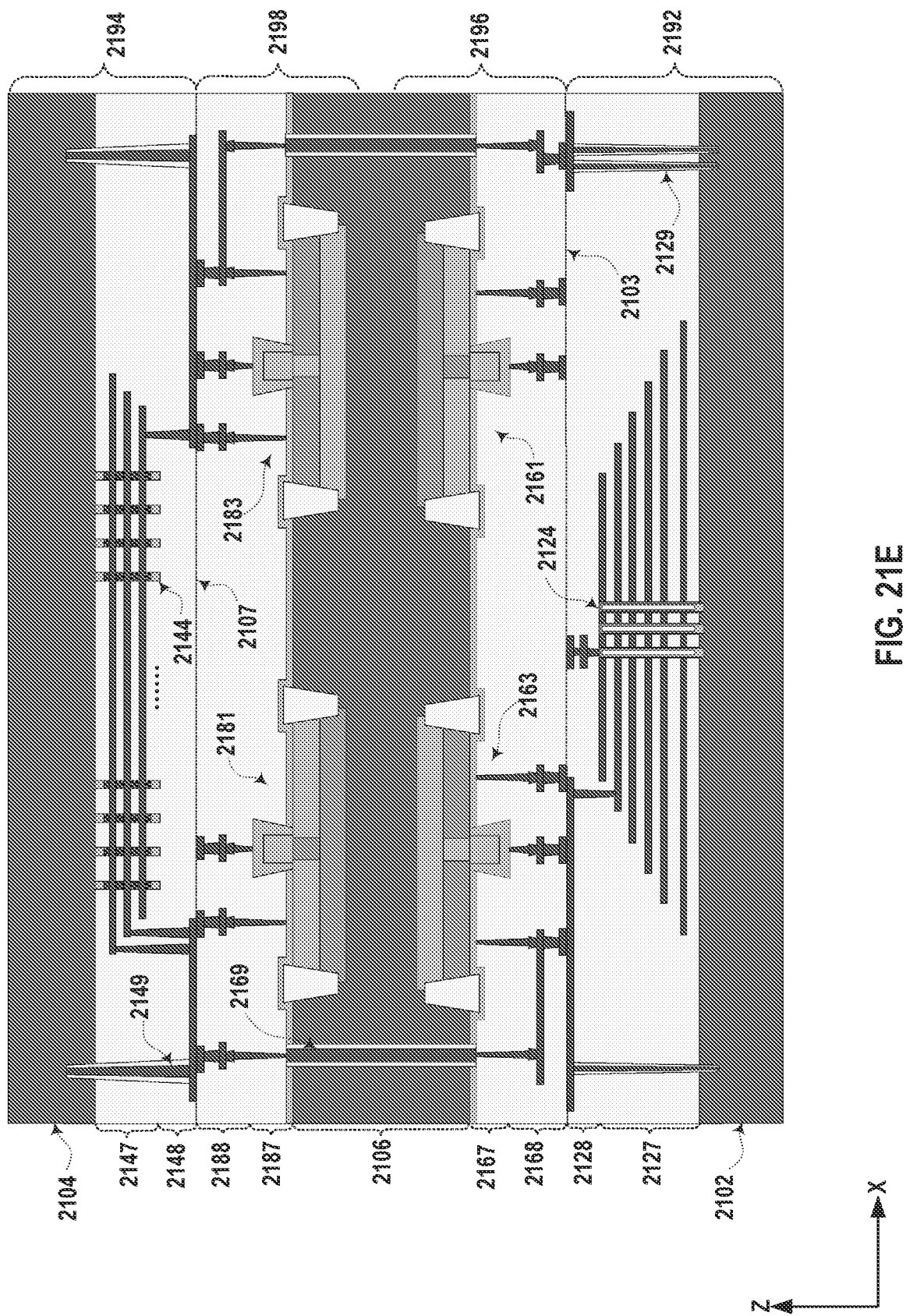

As illustrated in FIG. 21E, first semiconductor structure 2192 including semiconductor layer 2102 and components formed thereon (e.g., memory stack 2127 and NAND memory strings 2124 formed therethrough) can be bonded to side of the third semiconductor structure 2196. The bonding layer in interconnect layers 2128 of first semiconductor structure 2192 facing up is bonded with the bonding layer in interconnect layer 2168 of third semiconductor structure 2196 facing down, i.e., in a face-to-face manner, thereby forming a bonding interface 2103. The bonding contacts in bonding layer of interconnect layers 2128 are in contact with the bonding contacts in bonding layer of interconnect layer 2168 at bonding interface 2103. In some implementations, a treatment process, e.g., plasma treatment, wet treatment and/or thermal treatment, is applied to bonding surfaces prior to bonding. As a result of the bonding, e.g., hybrid bonding, the bonding contacts on opposite sides of bonding interface 2103 can be inter-mixed. After the bonding, bonding contacts in bonding layer of interconnect layers 2128 and the bonding contacts in bonding layer of interconnect layer 2168 are aligned and in contact with one another, such that memory stack 2127 and NAND memory strings 2124 formed therethrough can be coupled to the periphrasis circuits through the bonded bonding contacts across bonding interface 2103, according to some implementations.

As illustrated in FIG. 21E, second semiconductor structure 2194 including semiconductor layer 2104 and components formed thereon (e.g., memory stack 2147 and multi-gate DFM cells 2144 formed therethrough) can be flipped upside down, and bonded to side of the fourth semiconductor structure 2198. The bonding layer in interconnect layers 2148 of second semiconductor structure 2194 facing down is bonded with the bonding layer in interconnect layer 2188 of fourth semiconductor structure 2198 facing up, i.e., in a face-to-face manner, thereby forming a bonding interface 2107. The bonding contacts in bonding layer of interconnect layers 2148 are in contact with the bonding contacts in bonding layer of interconnect layers 2188 at bonding interface 2107. In some implementations, a treatment process, e.g., plasma treatment, wet treatment and/or thermal treatment, is applied to bonding surfaces prior to bonding. As a result of the bonding, e.g., hybrid bonding, the bonding contacts on opposite sides of bonding interface 2107 can be inter-mixed. After the bonding, bonding contacts in bonding layer of interconnect layers 2148 and the bonding contacts in bonding layer of interconnect layers 2188 are aligned and in contact with one another, such that memory stack 2147 and multi-gate DFM cells 2144 formed therethrough can be coupled to the periphery circuits through the bonded bonding contacts across bonding interface 2107, according to some implementations.

Method 2000 proceeds to operation 2012, as illustrated in FIG. 20, in which one or more pad-out interconnect layers can be formed. In some implementations, a pad-out interconnect layer can be formed above the second semiconductor structure. In some other implementations, a pad-out interconnect layer can be formed below the first semiconductor structure. In some other implementations, a first pad-out interconnect layer can be formed above the second semiconductor structure, and a second pad-out interconnect layer can be formed below the first semiconductor structure.

Figure 21F:
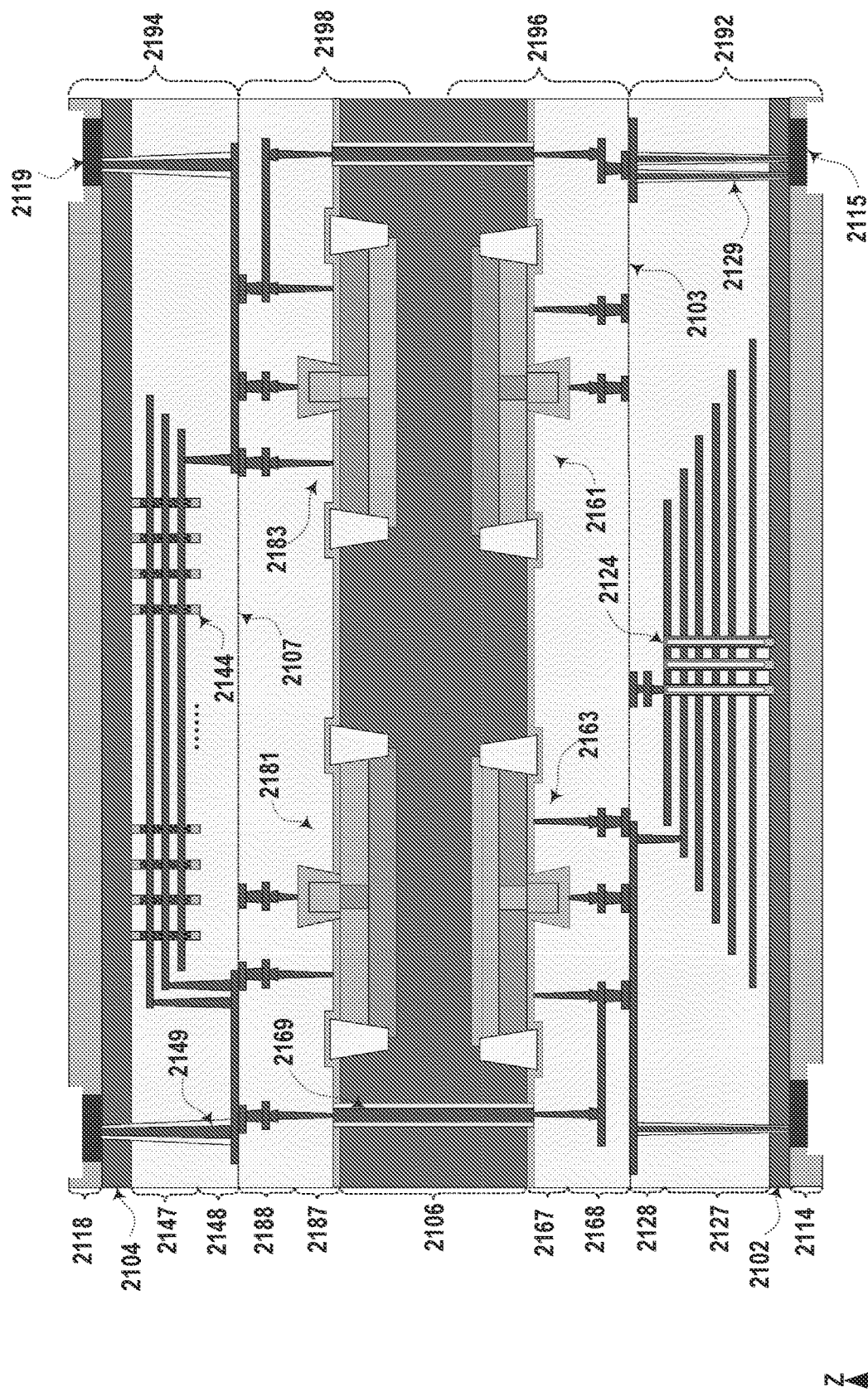

As illustrated in FIG. 21F, in some implementations, a thinning process, such as wafer grinding, dry etch, wet etch, CMP, and/or any combination thereof, can be performed to semiconductor layer 2104 of second semiconductor structure 2194, until through contacts 2149 are exposed. A first pad-out interconnect layer 2118 is formed on semiconductor layer 2104. Pad-out interconnect layer 2118 can include interconnects, such as contact pads 2119, formed in one or more ILD layers, and in contact with through contacts 2149. Contact pads 2119 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

As illustrated in FIG. 21F, in some implementations, a thinning process, such as wafer grinding, dry etch, wet etch, CMP, and/or any combination thereof, can be performed to semiconductor layer 2102 of first semiconductor structure 2192, until through contacts 2129 are exposed. A second pad-out interconnect layer 2114 is formed below on semiconductor layer 2102. Pad-out interconnect layer 2114 can include interconnects, such as contact pads 2115, formed in one or more ILD layers, and in contact with through contacts 2129. Contact pads 2115 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

Figure 22:
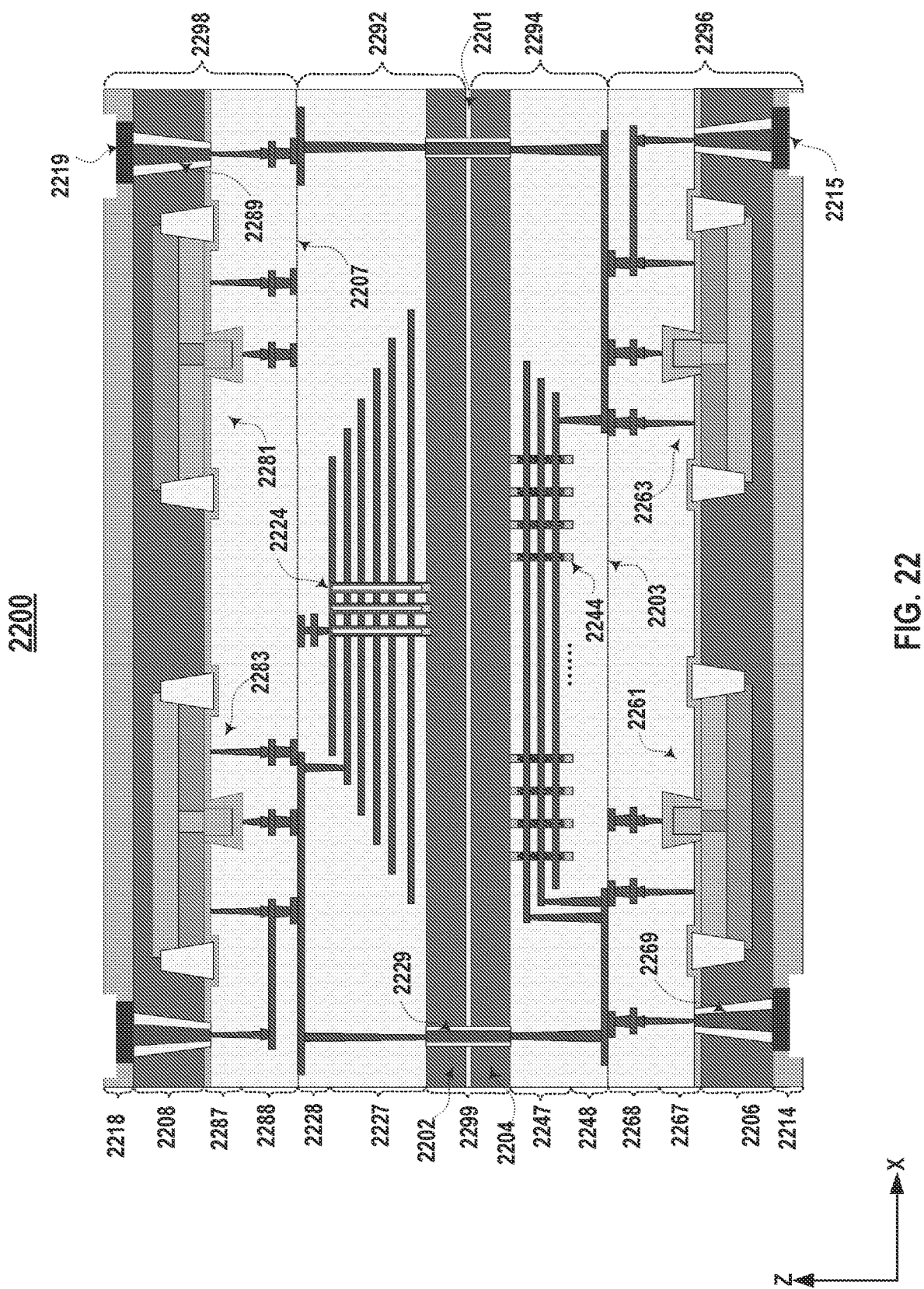
FIG. 22 illustrates a side view of another 3D memory device, according to some aspects of the present disclosure.

FIG. 22 illustrates a schematic diagram of a cross-sectional side view of another exemplary 3D memory device 2200 having four stacked semiconductor structures, according to some other aspects of the present disclosure. 3D memory device 2200 may be an example of 3D memory device 100E in FIG. 1E. 3D memory device 2200 includes four semiconductor structures stacked over one another in different planes in the vertical direction (e.g., the z-direction in FIG. 22). In some implementations, first semiconductor structure 2292 including a first memory cell array can be formed on one side of a substrate, and second semiconductor structure 2294 including a second memory cell array can be formed on another side of the substrate. The combination of first semiconductor structure 2292 and second semiconductor structure 2294 can be bonded between third semiconductor structure 1696 including a first periphery circuit and fourth semiconductor structure 1698 including a second periphery circuit.

That is, As shown in FIG. 22, third semiconductor structure 2296 including the first peripheral circuits (e.g., HV and LV circuits) can be formed on one side of 3D memory device 2200, and fourth semiconductor structure 2298 including the second peripheral circuits (e.g., LV and LLV circuits) can be formed on another side of 3D memory device 2200. First semiconductor structure 2292 including the first memory cell array (e.g., 3D NAND Flash memory cell array) and second semiconductor structure 2294 including the second memory cell array (e.g., 3D DFM cell array) can be sandwiched between third semiconductor structure 2296 and fourth semiconductor structure 2298. In some implementations, first semiconductor structure 2292 and fourth semiconductor structure 2298 can be bonded in a face-to-face manner, second semiconductor structure 2294 and third semiconductor structure 2296 can be bonded in a face-to-face manner.

In some implementations shown in FIG. 22, fourth semiconductor structure 2298 including the second peripheral circuit on one side of 3D memory device 2200 may include a first pad-out interconnect layer 2218, and third semiconductor structure 2296 including the first peripheral circuit on the other side of 3D memory device 2200 may include a second pad-out interconnect layer 2214, such that 3D memory device 2200 may be pad-out from both sides of 3D memory device 2200. In some other implementations not shown in the figures, one of first pad-out interconnect layer 2218 and second pad-out interconnect layer 2214 can be omitted, such that 3D memory device may be pad-out from a single side of the 3D memory device.

As shown in FIG. 22, first semiconductor structure 2292 can be formed on a first side of substrate 2299. Substrate 2299 can include a first semiconductor layer 2202 and a second semiconductor layer 2204 that are isolated from each other by a dielectric spacer layer 2201. In some implementations, first semiconductor layer 2202 and second semiconductor layer 2204 can have any suitable same or different semiconductor materials. In some implementations, first semiconductor layer 2202 and a second semiconductor layer 2204 can include single crystalline silicon or polycrystalline silicon. In some implementations, dielectric spacer layer 2201 can include any suitable dielectric material, such as silicon oxide.

First semiconductor structure 2292 can include a first memory cell array, such as an array of NAND memory strings 2224 on one side of substrate 2299 on semiconductor layer 2202. The sources of NAND memory strings 2224 can be in contact with semiconductor layer 2202. In some implementations, NAND memory strings 2224 are disposed vertically between bonding interface 2207 and semiconductor layer 2202. Each NAND memory string 2224 extends vertically through a plurality of pairs each including a conductive layer and a dielectric layer, according to some implementations. The stacked and interleaved conductive layers and dielectric layers are also referred to herein as a stack structure, e.g., a memory stack 2227.

Memory stack 2227 may be an example of memory stack 304 in FIGS. 3A-3C, and the conductive layer and dielectric layer in memory stack 2227 may be examples of gate conductive layers 306 and dielectric layer 308, respectively, in memory stack 304. The interleaved conductive layers and dielectric layers in memory stack 2227 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 2227. It is understood that in some examples, trench isolations and doped regions (not shown) may be formed in semiconductor layer 2202 as well.

In some implementations, each NAND memory string 2224 is a "charge trap" type of NAND memory string including any suitable channel structures disclosed herein, such as bottom plug channel structure 312A, sidewall plug channel structure 312B, or bottom open channel structure 312C, described above in detail with respect to FIGS. 3A-3C. It is understood that NAND memory strings 2224 are not limited to the "charge trap" type of NAND memory strings and may be "floating gate" type of NAND memory strings in other examples.

As shown in FIG. 22, first semiconductor structure 2292 can further include an interconnect layer 2228 on and in contact with NAND memory strings 2224 to transfer electrical signals to and from NAND memory strings 2224. Interconnect layer 2228 can include a plurality of interconnects, such as MEOL interconnects and BEOL interconnects. In some implementations, the interconnects in interconnect layer 2228 also include local interconnects, such as bit line contacts and word line contacts. Interconnect layer 2228 can further include one or more interlayer dielectric (ILD) layers in which the lateral lines and vias can form. The interconnects in interconnect layer 2228 can include conductive materials including, but not limited to, W, Co, Cu, Al, silicides, or any combination thereof. The ILD layers in interconnect layer 2228 can include dielectric materials including, but not limited to, silicon oxide, silicon nitride, silicon oxynitride, low-k dielectrics, or any combination thereof. Interconnect layer 2228 can further include a bonding layer comprising a plurality of conductive bonding contacts and dielectrics electrically isolating the bonding contacts, which can be used, for example, for hybrid bonding as described below in detail.

As shown in FIG. 16, second semiconductor structure 2294 can be formed on a second side of substrate 2299. Second semiconductor structure 2294 can include a second memory cell array, such as an array of multi-gate DFM cells 2244 on semiconductor layer 2204 of substrate 2299. The array of multi-gate DFM cells 2244 can be separated from the array of NAND memory strings 2224 by dielectric spacer layer 2201.

In some implementations, each multi-gate DFM cell 2244 can be referred to DFM memory cell 600A/600B described above in connection with FIGS. 6A and 6B, and the array of multi-gate DFM cells can be referred to DFM memory array 700 described above in connection with FIG. 7. The sources of multi-gate DFM cells 2244 can be in contact with semiconductor layer 2204. In some implementations, multi-gate DFM cells 2244 are disposed vertically between semiconductor layer 2204 and bonding interface 2203. Each multi-gate DFM cell 2244 extends vertically through a memory stack 2247 including a plurality of pairs each including a conductive layer and a dielectric layer, according to some implementations. The interleaved conductive layers and dielectric layers alternate in the vertical direction, according to some implementations. Each conductive layer can include a gate electrode surrounded by an adhesive layer and a gate dielectric layer. The gate electrode of the conductive layer can extend laterally as a word line or a plate line, ending at one or more staircase structures of the memory stack 2247. It is understood that in some examples, trench isolations and doped regions (not shown) may be formed in semiconductor layer 2204 as well.

As shown in FIG. 22, second semiconductor structure 2294 can further include an interconnect layer 2248 on and in contact with multi-gate DFM cells 2244 to transfer electrical signals to and from multi-gate DFM cells 2244. Interconnect layer 2248 can include a plurality of interconnects, such as MEOL interconnects and BEOL interconnects. In some implementations, the interconnects in interconnect layer 2248 also include local interconnects, such as bit line connections, word line connections, plate line connections, and/or source line connections. Interconnect layer 2248 can further include one or more interlayer dielectric (ILD) layers in which the lateral lines and vias can form. The interconnects in interconnect layer 2248 can include conductive materials including, but not limited to W, Co, Cu, Al, silicides, or any combination thereof. The ILD layers in interconnect layer 2248 can include dielectric materials including, but not limited to, silicon oxide, silicon nitride, silicon oxynitride, low-k dielectrics, or any combination thereof. Interconnect layer 2248 can further include a bonding layer comprising a plurality of conductive bonding contacts and dielectrics electrically isolating the bonding contacts, which can be used, for example, for hybrid bonding as described below in detail.

As shown in FIG. 22, one or more through contacts 2229 are formed extending vertically through substrate 2299 including semiconductor layers 2202, 2204 and dielectric spacer layer 2201. In some implementations, through contact 2229 couples the interconnects in interconnect layer 2228 to the interconnects in interconnect layer 2248 to make an electrical connection across substrate 2299 between components formed on opposite sides of substrate 2299. Through contact 2229 can include conductive materials including, but not limited to, W, Co, Cu, Al, silicides, or any combination thereof. In some implementations, through contact 2229 includes W. In some implementations, through contact 2229 includes a via surrounded by a dielectric spacer (e.g., having silicon oxide) to electrically separate the via from semiconductor layers 2202 and 2204. Depending on the thickness of substrate 2299, through contact 2229 can be an ILV having a depth in the submicron-level (e.g., between 10 nm and 1 μm), or a TSV having a depth in the micron- or tens micron-level (e.g., between 1 μm and 100 μm).

As shown in FIG. 22, third semiconductor structure 2296 includes semiconductor layer 2206 of single crystalline silicon or polycrystalline silicon thinned from a silicon substrate. Third semiconductor structure 2296 can include a device layer 2267 above and in contact with semiconductor layer 2206. In some implementations, device layer 2267 includes a first peripheral circuit 2261 and a second peripheral circuit 2263. First peripheral circuit 2261 can include HV circuits 866, such as driving circuits, and second peripheral circuit 2263 can include LV circuits 864, such as page buffer circuits and logic circuits. In some implementations, first peripheral circuit 2261 includes a plurality of HV transistors in contact with semiconductor layer 2206, and second peripheral circuit 2263 includes a plurality of LV transistors in contact with semiconductor layer 2206. In some implementations, each HV transistor or LV transistor includes a gate dielectric, and the thickness of the gate dielectric of HV transistor (e.g., in HV circuit 866) is larger than the thickness of the gate dielectric of LV transistor (e.g., in LV circuit 864) due to the higher voltage applied to the HV transistor than the LV transistor. Trench isolations (e.g., STIs) and doped regions (e.g., wells, sources, and drains of HV transistors and LV transistors) can be formed on or in semiconductor layer 2206 as well.

In some implementations, third semiconductor structure 2296 further includes an interconnect layer 2268 above device layer 2267 to transfer electrical signals to and from peripheral circuits 2261 and 2263. As shown in FIG. 22, interconnect layer 2268 can be vertically between bonding interface 2203 and device layer 2267 (including HV transistors and LV transistors of peripheral circuits 2261 and 2263). Interconnect layer 2268 can include a plurality of interconnects, such as MEOL interconnects and BEOL interconnects. The interconnects in interconnect layer 2268 can be coupled to HV transistors and LV transistors of peripheral circuits 2261 and 2263 in device layer 2267. Interconnect layer 2268 can further include one or more ILD layers in which the lateral lines and vias can form. That is, interconnect layer 2268 can include lateral lines and vias in multiple ILD layers. In some implementations, the devices in device layer 2267 are coupled to one another through the interconnects in interconnect layer 2268. For example, peripheral circuit 2261 may be coupled to peripheral circuit 2263 through interconnect layer 2268. The interconnects in interconnect layer 2268 can include conductive materials including, but not limited to, W, Co, Cu, Al, silicides, or any combination thereof. The ILD layers in interconnect layer 2268 can include dielectric materials including, but not limited to, silicon oxide, silicon nitride, silicon oxynitride, low-k dielectrics, or any combination thereof. In some implementations, the interconnects in interconnect layer 2268 include W, which has a relatively high thermal budget (compatible with high-temperature processes) and good quality (fewer detects, e.g., voids) among conductive metal materials.

Interconnect layer 2268 can further include a bonding layer comprising a plurality of conductive bonding contacts and dielectrics electrically isolating the bonding contacts, which can be used, for example, for hybrid bonding as described below in detail. As shown in FIG. 22, third semiconductor structure 2296 can be bonded to second semiconductor structure 2294 in a face-to-face manner at bonding interface 2203. That is, the bonding layer of interconnect layer 2268 of third semiconductor structure 2296 can be bonded to the bonding layer of interconnect layer 2248 of second semiconductor structure 2294. The bonding contacts in the bonding layer of interconnect layer 2248 can be in contact with the bonding contacts in the bonding layer of interconnect layer 2268 at bonding interface 2203. As a result, a plurality of bonding contacts across bonding interface 2203 can make direct, short-distance (e.g., micron-level) electrical connections between adjacent semiconductor structures 2296 and 2294. In some implementations, dielectric layer(s) (e.g., silicon oxide layer) are formed vertically between bonding interface 2203 and the bonding layers of interconnect layers 2248, 2268. Thus, it is understood that bonding interface 2203 may include the surfaces of the dielectric layer(s) in some examples.

As shown in FIG. 22, third semiconductor structure 2296 can further include one or more through contacts 2269 extending vertically through semiconductor layer 2206. In some implementations, through contact 2269 couples the interconnects in interconnect layer 2268 to contact pads 2215. Through contact 2269 can include conductive materials including, but not limited to, W, Co, Cu, Al, silicides, or any combination thereof. In some implementations, through contact 2269 includes W. In some implementations, through contact 2269 includes a via surrounded by a dielectric spacer (e.g., having silicon oxide) to electrically separate the via from semiconductor layer 2206. Depending on the thickness of semiconductor layer 2206, through contact 2269 can be an ILV having a depth in the submicron-level (e.g., between 10 nm and 1 µm), or a TSV having a depth in the micron- or tens micron-level (e.g., between 1 µm and 100 µm). As shown in FIG. 22, third semiconductor structure 2296 can further include a pad-out interconnect layer 2214 on semiconductor layer 2206. Pad-out interconnect layer 2214 can include interconnects, e.g., contact pads 2215, in one or more ILD layers. In some implementations, the interconnects in pad-out interconnect layer 2215 can transfer electrical signals between 3D memory device 2200 and external devices, e.g., for pad-out purposes.

As shown in FIG. 22, fourth semiconductor structure 2298 can be bonded on top of first semiconductor structure 2292 in a face-to-face manner at bonding interface 2207. It is noted that, fourth semiconductor structure 2298 is flipped over in FIG. 22. Therefore, some spatial terms such as "on," "above," "below," etc., in descriptions about fourth semiconductor structure 2298 may be upside down.

Fourth semiconductor structure 2298 can include semiconductor layer 2208 having semiconductor materials, such as single crystalline silicon or polycrystalline silicon. Fourth semiconductor structure 2298 can include a device layer 2287 above and in contact with semiconductor layer 2208. In some implementations, device layer 2287 includes a third peripheral circuit 2281 and a fourth peripheral circuit 2283. Third peripheral circuit 2281 can include LLV circuits 862, such as I/O circuits, and fourth peripheral circuit 2283 can include LV circuits 864, such as page buffer circuits and logic circuits. In some implementations, third peripheral circuit 2281 includes a plurality of LLV transistors, and fourth peripheral circuit 2283 includes a plurality of LV transistors as well. In some implementations, each LLV and LV transistor includes a gate dielectric, and the thickness of the gate dielectric of LLV transistor (e.g., in LLV circuit 862) is smaller than the thickness of the gate dielectric of LV transistor (e.g., in LV circuit 864) due to the lower voltage applied to the LLV transistor than the LV transistor. Trench isolations (e.g., STIs) and doped regions (e.g., wells, sources, and drains of the LLV transistor and the LV transistor can be formed on or in semiconductor layer 2208 as well.

Moreover, the different voltages applied to different HV transistors, LV transistors, and LLV transistors in third and fourth semiconductor structures 2296 and 2298 can lead to differences of device dimensions between second and third semiconductor structures 2296 and 2298. In some implementations, the thickness of the gate dielectric of HV transistor (e.g., in HV circuit 866) is larger than the thickness of the gate dielectric of LL V transistor (e.g., in LLV circuit 862) due to the higher voltage applied to the HV transistor than the LLV transistor. In some implementations, the thickness of the gate dielectric of the LV transistor (e.g., in LV circuit 864) in fourth semiconductor structure 2298 is the same as the thickness of the gate dielectric of the LV transistor (e.g., in LV circuit 864) in third semiconductor structure 2296 due to the same operation voltage. In some implementations, the thickness of semiconductor layer 2206 in which the HV transistor (e.g., in HV circuit 866) is formed is larger than the thickness of semiconductor layer 2208 in which the LLV transistor (e.g., in LLV circuit 862) is formed due to the higher voltage applied to the HV transistor than the LLV transistor.

As shown in FIG. 22, fourth semiconductor structure 2298 can further include an interconnect layer 2288 above device layer 2287 to transfer electrical signals to and from peripheral circuits 2281 and 2283. As shown in FIG. 22, device layer 2287 (including HV transistors and LV transistors of peripheral circuits 2281 and 2283) can be vertically between bonding interface 2207 and interconnect layer 2288. Interconnect layer 2288 can include a plurality of interconnects coupled to the HV transistors of peripheral circuit 2281 and the LV transistors of peripheral circuit 2283 in device layer 2287. Interconnect layer 2288 can further include one or more ILD layers in which the interconnects can form. That is, interconnect layer 2288 can include lateral lines and vias in multiple ILD layers. In some implementations, the devices in device layer 2287 are coupled to one another through the interconnects in interconnect layer 2288. For example, peripheral circuit 2281 may be coupled to peripheral circuit 2283 through interconnect layer 2288. The interconnects in interconnect layer 2288 can include conductive materials including, but not limited to, W, Co, Cu, Al, silicides, or any combination thereof. The ILD layers in interconnect layer 2288 can include dielectric materials including, but not limited to, silicon oxide, silicon nitride, silicon oxynitride, low-k dielectrics, or any combination thereof. In some implementations, the interconnects in interconnect layer 2268 include W, which has a relatively high thermal budget (compatible with high-temperature processes) and good quality (fewer detects, e.g., voids) among conductive metal materials.

Interconnect layer 2288 can further include a bonding layer comprising a plurality of conductive bonding contacts and dielectrics electrically isolating the bonding contacts, which can be used, for example, for hybrid bonding as described below in detail. As shown in FIG. 22, fourth semiconductor structure 2298 can be bonded to first semiconductor structure 2292 in a face-to-face manner at bonding interface 2207. That is, the bonding layer of interconnect layer 2288 of fourth semiconductor structure 2298 can be bonded to the bonding layer of interconnect layer 2228 of first semiconductor structure 2292. The bonding contacts in the bonding layer of interconnect layer 2288 can be in contact with the bonding contacts in the bonding layer of interconnect layer 2228 at bonding interface 2207. As a result, a plurality of bonding contacts across bonding interface 2207 can make direct, short-distance (e.g., micron-level) electrical connections between adjacent semiconductor structures 2298 and 2292. In some implementations, dielectric layer(s) (e.g., silicon oxide layer) are formed vertically between bonding interface 2207 and the bonding layers of interconnect layers 2288, 2228. Thus, it is understood that bonding interface 2207 may include the surfaces of the dielectric layer(s) in some examples.

As shown in FIG. 22, fourth semiconductor structure 2298 can further include one or more through contacts 2289 extending vertically through semiconductor layer 2208. In some implementations, through contact 2289 couples the interconnects in interconnect layer 2288 to the contact pads 2219 in pad-out interconnect layer 2218. Through contact 2289 can include conductive materials including, but not limited to, W, Co, Cu, Al, silicides, or any combination thereof. In some implementations, through contact 2289 includes a via surrounded by a dielectric spacer (e.g., having silicon oxide) to electrically separate the via from semiconductor layer 2208. Depending on the thickness of semiconductor layer 2208, through contact 2289 can be an ILV having a depth in the submicron-level (e.g., between 10 nm and 1 µm), or a TSV having a depth in the micron- or tens micron-level (e.g., between 1 µm and 100 µm). As shown in FIG. 22, fourth semiconductor structure 2298 can further include a pad-out interconnect layer 2218 on semiconductor layer 2208. Pad-out interconnect layer 2218 can include interconnects, e.g., contact pads 2219, in one or more ILD layers. In some implementations, the interconnects in pad-out interconnect layer 2218 can transfer electrical signals between 3D memory device 2200 and external devices, e.g., for pad-out purposes.

As a result, peripheral circuits 2261, 2263, 2281, and 2283 in third and fourth semiconductor structures 2296 and 2298 can be coupled to NAND memory strings 2224 in first semiconductor structure 2292 and multi-gate DFM cells 2244 in second semiconductor structure 2294 through various interconnection structures, including interconnect layers 2288, 2268, 2248, and 2228, and through contacts 2229. Moreover, peripheral circuits 2281, 2283, 2261, and 2263, as well as NAND memory strings 2224 and multi-gate DFM cells 2244 in 3D memory device 2200 can be further coupled to external devices through pad-out interconnect layer 2214 and/or pad-out interconnect layer 2218.

Figure 23:
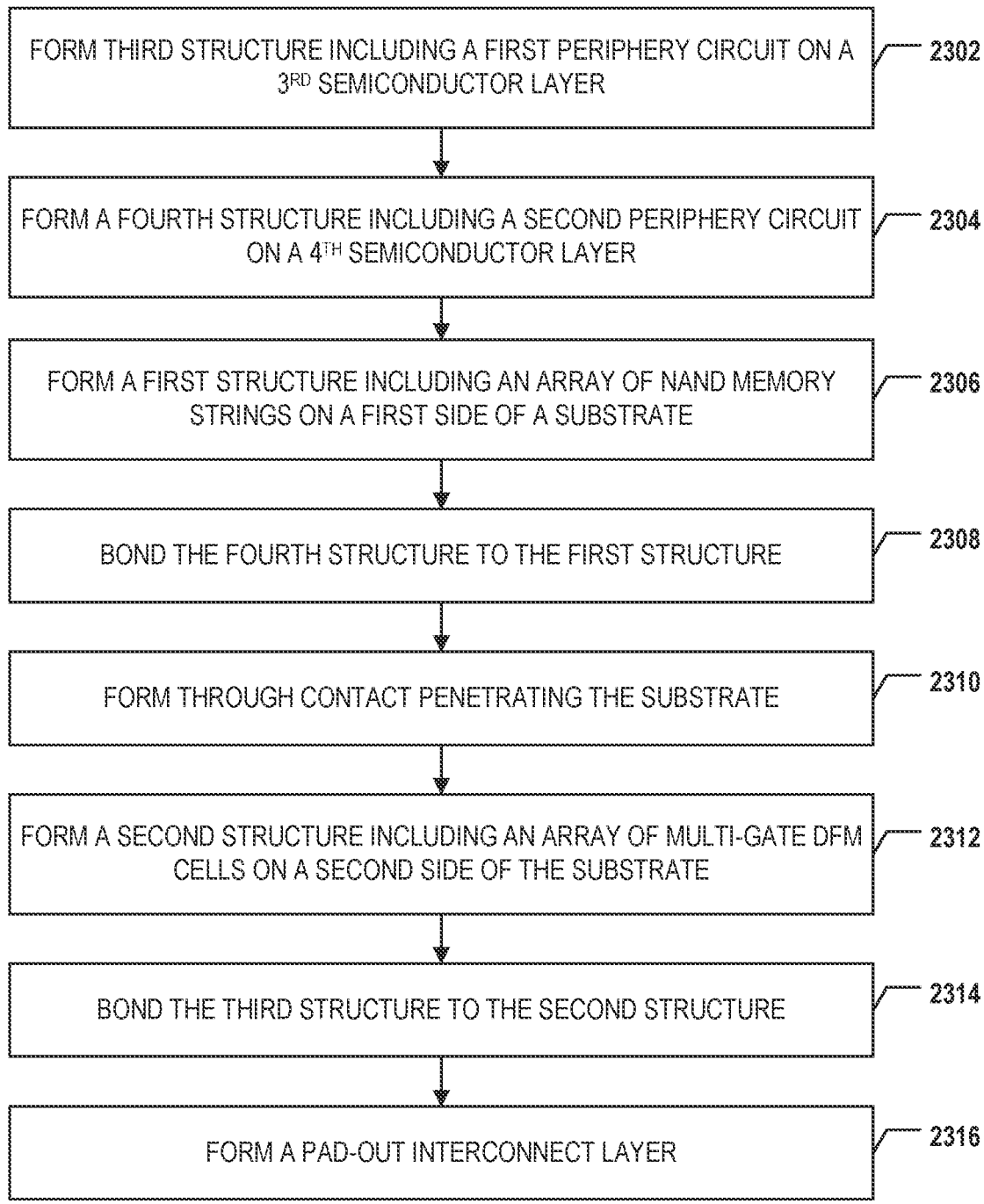
FIG. 23 illustrates a flowchart of a method for forming the 3D memory device in FIG. 22, according to some aspects of the present disclosure.

FIG. 23 illustrates a flowchart of a method 2300 for forming the 3D memory device 2200 shown in FIG. 22, according to some aspects of the present disclosure. FIGS. 24A-24H illustrate the 3D memory device 2200 at certain stages of the fabrication process of method 2300 as shown in FIG. 23, according to some aspects of the present disclosure. It is understood that the operations shown in method 2300 are not exhaustive and that other operations can be performed as well before, after, or between any of the illustrated operations. Further, some of the operations may be performed simultaneously, or in a different order than shown in FIG. 23.

Figure 24A:
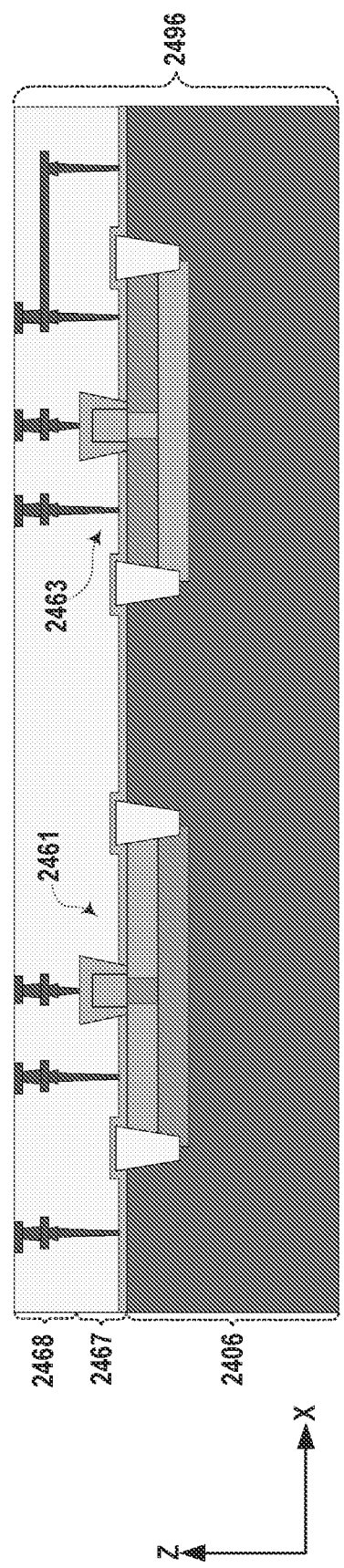
FIGS. 24A-24H illustrate a fabrication process for forming the 3D memory device in FIG. 22, according to some aspects of the present disclosure.

Referring to FIG. 23, method 2300 starts at operation 2302, in which a third semiconductor structure including a first periphery circuit can be formed. As illustrated in FIG. 24A, third semiconductor structure 2496 can including a first periphery circuit 2467 formed on a third semiconductor layer 2406 having single crystalline silicon or polycrystalline silicon. The first periphery circuit including a plurality of transistors 2461 and 2463. In some implementations, transistors 2461 can be HV transistor forming an HV circuit 866, and transistors 2463 can be LV transistor forming an LV circuit 864. Transistors 2461 and 2463 can be formed by a plurality of processes including, but not limited to, photolithography, dry/wet etch, thin film deposition, thermal growth, implantation, CMP, and any other suitable processes. In some implementations, doped regions are formed in semiconductor layer 2406 by ion implantation and/or thermal diffusion, which function, for example, as wells and source/drain regions of transistors 2461 and 2463. In some implementations, isolation regions (e.g., STIs) are also formed in semiconductor layer 2406 by wet/dry etch and thin film deposition. In some implementations, the thickness of gate dielectric of transistor 2461 is different from the thickness of gate dielectric of transistor 2463, for example, by depositing a thicker silicon oxide film in the region of HV transistor 2461 than the region of LV transistor 2463, or by etching back part of the silicon oxide film deposited in the region of transistor 2463. It is understood that the details of fabricating transistors 2461 and 2463 may vary depending on the types of the transistors (e.g., planar transistors 910 or 3D transistors 920 in FIGS. 9A, 9B, 9C, and 9D) and thus, are not elaborated for ease of description.

In some implementations, an interconnect layer 2468 is formed above the transistors on the third semiconductor layer. The interconnect layer can include a plurality of interconnects in one or more ILD layers. As illustrated in FIG. 24A, an interconnect layer 2468 can be formed above transistors 2461 and 2463. Interconnect layer 2468 can include interconnects of MEOL and/or BEOL in a plurality of ILD layers to make electrical connections with transistors 2461 and 2463. In some implementations, interconnect layer 2468 includes multiple ILD layers and interconnects therein formed in multiple processes. For example, the interconnects in interconnect layer 2468 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. In some implementations, interconnect layer 2468 can further include a bonding layer comprising a plurality of conductive bonding contacts and dielectrics electrically isolating the bonding contacts, which can be used, for example, for hybrid bonding as described below in detail. The ILD layers, bonding layer, interconnects, and bonding contacts illustrated in FIG. 24A can be collectively referred to as interconnect layer 2468.

Figure 24B:
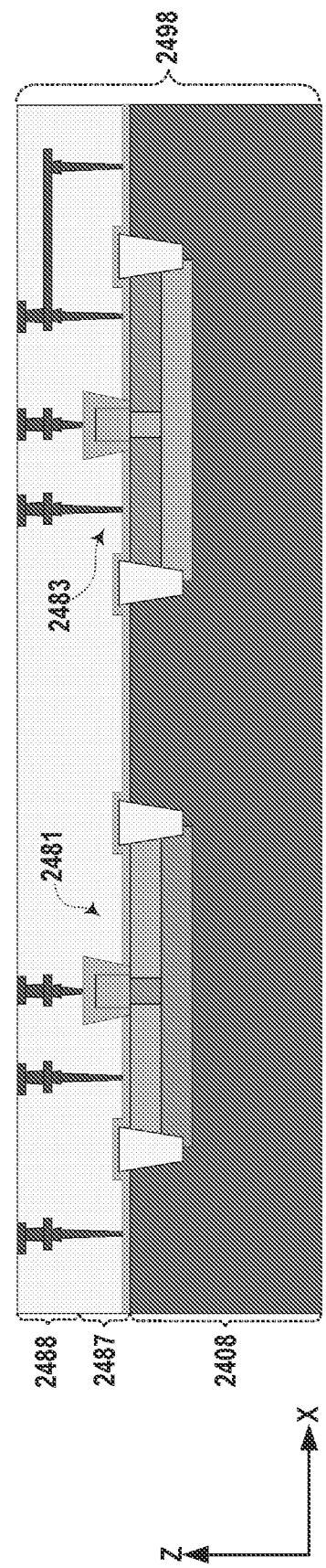

Method 2300 proceeds to operation 2304, as illustrated in FIG. 23, in which a fourth semiconductor structure including a second periphery circuit can be formed. As illustrated in FIG. 24B, fourth semiconductor structure 2498 can including a second periphery circuit 2487 formed on a fourth semiconductor layer 2408 having single crystalline silicon or polycrystalline silicon. As illustrated in FIG. 24B, the second periphery circuit can include a plurality of transistors 2481 and 2483. In some implementations, transistors 2481 can be LV transistor forming an LV circuit 864, and transistors 2483 can be LLV transistor forming an LLV circuit 862. Transistors 2481 and 2483 can be formed by a plurality of processes including, but not limited to, photolithography, dry/wet etch, thin film deposition, thermal growth, implantation, CMP, and any other suitable processes. In some implementations, doped regions are formed in semiconductor layer 2408 by ion implantation and/or thermal diffusion, which function, for example, as wells and source/drain regions of transistors 2481 and 2483. In some implementations, isolation regions (e.g., STIs) are also formed in semiconductor layer 2408 by wet/dry etch and thin film deposition. In some implementations, the thickness of gate dielectric of LV transistor 2481 is different from the thickness of gate dielectric of LLV transistor 2483, for example, by depositing a thicker silicon oxide film in the region of LV transistor 2481 than the region of LLV transistor 2483, or by etching back part of the silicon oxide film deposited in the region of LLV transistor 2483. It is understood that the details of fabricating transistors 2481 and 2483 may vary depending on the types of the transistors (e.g., planar transistors 910 or 3D transistors 920 in FIGS. 9A, 9B, 9C, and 9D) and thus, are not elaborated for ease of description.

In some implementations, an interconnect layer 2488 is formed above the transistor on the fourth semiconductor layer. The interconnect layer can include a plurality of interconnects in one or more ILD layers. As illustrated in FIG. 24B, an interconnect layer 2488 can be formed above transistors 2481 and 2483. Interconnect layer 2488 can include interconnects of MEOL and/or BEOL in a plurality of ILD layers to make electrical connections with transistors 2481 and 2483. In some implementations, interconnect layer 2488 includes multiple ILD layers and interconnects therein formed in multiple processes. For example, the interconnects in interconnect layer 2488 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. In some implementations, interconnect layer 2488 can further include a bonding layer comprising a plurality of conductive bonding contacts and dielectrics electrically isolating the bonding contacts, which can be used, for example, for hybrid bonding as described below in detail. The ILD layers, bonding layer, interconnects, and bonding contacts illustrated in FIG. 24B can be collectively referred to as interconnect layer 2488.

Method 2300 proceeds to operation 2306, as illustrated in FIG. 23, in which a first semiconductor structure including an array of NAND memory strings can be formed on a first side of a substrate. The substrate can include two semiconductor layers separated by a dielectric spacer layer. In some implementations, to form the array of NAND memory strings, a first memory stack is formed on a first semiconductor layer of the substrate.

Figure 24C:
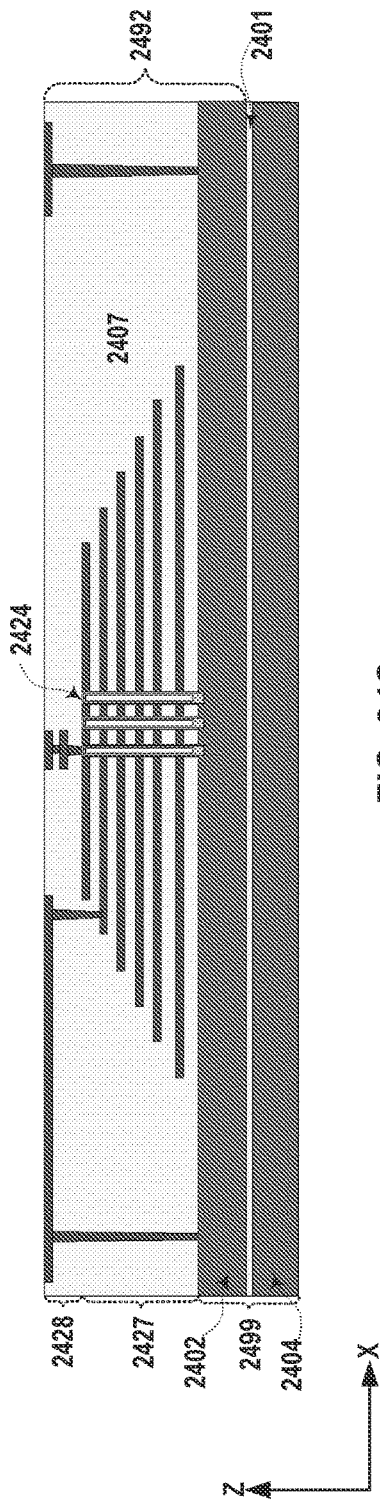

As shown in FIG. 24C, substrate 2499 can include a first semiconductor layer 2402 and a second semiconductor layer 2404 that are isolated from each other by a dielectric spacer layer 2401. In some implementations, first semiconductor layer 2402 and second semiconductor layer 2404 can have any suitable same or different semiconductor materials. In some implementations, first semiconductor layer 2402 and a second semiconductor layer 2404 can include single crystalline silicon or polycrystalline silicon. In some implementations, dielectric spacer layer 2401 can include any suitable dielectric material, such as silicon oxide. In some implementations, first semiconductor layer 2402, second semiconductor layer 2404, and dielectric spacer layer 2401 can be formed by any suitable thin film deposition processes including, but not limited to, CVD, PVD, ALD, or any combination thereof.

As illustrated in FIG. 24C, a first stack structure, such as a first memory stack 2427 including interleaved conductive layers and dielectric layers, is formed on first semiconductor layer 2402. To form first memory stack 2427, in some implementations, a dielectric stack (not shown) including interleaved sacrificial layers (not shown) and the dielectric layers is formed on first semiconductor layer 2402. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. First memory stack 2427 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that first memory stack 2427 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between first memory stack 2427 and semiconductor layer 2402.

As illustrated in FIG. 24C, NAND memory strings 2424 are formed above semiconductor layer 2402, each of which extends vertically through first memory stack 2427 to be in contact with semiconductor layer 2402. In some implementations, fabrication processes to form NAND memory string 2424 include forming a channel hole through first memory stack 2427 (or the dielectric stack) and into semiconductor layer 2402 using dry etching/and or wet etching, such as deep reactive-ion etching (DRIE), followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 2424 may vary depending on the types of channel structures of NAND memory strings 2424 (e.g., bottom plug channel structure 312A, sidewall plug channel structure 312B, or bottom open channel structure 312C in FIGS. 3A-3C) and thus, are not elaborated for ease of description.

In some implementations, an interconnect layer is formed above the array of NAND memory strings on the first semiconductor layer. The interconnect layer can include a first plurality of interconnects in one or more ILD layers. As illustrated in FIG. 24C, an interconnect layer 2428 is formed above first memory stack 2427 and NAND memory strings 2424. Interconnect layer 2428 can include interconnects of MEOL and/or BEOL in a plurality of ILD layers to make electrical connections with NAND memory strings 2424 and/or semiconductor layer 2402. In some implementations, interconnect layer 2428 includes multiple ILD layers and interconnects therein formed in multiple processes. For example, the interconnects in interconnect layer 2428 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. In some implementations, interconnect layer 2428 can further include a bonding layer comprising a plurality of conductive bonding contacts and dielectrics electrically isolating the bonding contacts, which can be used, for example, for hybrid bonding as described below in detail. The ILD layers, bonding layer, interconnects, and bonding contacts illustrated in FIG. 24C can be collectively referred to as interconnect layer 2428.

Method 2300 proceeds to operation 2308, as illustrated in FIG. 23, in which the first semiconductor structure and the fourth semiconductor structure are bonded in a face-to-face manner. The bonding can include hybrid bonding.

Figure 24D:
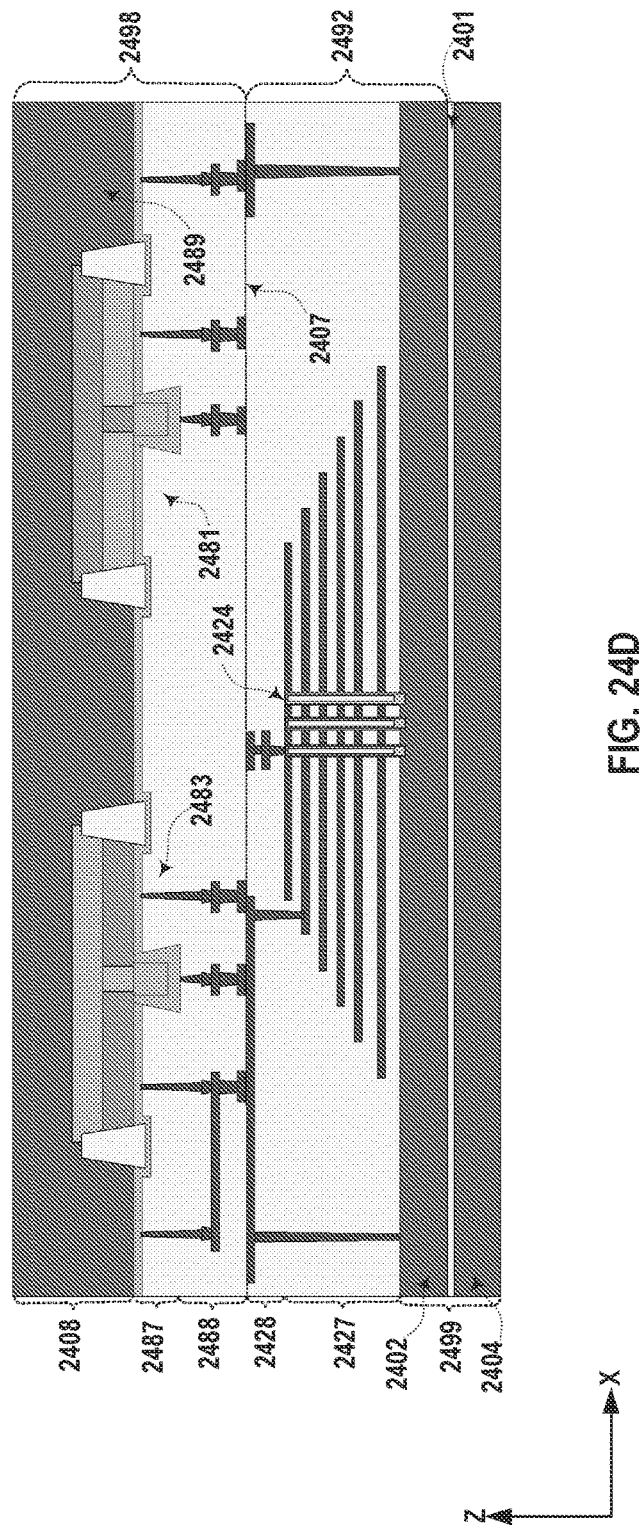

As illustrated in FIG. 24D, fourth semiconductor structure 2498 including semiconductor layer 2408 and components formed thereon (e.g., the second periphery circuit formed therethrough) can be flipped upside down. The bonding layer in interconnect layers 2488 of fourth semiconductor structure 2498 facing down is bonded with the bonding layer in interconnect layer 2428 of first semiconductor structure 2492 facing up, i.e., in a face-to-face manner, thereby forming a bonding interface 2407. The bonding contacts in bonding layer of interconnect layers 2428 are in contact with the bonding contacts in bonding layer of interconnect layer 2488 at bonding interface 2407. In some implementations, a treatment process, e.g., plasma treatment, wet treatment and/or thermal treatment, is applied to bonding surfaces prior to bonding.

As a result of the bonding, e.g., hybrid bonding, the bonding contacts on opposite sides of bonding interface 2407 can be inter-mixed. After the bonding, bonding contacts in bonding layer of interconnect layers 2428 and the bonding contacts in bonding layer of interconnect layer 2488 are aligned and in contact with one another, such that memory stack 2427 and NAND memory strings 2424 formed therethrough can be coupled to transistors 2481 and 2483 through the bonded bonding contacts across bonding interface 1807, according to some implementations.

Figure 24E:
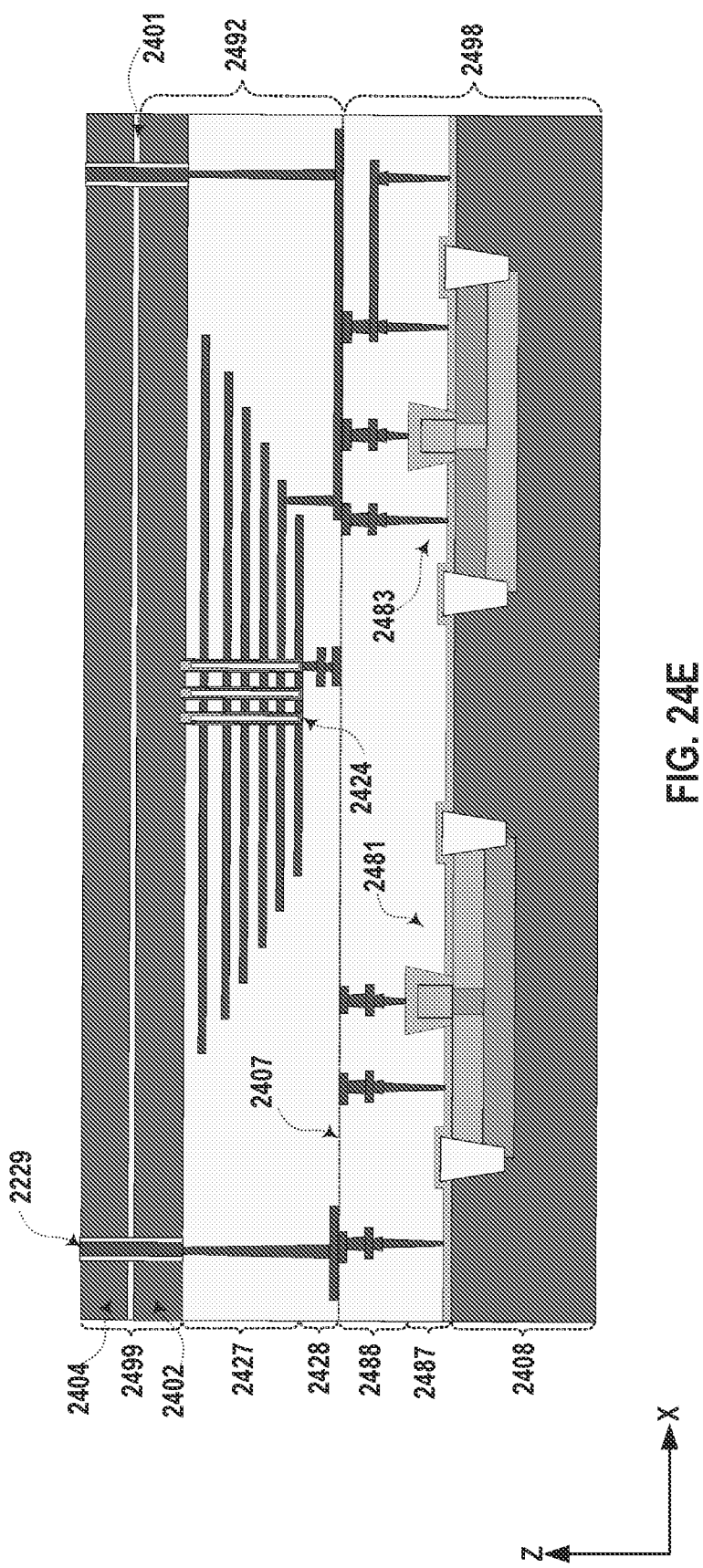

Method 2300 proceeds to operation 2310, as illustrated in FIG. 23, in which one or more through contacts can be formed vertically penetrating the substrate. As shown in FIG. 24E, the bonded structure including first semiconductor structure 2492 and fourth semiconductor structure 2498 can be flipped over, such that substrate 2499 is facing up. In some implementations, one or more through contacts 2229 each extending vertically through substrate 2499 can be formed. Through contacts 1829 can each penetrate semiconductor layers 2402 and 2404, as well as dielectric spacer layer 2401, and be connected with the interconnects in interconnect layers 1828. Through contacts 2229 can be formed by first patterning contact holes in substrate 2499 using patterning process (e.g., photolithography and dry/wet etch processes). The contact holes can be filled with a conductor material (e.g., W or Cu). In some implementations, filling the contact holes includes depositing a spacer (e.g., a silicon oxide layer) before depositing the conductor material.

Method 2300 proceeds to operation 2312, as illustrated in FIG. 23, in which a second semiconductor structure including an array of multi-gate DFM cells can be formed on a second side of the substrate. In some implementations, to form the array of multi-gate DFM cells, a second memory stack is formed on a second semiconductor layer of the substrate.

Figure 24F:
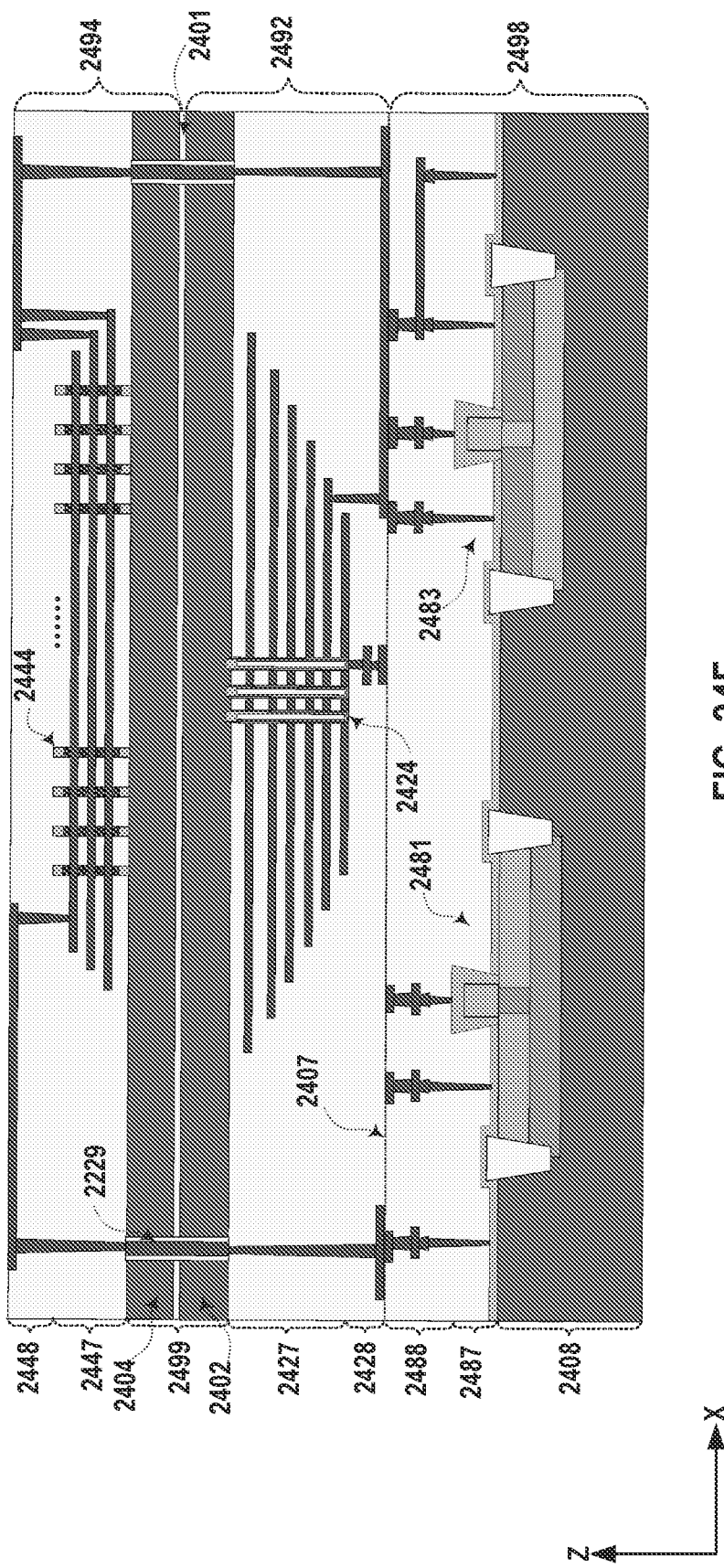

As illustrated in FIG. 24F, a second stack structure, such as a second memory stack 2447 including interleaved conductive layers and dielectric layers, is formed on semiconductor layer 2404. To form second memory stack 2447, in some implementations, a dielectric stack (not shown) including interleaved sacrificial layers (not shown) and the dielectric layers is formed on semiconductor layer 2404. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Second memory stack 2447 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that second memory stack 2447 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between second memory stack 2447 and semiconductor layer 2404.

As illustrated in FIG. 24F, a plurality of multi-gate DFM cells 2444 are formed above semiconductor layer 2404, each of which extends vertically through second memory stack 2447 to be in contact with semiconductor layer 2404. In some implementations, fabrication processes to form multi-gate DFM cells 2444 include forming a channel hole through second memory stack 2447 (or the dielectric stack) to expose semiconductor layer 2404 using dry etching/and or wet etching, such as DRIE, followed by subsequently filling the channel hole with one or more layers, such as a dielectric spacer layer and a semiconductor layer, using thin film deposition processes such as ALD, CVD, PVD, or any combination thereof.

In some implementations, an interconnect layer is formed above the array of multi-gate DFM cells on the third semiconductor layer. The interconnect layer can include a first plurality of interconnects in one or more ILD layers. As illustrated in FIG. 24F, an interconnect layer 2448 is formed above second memory stack 2447 and multi-gate DFM cells 2444. Interconnect layer 2448 can include interconnects of MEOL and/or BEOL in a plurality of ILD layers to make electrical connections with multi-gate DFM cells 2444, through contacts 2229, and/or semiconductor layer 2404. In some implementations, interconnect layer 2448 includes multiple ILD layers and interconnects therein formed in multiple processes. For example, the interconnects in interconnect layer 2448 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. In some implementations, interconnect layer 2448 can further include a bonding layer comprising a plurality of conductive bonding contacts and dielectrics electrically isolating the bonding contacts, which can be used, for example, for hybrid bonding as described below in detail. The ILD layers, bonding layer, interconnects, and bonding contacts illustrated in FIG. 24F can be collectively referred to as interconnect layer 2448.

Method 2300 proceeds to operation 2314, as illustrated in FIG. 23, in which the third semiconductor structure can be bonded to the second semiconductor structure in a face-to-face manner. The bonding can include hybrid bonding.

Figure 24G:
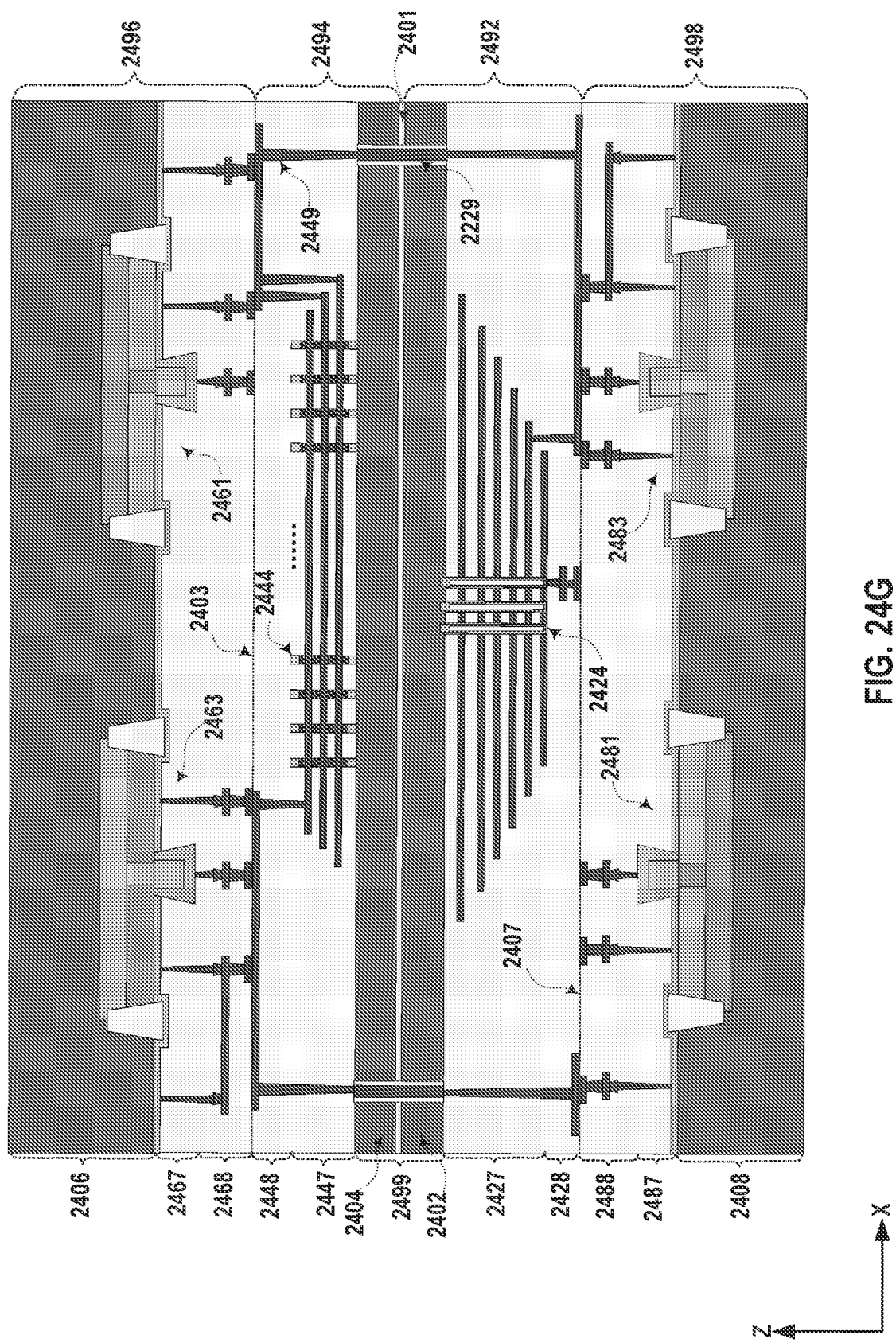

As illustrated in FIG. 24G, third semiconductor structure 2496 including semiconductor layer 2406 and components formed thereon (e.g., the first periphery circuit formed therethrough) can be flipped upside down. The bonding layer in interconnect layers 2468 of third semiconductor structure 2496 facing down is bonded with the bonding layer in interconnect layer 2448 of second semiconductor structure 2492 facing up, i.e., in a face-to-face manner, thereby forming a bonding interface 2403. The bonding contacts in bonding layer of interconnect layers 2448 are in contact with the bonding contacts in bonding layer of interconnect layers 2468 at bonding interface 2403. In some implementations, a treatment process, e.g., plasma treatment, wet treatment and/or thermal treatment, is applied to bonding surfaces prior to bonding.

As a result of the bonding, e.g., hybrid bonding, the bonding contacts on opposite sides of bonding interface 2403 can be inter-mixed. After the bonding, bonding contacts in bonding layer of interconnect layers 2448 and the bonding contacts in bonding layer of interconnect layers 2468 are aligned and in contact with one another, such that memory stack 2447 and multi-gate DFM cells 2444 formed therethrough can be coupled to transistors 2461 and 2463 through the bonded bonding contacts across bonding interface 2403, according to some implementations.

Method 2300 proceeds to operation 2316, as illustrated in FIG. 23, in which one or more pad-out interconnect layers can be formed. In some implementations, a pad-out interconnect layer can be formed on the fourth semiconductor structure. In some other implementations, a pad-out interconnect layer can be formed on the third semiconductor structure. In some other implementations, a first pad-out interconnect layer can be formed on the fourth semiconductor structure, and a second pad-out interconnect layer can be formed on the third semiconductor structure.

Figure 24H:
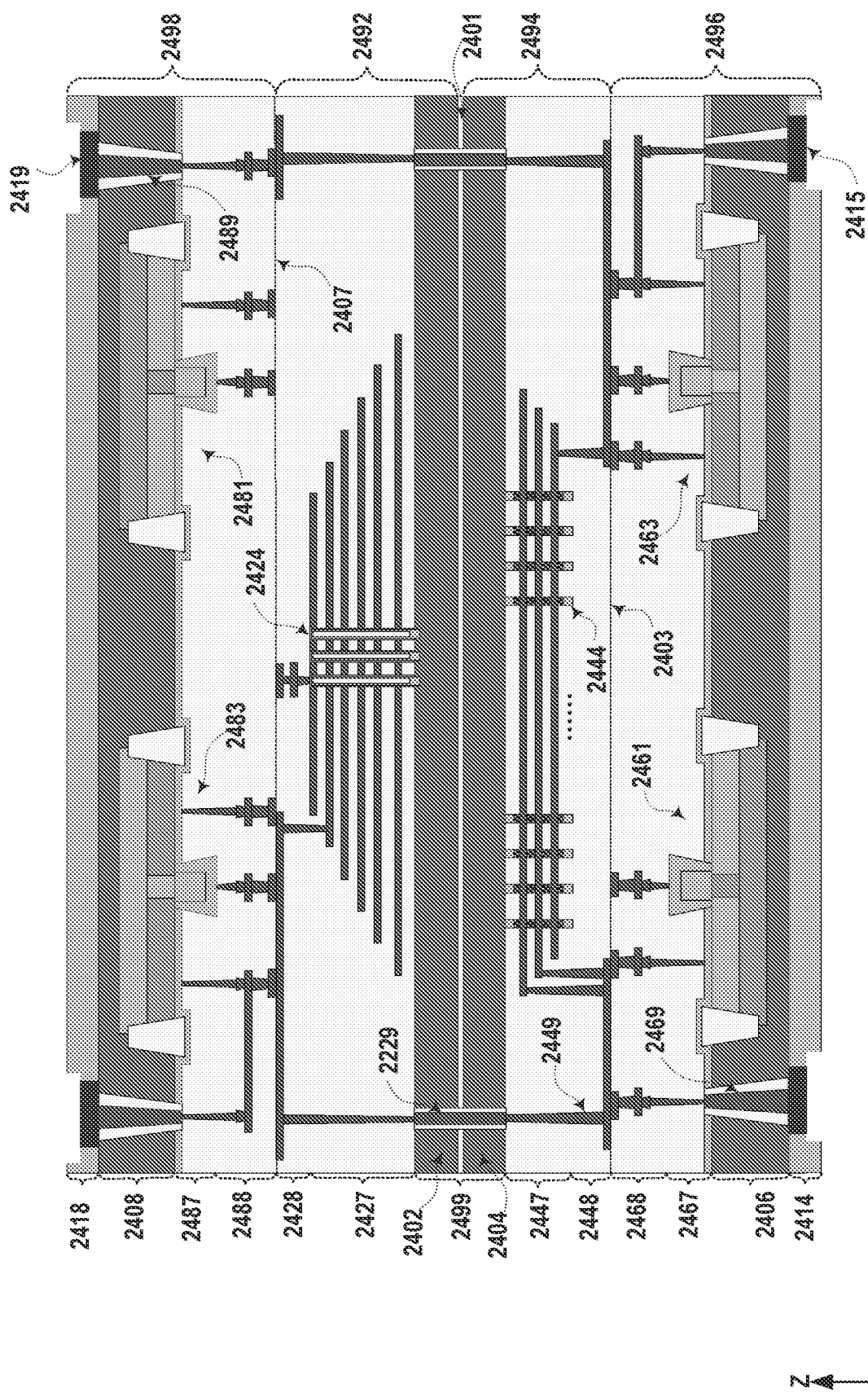

As illustrated in FIG. 24H, in some implementations, a thinning process, such as wafer grinding, dry etch, wet etch, CMP, and/or any combination thereof, can be performed to semiconductor layer 2408 of fourth semiconductor structure 2498. One or more through contacts 2489 each extending vertically through semiconductor layer 2408 can be formed. Through contacts 2489 can couple the interconnects in interconnect layer 2488. Through contacts 2489 can be formed by first patterning contact holes through semiconductor layer 2408 using patterning process (e.g., photolithography and dry/wet etch processes). The contact holes can be filled with a conductor (e.g., Cu). In some implementations, filling the contact holes includes depositing a spacer (e.g., a silicon oxide layer) before depositing the conductor. A first pad-out interconnect layer 2418 is formed on semiconductor layer 2408. Pad-out interconnect layer 2418 can include interconnects, such as contact pads 2419, formed in one or more ILD layers, and in contact with through contacts 2489. Contact pads 2419 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

As illustrated in FIG. 24H, in some implementations, a thinning process, such as wafer grinding, dry etch, wet etch, CMP, and/or any combination thereof, can be performed to semiconductor layer 2406 of third semiconductor structure 2496. One or more through contacts 2469 each extending vertically through semiconductor layer 2406 can be formed. Through contacts 2469 can couple the interconnects in interconnect layer 2468. Through contacts 2469 can be formed by first patterning contact holes through semiconductor layer 2406 using patterning process (e.g., photolithography and dry/wet etch processes). The contact holes can be filled with a conductor (e.g., Cu). In some implementations, filling the contact holes includes depositing a spacer (e.g., a silicon oxide layer) before depositing the conductor. A second pad-out interconnect layer 2414 is formed on semiconductor layer 2406. Pad-out interconnect layer 2414 can include interconnects, such as contact pads 2415, formed in one or more ILD layers, and in contact with through contacts 2469. Contact pads 2415 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

Figure 25:
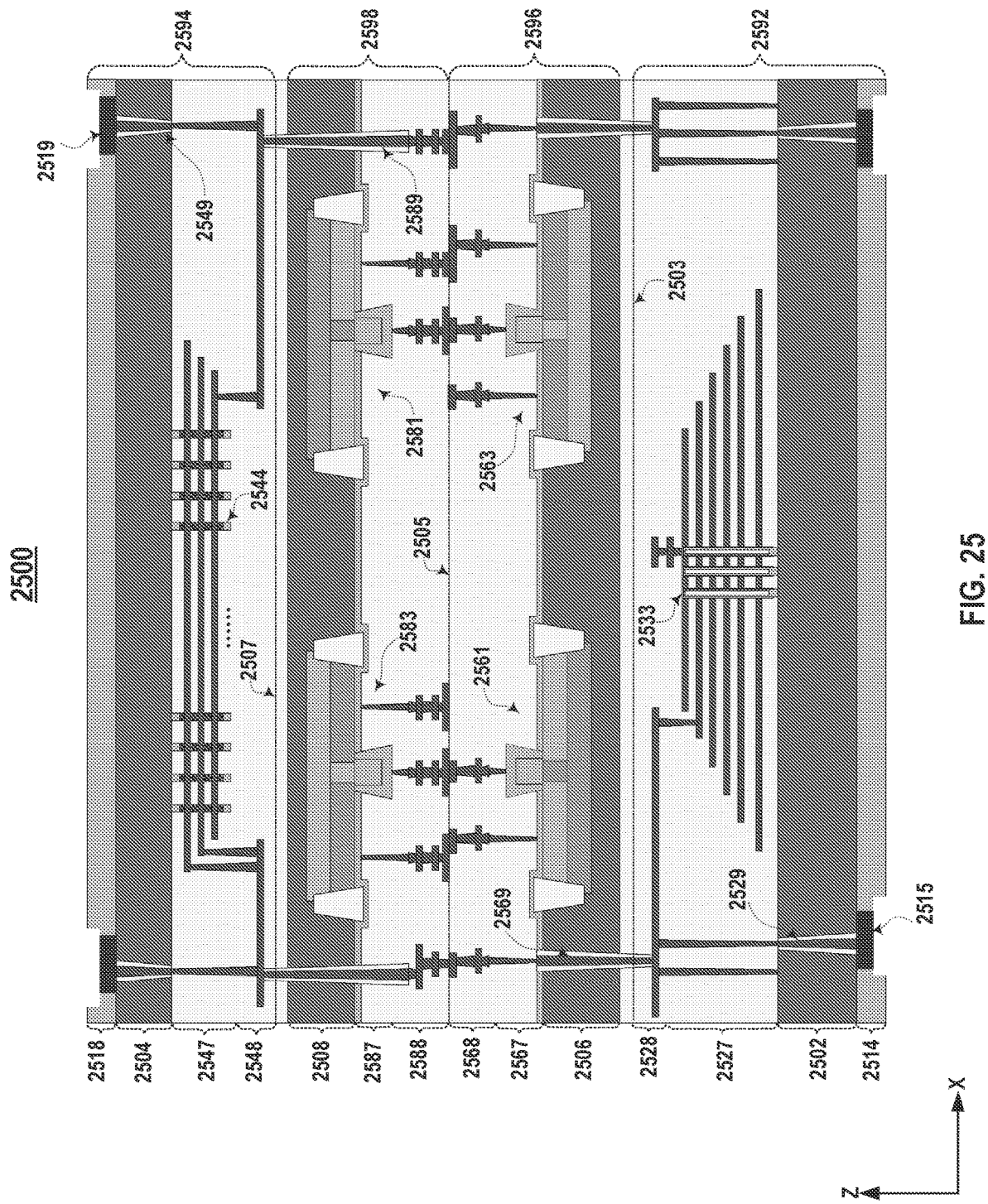
FIG. 25 illustrates a side view of another 3D memory device, according to some aspects of the present disclosure.

FIG. 25 illustrate a schematic diagram of a cross-sectional side view of an exemplary 3D memory device 2500 having four stacked semiconductor structures, according to some aspects of the present disclosure. 3D memory device 2500 may be an example of 3D memory device 100C in FIG. 1C. 3D memory device 2500 is a bonded chip including four semiconductor structures stacked over one another in different planes in the vertical direction (e.g., the z-direction in FIG. 25).

As shown in FIG. 25, first semiconductor structure 2592 including the first memory cell array (e.g., 3D NAND Flash memory cell array) can be formed on one side of 3D memory device 2500, and second semiconductor structure 2594 including the second memory cell array (e.g., 3D DFM cell array) can be formed on another side of 3D memory device 2500. Third semiconductor structure 2596 including the first peripheral circuits (e.g., HV and LV circuits) and fourth semiconductor structure 2598 including the second peripheral circuits (e.g., LV and LLV circuits) are sandwiched between first semiconductor structure 2592 and second semiconductor structure 2594. In some implementations, first semiconductor structure 2592 and third semiconductor structure 2596 can be bonded in a face-to-back manner, second semiconductor structure 2594 and fourth semiconductor structure 2598 can be bonded in a face-to-back manner, while third semiconductor structure 2596 and fourth semiconductor structure 2598 can be bonded in a face-to-face manner.

As shown in FIG. 25, first semiconductor structure 2592 can include semiconductor layer 2502 having semiconductor materials. In some implementations, semiconductor layer 2502 is a silicon substrate having single crystalline silicon or polycrystalline silicon. First semiconductor structure 2592 can include a first memory cell array, such as an array of NAND memory strings 2533 on semiconductor layer 2502.

The sources of NAND memory strings 2533 can be in contact with semiconductor layer 2502. In some implementations, NAND memory strings 2533 are disposed vertically between bonding interface 2503 and semiconductor layer 2502. Each NAND memory string 2533 extends vertically through a plurality of pairs each including a conductive layer and a dielectric layer, according to some implementations. The stacked and interleaved conductive layers and dielectric layers are also referred to herein as a stack structure, e.g., a memory stack 2527. Memory stack 2527 may be an example of memory stack 304 in FIGS. 3A-3C, and the conductive layer and dielectric layer in memory stack 2527 may be examples of gate conductive layers 306 and dielectric layer 308, respectively, in memory stack 304. The interleaved conductive layers and dielectric layers in memory stack 2527 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 2527. It is understood that in some examples, trench isolations and doped regions (not shown) may be formed in semiconductor layer 2502 as well.

In some implementations, each NAND memory string 2533 is a "charge trap" type of NAND memory string including any suitable channel structures disclosed herein, such as bottom plug channel structure 312A, sidewall plug channel structure 312B, or bottom open channel structure 312C, described above in detail with respect to FIGS. 3A-3C. It is understood that NAND memory strings 2533 are not limited to the "charge trap" type of NAND memory strings and may be "floating gate" type of NAND memory strings in other examples.

As shown in FIG. 25, first semiconductor structure 2592 can further include an interconnect layer 2528 above and in contact with NAND memory strings 2533 to transfer electrical signals to and from NAND memory strings 2533. Interconnect layer 2528 can include a plurality of interconnects, (also referred to herein as "contacts"), including lateral lines and vias. As used herein, the term "interconnects" can broadly include any suitable types of interconnects, such as MEOL interconnects and BEOL interconnects. In some implementations, the interconnects in interconnect layer 2528 also include local interconnects, such as bit line contacts and word line contacts. Interconnect layer 2528 can further include one or more ILD in which the lateral lines and vias can form. The interconnects in interconnect layer 2528 can include conductive materials including, but not limited to W, Co, Cu, Al, silicides, or any combination thereof. The ILD layers in interconnect layer 2528 can include dielectric materials including, but not limited to, silicon oxide, silicon nitride, silicon oxynitride, low dielectric constant (low-k) dielectrics, or any combination thereof. In some implementations, the interconnects in interconnect layer 2528 include W, which has a relatively high thermal budget (compatible with high-temperature processes) and good quality (fewer detects, e.g., voids) among conductive metal materials.

As shown in FIG. 25, first semiconductor structure 2592 can further include one or more through contacts 2529 extending vertically through semiconductor layer 2502. In some implementations, through contact 2529 couples the interconnects in interconnect layer 2528 to contact pads 2515. Through contact 2529 can include conductive materials including, but not limited to, W, Co, Cu, Al, silicides, or any combination thereof. In some implementations, through contact 2529 includes W. In some implementations, through contact 2529 includes a via surrounded by a dielectric spacer (e.g., having silicon oxide) to electrically separate the via from semiconductor layer 2502. Depending on the thickness of semiconductor layer 2502, through contact 2529 can be an ILV having a depth in the submicron-level (e.g., between 10 nm and 1 μm), or a TSV having a depth in the micron- or tens micron-level (e.g., between 1 μm and 100 μm).

As shown in FIG. 25, second and fourth semiconductor structures 2594 and 2598 are flipped over. Therefore, some spatial terms such as "on," "above," "below," etc., in descriptions about second and fourth semiconductor structure 2594 and 2598 may be upside down. Second semiconductor structure 2594 can include semiconductor layer 2504 having semiconductor materials, such as single crystalline silicon or polycrystalline silicon. Second semiconductor structure 2594 can include a second memory cell array, such as an array of multi-gate DFM cells 2544 on semiconductor layer 2504. In some implementations, each multi-gate DFM cell 2544 can be referred to DFM memory cell 600A/600B described above in connection with FIGS. 6A and 6B, and the array of multi-gate DFM cells can be referred to DFM memory array 700 described above in connection with FIG. 7. The sources of multi-gate DFM cells 2544 can be in contact with semiconductor layer 2504. In some implementations, multi-gate DFM cells 2544 are disposed vertically between bonding interface 2507 and semiconductor layer 2504. Each multi-gate DFM cell 2544 extends vertically through a memory stack 2547 including a plurality of pairs each including a conductive layer and a dielectric layer, according to some implementations. The interleaved conductive layers and dielectric layers alternate in the vertical direction, according to some implementations. Each conductive layer can include a gate electrode surrounded by an adhesive layer and a gate dielectric layer. The gate electrode of the conductive layer can extend laterally as a word line or a plate line, ending at one or more staircase structures of the memory stack 2547. It is understood that in some examples, trench isolations and doped regions (not shown) may be formed in semiconductor layer 2504 as well.

As shown in FIG. 25, second semiconductor structure 2594 can further include an interconnect layer 2548 above and in contact with multi-gate DFM cells 2544 to transfer electrical signals to and from multi-gate DFM cells 2544. Interconnect layer 2548 can include a plurality of interconnects, such as MEOL interconnects and BEOL interconnects. In some implementations, the interconnects in interconnect layer 2548 also include local interconnects, such as bit line connections, word line connections, plate line connections, and/or source line connections. Interconnect layer 2548 can further include one or more interlayer dielectric (ILD) layers in which the lateral lines and vias can form. The interconnects in interconnect layer 2548 can include conductive materials including, but not limited to W, Co, Cu, Al, silicides, or any combination thereof. The ILD layers in interconnect layer 1048 can include dielectric materials including, but not limited to, silicon oxide, silicon nitride, silicon oxynitride, low-k dielectrics, or any combination thereof.

As shown in FIG. 25, second semiconductor structure 2594 can further include one or more through contacts 2549 extending vertically through semiconductor layer 2504. In some implementations, through contact 2549 couples the interconnects in interconnect layer 2548 to contact pads 2519. Through contact 2549 can include conductive materials including, but not limited to, W, Co, Cu, Al, silicides, or any combination thereof. In some implementations, through contact 2549 includes W. In some implementations, through contact 2549 includes a via surrounded by a dielectric spacer (e.g., having silicon oxide) to electrically separate the via from semiconductor layer 2504. Depending on the thickness of semiconductor layer 2504, through contact 2549 can be an ILV having a depth in the submicron-level (e.g., between 10 nm and 1 µm), or a TSV having a depth in the micron- or tens micron-level (e.g., between 1 µm and 100 µm).

Third semiconductor structure 2596 can be bonded on top of first semiconductor structure 2592 in a back-to-face manner at bonding interface 2503. Third semiconductor structure 2596 can include semiconductor layer 2506 having semiconductor materials. In some implementations, semiconductor layer 2506 is a layer of single crystalline silicon or polycrystalline silicon transferred from a silicon substrate or a SOI substrate and attached to the top surface of first semiconductor structure 2592 by transfer bonding. In some implementations, bonding interface 2503 is disposed vertically between interconnect layer 2528 and semiconductor layer 2506 as a result of transfer bonding, which transfers semiconductor layer 2506 from another substrate and bonds semiconductor layer 2506 onto first semiconductor structure 2592 as described below in detail. In some implementations, bonding interface 2503 is the place at which interconnect layer 2528 and semiconductor layer 2506 are met and bonded. In practice, bonding interface 2503 can be a layer with a certain thickness that includes the top surface of interconnect layer 2528 of first semiconductor structure 2592 and the bottom surface of semiconductor layer 2506 of third semiconductor structure 2596. In some implementations, dielectric layer(s) (e.g., silicon oxide layer) are formed vertically between bonding interface 2503 and semiconductor layer 2506 and/or between bonding interface 2503 and interconnect layer 2528 to facilitate the transfer bonding of semiconductor layer 2506 onto interconnect layer 2528. Thus, it is understood that bonding interface 2503 may include the surfaces of the dielectric layer(s) in some examples.

As shown in FIG. 25, third semiconductor structure 2596 can also include a device layer 2567 above and in contact with semiconductor layer 2506. In some implementations, device layer 2567 includes a first peripheral circuit 2561 and a second peripheral circuit 2563. First peripheral circuit 2561 can include HV circuits 866, such as driving circuits, and second peripheral circuit 2563 can include LV circuits 864, such as page buffer circuits and logic circuits. In some implementations, first peripheral circuit 2561 includes a plurality of HV transistors in contact with semiconductor layer 2506, and second peripheral circuit 2563 includes a plurality of LV transistors in contact with semiconductor layer 2506. In some implementations, each HV transistor or LV transistor includes a gate dielectric, and the thickness of the gate dielectric of HV transistor (e.g., in HV circuit 866) is larger than the thickness of the gate dielectric of LV transistor (e.g., in LV circuit 864) due to the higher voltage applied to the HV transistor than the LV transistor. Trench isolations (e.g., STIs) and doped regions (e.g., wells, sources, and drains of HV transistors and LV transistors) can be formed on or in semiconductor layer 2506 as well.

In some implementations, third semiconductor structure 2596 further includes an interconnect layer 2568 above device layer 2567 to transfer electrical signals to and from peripheral circuits 2561 and 2563. As shown in FIG. 25, interconnect layer 2568 can be vertically between bonding interface 2505 and device layer 2567 (including HV transistors and LV transistors of peripheral circuits 2561 and 2563). Interconnect layer 2568 can include a plurality of interconnects, such as MEOL interconnects and BEOL interconnects. The interconnects in interconnect layer 2568 can be coupled to HV transistors and LV transistors of peripheral circuits 2561 and 2563 in device layer 2567. Interconnect layer 2568 can further include one or more ILD layers in which the lateral lines and vias can form. That is, interconnect layer 2568 can include lateral lines and vias in multiple ILD layers. In some implementations, the devices in device layer 2567 are coupled to one another through the interconnects in interconnect layer 2568. For example, peripheral circuit 2561 may be coupled to peripheral circuit 2563 through interconnect layer 2568. The interconnects in interconnect layer 2568 can include conductive materials including, but not limited to, W, Co, Cu, Al, silicides, or any combination thereof. The ILD layers in interconnect layer 2568 can include dielectric materials including, but not limited to, silicon oxide, silicon nitride, silicon oxynitride, low-k dielectrics, or any combination thereof. Interconnect layer 2568 can further include a bonding layer comprising a plurality of conductive bonding contacts and dielectrics electrically isolating the bonding contacts, which can be used, for example, for hybrid bonding as described below in detail.

As shown in FIG. 25, third semiconductor structure 2596 can further include one or more through contacts 2569 extending vertically through semiconductor layer 2506. In some implementations, through contact 2569 couples the interconnects in interconnect layer 2568 to the interconnects in interconnect layer 2528 to make an electrical connection across bonding interface 2503 between third and first semiconductor structures 2596 and 2592. Through contact 2569 can include conductive materials including, but not limited to, W, Co, Cu, Al, silicides, or any combination thereof. In some implementations, through contact 2569 includes W. In some implementations, through contact 2569 includes a via surrounded by a dielectric spacer (e.g., having silicon oxide) to electrically separate the via from semiconductor layer 2506. Depending on the thickness of semiconductor layer 2506, through contact 2569 can be an ILV having a depth in the submicron-level (e.g., between 10 nm and 1 µm), or a TSV having a depth in the micron- or tens micron-level (e.g., between 1 µm and 100 µm).

Fourth semiconductor structure 2598 can be bonded on top of second semiconductor structure 2596 in a back-to-face manner at bonding interface 2507. Fourth semiconductor structure 2598 can include semiconductor layer 2508 having semiconductor materials. In some implementations, semiconductor layer 2508 is a layer of single crystalline silicon or polycrystalline silicon transferred from a silicon substrate or an SOI substrate and attached to the top surface of second semiconductor structure 2594 by transfer bonding. In some implementations, bonding interface 2507 is disposed vertically between interconnect layer 2548 and semiconductor layer 2508 as a result of transfer bonding, which transfers semiconductor layer 2508 from another substrate and bonds semiconductor layer 2508 onto second semiconductor structure 2594 as described below in detail. In some implementations, bonding interface 2507 is the place at which interconnect layer 2548 and semiconductor layer 2508 are met and bonded. In practice, bonding interface 2507 can be a layer with a certain thickness that includes the top surface of interconnect layer 2548 of second semiconductor structure 2594 and the bottom surface of semiconductor layer 2508 of fourth semiconductor structure 2598. In some implementations, dielectric layer(s) (e.g., silicon oxide layer) are formed vertically between bonding interface 2507 and semiconductor layer 2508 and/or between bonding interface 2507 and interconnect layer 2548 to facilitate the transfer bonding of semiconductor layer 2508 onto interconnect layer 2548. Thus, it is understood that bonding interface 2507 may include the surfaces of the dielectric layer(s) in some examples.

Fourth semiconductor structure 2598 can include a device layer 2587 above and in contact with semiconductor layer 2508. In some implementations, device layer 2587 includes a third peripheral circuit 2581 and a fourth peripheral circuit 2583. Third peripheral circuit 2581 can include LLV circuits 862, such as I/O circuits, and fourth peripheral circuit 2583 can include LV circuits 864, such as page buffer circuits and logic circuits. In some implementations, third peripheral circuit 2581 includes a plurality of LLV transistors, and fourth peripheral circuit 2583 includes a plurality of LV transistors as well. In some implementations, each LLV and LV transistor includes a gate dielectric, and the thickness of the gate dielectric of LLV transistor (e.g., in LLV circuit 862) is smaller than the thickness of the gate dielectric of LV transistor (e.g., in LV circuit 864) due to the lower voltage applied to the LLV transistor than the LV transistor. Trench isolations (e.g., STIs) and doped regions (e.g., wells, sources, and drains of the LLV transistor and the LV transistor can be formed on or in semiconductor layer 2508 as well.

Moreover, the different voltages applied to different HV transistors, LV transistors, and LLV transistors in third and fourth semiconductor structures 2596 and 2598 can lead to differences of device dimensions between second and third semiconductor structures 2596 and 2598. In some implementations, the thickness of the gate dielectric of HV transistor (e.g., in HV circuit 866) is larger than the thickness of the gate dielectric of LLV transistor (e.g., in LLV circuit 862) due to the higher voltage applied to the HV transistor than the LLV transistor. In some implementations, the thickness of the gate dielectric of the LV transistor (e.g., in LV circuit 864) in fourth semiconductor structure 2598 is the same as the thickness of the gate dielectric of the LV transistor (e.g., in LV circuit 864) in third semiconductor structure 2596 due to the same operation voltage. In some implementations, the thickness of semiconductor layer 2506 in which the HV transistor (e.g., in HV circuit 866) is formed is larger than the thickness of semiconductor layer 2508 in which the LLV transistor (e.g., in LLV circuit 862) is formed due to the higher voltage applied to the HV transistor than the LLV transistor.

As shown in FIG. 25, fourth semiconductor structure 2598 can further include an interconnect layer 2588 above device layer 2587 to transfer electrical signals to and from peripheral circuits 2581 and 2583. As shown in FIG. 25, device layer 2587 (including HV transistors and LV transistors of peripheral circuits 2581 and 2583) can be vertically between bonding interface 2507 and interconnect layer 2588. Interconnect layer 2588 can include a plurality of interconnects coupled to the HV transistors of peripheral circuit 2581 and the LV transistors of peripheral circuit 2583 in device layer 2587. Interconnect layer 2588 can further include one or more ILD layers in which the interconnects can form. That is, interconnect layer 2588 can include lateral lines and vias in multiple ILD layers. In some implementations, the devices in device layer 2587 are coupled to one another through the interconnects in interconnect layer 2588. For example, peripheral circuit 2581 may be coupled to peripheral circuit 2583 through interconnect layer 2588. The interconnects in interconnect layer 2588 can include conductive materials including, but not limited to, W, Co, Cu, Al, silicides, or any combination thereof. The ILD layers in interconnect layer 2588 can include dielectric materials including, but not limited to, silicon oxide, silicon nitride, silicon oxynitride, low-k dielectrics, or any combination thereof.

Interconnect layer 2588 can further include a bonding layer comprising a plurality of conductive bonding contacts and dielectrics electrically isolating the bonding contacts, which can be used, for example, for hybrid bonding as described below in detail. As shown in FIG. 25, third semiconductor structure 2596 can be bonded to fourth semiconductor structure 2598 in a face-to-face manner at bonding interface 2505. That is, the bonding layer of interconnect layer 2568 of third semiconductor structure 2596 can be bonded to the bonding layer of interconnect layer 2588 of fourth semiconductor structure 2598. The bonding contacts in the bonding layer of interconnect layer 2568 can be in contact with the bonding contacts in the bonding layer of interconnect layer 2588 at bonding interface 2505. As a result, a plurality of bonding contacts across bonding interface 2505 can make direct, short-distance (e.g., micronlevel) electrical connections between adjacent semiconductor structures 2596 and 2598. In some implementations, dielectric layer(s) (e.g., silicon oxide layer) are formed vertically between bonding interface 2505 and the bonding layers of interconnect layers 2568, 2588. Thus, it is understood that bonding interface 2505 may include the surfaces of the dielectric layer(s) in some examples.

As shown in FIG. 25, fourth semiconductor structure 2598 can further include one or more through contacts 2589 extending vertically through semiconductor layer 2508. In some implementations, through contact 2589 couples the interconnects in interconnect layer 2588 to the interconnects in interconnect layer 2568 to make an electrical connection across bonding interface 2507 between second and fourth semiconductor structures 2594 and 2596. Through contact 2589 can include conductive materials including, but not limited to, W, Co, Cu, Al, silicides, or any combination thereof. In some implementations, through contact 2589 includes a via surrounded by a dielectric spacer (e.g., having silicon oxide) to electrically separate the via from semiconductor layer 2508. Depending on the thickness of semiconductor layer 2508, through contact 2589 can be an ILV having a depth in the submicron-level (e.g., between 10 nm and 1 µm), or a TSV having a depth in the micron- or tens micron-level (e.g., between 1 µm and 100 µm).

Moreover, as shown in FIG. 25, 3D memory device 2500 can further include one or more pad-out interconnect layers for pad-out purposes, i.e., interconnecting with external devices using contact pads on which bonding wires can be soldered. In some implementations shown in FIG. 25, first semiconductor structure 2592 can include a first pad-out interconnect layer 2514 on one side of 3D memory device 2500, and second semiconductor structure 2594 can include a second pad-out interconnect layer 2518 on another side of 3D memory device 2500. First pad-out interconnect layer 2514 can be formed above and in contact with semiconductor layer 2502. First pad-out interconnect layer 2514 can include interconnects, e.g., contact pads 2515, in one or more ILD layers and in electrical connection with through contacts 2529 penetrating semiconductor layer 2502. Second pad-out interconnect layer 2518 can be formed above and in contact with semiconductor layer 2504. Second pad-out interconnect layer 2518 can include interconnects, e.g., contact pads 2519, in one or more ILD layers and in electrical connection with through contacts 2549 penetrating semiconductor layer 2504. In some implementations, the interconnects in pad-out interconnect layers 2514 and 2519 can transfer electrical signals between 3D memory device 2500 and external devices, e.g., for pad-out purposes. In some implementations not shown in FIG. 25, one of pad-out interconnect layers 2514 and 2519 can be omitted.

As a result, peripheral circuits 2561, 2563, 2581, and 2583 in third and fourth semiconductor structures 2596 and 2598 can be coupled to NAND memory strings 2533 in first semiconductor structure 2592 and multi-gate DFM cells 2544 in second semiconductor structure 2594 through various interconnection structures, including interconnect layers 2588, 2568, 2548, and 2528, as well as through contacts 2589 and 2569. Moreover, peripheral circuits 2581, 2583, 2561, and 2563, as well as NAND memory strings 2533 and multi-gate DFM cells 2544 in 3D memory device 2500 can be further coupled to external devices through pad-out interconnect layers 2514, 2519, and through contacts 2529, 2549.

Figure 26:
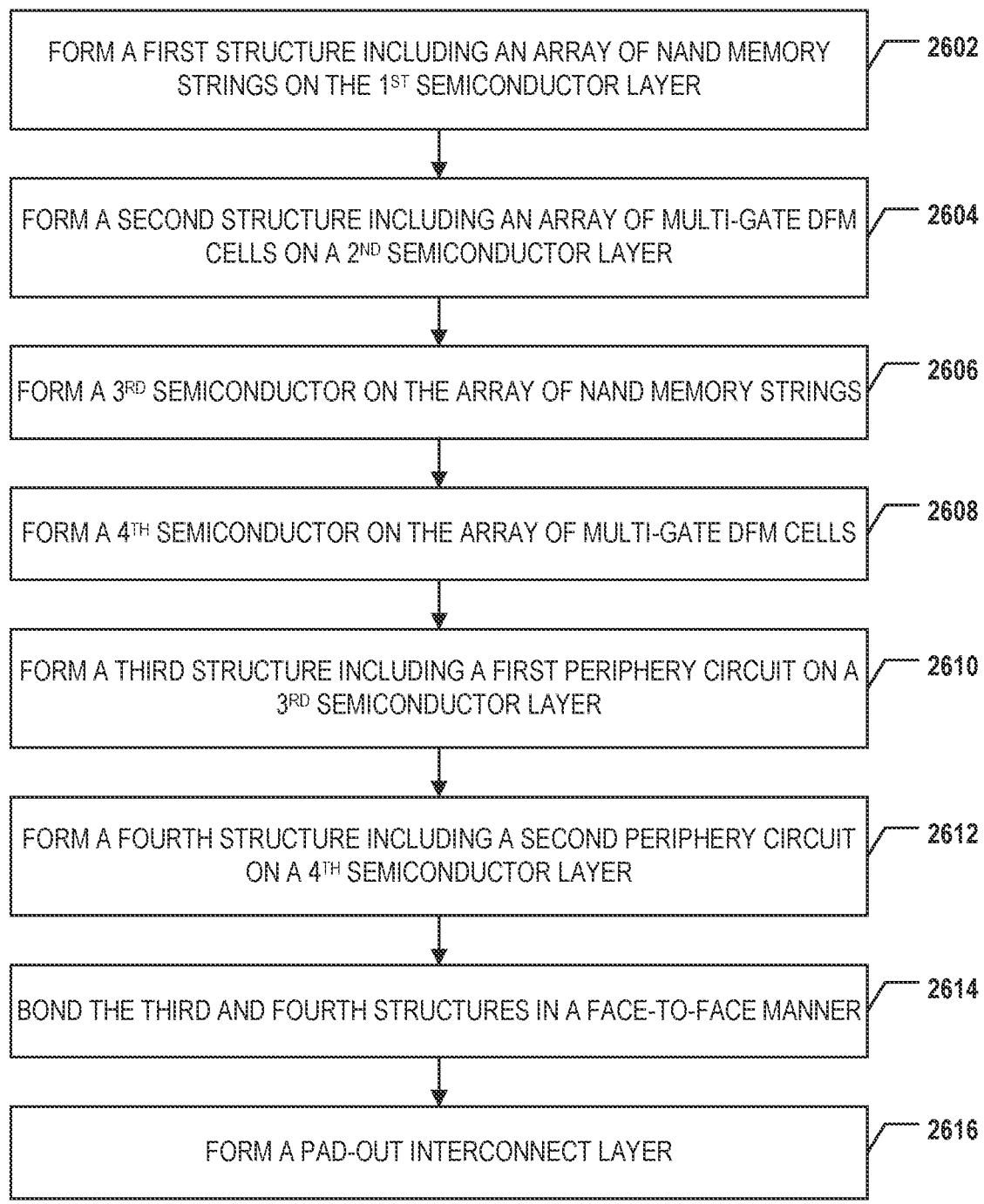
FIG. 26 illustrates a flowchart of a method for forming the 3D memory device in FIG. 25, according to some aspects of the present disclosure.

FIG. 26 illustrates a flowchart of a method 2600 for forming the 3D memory device 2500 shown in FIG. 25, according to some aspects of the present disclosure. FIGS. 27A-27H illustrate the 3D memory device 2500 at certain stages of the fabrication process of method 2600 as shown in FIG. 26, according to some aspects of the present disclosure. It is understood that the operations shown in method 2600 are not exhaustive and that other operations can be performed as well before, after, or between any of the illustrated operations. Further, some of the operations may be performed simultaneously, or in a different order than shown in FIG. 26.

Referring to FIG. 26, method 2600 starts at operation 2602, in which a first semiconductor structure including an array of NAND memory strings disposed on a first semiconductor layer can be formed. The first semiconductor layer can be a silicon substrate having single crystalline silicon or polycrystalline silicon. In some implementations, to form the array of NAND memory strings, a first memory stack is formed on the first semiconductor layer.

Figure 27A:
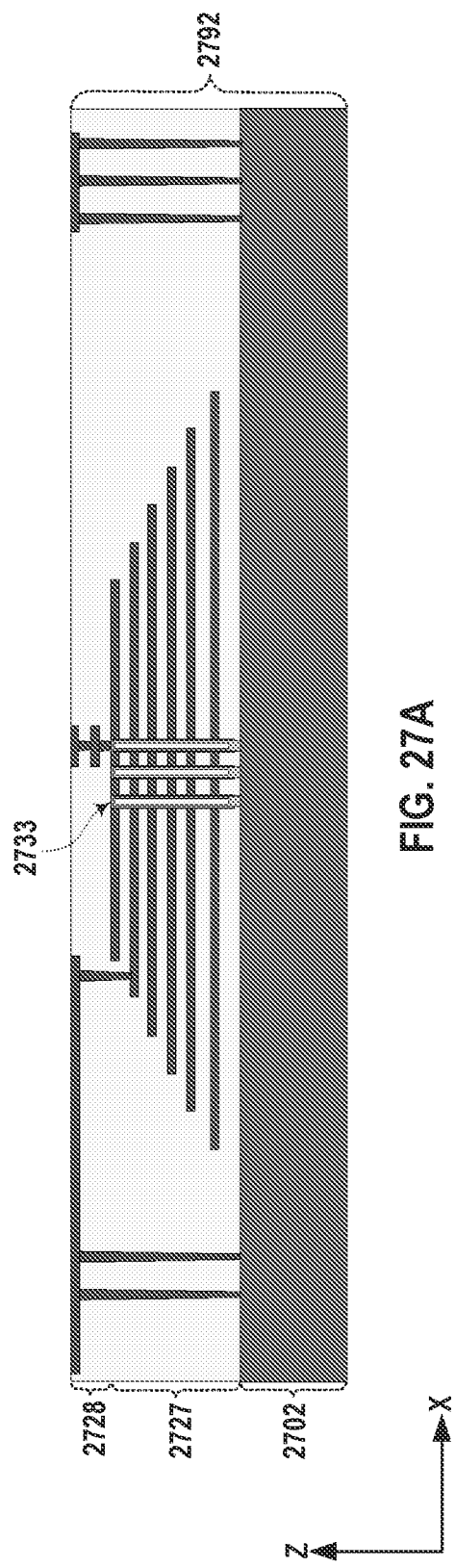
FIGS. 27A-27H illustrate a fabrication process for forming the 3D memory device in FIG. 25, according to some aspects of the present disclosure.

As illustrated in FIG. 27A, a first stack structure, such as a first memory stack 2727 including interleaved conductive layers and dielectric layers, is formed on a semiconductor layer 2702 (e.g., a silicon substrate). To form first memory stack 2727, in some implementations, a dielectric stack (not shown) including interleaved sacrificial layers (not shown) and the dielectric layers is formed on semiconductor layer 2702. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. First memory stack 2727 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that first memory stack 2727 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between first memory stack 2727 and semiconductor layer 2702.

As illustrated in FIG. 27A, NAND memory strings 2733 are formed above semiconductor layer 2702, each of which extends vertically through first memory stack 2727 to be in contact with semiconductor layer 2702. In some implementations, fabrication processes to form NAND memory string 2733 include forming a channel hole through first memory stack 2727 (or the dielectric stack) and into semiconductor layer 2702 using dry etching/and or wet etching, such as deep reactive-ion etching (DRIE), followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 2733 may vary depending on the types of channel structures of NAND memory strings 2733 (e.g., bottom plug channel structure 312A, sidewall plug channel structure 312B, or bottom open channel structure 312C in FIGS. 3A-3C) and thus, are not elaborated for ease of description.

In some implementations, an interconnect layer is formed above the array of NAND memory strings on the first semiconductor layer. The interconnect layer can include a first plurality of interconnects in one or more ILD layers. As illustrated in FIG. 27A, an interconnect layer 2728 is formed above first memory stack 2727 and NAND memory strings 2733. Interconnect layer 2728 can include interconnects of MEOL and/or BEOL in a plurality of ILD layers to make electrical connections with NAND memory strings 2733 and/or semiconductor layer 2702. In some implementations, interconnect layer 2728 includes multiple ILD layers and interconnects therein formed in multiple processes. For example, the interconnects in interconnect layer 2728 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 27A can be collectively referred to as interconnect layer 2728.

Referring to FIG. 26, method 2600 proceeds to operation 2604 in which a second semiconductor structure including an array of multi-gate DFM cells disposed on a second semiconductor layer can be formed. In some implementations, to form the array of multi-gate DFM cells, a second memory stack is formed on the second semiconductor layer.

Figure 27B:
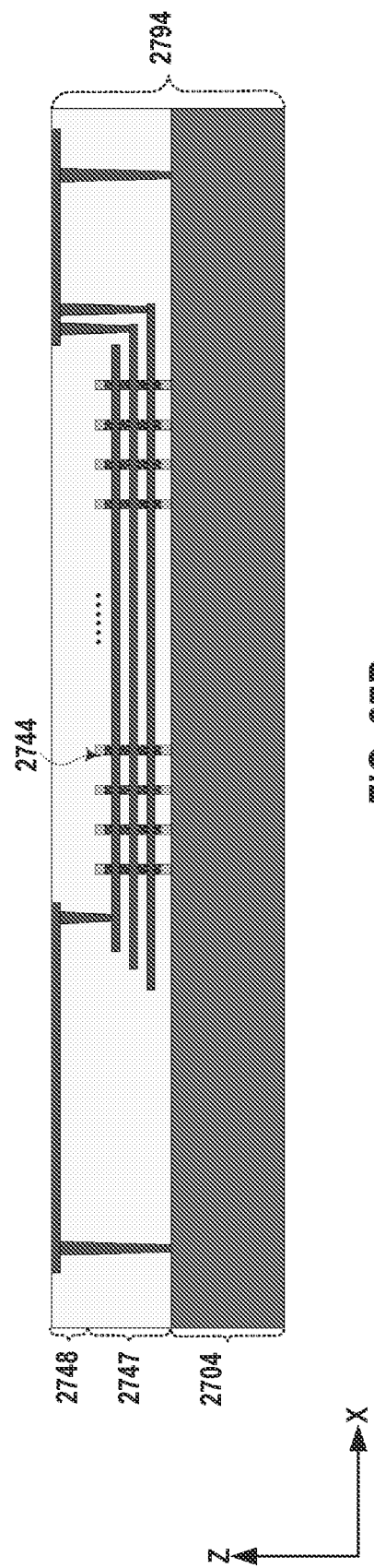

As illustrated in FIG. 27B, a second stack structure, such as a second memory stack 2747 including interleaved conductive layers and dielectric layers, is formed on semiconductor layer 2704, (e.g., a silicon substrate). To form second memory stack 2727, in some implementations, a dielectric stack (not shown) including interleaved sacrificial layers (not shown) and the dielectric layers is formed on semiconductor layer 2704. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Second memory stack 2747 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that second memory stack 2747 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between second memory stack 2747 and semiconductor layer 2704.

As illustrated in FIG. 27B, a plurality of multi-gate DFM cells 2744 are formed above semiconductor layer 2704, each of which extends vertically through second memory stack 2747 to be in contact with semiconductor layer 2704. In some implementations, fabrication processes to form multi-gate DFM cells 2744 include forming a channel hole through second memory stack 2747 (or the dielectric stack) to expose semiconductor layer 2704 using dry etching/and or wet etching, such as DRIE, followed by subsequently filling the channel hole with one or more layers, such as a dielectric spacer layer and a semiconductor layer, using thin film deposition processes such as ALD, CVD, PVD, or any combination thereof.

In some implementations, an interconnect layer is formed above the multi-gate DFM cells on the second semiconductor layer. The interconnect layer can include a first plurality of interconnects in one or more ILD layers. As illustrated in FIG. 27B, an interconnect layer 2748 is formed above second memory stack 2747 and multi-gate DFM cells 2744. Interconnect layer 2748 can include interconnects of MEOL and/or BEOL in a plurality of ILD layers to make electrical connections with multi-gate DFM cells 2744 and/or semiconductor layer 2704. In some implementations, interconnect layer 2748 includes multiple ILD layers and interconnects therein formed in multiple processes. For example, the interconnects in interconnect layer 2748 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 27B can be collectively referred to as interconnect layer 2748.

Method 2600 proceeds to operation 2606, as illustrated in FIG. 26, in which a third semiconductor layer is formed above the array of NAND memory strings. The third semiconductor layer can include single crystalline silicon or polycrystalline silicon. In some implementations, to form the third semiconductor layer, a third substrate and the first semiconductor structure 2792 are bonded in a face-to-face manner, and the third substrate is thinned to leave the third semiconductor layer. The bonding can include transfer bonding. The third substrate can be a silicon substrate having single crystalline silicon or polycrystalline silicon.

Figure 27C:
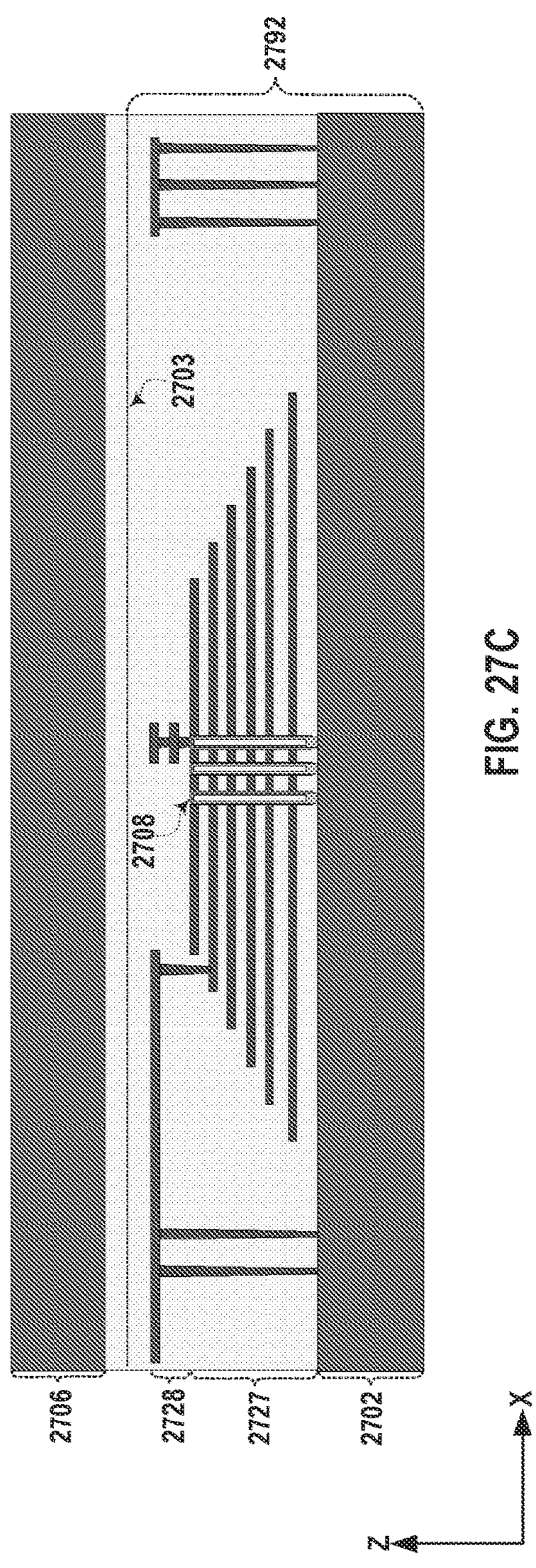

As illustrated in FIG. 27C, a semiconductor layer 2706, such as a single crystalline silicon layer or a polycrystalline silicon layer, is formed above interconnect layer 2728 and NAND memory strings 2733. Semiconductor layer 2706 can be attached above interconnect layer 2728 to form a bonding interface 2703 vertically between semiconductor layer 2706 and interconnect layer 2728. In some implementations, to form semiconductor layer 2706, a third silicon substrate (not shown in FIG. 27C) and first semiconductor structure 2792 are bonded in a face-to-face manner (having the components formed on semiconductor layer 2702, such as NAND memory strings 2733, facing toward the third silicon substrate) using transfer bonding, thereby forming bonding interface 2703. The third silicon substrate can then be thinned using any suitable processes to leave semiconductor layer 2706 attached above interconnect layer 2728. The details of various transfer bonding processes are described above with respect to FIGS. 31A-31D and FIGS. 32A-32D and thus, are not repeated for ease of description.

Method 2600 proceeds to operation 2608, as illustrated in FIG. 26, in which a fourth semiconductor layer is formed above the array of multi-gate DFM cells. The fourth semiconductor layer can include single crystalline silicon or polycrystalline silicon. In some implementations, to form the fourth semiconductor layer, a fourth substrate and the second semiconductor structure 2794 are bonded in a face-to-face manner, and the fourth substrate is thinned to leave the fourth semiconductor layer. The bonding can include transfer bonding. The fourth substrate can be a silicon substrate having single crystalline silicon or polycrystalline silicon.

Figure 27D:
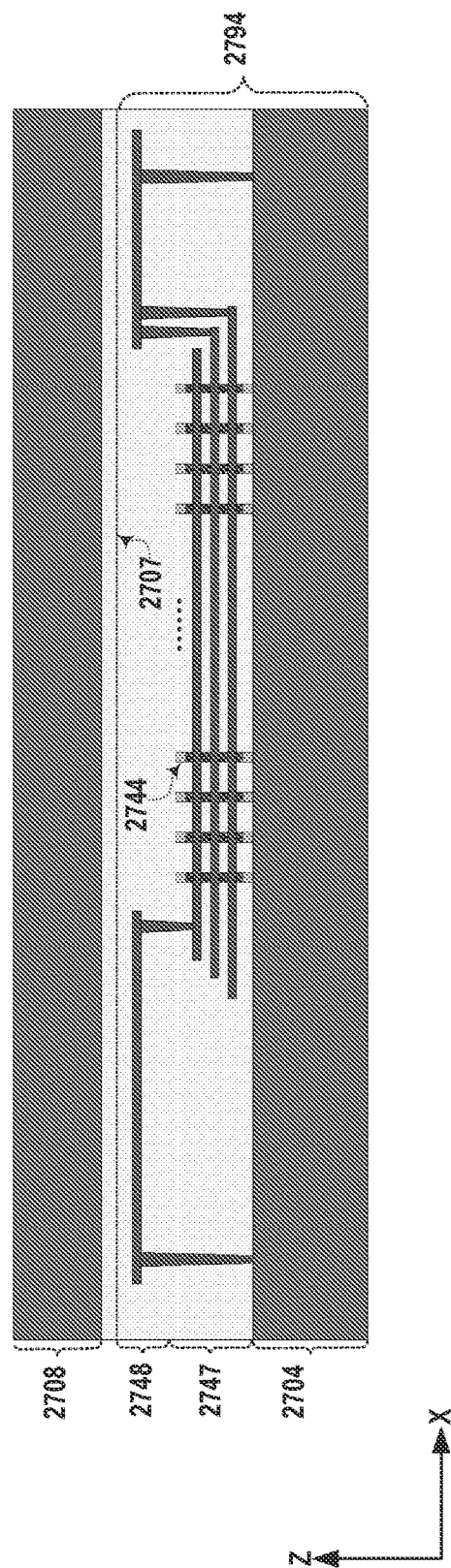

As illustrated in FIG. 27D, a semiconductor layer 2708, such as a single crystalline silicon layer or a polycrystalline silicon layer, is formed above interconnect layer 2748 and multi-gate DFM cells 2744. Semiconductor layer 2708 can be attached above interconnect layer 2748 to form a bonding interface 2707 vertically between semiconductor layer 2708 and interconnect layer 2748. In some implementations, to form semiconductor layer 2708, a fourth silicon substrate (not shown in FIG. 27D) and second semiconductor structure 2794 are bonded in a face-to-face manner (having the components formed on semiconductor layer 2704, such as multi-gate DFM cells 2744, facing toward the fourth silicon substrate) using transfer bonding, thereby forming bonding interface 2707. The fourth silicon substrate can then be thinned using any suitable processes to leave semiconductor layer 2708 attached above interconnect layer 2748. The details of various transfer bonding processes are described above with respect to FIGS. 31A-31D and FIGS. 32A-32D and thus, are not repeated for ease of description.

Figure 27E:
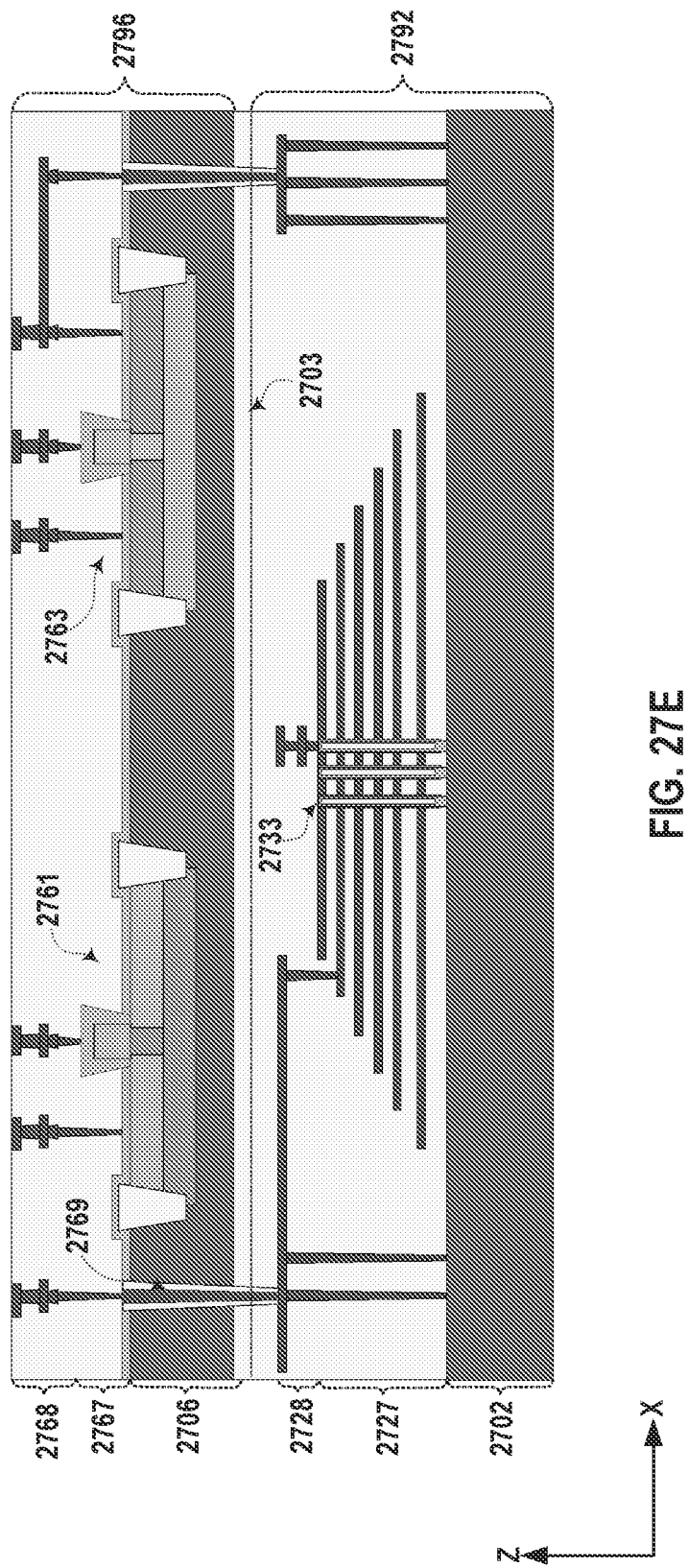

Referring to FIG. 26, method 2600 proceeds to operation 2610 in which a first periphery circuit is formed on the third semiconductor layer. As illustrated in FIG. 27E, the first periphery circuit 2767 including a plurality of transistors 2761 and 2763 can be formed on semiconductor layer 2706 having single crystalline silicon or polycrystalline silicon. In some implementations, transistors 2761 can be HV transistor forming an HV circuit 866, and transistors 2763 can be LV transistor forming an LV circuit 864. Transistors 2761 and 2763 can be formed by a plurality of processes including, but not limited to, photolithography, dry/wet etch, thin film deposition, thermal growth, implantation, CMP, and any other suitable processes. In some implementations, doped regions are formed in semiconductor layer 2706 by ion implantation and/or thermal diffusion, which function, for example, as wells and source/drain regions of transistors 2761 and 2763. In some implementations, isolation regions (e.g., STIs) are also formed in semiconductor layer 2706 by wet/dry etch and thin film deposition. In some implementations, the thickness of gate dielectric of transistor 2761 is different from the thickness of gate dielectric of transistor 2763, for example, by depositing a thicker silicon oxide film in the region of HV transistor 2761 than the region of LV transistor 2763, or by etching back part of the silicon oxide film deposited in the region of transistor 2763. It is understood that the details of fabricating transistors 2761 and 2763 may vary depending on the types of the transistors (e.g., planar transistors 910 or 3D transistors 920 in FIGS. 9A, 9B, 9C, and 9D) and thus, are not elaborated for ease of description.

In some implementations, an interconnect layer 2768 is formed above the transistor on the third semiconductor layer. The interconnect layer can include a plurality of interconnects in one or more ILD layers. As illustrated in FIG. 27E, an interconnect layer 2768 can be formed above transistors 2761 and 2763. Interconnect layer 2768 can include interconnects of MEOL and/or BEOL in a plurality of ILD layers to make electrical connections with transistors 2761 and 2763. In some implementations, interconnect layer 2768 includes multiple ILD layers and interconnects therein formed in multiple processes. For example, the interconnects in interconnect layer 2768 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. In some implementations, interconnect layer 2768 can further include a bonding layer comprising a plurality of conductive bonding contacts and dielectrics electrically isolating the bonding contacts, which can be used, for example, for hybrid bonding as described below in detail. The ILD layers, bonding layer, interconnects, and bonding contacts illustrated in FIG. 27E can be collectively referred to as interconnect layer 2768.

In some implementations, a through contact penetrating the third semiconductor layer is formed. As illustrated in FIG. 27E, one or more through contacts 2769 each extending vertically through semiconductor layer 2706 can be formed. Through contacts 2769 can couple the interconnects in interconnect layers 2768 and 2728. Through contacts 2769 can be formed by first patterning contact holes through semiconductor layer 2706 using patterning process (e.g., photolithography and dry/wet etch processes). The contact holes can be filled with a conductor (e.g., W or Cu). In some implementations, filling the contact holes includes depositing a spacer (e.g., a silicon oxide layer) before depositing the conductor.

Figure 27F:
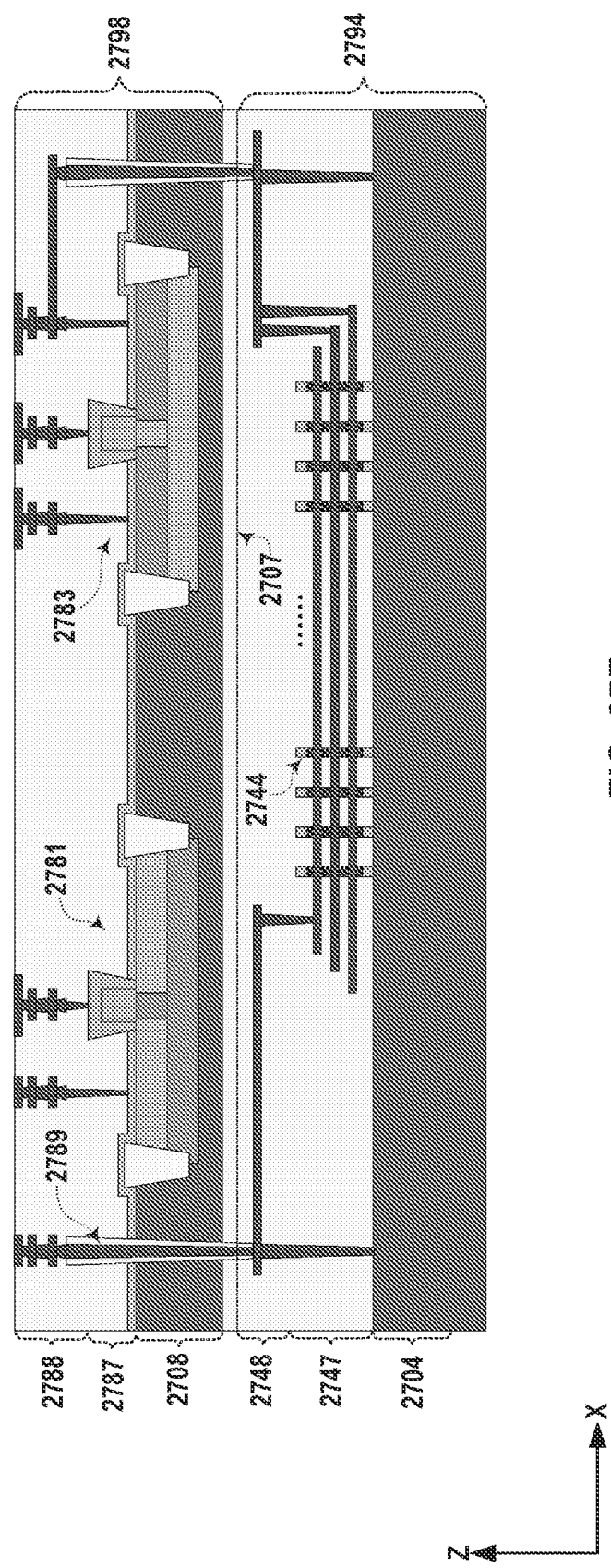

Method 2600 proceeds to operation 2612, as illustrated in FIG. 26, in which a second periphery circuit is formed on the fourth semiconductor layer. As illustrated in FIG. 27F, the second periphery circuit 2787 including a plurality of transistors 2781 and 2783 can be formed on semiconductor layer 2708 having single crystalline silicon or polycrystalline silicon. In some implementations, transistors 2781 can be LV transistor forming an LV circuit 864, and transistors 2783 can be LLV transistor forming an LLV circuit 862. Transistors 2781 and 2783 can be formed by a plurality of processes including, but not limited to, photolithography, dry/wet etch, thin film deposition, thermal growth, implantation, CMP, and any other suitable processes. In some implementations, doped regions are formed in semiconductor layer 2708 by ion implantation and/or thermal diffusion, which function, for example, as wells and source/drain regions of transistors 2781 and 2783. In some implementations, isolation regions (e.g., STIs) are also formed in semiconductor layer 2708 by wet/dry etch and thin film deposition. In some implementations, the thickness of gate dielectric of LV transistor 2781 is different from the thickness of gate dielectric of LLV transistor 2783, for example, by depositing a thicker silicon oxide film in the region of LV transistor 2781 than the region of LLV transistor 2783, or by etching back part of the silicon oxide film deposited in the region of LLV transistor 2783. It is understood that the details of fabricating transistors 2781 and 2783 may vary depending on the types of the transistors (e.g., planar transistors 910 or 3D transistors 920 in FIGS. 9A, 9B, 9C, and 9D) and thus, are not elaborated for ease of description.

In some implementations, an interconnect layer 2788 is formed above the transistor on the semiconductor layer. The interconnect layer can include a plurality of interconnects in one or more ILD layers. As illustrated in FIG. 27F, an interconnect layer 2788 can be formed above transistors 2781 and 2783. Interconnect layer 2788 can include interconnects of MEOL and/or BEOL in a plurality of ILD layers to make electrical connections with transistors 2781 and 2783. In some implementations, interconnect layer 2788 includes multiple ILD layers and interconnects therein formed in multiple processes. For example, the interconnects in interconnect layer 2788 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. In some implementations, interconnect layer 2788 can further include a bonding layer comprising a plurality of conductive bonding contacts and dielectrics electrically isolating the bonding contacts, which can be used, for example, for hybrid bonding as described below in detail. The ILD layers, bonding layer, interconnects, and bonding contacts illustrated in FIG. 27F can be collectively referred to as interconnect layer 2768.

In some implementations, a through contact penetrating the third semiconductor layer is formed. As illustrated in FIG. 27F, one or more through contacts 2789 each extending vertically through semiconductor layer 2708 can be formed. Through contacts 2789 can couple the interconnects in interconnect layers 2788 and 2748. Through contacts 2789 can be formed by first patterning contact holes through semiconductor layer 2708 using patterning process (e.g., photolithography and dry/wet etch processes). The contact holes can be filled with a conductor (e.g., W or Cu). In some implementations, filling the contact holes includes depositing a spacer (e.g., a silicon oxide layer) before depositing the conductor.

Method 2600 proceeds to operation 2614, as illustrated in FIG. 26, in which the formed structure including the second and fourth semiconductor structures can be bonded to the formed structure including the first and third semiconductor structures in a face-to-face manner. The bonding can include hybrid bonding.

Figure 27G:
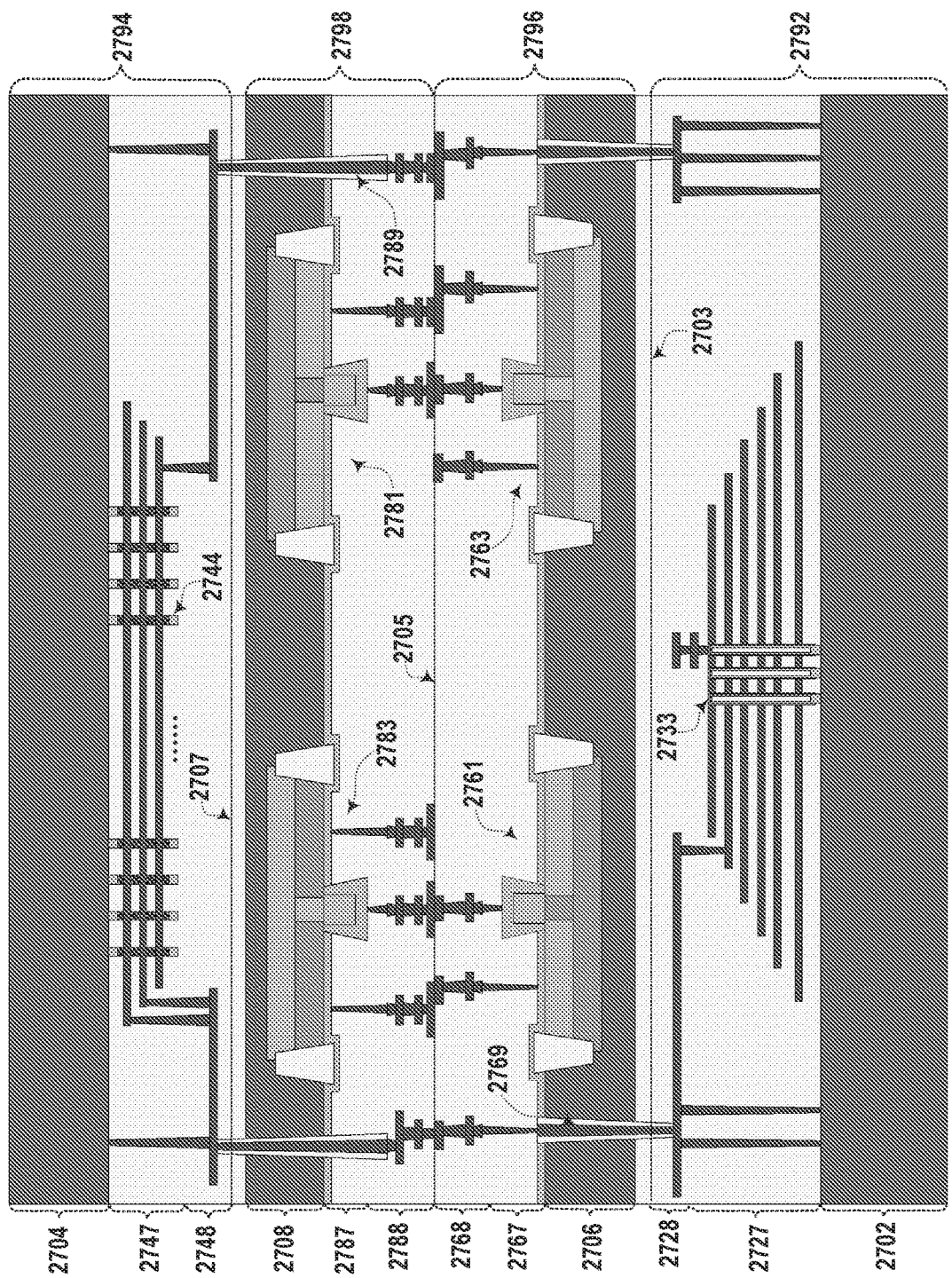

As illustrated in FIG. 27G, the formed structure including second and fourth semiconductor structures 2794 and 2798 can be flipped upside down, and bonded to the formed structure including the first and third semiconductor structures 2792 and 2796. That is, the bonding layer in interconnect layers 2788 of fourth semiconductor structure 2798 facing down is bonded with the bonding layer in interconnect layer 2768 of third semiconductor structure 2796 facing up, i.e., in a face-to-face manner, thereby forming a bonding interface 2705. The bonding contacts in bonding layer of interconnect layers 2788 are in contact with the bonding contacts in bonding layer of interconnect layer 2768 at bonding interface 2705. In some implementations, a treatment process, e.g., plasma treatment, wet treatment and/or thermal treatment, is applied to bonding surfaces prior to bonding.

As a result of the bonding, e.g., hybrid bonding, the bonding contacts on opposite sides of bonding interface 2705 can be inter-mixed. After the bonding, bonding contacts in bonding layer of interconnect layers 2788 and the bonding contacts in bonding layer of interconnect layer 2768 are aligned and in contact with one another, such that the devices (e.g., multi-gate DFM cells 2744, transistors 2781 and 2783) formed in second and fourth semiconductor structures 2794 and 2798 can be can be coupled to the devices (e.g., NAND memory strings 2733, transistors 2761 and 2763) formed in first and third semiconductor structures 2792 and 2796 can be coupled through the bonded bonding contacts across bonding interface 2705, according to some implementations.

Method 2600 proceeds to operation 2616, as illustrated in FIG. 26, in which one or more pad-out interconnect layers can be formed. In some implementations, a pad-out interconnect layer can be formed above the second semiconductor structure. In some other implementations, a pad-out interconnect layer can be formed below the first semiconductor structure. In some other implementations, a first pad-out interconnect layer can be formed above the second semiconductor structure, and a second pad-out interconnect layer can be formed below the first semiconductor structure.

Figure 27H:
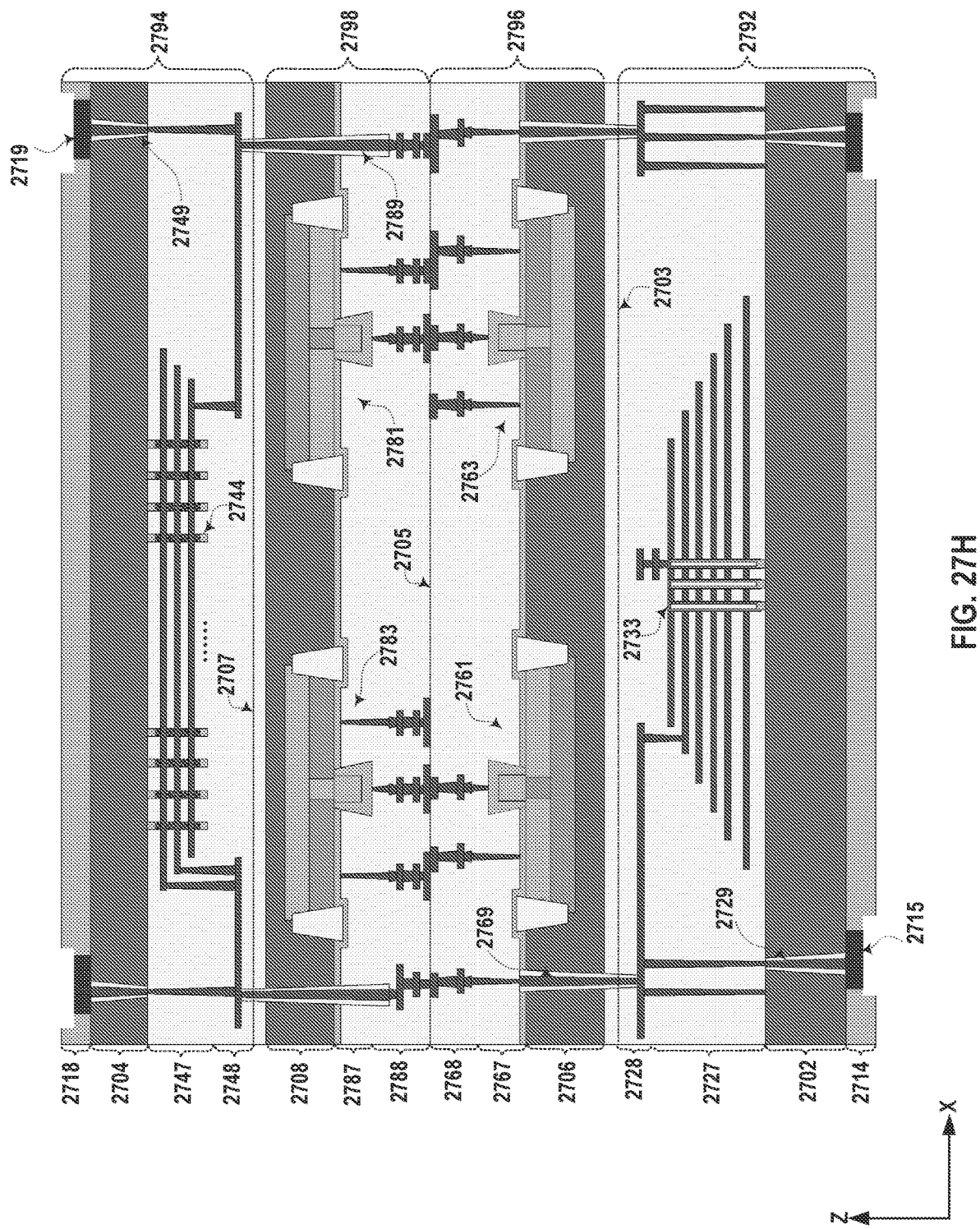

As illustrated in FIG. 27H, in some implementations, a thinning process, such as wafer grinding, dry etch, wet etch, CMP, and/or any combination thereof, can be performed to semiconductor layer 2704 of second semiconductor structure 2794. One or more through contacts 2749 each extending vertically through semiconductor layer 2704 can be formed. Through contacts 2749 can couple the interconnects in interconnect layer 2748. Through contacts 2749 can be formed by first patterning contact holes through semiconductor layer 2704 using patterning process (e.g., photolithography and dry/wet etch processes). The contact holes can be filled with a conductor material (e.g., W or Cu). In some implementations, filling the contact holes includes depositing a spacer (e.g., a silicon oxide layer) before depositing the conductor material. A first pad-out interconnect layer 2718 is formed on semiconductor layer 2704. Pad-out interconnect layer 2718 can include interconnects, such as contact pads 2719, formed in one or more ILD layers, and in contact with through contacts 2749. Contact pads 2719 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

As illustrated in FIG. 27H, in some implementations, a thinning process, such as wafer grinding, dry etch, wet etch, CMP, and/or any combination thereof, can be performed to semiconductor layer 2702 of first semiconductor structure 2792. One or more through contacts 2729 each extending vertically through semiconductor layer 2702 can be formed. Through contacts 2729 can couple the interconnects in interconnect layer 2728. Through contacts 2729 can be formed by first patterning contact holes through semiconductor layer 2702 using patterning process (e.g., photolithography and dry/wet etch processes). The contact holes can be filled with a conductor material (e.g., W or Cu). In some implementations, filling the contact holes includes depositing a spacer (e.g., a silicon oxide layer) before depositing the conductor material. A second pad-out interconnect layer 2714 is formed on semiconductor layer 2702. Pad-out interconnect layer 2714 can include interconnects, such as contact pads 2715, formed in one or more ILD layers, and in contact with through contacts 2729. Contact pads 2715 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

Figure 28:
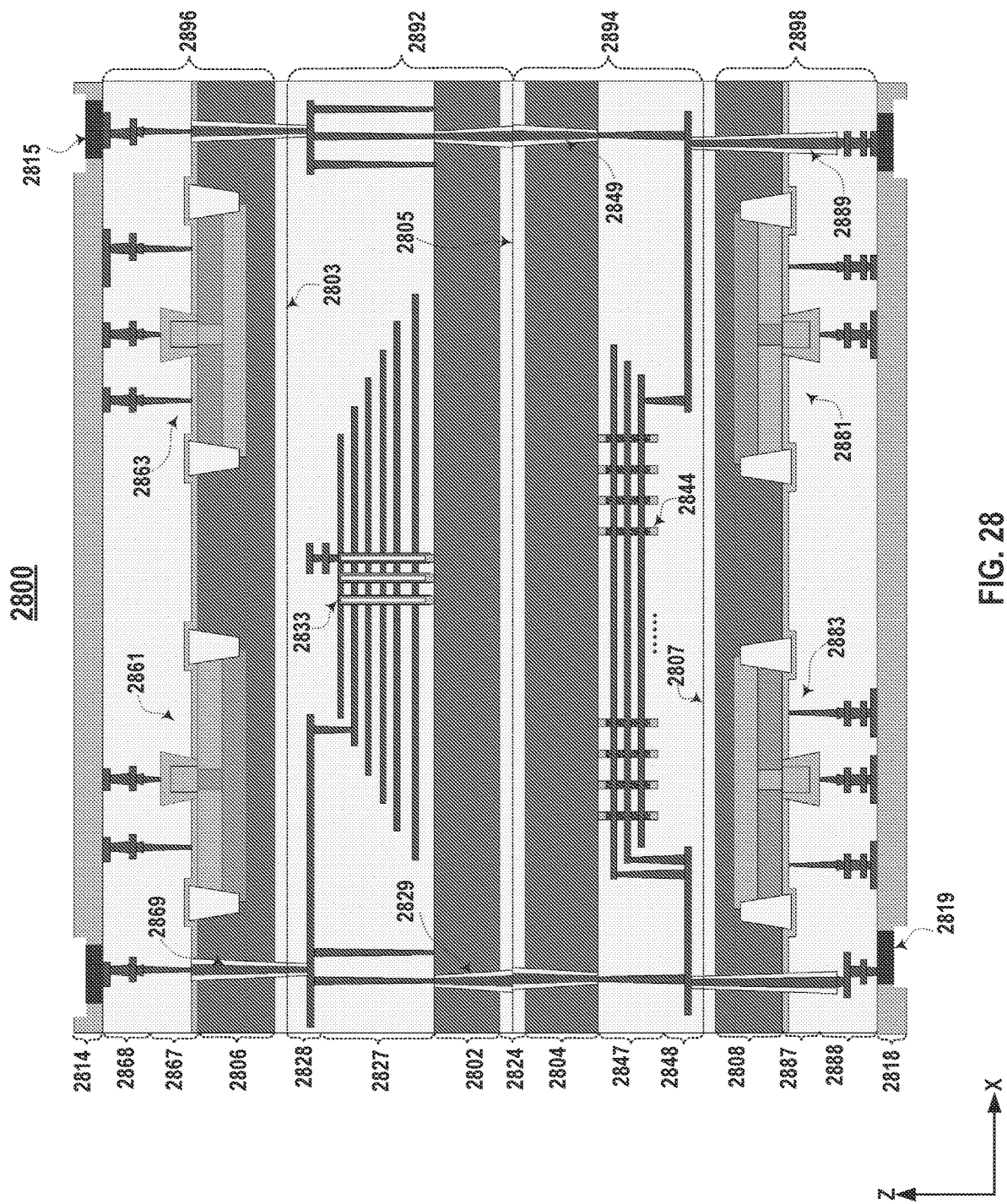
FIG. 28 illustrates a side view of another 3D memory device, according to some aspects of the present disclosure.

FIG. 28 illustrate a schematic diagram of a cross-sectional side view of an exemplary 3D memory device 2800 having four stacked semiconductor structures, according to some aspects of the present disclosure. 3D memory device 2800 may be an example of 3D memory device 100B in FIG. 1B. 3D memory device 2800 is a bonded chip including four semiconductor structures stacked over one another in different planes in the vertical direction (e.g., the z-direction in FIG. 28).

As shown in FIG. 28, first semiconductor structure 2892 including the first memory cell array (e.g., 3D NAND Flash memory cell array) and second semiconductor structure 2894 including the second memory cell array (e.g., 3D DFM cell array) can be sandwiched between third semiconductor structure 2896 including the first peripheral circuits (e.g., HV and LV circuits) and fourth semiconductor structure 2898 including the second peripheral circuits (e.g., LV and LLV circuits). That is, third semiconductor structure 2896 can be located on one side of 3D memory device 2800, and fourth semiconductor structure 2898 can be located on another side of 3D memory device 2800. In some implementations, first semiconductor structure 2892 and third semiconductor structure 2896 can be bonded in a face-to-back manner, second semiconductor structure 2894 and fourth semiconductor structure 2898 can be bonded in a face-to-back manner, while first semiconductor structure 2892 and second semiconductor structure 2894 can be bonded in a back-to-back manner.

As shown in FIG. 28, first semiconductor structure 2892 can include semiconductor layer 2802 having semiconductor materials. In some implementations, semiconductor layer 2802 is a silicon substrate having single crystalline silicon or polycrystalline silicon. First semiconductor structure 2892 can include a first memory cell array, such as an array of NAND memory strings 2833 on semiconductor layer 2802. The sources of NAND memory strings 2833 can be in contact with semiconductor layer 2802. In some implementations, NAND memory strings 2833 are disposed vertically between bonding interface 2803 and semiconductor layer 2802. Each NAND memory string 2833 extends vertically through a plurality of pairs each including a conductive layer and a dielectric layer, according to some implementations. The stacked and interleaved conductive layers and dielectric layers are also referred to herein as a stack structure, e.g., a memory stack 2827. Memory stack 2827 may be an example of memory stack 304 in FIGS. 3A-3C, and the conductive layer and dielectric layer in memory stack 2827 may be examples of gate conductive layers 306 and dielectric layer 308, respectively, in memory stack 304. The interleaved conductive layers and dielectric layers in memory stack 2827 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 2827. It is understood that in some examples, trench isolations and doped regions (not shown) may be formed in semiconductor layer 2802 as well.

In some implementations, each NAND memory string 2833 is a "charge trap" type of NAND memory string including any suitable channel structures disclosed herein, such as bottom plug channel structure 312A, sidewall plug channel structure 312B, or bottom open channel structure 312C, described above in detail with respect to FIGS. 3A-3C. It is understood that NAND memory strings 2833 are not limited to the "charge trap" type of NAND memory strings and may be "floating gate" type of NAND memory strings in other examples.

As shown in FIG. 28, first semiconductor structure 2892 can further include an interconnect layer 2828 above and in contact with NAND memory strings 2833 to transfer electrical signals to and from NAND memory strings 2833. Interconnect layer 2828 can include a plurality of interconnects, (also referred to herein as "contacts"), including lateral lines and vias. As used herein, the term "interconnects" can broadly include any suitable types of interconnects, such as MEOL interconnects and BEOL interconnects. In some implementations, the interconnects in interconnect layer 2828 also include local interconnects, such as bit line contacts and word line contacts. Interconnect layer 2828 can further include one or more ILD in which the lateral lines and vias can form. The interconnects in interconnect layer 2828 can include conductive materials including, but not limited to, W, Co, Cu, Al, silicides, or any combination thereof. The ILD layers in interconnect layer 2828 can include dielectric materials including, but not limited to, silicon oxide, silicon nitride, silicon oxynitride, low dielectric constant (low-k) dielectrics, or any combination thereof. In some implementations, the interconnects in interconnect layer 2828 include W, which has a relatively high thermal budget (compatible with high-temperature processes) and good quality (fewer detects, e.g., voids) among conductive metal materials.

As shown in FIG. 28, first semiconductor structure 2892 can further include one or more through contacts 2829 extending vertically through semiconductor layer 2802. In some implementations, through contact 2829 couples the interconnects in interconnect layer 2828 to through contact 2849 of second semiconductor structure 2894. Through contact 2829 can include conductive materials including, but not limited to, W, Co, Cu, Al, silicides, or any combination thereof. In some implementations, through contact 2829 includes W. In some implementations, through contact 2829 includes a via surrounded by a dielectric spacer (e.g., having silicon oxide) to electrically separate the via from semiconductor layer 2802. Depending on the thickness of semiconductor layer 2802, through contact 2829 can be an ILV having a depth in the submicron-level (e.g., between 10 nm and 1 µm), or a TSV having a depth in the micron- or tens micron-level (e.g., between 1 µm and 100 µm).

As shown in FIG. 28, second and fourth semiconductor structures 2894 and 2898 are flipped over. Therefore, some spatial terms such as "on," "above," "below," etc., in descriptions about second and fourth semiconductor structure 2894 and 2898 may be upside down. Second semiconductor structure 2894 can include semiconductor layer 2804 having semiconductor materials, such as single crystalline silicon or polycrystalline silicon. Second semiconductor structure 2894 can include a second memory cell array, such as an array of multi-gate DFM cells 2844 on semiconductor layer 2504. In some implementations, each multi-gate DFM cell 2844 can be referred to DFM memory cell 600A/600B described above in connection with FIGS. 6A and 6B, and the array of multi-gate DFM cells can be referred to DFM memory array 700 described above in connection with FIG. 7. The sources of multi-gate DFM cells 2844 can be in contact with semiconductor layer 2804. In some implementations, multi-gate DFM cells 2844 are disposed vertically between bonding interface 2807 and semiconductor layer 2804. Each multi-gate DFM cell 2844 extends vertically through a memory stack 2847 including a plurality of pairs each including a conductive layer and a dielectric layer, according to some implementations. The interleaved conductive layers and dielectric layers alternate in the vertical direction, according to some implementations. Each conductive layer can include a gate electrode surrounded by an adhesive layer and a gate dielectric layer. The gate electrode of the conductive layer can extend laterally as a word line or a plate line, ending at one or more staircase structures of the memory stack 2847. It is understood that in some examples, trench isolations and doped regions (not shown) may be formed in semiconductor layer 2804 as well.

As shown in FIG. 28, second semiconductor structure 2894 can further include an interconnect layer 2848 above and in contact with multi-gate DFM cells 2844 to transfer electrical signals to and from multi-gate DFM cells 2844. Interconnect layer 2848 can include a plurality of interconnects, such as MEOL interconnects and BEOL interconnects. In some implementations, the interconnects in interconnect layer 2848 also include local interconnects, such as bit line connections, word line connections, plate line connections, and/or source line connections. Interconnect layer 2848 can further include one or more interlayer dielectric (ILD) layers in which the lateral lines and vias can form. The interconnects in interconnect layer 2848 can include conductive materials including, but not limited to W, Co, Cu, Al, silicides, or any combination thereof. The ILD layers in interconnect layer 1048 can include dielectric materials including, but not limited to, silicon oxide, silicon nitride, silicon oxynitride, low-k dielectrics, or any combination thereof.

As shown in FIG. 28, second semiconductor structure 2894 can further include one or more through contacts 2849 extending vertically through semiconductor layer 2804. In some implementations, through contact 2849 couples the interconnects in interconnect layer 2848 to through contact 2829 of first semiconductor structure 2892. Through contact 2849 can include conductive materials including, but not limited to, W, Co, Cu, Al, silicides, or any combination thereof. In some implementations, through contact 2849 includes W. In some implementations, through contact 2849 includes a via surrounded by a dielectric spacer (e.g., having silicon oxide) to electrically separate the via from semiconductor layer 2804. Depending on the thickness of semiconductor layer 2804, through contact 2849 can be an ILV having a depth in the submicron-level (e.g., between 10 nm and 1 µm), or a TSV having a depth in the micron- or tens micron-level (e.g., between 1 µm and 100 µm).

As shown in FIG. 28, a bonding layer 2824 can be located between first semiconductor structure 2892 and second semiconductor structure 2894. Bonding layer 2824 can comprising a plurality of conductive bonding contacts and dielectrics electrically isolating the bonding contacts, which can be used for hybrid bonding. First semiconductor structure 2892 can be bonded to second semiconductor structure 2894 in a back-to-back manner at bonding interface 2805. A first bonding sublayer attached on first semiconductor layer 2802 of first semiconductor structure 2892 can be bonded to a second bonding sublayer of attached on second semiconductor layer 2804 of second semiconductor structure 2894. The bonding contacts and/or through contacts in the first bonding sublayer can be in contact with the bonding contacts and/or through contacts in the second bonding sublayer at bonding interface 2805. As a result, a plurality of bonding contacts and/or through contacts across bonding interface 2805 can make direct, short-distance (e.g., micron-level) electrical connections between adjacent semiconductor structures 2892 and 2894. In some implementations, dielectric layer(s) (e.g., silicon oxide layer) are formed to isolate bonding contacts and/or through contacts 2829, 2849. Thus, it is understood that bonding interface 2805 may include the surfaces of the dielectric layer(s) in some examples.

Third semiconductor structure 2896 can be bonded on top of first semiconductor structure 2892 in a back-to-face manner at bonding interface 2803. Third semiconductor structure 2896 can include semiconductor layer 2806 having semiconductor materials. In some implementations, semiconductor layer 2806 is a layer of single crystalline silicon or polycrystalline silicon transferred from a silicon substrate or a SOI substrate and attached to the top surface of first semiconductor structure 2892 by transfer bonding. In some implementations, bonding interface 2803 is disposed vertically between interconnect layer 2828 and semiconductor layer 2806 as a result of transfer bonding, which transfers semiconductor layer 2806 from another substrate and bonds semiconductor layer 2806 onto first semiconductor structure 2892 as described below in detail. In some implementations, bonding interface 2803 is the place at which interconnect layer 2828 and semiconductor layer 2806 are met and bonded. In practice, bonding interface 2803 can be a layer with a certain thickness that includes the top surface of interconnect layer 2828 of first semiconductor structure 2892 and the bottom surface of semiconductor layer 2806 of third semiconductor structure 2896. In some implementations, dielectric layer(s) (e.g., silicon oxide layer) are formed vertically between bonding interface 2803 and semiconductor layer 2806 and/or between bonding interface 2803 and interconnect layer 2828 to facilitate the transfer bonding of semiconductor layer 2806 onto interconnect layer 2828. Thus, it is understood that bonding interface 2803 may include the surfaces of the dielectric layer(s) in some examples.

As shown in FIG. 28, third semiconductor structure 2896 can also include a device layer 2867 above and in contact with semiconductor layer 2806. In some implementations, device layer 2867 includes a first peripheral circuit 2861 and a second peripheral circuit 2863. First peripheral circuit 2861 can include HV circuits 866, such as driving circuits, and second peripheral circuit 2863 can include LV circuits 864, such as page buffer circuits and logic circuits. In some implementations, first peripheral circuit 2861 includes a plurality of HV transistors in contact with semiconductor layer 2806, and second peripheral circuit 2863 includes a plurality of L V transistors in contact with semiconductor layer 2806. In some implementations, each HV transistor or LV transistor includes a gate dielectric, and the thickness of the gate dielectric of HV transistor (e.g., in HV circuit 866) is larger than the thickness of the gate dielectric of LV transistor (e.g., in LV circuit 864) due to the higher voltage applied to the HV transistor than the LV transistor. Trench isolations (e.g., STIs) and doped regions (e.g., wells, sources, and drains of HV transistors and LV transistors) can be formed on or in semiconductor layer 2806 as well.

In some implementations, third semiconductor structure 2896 further includes an interconnect layer 2868 above device layer 2867 to transfer electrical signals to and from peripheral circuits 2861 and 2863. As shown in FIG. 28, interconnect layer 2868 can be vertically between bonding interface 2805 and device layer 2867 (including HV transistors and LV transistors of peripheral circuits 2861 and 2863). Interconnect layer 2868 can include a plurality of interconnects, such as MEOL interconnects and BEOL interconnects. The interconnects in interconnect layer 2868 can be coupled to HV transistors and LV transistors of peripheral circuits 2861 and 2863 in device layer 2867. Interconnect layer 2868 can further include one or more ILD layers in which the lateral lines and vias can form. That is, interconnect layer 2868 can include lateral lines and vias in multiple ILD layers. In some implementations, the devices in device layer 2867 are coupled to one another through the interconnects in interconnect layer 2868. For example, peripheral circuit 2861 may be coupled to peripheral circuit 2863 through interconnect layer 2868. The interconnects in interconnect layer 2868 can include conductive materials including, but not limited to, W, Co, Cu, Al, silicides, or any combination thereof. The ILD layers in interconnect layer 2868 can include dielectric materials including, but not limited to, silicon oxide, silicon nitride, silicon oxynitride, low-k dielectrics, or any combination thereof.

As shown in FIG. 28, third semiconductor structure 2896 can further include one or more through contacts 2869 extending vertically through semiconductor layer 2806. In some implementations, through contact 2869 couples the interconnects in interconnect layer 2868 to the interconnects in interconnect layer 2828 to make an electrical connection across bonding interface 2803 between third and first semiconductor structures 2896 and 2892. Through contact 2869 can include conductive materials including, but not limited to, W, Co, Cu, Al, silicides, or any combination thereof. In some implementations, through contact 2869 includes W. In some implementations, through contact 2869 includes a via surrounded by a dielectric spacer (e.g., having silicon oxide) to electrically separate the via from semiconductor layer 2806. Depending on the thickness of semiconductor layer 2806, through contact 2869 can be an ILV having a depth in the submicron-level (e.g., between 10 nm and 1 μm), or a TSV having a depth in the micron- or tens micron-level (e.g., between 1 μm and 100 μm).

Fourth semiconductor structure 2898 can be bonded on top of second semiconductor structure 2896 in a back-to-face manner at bonding interface 2807. Fourth semiconductor structure 2898 can include semiconductor layer 2808 having semiconductor materials. In some implementations, semiconductor layer 2808 is a layer of single crystalline silicon or polycrystalline silicon transferred from a silicon substrate or an SOI substrate and attached to the top surface of second semiconductor structure 2894 by transfer bonding. In some implementations, bonding interface 2807 is disposed vertically between interconnect layer 2848 and semiconductor layer 2808 as a result of transfer bonding, which transfers semiconductor layer 2808 from another substrate and bonds semiconductor layer 2508 onto second semiconductor structure 2894 as described below in detail. In some implementations, bonding interface 2807 is the place at which interconnect layer 2848 and semiconductor layer 2808 are met and bonded. In practice, bonding interface 2807 can be a layer with a certain thickness that includes the top surface of interconnect layer 2848 of second semiconductor structure 2894 and the bottom surface of semiconductor layer 2808 of fourth semiconductor structure 2898. In some implementations, dielectric layer(s) (e.g., silicon oxide layer) are formed vertically between bonding interface 2807 and semiconductor layer 2808 and/or between bonding interface 2807 and interconnect layer 2848 to facilitate the transfer bonding of semiconductor layer 2808 onto interconnect layer 2848. Thus, it is understood that bonding interface 2807 may include the surfaces of the dielectric layer(s) in some examples.

Fourth semiconductor structure 2898 can include a device layer 2887 above and in contact with semiconductor layer 2808. In some implementations, device layer 2887 includes a third peripheral circuit 2881 and a fourth peripheral circuit 2883. Third peripheral circuit 2881 can include LLV circuits 862, such as I/O circuits, and fourth peripheral circuit 2883 can include LV circuits 864, such as page buffer circuits and logic circuits. In some implementations, third peripheral circuit 2881 includes a plurality of LLV transistors, and fourth peripheral circuit 2883 includes a plurality of LV transistors as well. In some implementations, each LLV and LV transistor includes a gate dielectric, and the thickness of the gate dielectric of LLV transistor (e.g., in LLV circuit 862) is smaller than the thickness of the gate dielectric of LV transistor (e.g., in LV circuit 864) due to the lower voltage applied to the LLV transistor than the LV transistor. Trench isolations (e.g., STIs) and doped regions (e.g., wells, sources, and drains of the LL V transistor and the LV transistor can be formed on or in semiconductor layer 2808 as well.

Moreover, the different voltages applied to different HV transistors, LV transistors, and LLV transistors in third and fourth semiconductor structures 2896 and 2898 can lead to differences of device dimensions between second and third semiconductor structures 2896 and 2898. In some implementations, the thickness of the gate dielectric of HV transistor (e.g., in HV circuit 866) is larger than the thickness of the gate dielectric of LLV transistor (e.g., in LLV circuit 862) due to the higher voltage applied to the HV transistor than the LLV transistor. In some implementations, the thickness of the gate dielectric of the LV transistor (e.g., in LV circuit 864) in fourth semiconductor structure 2898 is the same as the thickness of the gate dielectric of the LV transistor (e.g., in LV circuit 864) in third semiconductor structure 2896 due to the same operation voltage. In some implementations, the thickness of semiconductor layer 2806 in which the HV transistor (e.g., in HV circuit 866) is formed is larger than the thickness of semiconductor layer 2808 in which the LLV transistor (e.g., in LLV circuit 862) is formed due to the higher voltage applied to the HV transistor than the LLV transistor.

As shown in FIG. 28, fourth semiconductor structure 2898 can further include an interconnect layer 2888 above device layer 2887 to transfer electrical signals to and from peripheral circuits 2881 and 2883. As shown in FIG. 28, device layer 2887 (including HV transistors and LV transistors of peripheral circuits 2881 and 2883) can be vertically between bonding interface 2807 and interconnect layer 2888. Interconnect layer 2888 can include a plurality of interconnects coupled to the HV transistors of peripheral circuit 2881 and the LV transistors of peripheral circuit 2883 in device layer 2887. Interconnect layer 2888 can further include one or more ILD layers in which the interconnects can form. That is, interconnect layer 2888 can include lateral lines and vias in multiple ILD layers. In some implementations, the devices in device layer 2887 are coupled to one another through the interconnects in interconnect layer 2888. For example, peripheral circuit 2881 may be coupled to peripheral circuit 2883 through interconnect layer 2888. The interconnects in interconnect layer 2888 can include conductive materials including, but not limited to, W, Co, Cu, Al, silicides, or any combination thereof. The ILD layers in interconnect layer 2888 can include dielectric materials including, but not limited to, silicon oxide, silicon nitride, silicon oxynitride, low-k dielectrics, or any combination thereof.

As shown in FIG. 28, fourth semiconductor structure 2898 can further include one or more through contacts 2889 extending vertically through semiconductor layer 2808. In some implementations, through contact 2889 couples the interconnects in interconnect layer 2888 to the interconnects in interconnect layer 2868 to make an electrical connection across bonding interface 2807 between second and fourth semiconductor structures 2894 and 2896. Through contact 2889 can include conductive materials including, but not limited to, W, Co, Cu, Al, silicides, or any combination thereof. In some implementations, through contact 2889 includes a via surrounded by a dielectric spacer (e.g., having silicon oxide) to electrically separate the via from semiconductor layer 2808. Depending on the thickness of semiconductor layer 2808, through contact 2889 can be an ILV having a depth in the submicron-level (e.g., between 10 nm and 1 μm), or a TSV having a depth in the micron- or tens micron-level (e.g., between 1 μm and 100 μm).

Moreover, as shown in FIG. 28, 3D memory device 2800 can further include one or more pad-out interconnect layers for pad-out purposes, i.e., interconnecting with external devices using contact pads on which bonding wires can be soldered. In some implementations shown in FIG. 28, third semiconductor structure 2896 can include a first pad-out interconnect layer 2814 on one side of 3D memory device 2800, and fourth semiconductor structure 2898 can include a second pad-out interconnect layer 2818 on another side of 3D memory device 2800. First pad-out interconnect layer 2814 can be formed above and in contact with interconnect layer 2868. First pad-out interconnect layer 2814 can include interconnects, e.g., contact pads 2815, in one or more ILD layers and in electrical connection with the interconnects in interconnect layer 2868. Second pad-out interconnect layer 2818 can be formed above and in contact with interconnect layer 2888. Second pad-out interconnect layer 2818 can include interconnects, e.g., contact pads 2819, in one or more ILD layers and in electrical connection with the interconnects in interconnect layer 2888. In some implementations, the interconnects in pad-out interconnect layers 2814 and 2819 can transfer electrical signals between 3D memory device 2800 and external devices, e.g., for pad-out purposes. In some implementations not shown in FIG. 28, one of pad-out interconnect layers 2814 and 2819 can be omitted.

As a result, peripheral circuits 2861, 2863, 2881, and 2883 in third and fourth semiconductor structures 2896 and 2898 can be coupled to NAND memory strings 2833 in first semiconductor structure 2892 and multi-gate DFM cells 2844 in second semiconductor structure 2894 through various interconnection structures, including interconnect layers 2888, 2868, 2848, and 2828, as well as through contacts 2889, 2869, 2849 and 2829. Moreover, peripheral circuits 2881, 2883, 2861, and 2863, as well as NAND memory strings 2833 and multi-gate DFM cells 2844 in 3D memory device 2800 can be further coupled to external devices through pad-out interconnect layers 2814, 2819.

Figure 29:
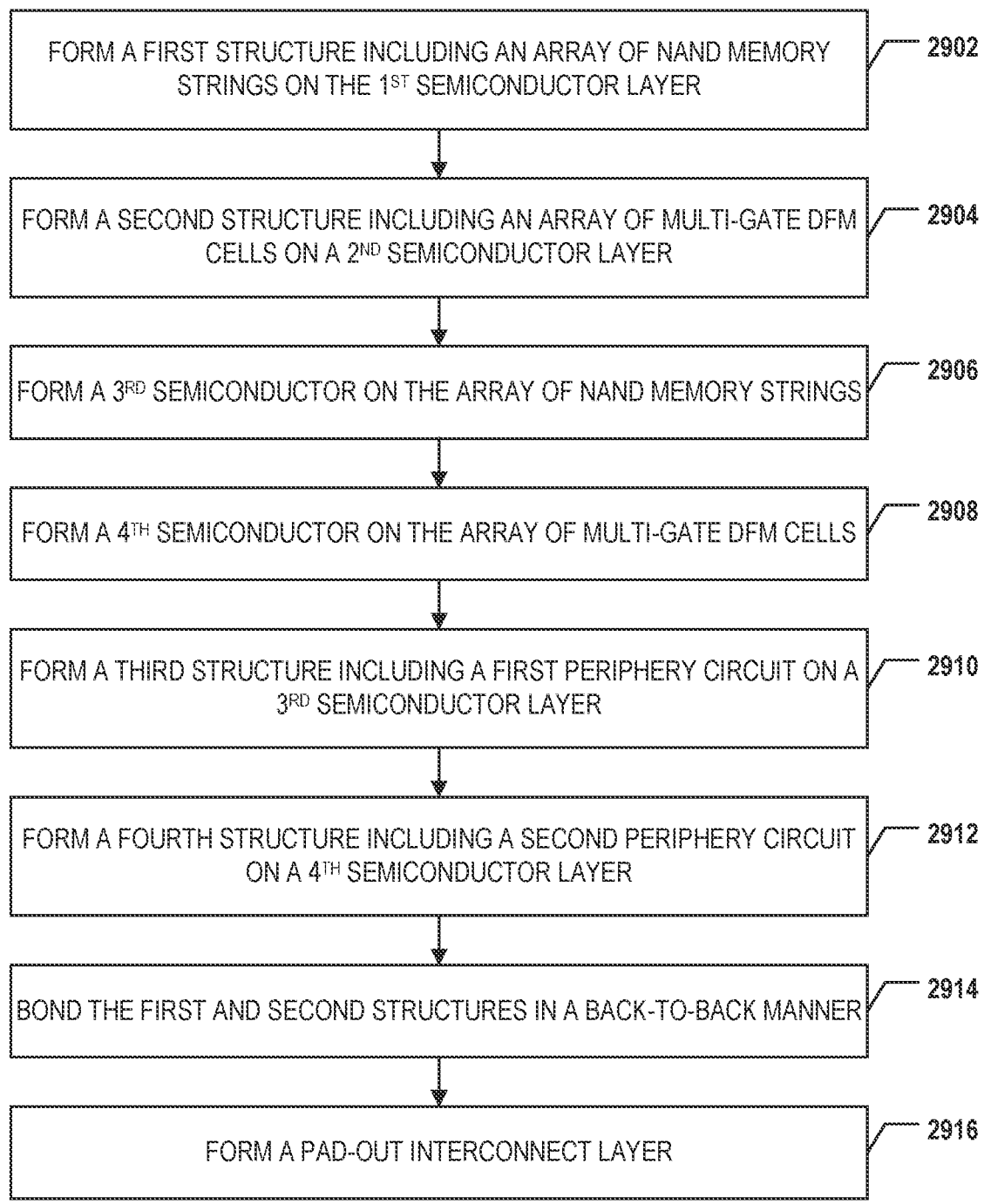
FIG. 29 illustrates a flowchart of a method for forming the 3D memory device in FIG. 28, according to some aspects of the present disclosure.

FIG. 29 illustrates a flowchart of a method 2900 for forming the 3D memory device 2900 shown in FIG. 29, according to some aspects of the present disclosure. FIGS. 30A-30H illustrate the 3D memory device 2800 at certain stages of the fabrication process of method 2900 as shown in FIG. 29, according to some aspects of the present disclosure. It is understood that the operations shown in method 2900 are not exhaustive and that other operations can be performed as well before, after, or between any of the illustrated operations. Further, some of the operations may be performed simultaneously, or in a different order than shown in FIG. 29.

Referring to FIG. 29, method 2900 starts at operation 2902, in which a first semiconductor structure including an array of NAND memory strings disposed on a first semiconductor layer can be formed. The first semiconductor layer can be a silicon substrate having single crystalline silicon or polycrystalline silicon. In some implementations, to form the array of NAND memory strings, a first memory stack is formed on the first semiconductor layer.

As illustrated in FIG. 30A, a first stack structure, such as a first memory stack 3027 including interleaved conductive layers and dielectric layers, is formed on a semiconductor layer 3002 (e.g., a silicon substrate). To form first memory stack 3027, in some implementations, a dielectric stack (not shown) including interleaved sacrificial layers (not shown) and the dielectric layers is formed on semiconductor layer 3002. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. First memory stack 3027 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that first memory stack 3027 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between first memory stack 3027 and semiconductor layer 3002.

As illustrated in FIG. 30A, NAND memory strings 3033 are formed above semiconductor layer 3002, each of which extends vertically through first memory stack 3027 to be in contact with semiconductor layer 3002. In some implementations, fabrication processes to form NAND memory string 3033 include forming a channel hole through first memory stack 3027 (or the dielectric stack) and into semiconductor layer 3002 using dry etching/and or wet etching, such as deep reactive-ion etching (DRIE), followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 3033 may vary depending on the types of channel structures of NAND memory strings 3033 (e.g., bottom plug channel structure 312A, sidewall plug channel structure 312B, or bottom open channel structure 312C in FIGS. 3A-3C) and thus, are not elaborated for ease of description.

In some implementations, an interconnect layer is formed above the array of NAND memory strings on the first semiconductor layer. The interconnect layer can include a first plurality of interconnects in one or more ILD layers. As illustrated in FIG. 30A, an interconnect layer 3028 is formed above first memory stack 3027 and NAND memory strings 3033. Interconnect layer 3028 can include interconnects of MEOL and/or BEOL in a plurality of ILD layers to make electrical connections with NAND memory strings 3033 and/or semiconductor layer 3002. In some implementations, interconnect layer 3028 includes multiple ILD layers and interconnects therein formed in multiple processes. For example, the interconnects in interconnect layer 3028 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 30A can be collectively referred to as interconnect layer 3028.

Referring to FIG. 29, method 2900 proceeds to operation 2904 in which a second semiconductor structure including an array of multi-gate DFM cells disposed on a second semiconductor layer can be formed. In some implementations, to form the array of multi-gate DFM cells, a second memory stack is formed on the second semiconductor layer.

As illustrated in FIG. 30B, a second stack structure, such as a second memory stack 3047 including interleaved conductive layers and dielectric layers, is formed on semiconductor layer 3004, (e.g., a silicon substrate). To form second memory stack 3027, in some implementations, a dielectric stack (not shown) including interleaved sacrificial layers (not shown) and the dielectric layers is formed on semiconductor layer 3004. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Second memory stack 3047 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that second memory stack 3047 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between second memory stack 3047 and semiconductor layer 3004.

As illustrated in FIG. 30B, a plurality of multi-gate DFM cells 3044 are formed above semiconductor layer 3004, each of which extends vertically through second memory stack 3047 to be in contact with semiconductor layer 3004. In some implementations, fabrication processes to form multi-gate DFM cells 3044 include forming a channel hole through second memory stack 3047 (or the dielectric stack) to expose semiconductor layer 3004 using dry etching/and or wet etching, such as DRIE, followed by subsequently filling the channel hole with one or more layers, such as a dielectric spacer layer and a semiconductor layer, using thin film deposition processes such as ALD, CVD, PVD, or any combination thereof.

In some implementations, an interconnect layer is formed above the multi-gate DFM cells on the second semiconductor layer. The interconnect layer can include a first plurality of interconnects in one or more ILD layers. As illustrated in FIG. 30B, an interconnect layer 3048 is formed above second memory stack 3047 and multi-gate DFM cells 3044. Interconnect layer 3048 can include interconnects of MEOL and/or BEOL in a plurality of ILD layers to make electrical connections with multi-gate DFM cells 3044 and/or semiconductor layer 3004. In some implementations, interconnect layer 3048 includes multiple ILD layers and interconnects therein formed in multiple processes. For example, the interconnects in interconnect layer 3048 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 30B can be collectively referred to as interconnect layer 3048.

Method 2900 proceeds to operation 2906, as illustrated in FIG. 29, in which a third semiconductor layer is formed above the array of NAND memory strings. The third semiconductor layer can include single crystalline silicon or polycrystalline silicon. In some implementations, to form the third semiconductor layer, a third substrate and the first semiconductor structure 3092 are bonded in a face-to-face manner, and the third substrate is thinned to leave the third semiconductor layer. The bonding can include transfer bonding. The third substrate can be a silicon substrate having single crystalline silicon or polycrystalline silicon.

Figure 30C:
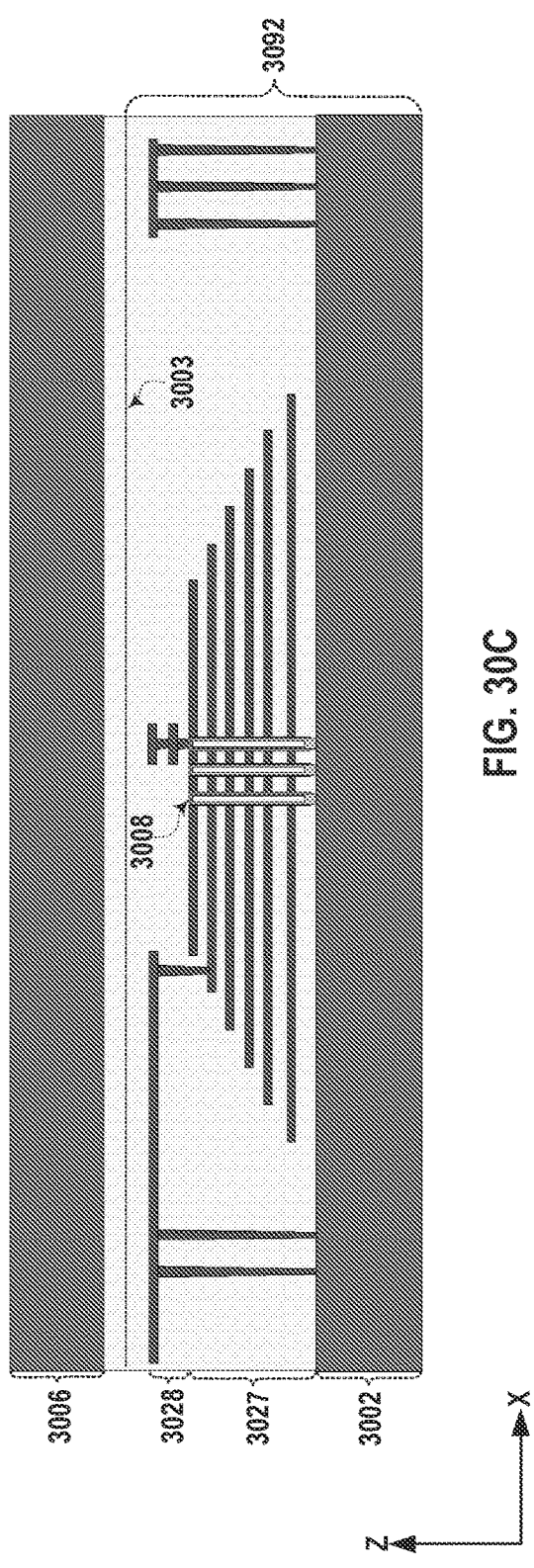

As illustrated in FIG. 30C, a semiconductor layer 3006, such as a single crystalline silicon layer or a polycrystalline silicon layer, is formed above interconnect layer 3028 and NAND memory strings 3033. Semiconductor layer 3006 can be attached above interconnect layer 3028 to form a bonding interface 3003 vertically between semiconductor layer 3006 and interconnect layer 3028. In some implementations, to form semiconductor layer 3006, a third silicon substrate (not shown in FIG. 30C) and first semiconductor structure 3092 are bonded in a face-to-face manner (having the components formed on semiconductor layer 3002, such as NAND memory strings 3033, facing toward the third silicon substrate) using transfer bonding, thereby forming bonding interface 3003. The third silicon substrate can then be thinned using any suitable processes to leave semiconductor layer 3006 attached above interconnect layer 3028. The details of various transfer bonding processes are described above with respect to FIGS. 31A-31D and FIGS. 32A-32D and thus, are not repeated for ease of description.

Method 2900 proceeds to operation 2908, as illustrated in FIG. 29, in which a fourth semiconductor layer is formed above the array of multi-gate DFM cells. The fourth semiconductor layer can include single crystalline silicon or polycrystalline silicon. In some implementations, to form the fourth semiconductor layer, a fourth substrate and the second semiconductor structure 3094 are bonded in a face-to-face manner, and the fourth substrate is thinned to leave the fourth semiconductor layer. The bonding can include transfer bonding. The fourth substrate can be a silicon substrate having single crystalline silicon or polycrystalline silicon.

Figure 30D:
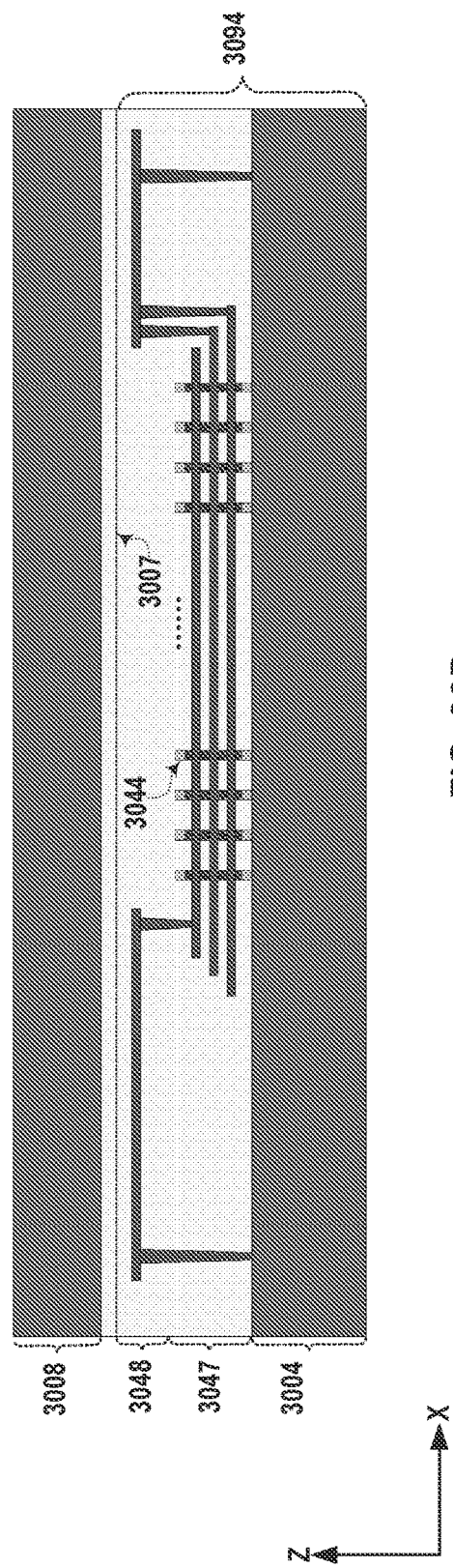

As illustrated in FIG. 30D, a semiconductor layer 3008, such as a single crystalline silicon layer or a polycrystalline silicon layer, is formed above interconnect layer 3048 and multi-gate DFM cells 3044. Semiconductor layer 3008 can be attached above interconnect layer 3048 to form a bonding interface 3007 vertically between semiconductor layer 3008 and interconnect layer 3048. In some implementations, to form semiconductor layer 3008, a fourth silicon substrate (not shown in FIG. 30D) and second semiconductor structure 3094 are bonded in a face-to-face manner (having the components formed on semiconductor layer 3004, such as multi-gate DFM cells 3044, facing toward the fourth silicon substrate) using transfer bonding, thereby forming bonding interface 3007. The fourth silicon substrate can then be thinned using any suitable processes to leave semiconductor layer 3008 attached above interconnect layer 3048. The details of various transfer bonding processes are described above with respect to FIGS. 31A-31D and FIGS. 32A-32D and thus, are not repeated for ease of description.

Figure 30E:
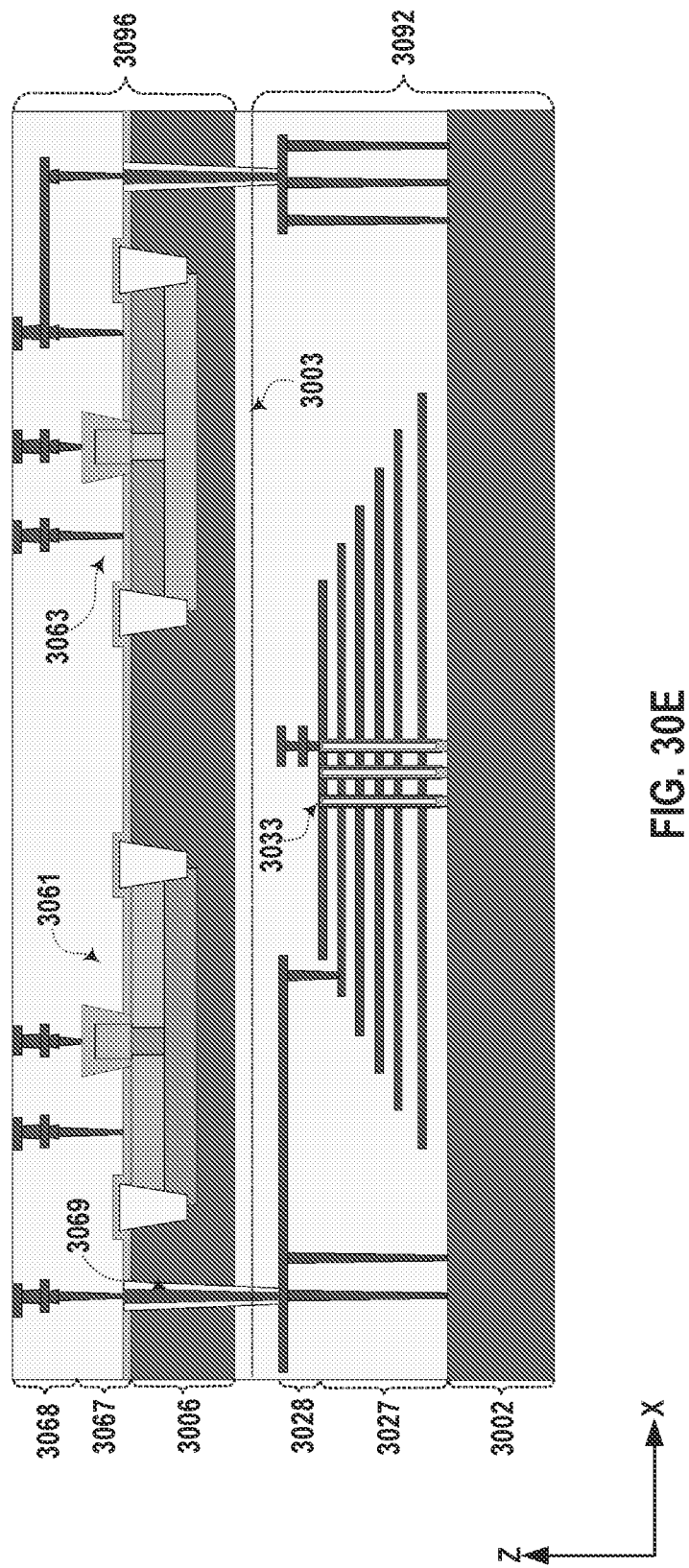

Referring to FIG. 29, method 2900 proceeds to operation 2910 in which a first periphery circuit is formed on the third semiconductor layer. As illustrated in FIG. 30E, the first periphery circuit 3067 including a plurality of transistors 3061 and 3063 can be formed on semiconductor layer 3006 having single crystalline silicon or polycrystalline silicon. In some implementations, transistors 3061 can be HV transistor forming an HV circuit 866, and transistors 3063 can be LV transistor forming an LV circuit 864. Transistors 3061 and 3063 can be formed by a plurality of processes including, but not limited to, photolithography, dry/wet etch, thin film deposition, thermal growth, implantation, CMP, and any other suitable processes. In some implementations, doped regions are formed in semiconductor layer 3006 by ion implantation and/or thermal diffusion, which function, for example, as wells and source/drain regions of transistors 3061 and 3063. In some implementations, isolation regions (e.g., STIs) are also formed in semiconductor layer 3006 by wet/dry etch and thin film deposition. In some implementations, the thickness of gate dielectric of transistor 3061 is different from the thickness of gate dielectric of transistor 3063, for example, by depositing a thicker silicon oxide film in the region of HV transistor 3061 than the region of LV transistor 3063, or by etching back part of the silicon oxide film deposited in the region of transistor 3063. It is understood that the details of fabricating transistors 3061 and 3063 may vary depending on the types of the transistors (e.g., planar transistors 910 or 3D transistors 920 in FIGS. 9A, 9B, 9C, and 9D) and thus, are not elaborated for ease of description.

In some implementations, an interconnect layer 3068 is formed above the transistor on the third semiconductor layer. The interconnect layer can include a plurality of interconnects in one or more ILD layers. As illustrated in FIG. 30E, an interconnect layer 3068 can be formed above transistors 3061 and 3063. Interconnect layer 3068 can include interconnects of MEOL and/or BEOL in a plurality of ILD layers to make electrical connections with transistors 3061 and 3063. In some implementations, interconnect layer 3068 includes multiple ILD layers and interconnects therein formed in multiple processes. For example, the interconnects in interconnect layer 3068 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers, interconnects, and bonding contacts illustrated in FIG. 30E can be collectively referred to as interconnect layer 3068.

In some implementations, a through contact penetrating the third semiconductor layer is formed. As illustrated in FIG. 30E, one or more through contacts 3069 each extending vertically through semiconductor layer 3006 can be formed. Through contacts 3069 can couple the interconnects in interconnect layers 3068 and 3028. Through contacts 3069 can be formed by first patterning contact holes through semiconductor layer 3006 using patterning process (e.g., photolithography and dry/wet etch processes). The contact holes can be filled with a conductor (e.g., W or Cu). In some implementations, filling the contact holes includes depositing a spacer (e.g., a silicon oxide layer) before depositing the conductor.

Figure 30F:
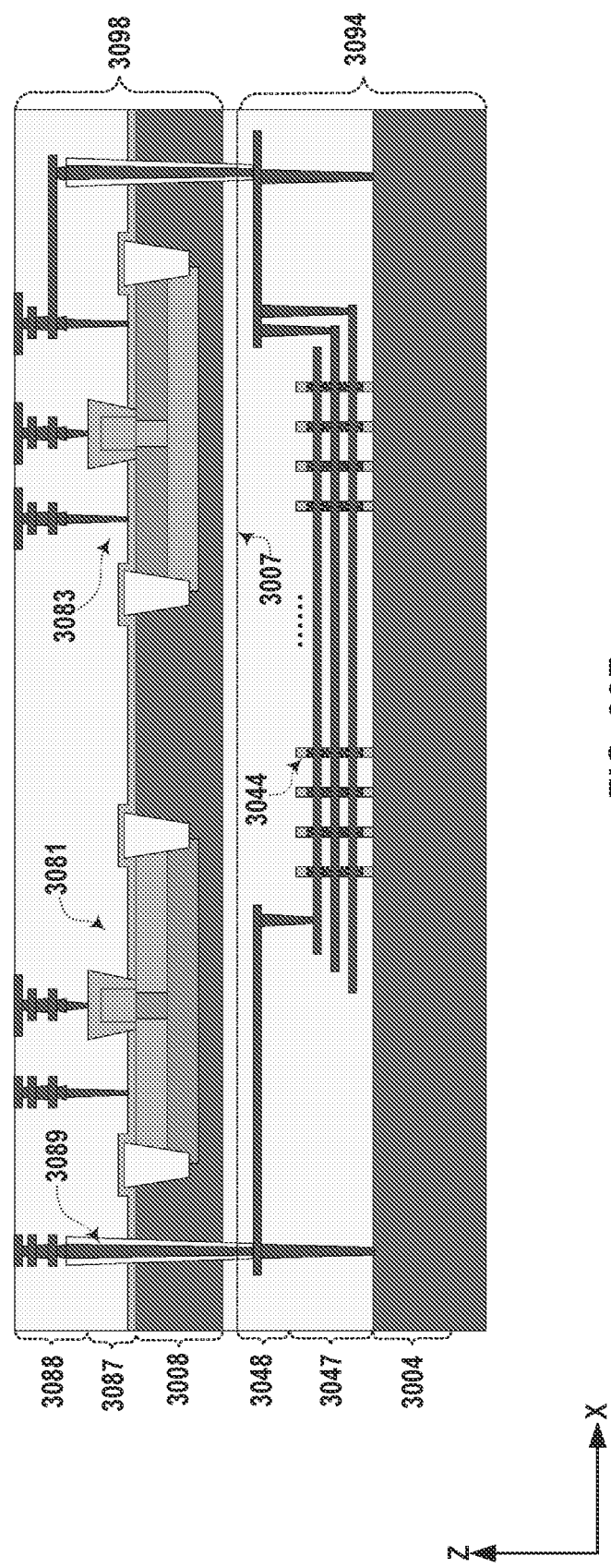

Method 2900 proceeds to operation 2912, as illustrated in FIG. 29, in which a second periphery circuit is formed on the fourth semiconductor layer. As illustrated in FIG. 30F, the second periphery circuit 3087 including a plurality of transistors 3081 and 3083 can be formed on semiconductor layer 3008 having single crystalline silicon or polycrystalline silicon. In some implementations, transistors 3081 can be LV transistor forming an LV circuit 864, and transistors 3083 can be LLV transistor forming an LLV circuit 862. Transistors 3081 and 3083 can be formed by a plurality of processes including, but not limited to, photolithography, dry/wet etch, thin film deposition, thermal growth, implantation, CMP, and any other suitable processes. In some implementations, doped regions are formed in semiconductor layer 3008 by ion implantation and/or thermal diffusion, which function, for example, as wells and source/drain regions of transistors 3081 and 3083. In some implementations, isolation regions (e.g., STIs) are also formed in semiconductor layer 3008 by wet/dry etch and thin film deposition. In some implementations, the thickness of gate dielectric of LV transistor 3081 is different from the thickness of gate dielectric of LLV transistor 3083, for example, by depositing a thicker silicon oxide film in the region of LV transistor 3081 than the region of LLV transistor 3083, or by etching back part of the silicon oxide film deposited in the region of LLV transistor 3083. It is understood that the details of fabricating transistors 3081 and 3083 may vary depending on the types of the transistors (e.g., planar transistors 910 or 3D transistors 920 in FIGS. 9A, 9B, 9C, and 9D) and thus, are not elaborated for ease of description.

In some implementations, an interconnect layer 3088 is formed above the transistor on the semiconductor layer. The interconnect layer can include a plurality of interconnects in one or more ILD layers. As illustrated in FIG. 30F, an interconnect layer 3088 can be formed above transistors 3081 and 3083. Interconnect layer 3088 can include interconnects of MEOL and/or BEOL in a plurality of ILD layers to make electrical connections with transistors 3081 and 3083. In some implementations, interconnect layer 3088 includes multiple ILD layers and interconnects therein formed in multiple processes. For example, the interconnects in interconnect layer 3088 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers, interconnects, and bonding contacts illustrated in FIG. 30F can be collectively referred to as interconnect layer 3068.

In some implementations, a through contact penetrating the third semiconductor layer is formed. As illustrated in FIG. 30F, one or more through contacts 3089 each extending vertically through semiconductor layer 3008 can be formed. Through contacts 3089 can couple the interconnects in interconnect layers 3088 and 3048. Through contacts 3089 can be formed by first patterning contact holes through semiconductor layer 3008 using patterning process (e.g., photolithography and dry/wet etch processes). The contact holes can be filled with a conductor (e.g., W or Cu). In some implementations, filling the contact holes includes depositing a spacer (e.g., a silicon oxide layer) before depositing the conductor.

Method 2900 proceeds to operation 2914, as illustrated in FIG. 29, in which the formed structure including the second and fourth semiconductor structures can be bonded to the formed structure including the first and third semiconductor structures in a back-to-back manner. The bonding can include hybrid bonding.

Figure 30G:
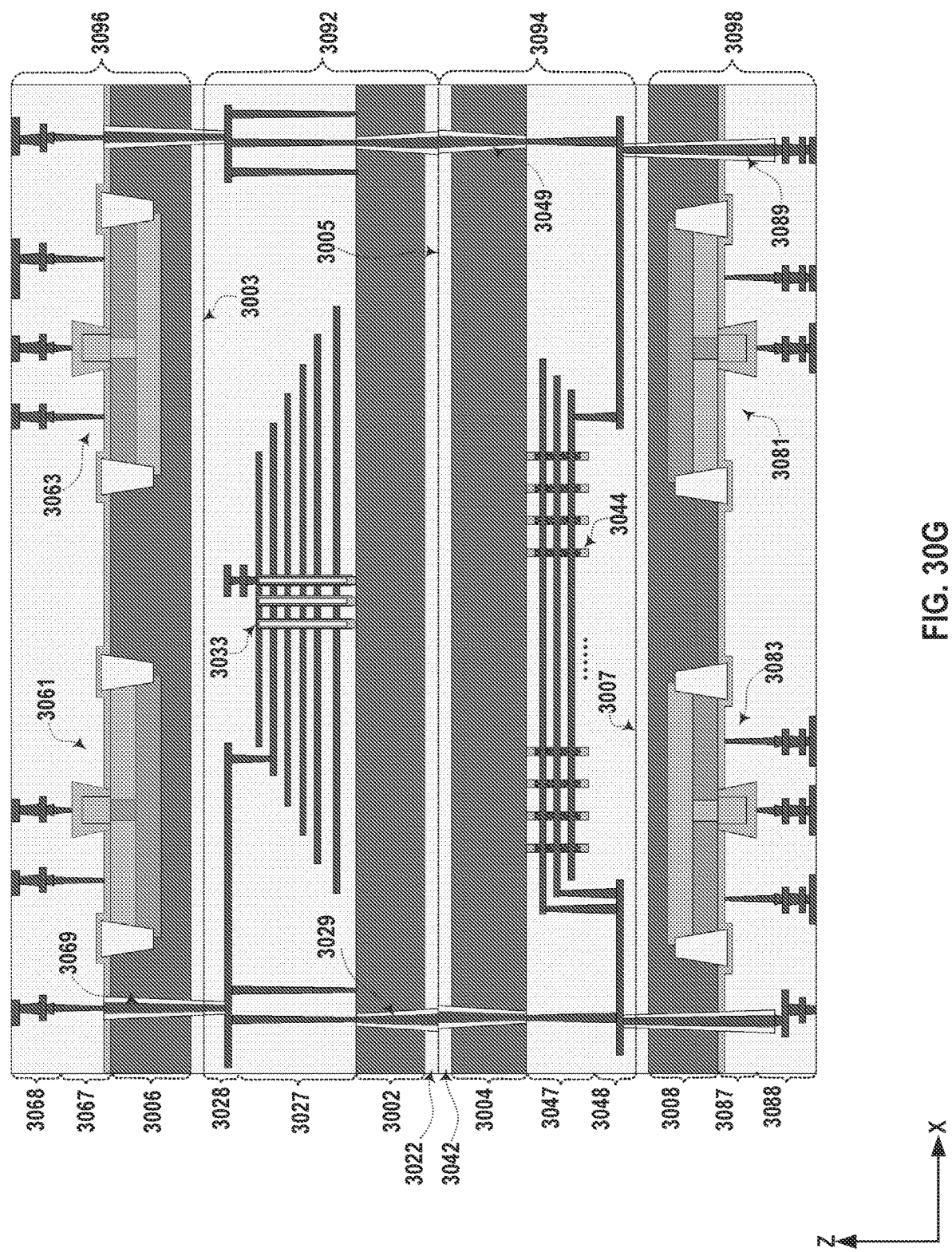

As illustrated in FIG. 30G, a dielectric bonding layer 3022 can be formed on a back side of first semiconductor layer 3002, and another dielectric bonding layer 3042 can be formed on a back side of second semiconductor layer 3004. One or more through contacts 3029 each extending vertically through semiconductor layer 3002 and dielectric bonding layer 3022 can be formed to couple the interconnects in interconnect layer 3028, and one or more through contacts 3049 each extending vertically through semiconductor layer 3002 and dielectric bonding layer 3022 can be formed to couple the interconnects in interconnect layer 3048. Through contacts 3029 and 3049 can be formed by first patterning contact holes through semiconductor layers 3002, 3004 and dielectric bonding layers 3022, 3042 using patterning process (e.g., photolithography and dry/wet etch processes). The contact holes can be filled with a conductor (e.g., W or Cu). In some implementations, filling the contact holes includes depositing a spacer (e.g., a silicon oxide layer) before depositing the conductor.

The formed structure including second and fourth semiconductor structures 3094 and 3098 can then be flipped upside down, and bonded to the formed structure including the first and third semiconductor structures 3092 and 3096 in a back-to-back manner. That is, dielectric bonding layer 3022 on first semiconductor layer 3002 facing down is bonded with dielectric bonding layer 3042 on second semiconductor layer 3006 facing up, thereby forming a bonding interface 3005. Through contacts 3029 are in contact with through contacts 3049 at bonding interface 3005. In some implementations, a treatment process, e.g., plasma treatment, wet treatment and/or thermal treatment, is applied to bonding surfaces prior to bonding. As a result of the bonding, e.g., hybrid bonding, through contacts 3029 and 3049 on opposite sides of bonding interface 3005 are aligned and in contact with one another, such that the devices (e.g., multigate DFM cells 3044, transistors 3081 and 3083) formed in second and fourth semiconductor structures 3094 and 3098 can be can be coupled to the devices (e.g., NAND memory strings 3033, transistors 3061 and 3063) formed in first and third semiconductor structures 3092 and 3096 can be coupled through the bonded bonding contacts across bonding interface 3005, according to some implementations.

Method 2900 proceeds to operation 2916, as illustrated in FIG. 29, in which one or more pad-out interconnect layers can be formed. In some implementations, a pad-out interconnect layer can be formed above the second semiconductor structure. In some other implementations, a pad-out interconnect layer can be formed below the first semiconductor structure. In some other implementations, a first pad-out interconnect layer can be formed above the second semiconductor structure, and a second pad-out interconnect layer can be formed below the first semiconductor structure.

Figure 30H:
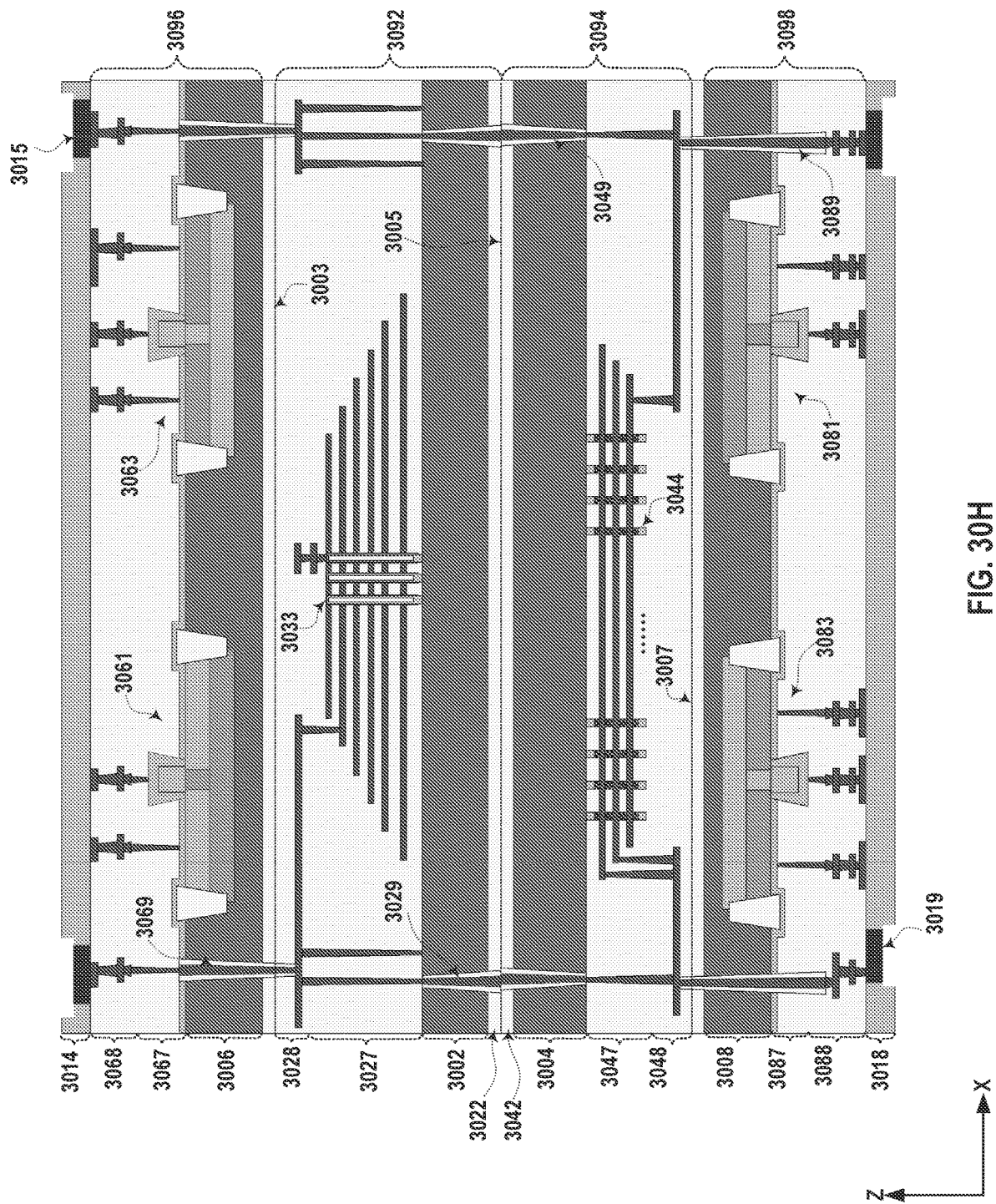

As illustrated in FIG. 30H, first pad-out interconnect layer 3014 is formed on interconnect layer 3068 of third semiconductor structure 3096, and second pad-out interconnect layer 3018 is formed on interconnect layer 3088 of fourth semiconductor structure 3098. First pad-out interconnect layer 3014 can include interconnects, such as contact pads 3015, formed in one or more ILD layers, and in contact with the interconnects in interconnect layer 3068. second pad-out interconnect layer 3018 can include interconnects, such as contact pads 3019, formed in one or more ILD layers, and in contact with the interconnects in interconnect layer 3098. Contact pads 3015 and 3019 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations not shown in FIG. 30H, one of first pad-out interconnect layer 3014 and second pad-out interconnect layer 3018 can be omitted.

Figure 33A:
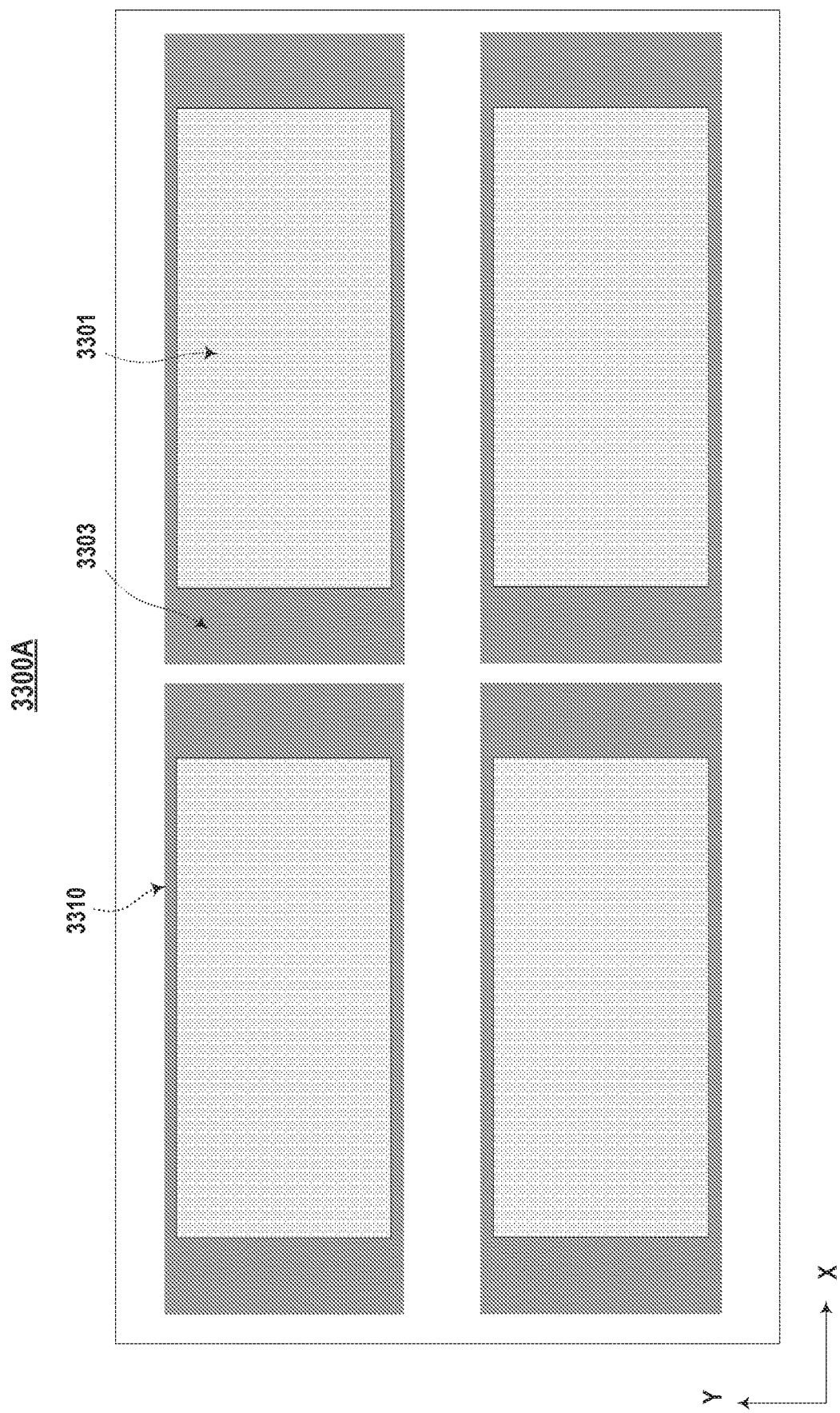
FIGS. 33A and 33B illustrate schematic diagrams of exemplary 3D memory dies in a top view, according to various aspects of the present disclosure.
Figure 33B:
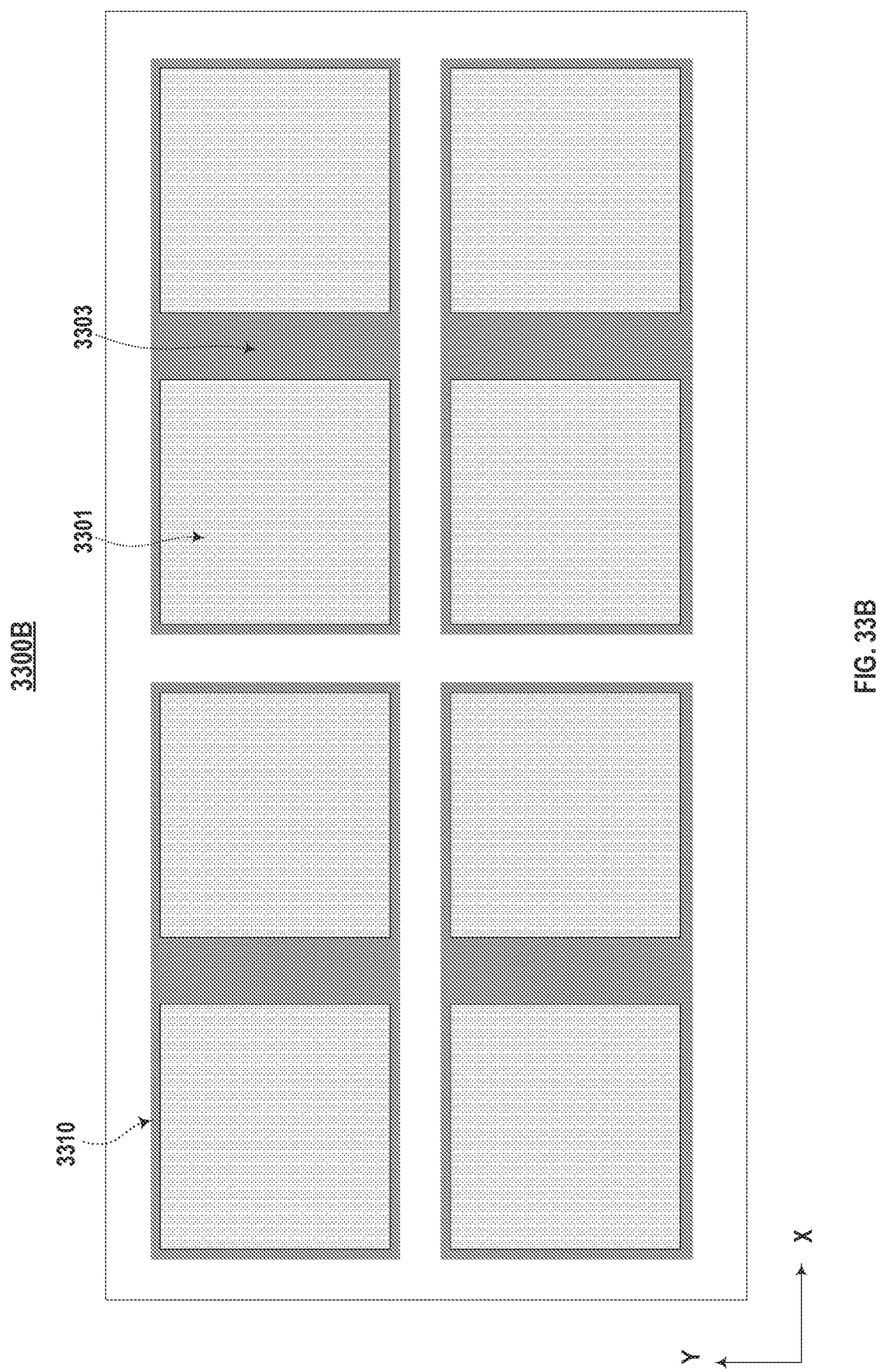

FIGS. 33A and 33B illustrate schematic diagrams of exemplary 3D memory dies 3300A and 3300B in a top view, according to various aspects of the present disclosure. It is noted that, a memory die of a 3D memory device can include one or more memory planes, such as four memory planes 3310 as shown in FIGS. 33A and 33B. Identical and concurrent operations can take place at each memory plane 3310. Each memory plane can include one or more core regions 3301 and one or more staircase regions 3303. Core region 3301 can include a 3D NAND cell array or a 3D DFM array described above, and staircase region 3303 can include a staircase structure of memory stack of the 3D NAND cell array or the 3D DFM array. In some implementations as shown in FIG. 33A, each memory plane 3310 of memory die 3300A can include one core region 3301, and at least two staircase regions 3301 at both sides of core region 3301 in the word line direction (e.g., x-direction in FIG. 33A). In some other implementations as shown in FIG. 33B, each memory plane 3310 of memory die 3300B can include one staircase region 3303 sandwiched between two core regions 3301 in the word line direction (e.g., x-direction in FIG. 33B).

FIG. 34 illustrates a block diagram of a system 3400 having a memory device, according to some aspects of the present disclosure. System 3400 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 34, system 3400 can include a host 3408 and a memory system 3402 having one or more memory devices 3404 and a memory controller 3406. Host 3408 can be a processor of an electronic device, such as a central processing unit (CPU), or a system-on-chip (SoC), such as an application processor (AP). Host 3408 can be configured to send or receive the data to or from memory devices 3404.

Memory device 3404 can be any memory devices disclosed herein, such as 3D memory devices 100A-100H. In some implementations, each memory device 3404 includes memory cell arrays and peripheral circuits of the memory cell arrays that are stacked over one another in different planes, as described above in detail.

Memory controller 3406 is coupled to memory device 3404 and host 3408 and is configured to control memory device 3404, according to some implementations. Memory controller 3406 can manage the data stored in memory device 3404 and communicate with host 3408. In some implementations, memory controller 3406 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 3406 is designed for operating in a high duty-cycle environment SSDs or embedded multi-media-cards (eMMCs) used as data storage for mobile devices, such as smartphones, tablets, laptop computers, etc., and enterprise storage arrays. Memory controller 3406 can be configured to control operations of memory device 3404, such as read, erase, and program operations. In some implementations, memory controller 3406 is configured to control the array of memory cells through the first peripheral circuit and the second peripheral circuit. Memory controller 3406 can also be configured to manage various functions with respect to the data stored or to be stored in memory device 3404 including, but not limited to bad-block management, garbage collection, logical-to-physical address conversion, wear leveling, etc. In some implementations, memory controller 3406 is further configured to process error correction codes (ECCs) with respect to the data read from or written to memory device 3404. Any other suitable functions may be performed by memory controller 3406 as well, for example, formatting memory device 3404. Memory controller 3406 can communicate with an external device (e.g., host 3408) according to a particular communication protocol. For example, memory controller 3406 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 3406 and one or more memory devices 3404 can be integrated into various types of storage devices, for example, be included in the same package, such as a universal Flash storage (UFS) package or an eMMC package. That is, memory system 3402 can be implemented and packaged into different types of end electronic products. In one example as shown in FIG. 35A, memory controller 3406 and a single memory device 3404 may be integrated into a memory card 3502. Memory card 3502 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 3502 can further include a memory card connector 3504 coupling memory card 3502 with a host (e.g., host 3408 in FIG. 34). In another example as shown in FIG. 35B, memory controller 3406 and multiple memory devices 3404 may be integrated into an SSD 3506. SSD 3506 can further include an SSD connector 3508 coupling SSD 3506 with a host (e.g., host 3408 in FIG. 34). In some implementations, the storage capacity and/or the operation speed of SSD 3506 is greater than those of memory card 3502.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a first semiconductor structure comprising an array of first type memory cells;
a second semiconductor structure comprising an array of second type memory cells different from the first type memory cells;
a third semiconductor structure comprising a first peripheral circuit; and
a fourth semiconductor structure comprising a second peripheral circuit;
wherein the first semiconductor structure and the second semiconductor structure are sandwiched between the third semiconductor structure and the fourth semiconductor structure in a vertical direction.

2. The 3D memory device of claim 1, wherein:
the first semiconductor structure further comprises a first semiconductor layer; and
the array of first type memory cells comprises an array of NAND memory strings formed on the first semiconductor layer.

3. The 3D memory device of claim 2, wherein:
the second semiconductor structure further comprises a second semiconductor layer; and
the array of second type memory cells comprises an array of multi-gate dynamic flash memory (DFM) cells formed on the second semiconductor layer.

4. The 3D memory device of claim 3, wherein:
the third semiconductor structure further comprises a third semiconductor layer; and
the first peripheral circuit comprises a plurality of first type transistors having a first operating voltage on the third semiconductor layer.

5. The 3D memory device of claim 4, wherein:
the fourth semiconductor structure further comprises a fourth semiconductor layer; and
the second peripheral circuit comprises a plurality of third type transistors having a third operating voltage on the fourth semiconductor layer, wherein the third operating voltage is lower than the first operating voltage.

6. The 3D memory device of claim 5, wherein:
the first peripheral circuit or the second peripheral circuit comprises a plurality of second type transistors having a second operating voltage lower than the first operating voltage and higher than the third operating voltage; and
the third and fourth semiconductor layers have different thicknesses.

7. The 3D memory device of claim 6, further comprising:
a first bonding interface between the first semiconductor structure and the third semiconductor structure;
a second bonding interface between the second semiconductor structure and the fourth semiconductor structure; and
a third bonding interface between the first semiconductor structure and the second semiconductor structure.

8. The 3D memory device of claim 7, wherein:
the first semiconductor structure further comprises a first interconnect layer comprising a first interconnect coupled to the array of NAND memory strings;
the second semiconductor structure further comprises a second interconnect layer comprising a second interconnect coupled to the array of multi-gate DFM cells;
the third semiconductor structure further comprises a third interconnect layer comprising a third interconnect coupled to the HV circuit; and
the fourth semiconductor structure further comprises a fourth interconnect layer comprising a fourth interconnect coupled to the LLV circuit.

9. The 3D memory device of claim 8, wherein:
the first semiconductor structure further comprises a first through contact penetrating the first semiconductor layer to couple the first interconnect;
the second semiconductor structure further comprises a second through contact penetrating the second semiconductor layer to couple the second interconnect;
the third semiconductor structure further comprises a third through contact penetrating the third semiconductor layer to couple the third interconnect; and
the fourth semiconductor structure further comprises a fourth through contact penetrating the fourth semiconductor layer to couple the fourth interconnect.

10. The 3D memory device of claim 9, wherein:
the third semiconductor structure or the fourth semiconductor structure further comprises a pad-out interconnect layer including a contact pad in electrical connection with the third through contact or the fourth through contact.

11. A system, comprising:
a memory device configured to store data, and comprising:
a first semiconductor structure comprising an array of first type memory cells,
a second semiconductor structure comprising an array of second type memory cells different from the first type memory cells,
a third semiconductor structure comprising a first peripheral circuit, and
a fourth semiconductor structure comprising a second peripheral circuit,
wherein the first semiconductor structure and the second semiconductor structure are sandwiched between the third semiconductor structure and the fourth semiconductor structure in a vertical direction; and
a memory controller coupled to the memory device and configured to control the array of first type memory cells and the array of second type memory cells through the first peripheral circuit and the second peripheral circuit.

12. A method of forming a three-dimensional (3D) memory device, comprising:
forming a first semiconductor structure comprising an array of first type memory cells;
forming a second semiconductor structure comprising an array of second type memory cells different from the first type memory cells;
forming a third semiconductor structure comprising a first peripheral circuit;
forming a fourth semiconductor structure comprising a second peripheral circuit;
bonding the first semiconductor structure to the third semiconductor structure;

bonding the second semiconductor structure to the fourth semiconductor structure; and bonding the first semiconductor structure to the second semiconductor structure.

13. The method of claim 12, wherein forming the first semiconductor structure comprises:

forming an array of NAND memory strings on a first semiconductor layer;

forming a first interconnect layer comprising a first interconnect coupled to the array of NAND memory strings; and forming a first through contact in the first semiconductor layer to couple the first interconnect.

14. The method of claim 13, wherein forming the second semiconductor structure comprises:

forming an array of multi-gate dynamic flash memory (DFM) cells on a second semiconductor layer;

forming a second interconnect layer comprising a second interconnect coupled to the array of multi-gate DFM cells; and forming a second through contact in the second semiconductor layer to couple the second interconnect.

15. The method of claim 14, wherein forming the third semiconductor structure comprises:

forming a first circuit including a plurality of first type transistors having a first operating voltage on a third semiconductor layer; and forming a third interconnect layer comprising a third interconnect coupled to the first circuit.

16. The method of claim 15, wherein forming the fourth semiconductor structure comprises:

forming a third circuit including a plurality of third transistors having a third operating voltage on a fourth semiconductor layer, wherein the third operating voltage is lower than the first operating voltage; and forming a fourth interconnect layer comprising a fourth interconnect coupled to the third circuit.

17. The method of claim 12, wherein forming the third semiconductor structure or forming the fourth semiconductor structure further comprises:

forming a second circuit including a plurality of second type transistors having a second operating voltage;

wherein the second operating voltage is lower than the first operating voltage and higher than the third operating voltage.

18. The method of claim 17, wherein:

bonding the first semiconductor structure to the third semiconductor structure comprises bonding the first semiconductor structure and the third semiconductor structure in a face-to-face manner, such that the first interconnect is in contact with the third interconnect at a first bonding interface; and bonding the second semiconductor structure to the fourth semiconductor structure comprises bonding the second semiconductor structure and the fourth semiconductor structure in a face-to-face manner, such that the second interconnect is in contact with the fourth interconnect at a second bonding interface.

19. The method of claim 18, wherein bonding the first semiconductor structure to the second semiconductor structure comprises:

forming a first bonding layer on a backside of the first semiconductor layer;

forming a second bonding layer on a backside of the second semiconductor layer; and bonding the first semiconductor structure and the second semiconductor structure in a back-to-back manner, such that the first through contact is coupled with the second through contact through a third bonding interface between the first bonding layer and the second bonding layer.

20. The method of claim 19, further comprising:

forming a third through contact penetrating the third semiconductor layer and coupled to the third interconnect, and forming a first pad-out interconnect layer on a back side of the third semiconductor layer, the first pad-out interconnect layer including a first contact pad coupled with the third through contact; or forming a fourth through contact penetrating the fourth semiconductor layer and coupled to the fourth interconnect, and forming a second pad-out interconnect layer on a back side of the fourth semiconductor layer, the second pad-out interconnect layer including a second contact pad coupled with the fourth through contact.

* * * * *